United States Patent [19]
Okamura et al.

[11] Patent Number: 5,817,181
[45] Date of Patent: *Oct. 6, 1998

[54] PROCESS FOR FORMING DEPOSITED FILM FOR LIGHT-RECEIVING MEMBER, LIGHT-RECEIVED MEMBER PRODUCED BY THE PROCESS DEPOSITED FILM FORMING APPARATUS, AND METHOD FOR CLEANING DEPOSITED FILM FORMING APPARATUS

[75] Inventors: Ryuji Okamura; Kazuyoshi Akiyama, both of Nara; Hitoshi Murayama, Soraku-gun; Koji Hitsuishi, Nara; Satoshi Kojima, Tsuzuki-gun; Hirokazu Ohtoshi, Nara; Masaaki Yamamura, Nagahama, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 506,347

[22] Filed: Jul. 24, 1995

Related U.S. Application Data

[62] Division of Ser. No. 138,962, Oct. 21, 1993, Pat. No. 5,455,138.

[30] Foreign Application Priority Data

| Oct. 23, 1992 | [JP] | Japan | 4-307872 |
| Oct. 23, 1992 | [JP] | Japan | 4-307873 |
| Nov. 6, 1992 | [JP] | Japan | 4-297266 |
| Nov. 6, 1992 | [JP] | Japan | 4-297268 |
| Nov. 6, 1992 | [JP] | Japan | 4-297269 |
| Dec. 22, 1992 | [JP] | Japan | 4-342113 |
| Dec. 24, 1992 | [JP] | Japan | 4-343018 |
| Dec. 24, 1992 | [JP] | Japan | 4-357276 |
| Oct. 20, 1993 | [JP] | Japan | 5-262213 |

[51] Int. Cl.$^6$ .................................................. B08B 7/00
[52] U.S. Cl. .................................... 134/1.1; 134/1
[58] Field of Search ................................ 134/1, 1.1, 1.2, 134/1.3; 430/128; 118/20.1, 620, 70

[56] References Cited

U.S. PATENT DOCUMENTS

| 4,265,991 | 5/1981 | Hirai et al. | 430/64 |
| 4,466,380 | 8/1984 | Jansen et al. | 418/55.2 |
| 4,529,474 | 7/1985 | Fujiyama et al. | 156/643 |

(List continued on next page.)

FOREIGN PATENT DOCUMENTS

| 1245183 | 11/1988 | Canada . |
| 154160 | 9/1985 | European Pat. Off. . |
| 328097 | 8/1989 | European Pat. Off. . |

(List continued on next page.)

OTHER PUBLICATIONS

Patent Abstracts of Japan, vol. 6, No. 217, (p–152) Oct. 1982.
Patent Abstracts of Japan, vol. 12, No. 40 (C474) (2887) Feb. 1988.

(List continued on next page.)

*Primary Examiner*—Jill Warden
*Assistant Examiner*—Alexander Markoff
*Attorney, Agent, or Firm*—Fitzpatrick, Cella Harper & Scinto

[57] ABSTRACT

A process for producing a light-receiving member comprising a substrate and provided thereon a blocking layer and a photoconductive layer each comprised of a non-monocrystalline material is disclosed in which the blocking layer is comprised of a non-monocrystalline material comprising silicon atoms as matrix and at least one kind of atoms selected from the group consisting of carbon atoms, oxygen atoms and nitrogen atoms, the process comprising forming the blocking layer and the photoconductive layer by plasma CVD using glow discharge decomposition of a starting material gas caused by applying to the starting material gas an electromagnetic wave with a frequency of from 20 MHz to 450 MHz.

14 Claims, 23 Drawing Sheets

U.S. PATENT DOCUMENTS

| | | | |
|---|---|---|---|
| 4,539,934 | 9/1985 | Fujiyama et al. | 118/723 E |
| 4,552,824 | 11/1985 | Hirai et al. | 430/64 |
| 4,786,352 | 11/1988 | Benzing | 134/1 |
| 4,788,120 | 11/1988 | Shirai et al. | 430/66 |
| 4,795,691 | 1/1989 | Takei et al. | 430/67 |
| 4,954,397 | 9/1990 | Amada et al. | 430/58 |
| 4,998,979 | 3/1991 | Niino | 134/1 |
| 5,314,780 | 5/1994 | Takei et al. | 430/138 |

FOREIGN PATENT DOCUMENTS

| | | |
|---|---|---|
| 562623 | 9/1993 | European Pat. Off. . |
| 57-115551 | 7/1982 | Japan . |
| 57-115556 | 7/1982 | Japan . |
| 59-142839 | 8/1984 | Japan . |
| 60-168156 | 8/1985 | Japan . |
| 60-178457 | 9/1985 | Japan . |
| 60-186849 | 9/1985 | Japan . |
| 60-225854 | 11/1985 | Japan . |
| 61-231561 | 10/1986 | Japan . |
| 62-168161 | 7/1987 | Japan . |
| 2-77579 | 3/1990 | Japan . |

OTHER PUBLICATIONS

Database WPI, Week 8441, Derwent Publ.; AN84–254019 [41].

Fluckiger, et al., "Microcrystalline Silicon," 11th Photovolt. Solar En. Conf., pp. 617–620 Oct. 1992.

Curtins, et al. "High–Rate Deposition of Hydrogenated Amorphous Silicon," 19th IEEE Photovoltaic Spec. Conf., pp. 695–696 May 1987.

Fischer et al. "VHF Plasma Deposition," 10th Photovolt. Solar En. Conf., pp. 201–204 Apr. 1991.

Curtins, et al. "Influence of Plasma Excitation Energy," Plasma Chem. and Plasma Proc., vol. 7, No. 3, 1987, pp. 267–273 Mar. 1987.

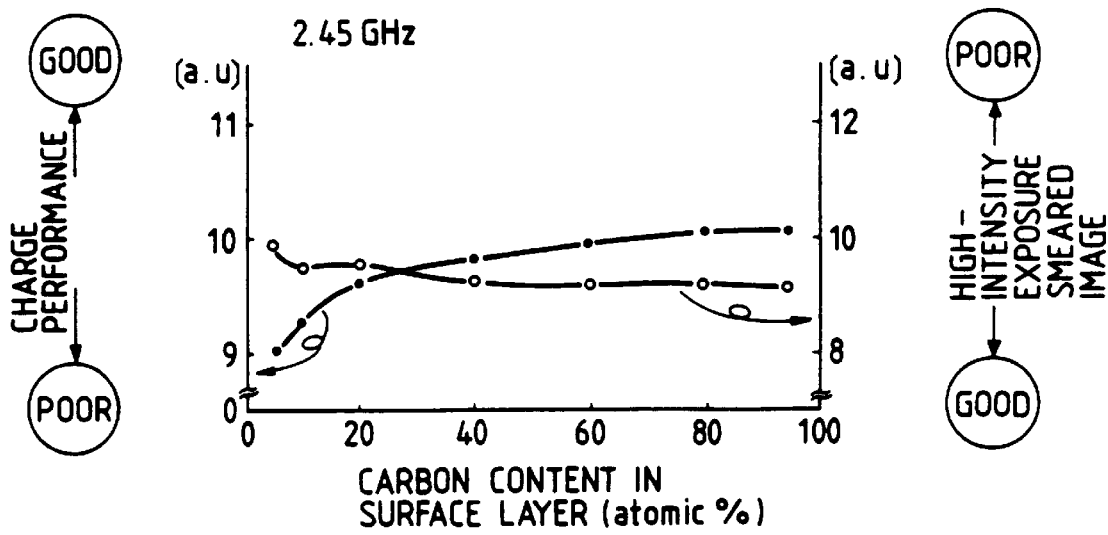

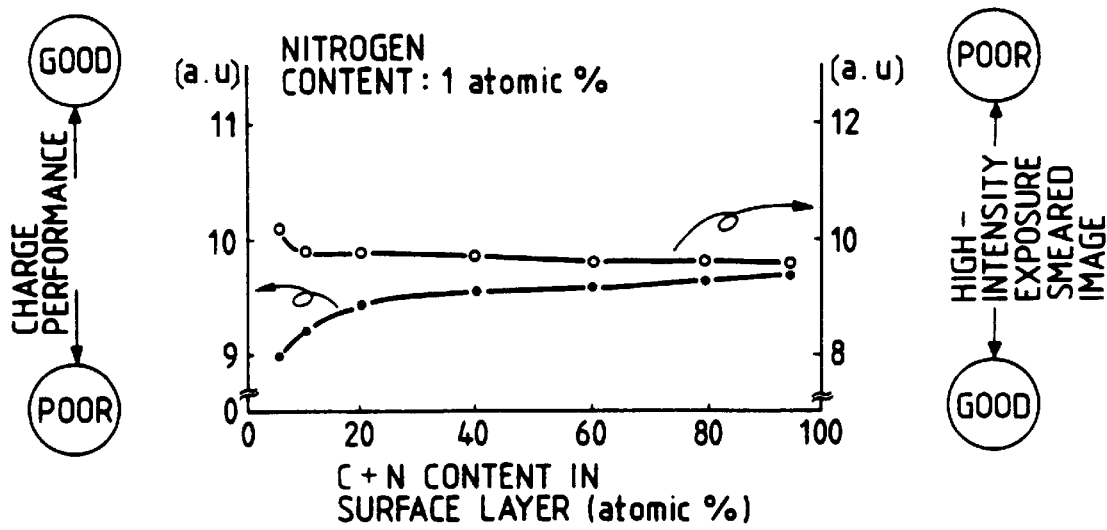
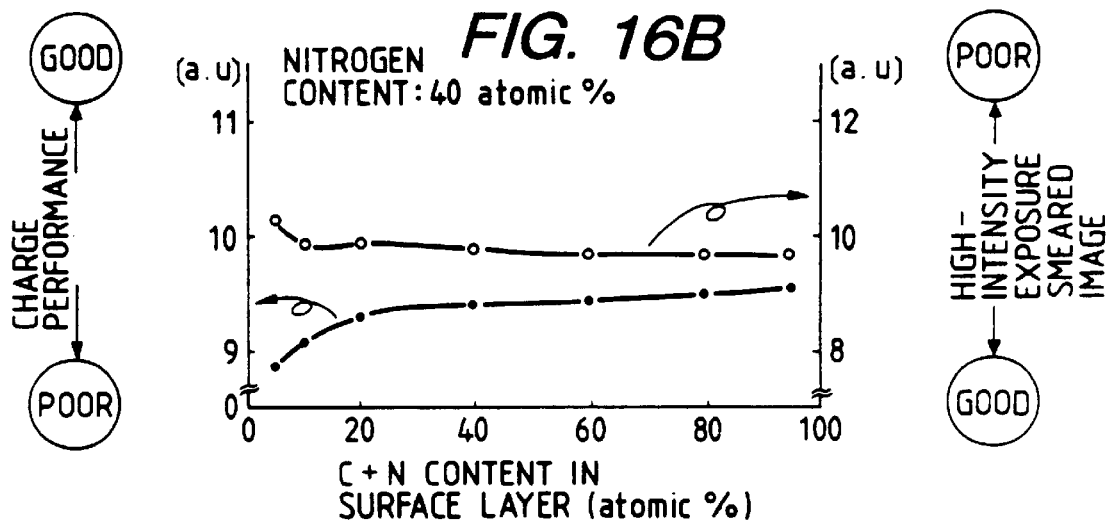
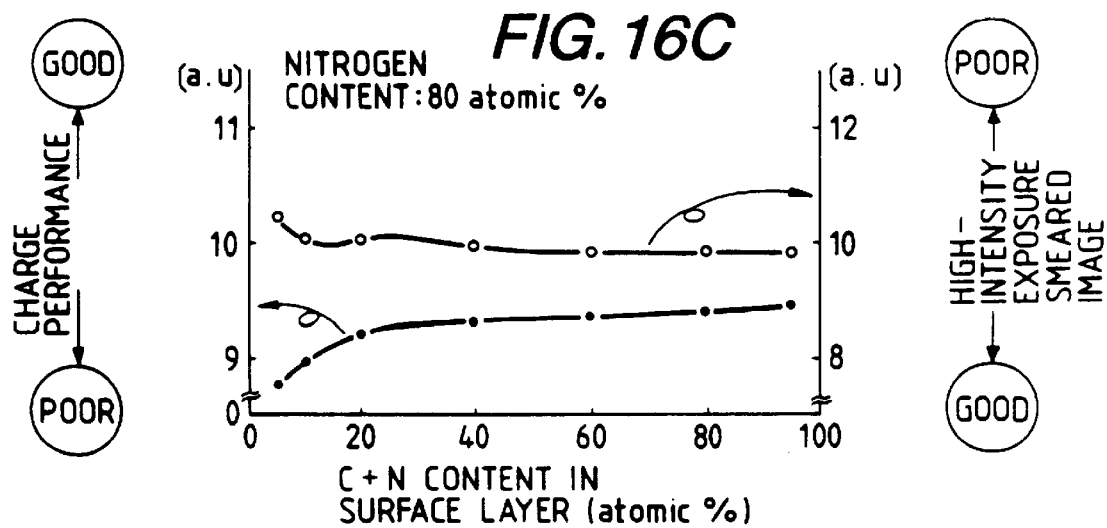

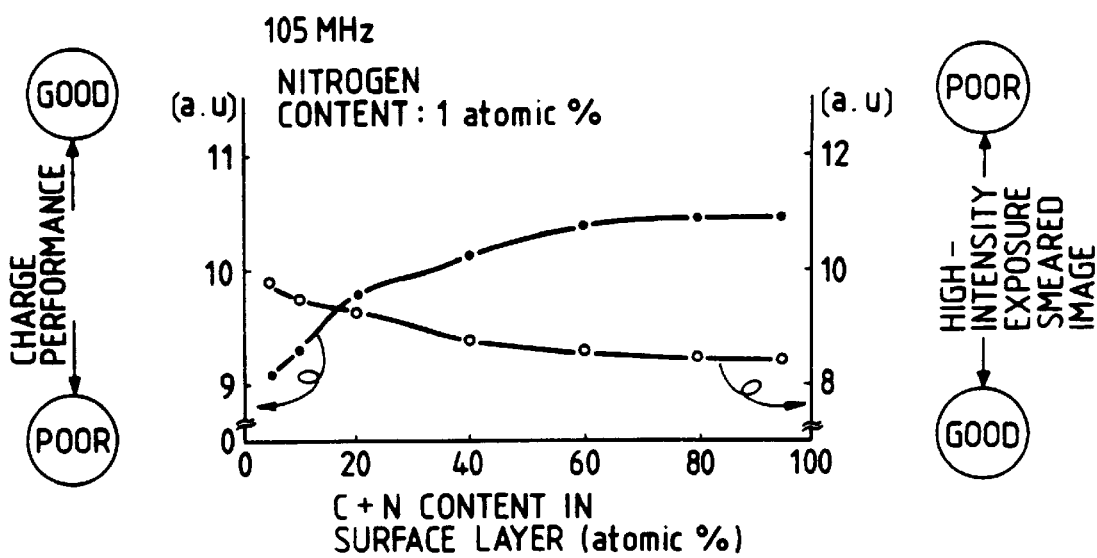
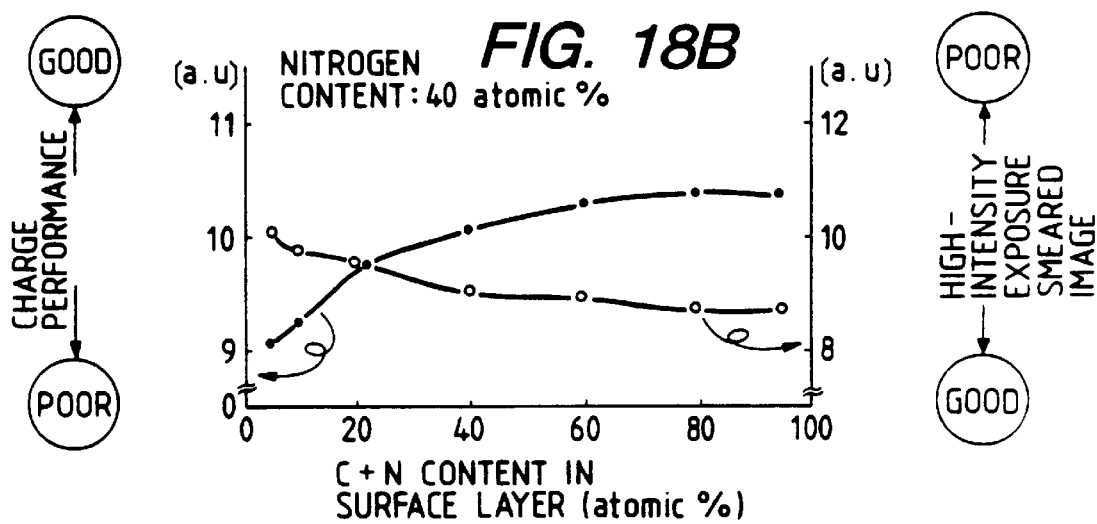
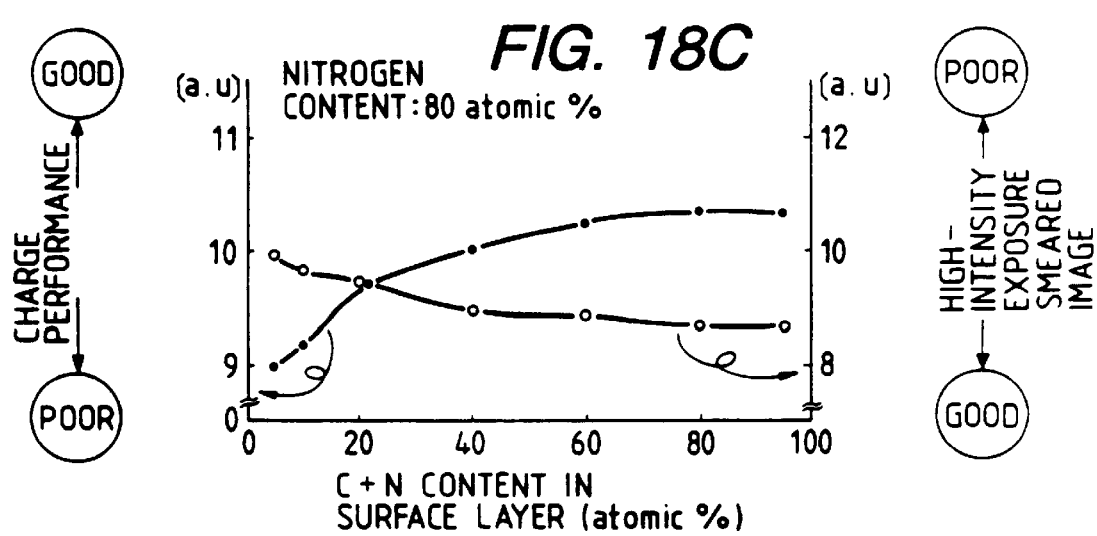

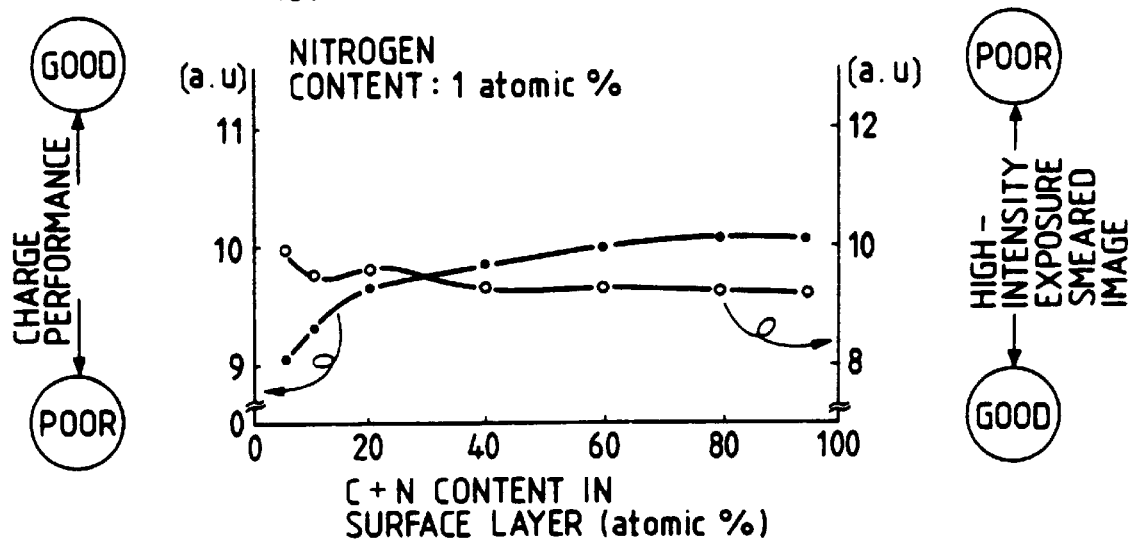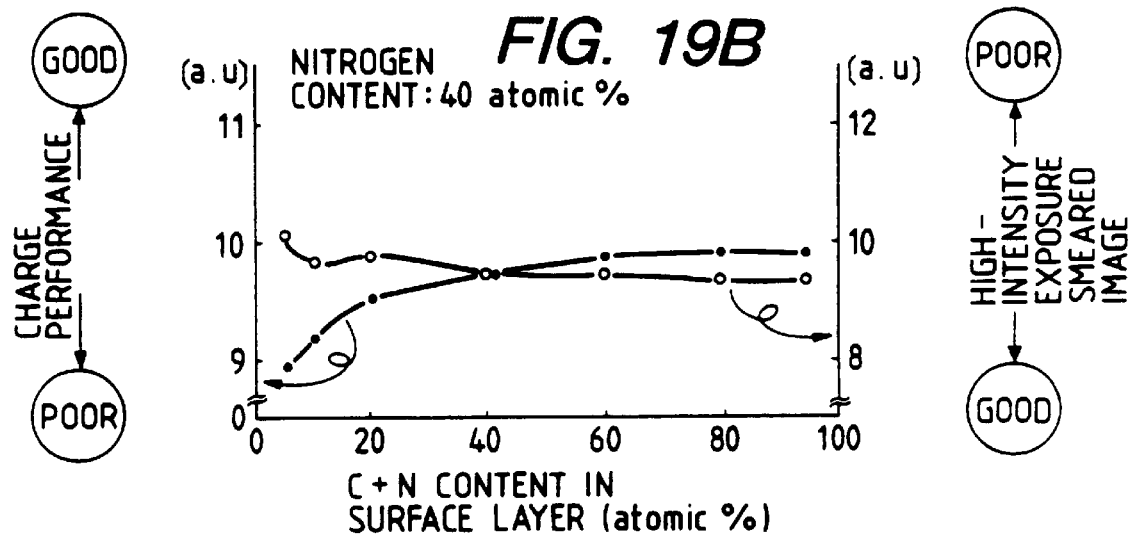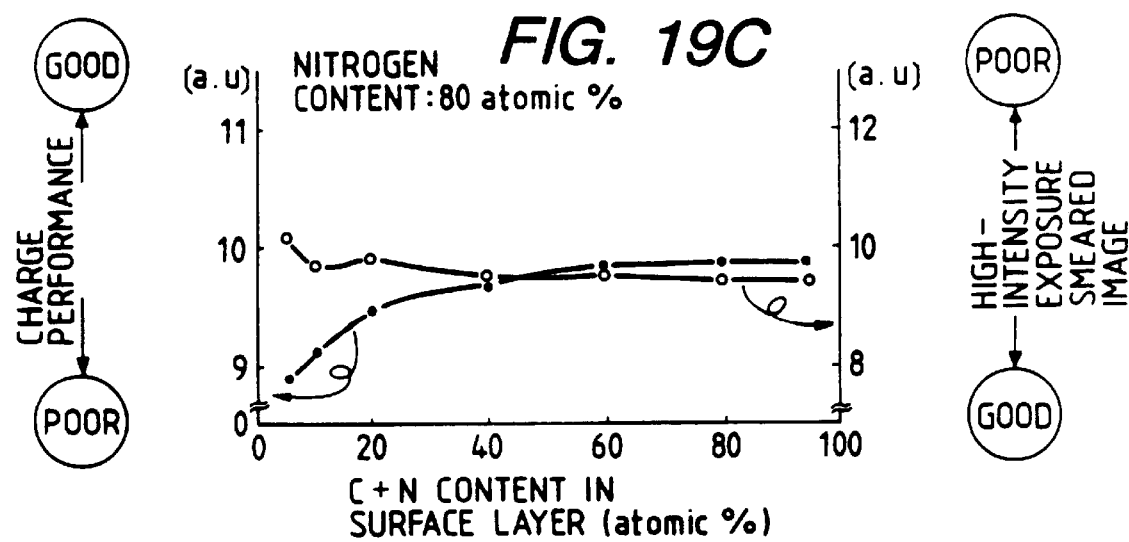

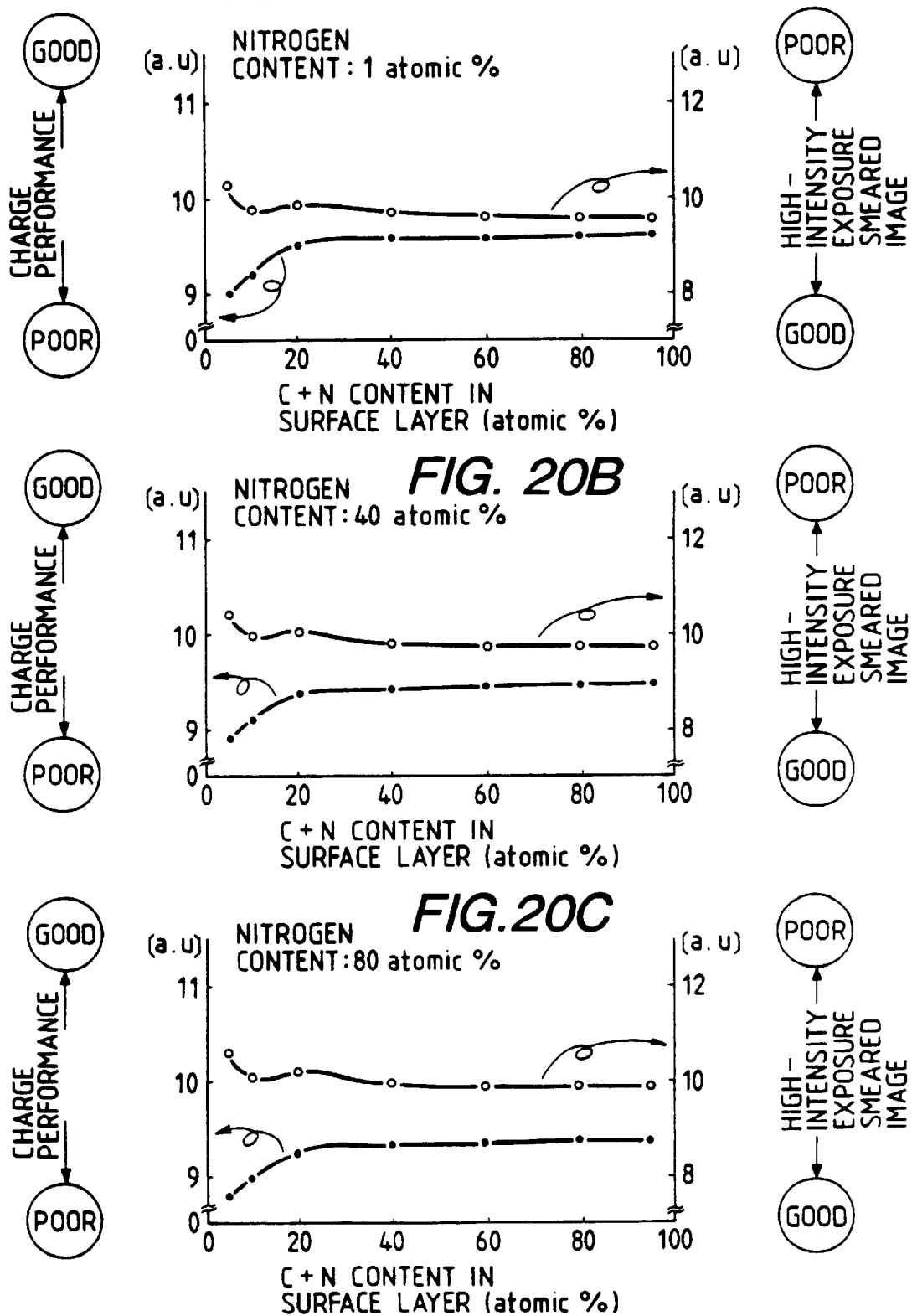

PROCESS FOR FORMING DEPOSITED FILM FOR LIGHT-RECEIVING MEMBER, LIGHT-RECEIVED MEMBER PRODUCED BY THE PROCESS DEPOSITED FILM FORMING APPARATUS, AND METHOD FOR CLEANING DEPOSITED FILM FORMING APPARATUS

This application is a division of application Ser. No. 08/138,962 filed Oct. 21, 1993, now U.S. Pat. No. 5,455,138.

BACKGROUND OF THE INVENTION

1. Field of the Invention

This invention relates to a process for producing a light-receiving member having a sensitivity to light (which herein refers to light in a broad sense and indicates ultraviolet rays, visible rays, infrared rays, X-rays, γ-rays, electromagnetic waves, etc.), a deposited film forming apparatus used to produce the light-receiving member, and a method for cleaning the apparatus. More particularly, the present invention relates to a process for producing a light-receiving member suited for its application in light-receiving members for electrophotography, a deposited film forming apparatus used to produce the light-receiving member, and a method for cleaning the apparatus.

2. Related Background Art

Copying machines, facsimile machines, printers and so forth that utilize electrophotography have been put into wide use. In these electrophotographic systems, it is common to form a toner image by utilizing a light-receiving member having a sensitivity to light, and transfer the toner image to a recording medium.

Photoconductive materials capable of forming photoconductive layers in light-receiving members used in the field of such image formation are required to have properties such that they are highly sensitive, have a high SN ratio [photocurrent (Ip)/dark current (Id)], have absorption spectra suited to spectral characteristics of electromagnetic waves to be radiated, have a high response to light, have the desired dark resistance and are safe to human bodies when used. In particular, in the case of electrophotographic light-receiving members set in electrophotographic apparatus used in offices, the above safety in their use is an important point.

Photoconductive materials recently attracting notice from such a viewpoint include amorphous silicon (hereinafter "a-Si") (for example, U.S. Pat. Nos. 4,265,991 and 4,552,824 disclose its application in electrophotographic light-receiving members), and are put into practical use as materials for electrophotographic light-receiving members.

Various improvements or proposals are made on the electrophotographic light-receiving members utilizing the a-Si.

These techniques have brought about further improvements in electrical, optical and photoconductive properties, service environmental properties and durability and also have made it possible to improve image quality levels. Such a-Si electrophotographic light-receiving members can be formed by a process including plasma-assisted CVD utilizing glow discharge hereinafter simply "plasma-assisted CVD").

In spite of originally high durability of a-Si photoconductive layers, it is also known to further form a surface layer (protective layer) on an a-Si photoconductive layer as a technique that can achieve more improvements in the electrical, optical and photoconductive properties, service environmental properties and durability. For example, Japanese Patent Application Laid-open No. 57-115551 discloses an example in which the surface layer is deposited by high-frequency plasma-assisted CVD, decomposing starting material gases by the use of electromagnetic waves with a frequency of 13.56 MHz to cause glow discharge.

To achieve improvements in properties in respect of electrical, optical and photoconductive properties such as dark resistance, photoconductivity and light-response and service environmental properties such as moisture resistance, and also in respect of timer stability, Japanese Patent Application Laid-open No. 57-11556 also discloses a technique in which a surface barrier layer formed of a non-photoconductive amorphous material containing silicon atoms and carbon atoms is provided on a photoconductive layer formed of an amorphous material mainly composed of silicon atoms.

Japanese Patent Application Laid-open No. 62-168161 also discloses a technique in which a material comprised of an amorphous material containing silicon atoms, carbon atoms and 41 to 70 atomic % of hydrogen atoms as component elements is used to form the surface layer.

Such layers of a-Si electrophotographic light-receiving members can be formed by a process including glow discharge plasma-assisted CVD as mentioned above, where it is common to use RF plasma-assisted CVD which comprises decomposing starting material gases by the use of electromagnetic waves with a frequency of 13.56 MHz to cause glow discharge.

In recent years, a method of forming deposited films by microwave plasma-assisted CVD making use of a microwave with a frequency of 2.45 GHz as a source for decomposing starting material gases has attracted notice for its industrial application and has been put into practical use (see, for example, Japanese Patent Application Laid-open No. 60-186849).

Such a technique has made it possible to provide electrophotographic light-receiving members having better electrical properties.

Incidentally, in recent years, with spread of high-speed copying machines, digital copying machines and full-color copying machines, electrophotographic apparatus are sought to achieve higher image quality, higher speed and higher durability. As a result, electrophotographic light-receiving members are now required to be more free from memory or faulty copy than ever and, in addition to further improvements in electrical properties or photoconductive properties, to raise charge performance to a level required when used at a high speed and at the same time achieve a great improvement in durability.

For the purpose of service-cost saving, it is also required to improve reliability of component parts so that maintenance regimes less times Under such circumstances, electrophotographic light-receiving members are now so designed that repeated use can be continued for a much longer time than ever in various environments without servicemen's maintenance service.

However, even under such circumstances, the fact is that there is room for further improvements in conventional electrophotographic light-receiving members.

For example, when images are repeatedly formed, sometimes residual images caused during exposure in the course of copying (called blank memory when it is caused by blank exposure) appears in images, or that what is called "ghost", which is a phenomenon in which an image once formed remains as a residual image in the subsequent image formation, is formed drums having been used at a high speed for a long time.

Such blank memory and ghost are steadily decreasing on account of various improvements having been hitherto made, but the improvements are still unsatisfactory considering that higher image quality and higher-speed copying will be required more in the future, and it is sought to make improvements.

When copying machines are used under higher-speed conditions for a long time, what are called black lines has sometimes occurred, which are black lines appearing on halftone images along the peripheral direction of electrophotographic light-receiving members.

When images are repeatedly formed at a high-speed, it has also often happened that, because of an unsatisfactory uniformity of films formed in electrophotographic light-receiving members obtained by conventional film forming methods, an image density unevenness occurs and conspicuously appears as what is called coarse images, which is ascribable to uneven density of minute images particularly in halftone images. Besides the minute unevenness such as coarse image, uneven density on the whole halftone images may also occur.

When images are repeatedly formed at a high-speed, what is called "white dots" may also occur, which are white small spots on copied images caused, because of an unsatisfactory durability of electrophotographic light-receiving members obtained by conventional film forming methods, and there is a tendency of a gradual increase in its occurrence.

When machines are repeatedly used at a very high speed for a long time, fine lines of images may become blurred (to form smeared images), and, in an extreme instance, images become so coarse that printed letters can not be read at all. Hitherto, smeared images occurring in an environment of high humidity have been prevented by heating a light-receiving member so that the relative humidity on the surface of the light-receiving member is decreased. However, when used under the highest-speed conditions that have ever been experienced, the smeared images can not be prevented on some occasions even if the photoconductive material is heated. Thus, in the development of high-speed copying machines, it is strongly sought to improve light-receiving members also.

Moreover, in electrophotographic apparatus making use of electrophotographic light-receiving members that have once caused such a phenomenon, the occurrence of smeared images often does not stop even if the apparatus are restored to an environment of a relatively low humidity in which no smeared images have ever occurred at all. Hitherto, as stated above, smeared images occurring in an environment of high humidity have been prevented by heating a light-receiving member so that the relative humidity on the surface of the light-receiving member is decreased. However, solving the problem by this method makes it necessary to make the drum surface temperature very high, bringing about the problem that the cost of apparatus increases and the consumption of electricity increases.

As a phenomenon different from the one ascribable to humidity, smeared images may also occur when light-receiving members are subjected to high-intensity exposure. This is caused by the disturbance of latent images formed on the surface of an electrophotographic light-receiving member because of charges flowing in the lateral direction in the electrophotographic light-receiving member. The problem of the smeared images that may occur in this way has been almost completely resolved in conventional use by, for example, greatly decreasing oxygen contained as impurities. In the future, however, further improvements should be made when an advance is made toward ultra-high image quality or studies are made on equipment for high image quality full-color copying machines, and this can be regarded as a problem to be solved. This problem is herein called high-intensity exposure smeared images.

Meanwhile, in addition to the above subjects mainly concerned with copied images, it is also sought to more improve potential characteristics such as photosensitivity.

In the amorphous silicon electrophotographic light-receiving members, there is also a problem of potential shift. The potential shift refers to a phenomenon in which the dark-portion surface potential of an electrophotographic light-receiving member changes immediately after charging or changes several minutes thereafter, and includes "rise" that indicates an increase in potential and "drop" that indicates a decrease in potential. This appears as a phenomenon in which the density of a copied image on the first sheet becomes different from that on a sheet after continuous copying when copying machines are used. Hitherto, the potential shift has been eliminated by layer configuration designed utilizing the tendency that the rise occurs in a-Si and the drop occurs in a-SiC. In such a case, however, other performances (e.g., ghost) may also change. It is difficult to simultaneously improve the different performances, and it has been sought to make complete improvements.

In the achievement of high-speed copying that is nowadays strongly demanded in the market, charge currents must be increased in order to obtain latent image potential required at the development position. For example, merely increasing charge current density as a means for increasing charge currents results in a serious contamination of a charger which brings about the problem that maintenance must be conducted at shorter intervals. As other means therefor, one may contemplate a method in which the width of a charger is made larger so that charge currents can be increased without changing the charge current density. In such a case, however, it becomes impossible to achieve another demand in the market, i.e., to make copying machines small-sized. Under such circumstances, it is also strongly sought to improve charge performance of an electrophotographic light-receiving member. Achievement of this improvement in charge performance makes it unnecessary to increase charge currents when high-speed copying is carried out, and to obtain the required latent image potential without causing the problems as discussed above.

When copying machines are used at higher speeds for a long time, a toner may melt-adhere to the surface of an electrophotographic light-receiving member because of sliding friction between a cleaning blade and the surface of the electrophotographic light-receiving member, often causing black dots around imagewise.

Incidentally, as device members used in semiconductor devices, electrophotographic light-receiving members, image input line sensors, image pick-up devices, photovoltaic devices and other electronic devices, deposited films for semiconductors comprised of an amorphous material such as amorphous silicon or amorphous silicon compensated with, e.g., hydrogen and/or a halogen are proposed, many of which have been put into practical use.

Some of these devices have a problem with respect to cost of manufacture. For example, when electrophotographic light-receiving members are produced, films must be formed in a relatively large thickness, and necessarily require a long deposition time, resulting in a high cost for their manufacture. Hence, it is sought to provide a deposited film forming apparatus capable of improving efficiency in various aspects concurrently with an improvement in productivity.

As a deposited film forming apparatus for overcoming problems of this type, an apparatus is proposed in which deposited films are formed by plasma-assisted CVD making use of microwaves, as disclosed in Japanese Patent Application Laid-open No. 60-186849. In this apparatus, a plurality of cylindrical members are arranged in a deposition chamber to form an internal chamber, and starting material gases are fed internally so that gas utilization efficiency can be enhanced and at the same time the productivity can be improved.

Since, however, in the case of the above deposited film forming apparatus the microwaves are introduced from the top and bottom of the internal chamber (both ends of each cylindrical conductive substrate), non-uniformity may occur in properties in the generatrix direction of the cylindrical conductive substrate, making it difficult to make the characteristics of deposited films uniform between cylindrical conductive substrates. Such non-uniformity in characteristics has an influence on the yield, and hence has been a factor that brings about a cost increase of devices thus manufactured, even if production efficiency has been improved.

Thus, in the deposited film forming apparatus, it is sought to further satisfy all the gas utilization efficiency, productivity and uniformity characteristics.

In the deposited film forming apparatus as described above, reaction products are partly deposited, or adhere in the form of powder, to portions other than the target substrates, i.e., inner walls and so forth of the reaction chamber. Such deposits or powder may be peeled off and fly to adhere to the surfaces of the substrates to cause, for one thing, film defects such as pinholes in deposited films. Hence, it is necessary to clean inner walls and so forth of the deposited film forming apparatus after deposited films have been formed.

As a method for cleaning a deposited film forming apparatus to remove such reaction products having adhered to the inside of the reaction chamber, a method is known in which the reaction products are removed by using a mixed gas of carbon tetrafluoride ($CF_4$) and oxygen ($O_2$), as disclosed in U.S. Pat. No. 4,529,474 and Japanese Patent Application Laid-open No. 59-142839. The former U.S. Pat. No. 4,529,474 discloses that the method is used to remove polysilane having adhered to the inner walls of a reaction chamber in which amorphous silicon deposited films are formed, and the latter Japanese Patent Application Laid-open No. 59-142839 discloses that the method is also effective for cleaning the inside of a reaction chamber in which silicon carbide films are formed.

Japanese Patent Application Laid-open No. 2-77579 also discloses that $ClF_3$ gas is effective for cleaning a deposited film forming apparatus. This publication also discloses that reaction products having adhered to the inside of a reaction chamber as a result of formation of deposited films are removed by using $ClF_3$ gas and the deposited film forming apparatus is cleaned while feeding discharge energy of RF plasma (frequency: 13.56 MHz) and microwave plasma (frequency: 2.45 GHz).

As previously stated, in recent years, with proliferation of high-speed copying machines, digital copying machines and full-color copying machines, electrophotographic apparatus are sought to achieve higher image quality, higher speed and higher running performance. As a result, as previously stated, it is sought to make image quality higher than ever in amorphous silicon drums.

The formation of amorphous silicon deposited films, however, is also accompanied by generation of deposits and products deposited, or adhering in the form of powder, to the inner walls of a reaction chamber. Such deposits or powder may be peeled off and fly to adhere to the surfaces of the substrates to cause film defects such as pinholes in deposited films, resulting in occurrence of faulty images.

Various improvements have been hitherto made in order to decrease such faulty images, and have accomplished a reasonable decrease. However, with the advance of higher image quality attributable to electrophotographic apparatus, it is sought to more than even reduce faulty images.

Although the amorphous silicon drums are enjoying a reasonable cost decrease by virtue of the techniques seen in proposals on their production using microwave plasma-assisted CVD, they are still expensive and further efforts must be made.

Under such circumstances, the fact is that in the field of the production of conventional amorphous silicon drums there is room for further improvements for achieving further cost decreases.

In addition, under the existing conditions, it is urgently sought from an industrial viewpoint to establish a method by which the electrophotographic light-receiving members having solved the problems as discussed above can be produced with good reproducibility of various characteristics, i.e., a good yield, and at a low cost.

SUMMARY OF THE INVENTION

The present invention was made taking account of the foregoing points, and aims at solution of the problems involved in electrophotographic light-receiving members having the light-receiving layer comprised of a material mainly composed of silicon atoms as stated above.

That is, a main object of the present invention is to provide an electrophotographic light-receiving member having a light-receiving layer comprised of a material mainly composed of silicon atoms, that may cause no deterioration of electrical, optical and photoconductive characteristics when repeatedly used, has a superior durability and is capable of stably forming images in a higher quality so that it can be set on copying machines with higher performance as exemplified by high-speed copying machines, digital copying machine and full-color copying machines.

Another object of the present invention is to provide an electrophotographic light-receiving member having a light-receiving layer comprised of a material mainly composed of silicon atoms, that has a superior adhesion and interfacial state between a layer provided on a substrate and the substrate or between layers superposed thereon, has a dense and stable structural arrangement, and has a high film quality.

Still another object of the present invention is to solve the problems in the electrophotographic light-receiving member having the conventional light-receiving layer comprised of a-Si as previously discussed, and provide an electrophotographic light-receiving member having a light-receiving layer comprised of a material mainly composed of silicon atoms, that is substantially always stable almost without dependence of electrical, optical and photoconductive characteristics on environment, may cause no deterioration thereof when repeatedly used, and has a superior durability and moisture resistance.

A further object of the present invention is to provide an electrophotographic light-receiving member and a process for producing, it that can serve as a means for stably supplying at a low cost the electrophotographic light-receiving member improved as stated above, from an industrial viewpoint.

A still further object of the present invention is to provide a cleaning method by which a deposited film forming apparatus can be cleaned in a short time and effectively.

A still further object of the present invention is to provide a deposited film forming apparatus that can be preferably used as a deposited film forming apparatus used to achieve the above objects.

A still further object of the present invention is to provide a deposited film forming apparatus that can achieve superior gas utilization efficiency, productivity and uniformity in characteristics.

A still further object of the present invention is to provide a deposited film forming apparatus that can stably supply at a low cost, deposited films with a good quality, in a plasma-assisted CVD apparatus that forms deposited films, in particular, functional deposited films, on cylindrical conductive substrates, in particular, that forms amorphous semiconductors used in semiconductor devices, electrophotographic light-receiving members, image input line sensors, image pick-up devices, photovoltaic devices and so forth.

The present invention provides a process for producing a light-receiving member having a substrate and a non-monocrystalline light-receiving layer provided on the substrate, wherein;

at least part of said light-receiving layer is formed by decomposing a starting material gas fed into a reaction chamber by means of a high-frequency power supply with a frequency of from 20 MHz to 450 MHz.

The present invention also provides a process for producing a light-receiving member having a substrate and successively provided thereon in order at least a photoconductive layer and a surface layer each comprised of a non-monocrystalline material, wherein;

said surface layer is formed by plasma CVD making use of a starting material gas comprising at least a gas comprising silicon atoms and a gas comprising carbon atoms, and decomposing said starting material gases through glow discharge by means of a high-frequency power supply with a frequency of from 20 MHz to 450 MHz.

The present invention still also provides a process for producing a light-receiving member having a substrate and provided thereon a blocking layer and a photoconductive layer each comprised of a non-monocrystalline material, wherein;

said blocking layer is comprised of a non-monocrystalline material comprising silicon atoms as matrix and at least one kind of atoms selected from the group consisting of carbon atoms, oxygen atoms and nitrogen atoms; and said blocking layer and said photoconductive layer are formed by plasma CVD, decomposing a starting material gas comprising said atoms, through glow discharge caused by applying thereto an electromagnetic wave with a frequency of from 20 MHz to 450 MHz.

The present invention still further provides a process for producing a light-receiving member comprising a substrate and provided thereon in order at least a photoconductive layer and a surface layer each comprised of a non-monocrystalline material, wherein;

said layers are formed by plasma CVD, decomposing a starting material gas through glow discharge by means of an electromagnetic wave with a frequency of from 20 MHz to 450 MHz.

The present invention still further provides a process for producing a light-receiving member having a substrate and provided thereon at least a charge generation layer and a charge transport layer each comprised of a non-monocrystalline material, wherein;

said charge generation layer is formed of a material comprising silicon atoms as matrix;

said charge transport layer is formed of a non-monocrystalline material comprising silicon atoms as matrix and at least one kind of atoms selected from the group consisting of carbon atoms, oxygen atoms and nitrogen atoms; and at least the interfacial portion of said charge generation layer and said charge transport layer is formed by plasma CVD, decomposing a starting material gas through glow discharge caused by applying thereto an electromagnetic wave with a frequency of from 20 MHz to 450 MHz.

The present invention still further provides a light-receiving member produced by any of the processes described above.

The present invention still further provides a deposited film forming apparatus comprising means for rotating a plurality of cylindrical conductive substrates concyclicly arranged in a reaction chamber capable of being evacuated, means for introducing a starting material gas into the space within the circle formed by said arranged cylindrical conductive substrates, and means for applying to at least one of said cylindrical conductive substrates a high-frequency power supply with a frequency of from 20 MHz to 450 MHz, said starting material gas being decomposed by means of said high-frequency power.

The present invention still further provides a method for cleaning a deposited film forming apparatus that forms a deposited film by a vapor phase process, wherein;

a reaction product adhered to the inside of said deposited film forming apparatus after the deposited film formation is removed by introducing $ClF_3$ gas into said apparatus and further applying thereto an electromagnetic wave with a frequency of from 20 MHz to 450 MHz to generate plasma.

BRIEF DESCRIPTION OF THE DRAWINGS

FIGS. 11A to 23E each show the relationship between i) frequency of electromagnetic waves used to decompose a starting material gas, ii) carbon content, nitrogen content and oxygen content in a surface layer and iii) charge performance and high-intensity exposure smeared images.

FIGS. 21, 22A, 22B, 23, 24, 25A, 25B, 26A and 26B each schematically illustrate the construction of a deposited film forming apparatus.

DESCRIPTION OF THE PREFERRED EMBODIMENTS

Figure 1:
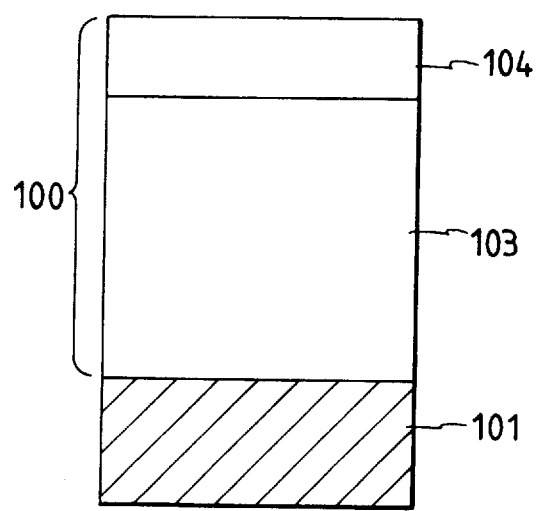
FIGS. 1 to 4 are each a diagrammatic cross section of an electrophotographic light-receiving member to which the present invention can be applied.

To simply describe the process for producing a light-receiving member according to the present invention that can achieve the above objects, the process comprises decomposing a starting material gas by the use of a high-frequency power with a frequency of from 20 MHz to 450 MHz.

The light-receiving member obtained by the above production process can solve the problems as previously discussed.

More specifically, forming a surface layer through the above production process makes it possible to solve the problems concerned with surface layers, and to produce an electrophotographic light-receiving member that can exhibit very good electrical, optical and photoconductive characteristics, durability and service environmental properties when applied to electrophotography.

Forming both a surface layer and a photoconductive layer through the above production process also makes it possible to solve the problems as previously discussed, and to produce an electrophotographic light-receiving member that can exhibit much better electrical, optical and photoconductive characteristics, durability and service environmental properties.

In this case, the surface layer is comprised of a non-monocrystalline material, and preferably comprised of a non-monocrystalline material having silicon and at least one element selected from the group consisting of carbon, nitrogen and oxygen.

The non-monocrystalline material may more preferably be an amorphous material.

In particular, in the production of an electrophotographic light-receiving member successively provided in layers with a photoconductive layer and a surface layer comprising silicon atoms and at least one kind of carbon atoms, nitrogen atoms and oxygen atoms, use of the electromagnetic wave having a frequency in the above range makes it possible to improve an interfacial state between layers, and more improve specific electrophotographic characteristics.

The present invention can also be effective for property modification of an interfacial portion (including composition-changed layer) between the photoconductive layer and the surface layer comprising at least one of carbon atoms, nitrogen atoms and oxygen atoms. This can be remarkably effective particularly when carbon, nitrogen and oxygen are each in a content of not more than 95 atomic %, not more than 80 atomic % and not more than 80 atomic %, respectively, based on the total of each single element and silicon, and the carbon, nitrogen and oxygen are in a content of from 20 to 95 atomic % in total, based on the sum total of silicon and these all elements, so that the problem arising from the interface between layers can be much better overcome.

Forming a blocking layer through the above production process or forming the blocking layer and a photoconductive layer through the above production process also makes it possible to improve an interfacial state between layers, and to attain better performances when applied to electrophotographic light-receiving members.

In addition, forming a charge generation layer and a charge transport layer through the above production process also makes it possible to improve the interfacial state between the layers, and to attain very good performances when applied to electrophotography.

More specifically, in the plasma-assisted CVD process, the electromagnetic waves of glow discharge used to decompose a starting material gas is so selected as to be in the frequency as specified above, whereby it is possible to attain a superior adhesion and interfacial state between layers, a superior film quality having a dense and stable structural arrangement, and to provide a light-receiving member having a light-receiving layer comprised of a material mainly composed of silicon atoms, that may cause no deterioration of electrical, optical and photoconductive characteristics when repeatedly used, has a superior durability and is capable of stably forming images in a higher quality, compared with conventional light-receiving members.

In the present invention, it is also preferable to apply a bias voltage in addition to the high-frequency waves (electromagnetic waves).

In any case, the frequency is preferably in the range of from 20 MHz to 450 MHz, more preferably from 30 MHz to 300 MHz, and still more preferably from 51 MHz to 250 MHz.

This makes it possible to obtain a light-receiving member having much better characteristics.

The bias voltage applied may be either DC voltage or AC voltage, or may be a combination of these.

In addition, the bias voltage applied may not necessarily be kept at a constant value during the film formation, and voltage values in the case of DC and effective voltage values in the case of AC may be changed as occasion calls. The amount of AC voltage shift may also be changed.

With regard to the high-frequency power, its frequency may also be changed during the film formation.

The deposited film forming apparatus to which the production process of the present invention is applied comprises means for rotating a plurality of cylindrical conductive substrates concyclicly provided in a reaction chamber capable of being evacuated, means for feeding a starting material gas to the space within the circle formed by said cylindrical conductive substrates as concyclicly provided, and means for applying to at least one of said cylindrical conductive substrates a high-frequency power, where the starting material gas is decomposed by means of the high-frequency power.

In the present invention, the apparatus can be effective even when the cylindrical conductive substrate to which the high-frequency power is applied is only one in number. When any non-uniformity in characteristics of deposited films simultaneously formed on a plurality of cylindrical conductive substrates may particularly come into question, the number or arrangement of the cylindrical conductive substrates to which the high-frequency power is applied may be altered to make appropriate adjustment. Stated specifically, the number of the cylindrical conductive substrate to which the high-frequency power is applied may be appropriately determined taking account of conditions such as easiness of beginning slow discharge, transmitting characteristics of high frequency such as impedance matching, the number of the whole cylindrical conductive substrates and the properties of deposited films. In this case, the cylindrical conductive substrates may be 2N (N is an integer) in number, the cylindrical conductive substrates to which the high-frequency power is applied may be N in number and also the cylindrical conductive substrates to which the high-frequency power is applied and the cylindrical conductive substrates to which no high-frequency power is applied may be alternately so arranged that they are adjacent to each other. This is desirable for uniformizing the characteristics of deposited films and for preventing self-bias from occurring between the cylindrical conductive substrates.

When the cylindrical conductive substrates to which the high-frequency power is applied are set in a large number, in particular, when they are arranged in the manner as described above, a matching box may be provided for each of the cylindrical conductive substrates to which the high-frequency power is applied in order to enable simultaneous excitation so that the high-frequency power can be effectively transmitted and also the achievement of uniform characteristics of deposited films can be more promoted. In this case, the high-frequency power fed to the individual cylindrical conductive substrate may be separately controlled.

The high-frequency power applied to the cylindrical conductive substrate is set in a frequency of from 20 MHz to 450 MHz. This is because, if the frequency is less than 20 MHz, a difference in characteristics tends to be produced between a deposited film formed on the cylindrical conductive substrate to which the high-frequency power is applied and a deposited film formed on the cylindrical conductive substrate to which no high-frequency power is applied and hence it becomes difficult to form deposited films in a good yield. The reason therefor is unknown at present, but can be considered due to any relation to a change in energy of ions present in plasma, caused by changes in frequency. If the frequency of the high-frequency power is higher than 450 MHz, the high-frequency power transmission performance becomes poor to make it difficult to maintain glow discharge.

The high-frequency power used in the present invention may have any waveform. Sine waveform or short waveform is suitable. The magnitude of the high-frequency power may be appropriately determined according to the intended characteristics of deposited films, and should preferably be from 10 to 5,000 W, and more preferably from 20 to 2,000 W, per one cylindrical conductive substrate.

In the method for cleaning a deposited film forming apparatus in order to solve the problems previously discussed and provide light-receiving members with a higher quality, in particular, amorphous silicon drums promising a higher image quality, the frequency of electromagnetic waves is selected when the deposited film forming apparatus is cleaned while supplying plasma energy using $ClF_3$, whereby a more advantageous method for cleaning a deposited film forming apparatus can be accomplished.

More specifically, this can be achieved by a method for cleaning a deposited film forming apparatus in which a reaction product having adhered to inner walls that form the space through which deposited film forming gases are passed in the deposited film forming apparatus when deposited films are formed is removed by using $ClF_3$ gas and a high-frequency plasma energy making use of an electromagnetic wave with a frequency of from 20 MHz to 450 MHz.

Setting the frequency as described above enables very quick and uniform cleaning, so that it is possible both to decrease cost on account of a great reduction of etching time and to decrease faulty images on account of uniform cleaning. The discharging at the above frequency also makes it possible to increase electron energy compared with that at a frequency of 13.56 MHz and to effectively produce radicals of fluorine, chlorine and so forth useful for the etching. In the discharging at the microwave frequency, the pressure must be made lower in order to maintain the stability of discharging, and it is difficult to achieve proper conditions in the cleaning carried out in a very short time and uniformly, so that the apparatus must be treated for a time longer than a proper time. In that respect, the discharging at the above-mentioned frequency can provide uniform plasma conditions even if the inner pressure is raised, which can easily make etching conditions proper and are advantageous conditions.

To find out a way to solve the problems as previously discussed, the present inventors studied in detail the causes of such problems and have discovered a countermeasure for their solution, so that they have accomplished the present invention. Now, the present invention will be described below in detail along how the present invention has been accomplished.

To find out a way to solve the problems by property modification of surface layers, the present inventors made intensive studies extending to methods of forming surface layers. As a result, they reached a discovery that more property modification of surface layers can be made and the stated objects of the present invention can be more effectively achieved by selecting a specific frequency of the electromagnetic waves applied when a starting material gas is decomposed in order to form a surface layer.

According to the discovery made by the present inventors, the problems concerned with surface layers can be generally considered to be caused by the following mechanism. That is, when image formation is repeated over a long period of time, the materials in the surface of a light-receiving member are repeatedly exposed to corona discharge generated by a charger of an electrophotographic apparatus. At this time, the surface of the electrophotographic light-receiving member reacts with water or with oxygen, in the air because of corona discharge energy tp come to have a low resistance, or an oxidized product that brings about a low resistance because of moisture absorption is produced. The low-resistance matter thus accumulated inhibits sound formation of latent images to cause smeared images, and further to make toner cleaning performance poor because of moisture absorption, tending to cause melt-adhesion of toner. Such reaction, as it proceeds, may also cause a lowering in sensitivity to bring about uneven sensitivity with respect to the portions where the reaction does relatively not proceed, which uneven sensitivity appears as uneven image density particularly on halftone images.

The occurrence of the smeared images cause by this mechanism can hardly be stopped if the light-receiving member is rubbed with a toner, an abrasive incorporated in the toner, a blade or the like, or if a serviceman wipes off the surface of the light-receiving member with the aid of water, an organic solvent or the like. Heating the light-receiving member to decrease relative humidity on its surface is also not so effective as a countermeasure for the smeared images caused by this mechanism, and the light-receiving member has had to be kept at a very high temperature.

In order to improve electrical, optical and photoconductive characteristics, service environmental properties and durability and also improve image quality, it has been conventional to form the surface layer by using a non-monocrystalline material containing silicon atoms and carbon atoms as constituents.

The amount of carbon atoms in such a surface layer is considered preferable when it is in the range of from $1 \times 10^{-3}$ to 90 atomic %, and most suitably from 10 atomic % to 80 atomic %, assuming the total of silicon atoms and carbon atoms as 100%. Here, if the surface layer is formed without any particular attention to the state of bonds as conventionally so, silicon atoms and carbon atoms can not be uniformly distributed and are brought into a state in which portions with silicon atoms in a high concentration and portions with carbon atoms in a high concentration are mixed. Hence, the number of silicon atoms having at least one bond to a carbon atom becomes smaller than the value expected from the compositional viewpoint.

Meanwhile, according to the discovery made by the present inventors, the above mechanism operates when any dangling bonds of silicon atoms, originally present in the surface layer or caused by the break of Si—H and Si—Si bonds due to corona energy are bonded to oxygen atoms under corona discharging. Analysis by ESCA of the surface of the light-receiving member having caused such a phenomenon can ascertain that about 10 to 30% of silicon atoms are bonded to oxygen atoms. Here, the state of bonds between silicon atoms and oxygen atoms is such that z is 1.0 to 1.5 when expressed by $SiO_z$.

However, such oxidation become inhibited when silicon atoms have at least one bond to a carbon atom(s). Furthermore, even if the oxidation has taken place, the influence it may have on electrophotographic performances can be decreased. Hence, the occurrence of smeared images and so forth can be effectively stopped. In order to improve the characteristics of electrophotographic light-receiving members on account of such an effect, the silicon atoms having bond(s) to carbon atom(s) should preferably be in a content of not less than 50% of the whole silicon atoms.

Hitherto, however, the state of bonds between silicon atoms and carbon atoms in a deposited film has strongly tended to be absolutely determined by the structure of molecules contained in a starting material gas. Thus, in the case when a gas comprising silicon atoms and a gas comprising carbon atoms are used, i.e., what is called a binary type starting material gas is used, it is not so effective to merely increase the flow rate of the gas comprising carbon atoms in the starting material gas in order to increase the probability of the bonding of silicon atoms to carbon atoms, and it has been difficult to control the silicon atoms having at least one bond to carbon atom(s), to be in a content of not less than 30%. In addition, with such an increase in the amount of carbon atoms, mechanical strength required for electrophotographic light-receiving members and other characteristics such as a good broad optical band gap may become poor without any satisfactory improvement regarding the above smeared images.

The present inventors took note of the course through which starting material gases are decomposed and deposited films are formed, and made various studies. As a result, they have discovered that the frequency of electromagnetic waves applied to effect decomposition of a starting material gas should be changed to thereby change the state of bonds between silicon atoms and carbon atoms.

In order to increase the probability of the bonding of silicon atoms to carbon atoms, it is important to keep balance when the starting material gas is decomposed and balance when atoms produced as a result of decomposition of gases are rearranged on the surface of a deposited film. In conventional RF plasma-assisted CVD or microwave plasma-assisted CVD, this balance is not necessarily optimum, tending to cause a decrease in the probability of the bonding of silicon atoms to carbon atoms because of an increase in the bonding of silicon atoms to silicon atoms or because of incorporation of carbon atoms bonded to carbon into the film in the form of clusters.

According to the present invention, the frequency of electromagnetic waves applied to effect decomposition of a starting material gas is carefully selected so that the binary type starting material gas comprised of a gas capable of feeding silicon atoms and a gas capable of feeding carbon atoms can be decomposed in a good efficiency and the bonding at the surface of a deposited film can be balanced in an optimum state. This enables dramatic enhancement of the probability of the bonding of silicon atoms to carbon atoms. It has been discovered that the problems concerned with surface layers can be solved by forming the surface layer in this way.

More specifically, according to the process for producing an electrophotographic light-receiving member of the present invention, in the case when the binary type starting material gas comprised of a gas capable of feeding silicon atoms and a gas capable of feeding carbon atoms is used, the frequency of electromagnetic waves for decomposing the starting material gas is set in a VHF band of from 20 to 450 MHz, whereby molecules of different bond energy can be effectively decomposed so as to be incorporated into deposited films and also films with a uniform state of bonds can be readily obtained also on devices with a large area as in electrophotographic light-receiving members. This means is particularly effective for improving film quality when a binary, or ternary or more type starting material gas is used. For example, although no remarkable improvement in film quality can be seen when silicon films are formed using a unitary type starting material gas such as silane, homogeneous surface layers can be readily formed when the binary type starting material gas comprised of a gas capable of feeding silicon atoms and a gas capable of feeding carbon atoms is used, as exemplified by a silicon hydride gas and a hydrocarbon gas which are commonly used are used as starting materials. Thus, it has become possible to effectively solve the problems concerned with surface layers.

Incidentally, as previously described, the electrophotographic light-receiving member is, in order to significantly raise its functions, commonly formed by superposing two or more layers having different properties. For example, a technique is employed such that a photoconductive layer with excellent light-receiving properties and a charge injection blocking layer for preventing injection of charges are superposed. In addition thereto, in order to protect these layers, a surface layer with a high hardness may also be further formed. Alternatively, another technique is employed such that a photoconductive layer with excellent light-receiving properties and, in order to protect this layer, a surface layer with a high hardness are superposed. In addition to these, layer regions endowed with various functions as exemplified by a charge injection blocking layer for preventing injection of charges may be further formed.

Still another technique is also employed such that a charge generation layer having excellent light-receiving properties and capable of generating charges in a high efficiency and a charge transport layer having an excellent charge mobility are superposed as a photoconductive layer.

When such a multi-layer structure is formed it is needless to say that what is important is to design the characteristics pertaining to individual layers so that the desired electrophotographic characteristics can be obtained. At the same time, it is also an important factor as to how well the layers having different characteristics are joined at the interface between them.

Meanwhile, according to studies further made by the present inventors, the problems as previously discussed are found to be caused by the state of this interfacial portion.

For example, with regard to "white dots", it has been found that, when machines are used at a high speed for a long time, deposited films may peel off at their interface because of an unsatisfactory adhesion at the interface between layers, which occurs at spherical projections mainly produced by abnormal growth of the deposited films during their formation, and this appears as "white dots" on images. The "white dots" thus caused tend to gradually increase every time when the image formation is repeated.

Accumulation of charges at such an interfacial portion is considered to cause light-memory called blank memory.

"Black lines" are known to occur when a local pressure is applied to some part of the surface of an electrophotographic light-receiving member during its use over a long period of time, because of component parts coming into contact with the electrophotographic light-receiving member in an electrophotographic apparatus, e.g., component parts such as separating claws provided to separate a copy sheet from the surface of the electrophotographic light-receiving member. Presumably, when layers have no satisfactory adhesion at their interface, application of such a local pressure causes a stress at their interfacial portion, resulting in a poor charge mobility at that portion, which appears as "black lines" on images.

According to a process for producing electrophotographic light-receiving members by conventional plasma-assisted CVD or the like, such an interfacial portion has been formed by a method in which discharging is once cut off after a layer has been formed and discharging is started again after gas conditions and so forth for constituting a layer to be subsequently formed have been adjusted, or a method in which the composition and so forth are continuously changed between layers. In the former case, conventional RF plasma-assisted CVD or microwave plasma-assisted CVD can not achieve a satisfactory adhesion at the interface depending on the condition in which discharging again started, not only tending to cause problems such as an increase of "white dots" and occurrence of "black lines" but also sometimes causing film peeling at the interface depending on the condition in which discharging is again started. The latter method in which the composition and so forth are changed by conventional RF plasma-assisted CVD or microwave plasma-assisted CVD is also involved in, problems such as an increase of "white dots", occurrence of "black lines", film peeling at the interface, no achievement of expected effects, and a tendency to unstable discharge which, in some instances, disturbs the interface to rather cause smeared images or ghost and make electrophotographic characteristics such as chargeability and sensitivity poor.

Now, to overcome such problems, the present inventors made detailed studies on its formation method. As a result, they have discovered that the characteristics of the interface greatly change depending on the frequency of electromagnetic waves used to decompose starting material gases.

As a specific example, they have discovered that the characteristics of the interface between a photoconductive layer and a surface layer greatly change depending on the frequency of electromagnetic waves used to decompose starting material gases, and the combination of the contents of carbon, nitrogen and oxygen in the surface layer.

To overcome such problems, the present inventors made further detailed studies on its formation method. As a result, they have discovered that the characteristics of the interface greatly change also depending on the frequency of electromagnetic waves used to decompose a starting material gases and the bias voltage applied to the cathode.

At present, it is not clearly known what effect the electromagnetic waves with a frequency of from 20 MHz to 450 MHz specifically have with respect to the interfacial portion, compared with the conventional RF plasma-assisted CVD using a frequency of 13.56 MHz or microwave plasma-assisted CVD using a frequency of 2.45 GHz. It is presumed that the effect depends on differences in decomposing properties of starting material gases and in energy of active species produced after decomposition.

More specifically, in the case where discharging is once stopped after a layer has been formed and again discharging is started thereafter, it is considered that there are a problem in the bonding properties of the deposited film formed immediately after the discharging is again carried out, and a problem that the surface of the layer previously formed is damaged. According to the present invention, however, it is presumed that these problems can be reduced by suitably selecting the frequency of electro-magnetic waves to change decomposing properties of starting material gases and energy of active species.

Also in the case where the composition is continuously changed between layers, it is presumed that layers with compositional changes under almost ideal conditions are formed, compared with conventional processes, because of the difference in decomposing properties of starting material gases.

Selection of the frequency of electromagnetic waves used to decompose starting material gases also makes it possible to more effectively relieve the stress in a deposited film to control structural defects of the film, so that the mobility of carriers in the deposited film can be improved particularly in multiplex reaction between silicon atoms, and carbon atoms, oxygen atoms and nitrogen atoms, and light-memory such as "blank memory" or "ghost" can be better prevented.

The foregoing description will be supplemented by a specific example. At present, it is not clearly known what effect the electromagnetic waves with a frequency of from 20 MHz to 450 MHz specifically have with respect to the interfacial portion between a photoconductive layer and a surface layer and what role the carbon atoms, nitrogen atoms and oxygen atoms play in the surface layer (or in the vicinity of its interface to the photoconductive layer) on that occasion, compared with the conventional RF plasma-assisted CVD using a frequency of 13.56 MHz or microwave plasma-assisted CVD using a frequency of 2.45 GHz. It is presumed that the effect depends on differences in decomposing properties of starting material gases and in energy of active species produced after decomposition, differences in the percentage of the respective active species and differences in the state of bonds between carbon atoms, nitrogen atoms and oxygen atoms present at the interface between the photoconductive layer and the surface layer.

More specifically, in the case where discharging is once stopped and discharging is started again thereafter at the interface between the photoconductive layer and the surface layer, it is considered that there are a problem in the bonding properties of the deposited film formed immediately after the discharging is again carried out, and a problem that the surface of the layer previously formed is damaged. According to the present invention, however, it is presumed that these problems can be reduced by suitably selecting the frequency of electromagnetic waves to change decomposing properties of starting material gases and energy of active species and also to make the carbon atoms, nitrogen atoms and oxygen atoms present in an atomic ratio suited therefor. Also in the case where the composition is continuously changed between the photoconductive layer and the surface layer, layers with compositional changes under almost ideal conditions are formed, compared with conventional processes, because of the difference in decomposing properties of starting material gases.

The smeared images are conventionally known to be closely concerned with charge retentivity on the surface of the electrophotographic light-receiving member. For another reason, the smeared images are considered to occur also when charges can not move at an interface in the electrophotographic light-receiving member and accumulate there, and such charges flow in the lateral direction to cause disturbance of latent images formed on the surface of the electrophotographic light-receiving member. The smeared images that may occur in this way depend only on the interface in the electrophotographic light-receiving member and do not depend on the surface state thereof. Hence, it has been little effective for improvement to heat the surface of the electrophotographic light-receiving member as conventionally done so that the relative humidity on its surface is decreased. The accumulation of charges at the interfacial portion as stated above may also cause light memory such as ghost or blank memory, and at the same time any carriers produced by imagewise exposure recombine with these accumulated charges and hence do not effectively contribute the formation of latent images, resulting in a lowering of photosensitivity.

Such disturbance at the interface may further cause injection of charges from the surface layer into the photoconductive layer, resulting in a lowering of chargeability. "Black lines" are also known to occur when a local pressure is applied to some part of the surface of an electrophotographic light-receiving member during its use over a long period of time, because of component parts coming into contact with the electrophotographic light-receiving member in an electrophotographic apparatus, e.g., component parts such as separating claws provided to separate a copy sheet from the surface of the electrophotographic light-receiving member. Presumably, when layers have no satisfactory adhesion at their interface, application of such a local pressure causes a stress at their interfacial portion, resulting in a poor charge mobility at that portion, which appears as "black lines" on images.

In the present invention, it has been also discovered that application of a bias voltage to the cathode makes the effects of the aforesaid selection of the frequency of electromagnetic waves more remarkably effective.

According to the discovery made by the present inventors, it is found that in general the energy of ions made incident on the substrate tends to decrease with an increase in the frequency of electromagnetic waves used to decompose starting material gases. This is considered, while deposited films can have less damage due to ion bombardment, to just result in a shortage of the assist energy attributable to ions that is capable of accelerating surface mobility when active species are deposited on the substrate. The shortage of the assist energy attributable to ions tends to have a great influence particularly on the interfacial portion.

Even when the frequency of electromagnetic waves used to decompose starting material gases is selected as stated above in order to improve interfacial characteristics, its selection may become less effective under some conditions for the film formation for such reasons. This tendency becomes more remarkable when films are formed under conditions of a higher deposition rate which particularly tend to result in a shortage of surface mobility.

According to the present invention, a bias voltage is applied to the cathode even under such conditions so that energy can be imparted to ions. This makes it possible to achieve an effective improvement in interfacial characteristics even under all conditions, in particular, conditions for a higher deposition rate.

It has been also discovered that the application of a bias voltage to the cathode can also bring about an improvement in reproducibility of the effect of improving interfacial characteristics and an improvement in photosensitivity.

In the case when no bias voltage is applied to the cathode, the energy of ions made incident on the substrate is influenced by a plasma space potential that depends on the shape of deposited film forming apparatus and various discharge conditions such as gas species of starting material gases, pressure at the time of discharging, and electromagnetic wave power at the time of glow discharge. In particular, in the formation of the interfacial portion, when discharging is once stopped or when the layers with compositional changes are provided, the discharge conditions change immediately after discharging is again carried out or during the formation of the layers with compositional changes and hence the plasma space potential changes, so that the energy of ions made incident on the substrate can not be constant.

However, it is presumed that the additional application of a bias voltage to the cathode makes it possible to increase incident energy of ions and make the influence of such variations in incident energy of ions much smaller. This is also considered to enable effective promotion of the surface mobility to bring about an improvement in photosensitivity.

As described above, the present inventors have discovered that, when electrophotographic light-receiving members with a multilayered structure are produced, the use of electromagnetic waves with a frequency in the stated range as an excitation source of the starting material gas and also the additional application of a bias voltage to the cathode can keep a balance between the decomposing properties of the starting material gas and the energy and surface mobility of its active species, and also making smaller the influence of variations in incident energy of ions can mainly bring about a more improvement in the interfacial state between layers and also a much more improvement in specific electrophotographic characteristics.

According to the discovery made by the present inventors, as a countermeasure for the conventional RF plasma-assisted CVD using a frequency of 13.56 MHz or microwave plasma-assisted CVD using a frequency of 2.45 GHz, the effect of property modification of the interfacial portion (including the layer with compositional changes) described above can be obtained at any frequency of from 20 MHz to 450 MHz. A particularly remarkable effect can be obtained in the range of preferably from 30 MHz to 300 MHz, and more preferably from 51 MHz to 250 MHz.

If the frequency is more than 450 MHz, the apparatus construction used in the present invention may cause a great decay of electromagnetic waves and show a remarkable tendency toward a poor deposited rate.

As for the bias voltage ($V_1$) with respect to self-bias voltage ($V_2$) of the cathode under no application of bias voltage, good results can be obtained when it is set within the range of:

$$0 < V_1 - V_2 \leq 200 \text{ V.}$$

More specifically, if the bias voltage $V_1$ is not higher than the self-bias voltage $V_2$, the effect of an increase in incident energy as stated above can not be obtained. If on the other hand $V_1$ minus $V_2$ is greater than 200 V ($V_1 - V_2 > 200$ V), the deposited film may be remarkably damaged by ion bombardment, particularly bringing about a remarkable tendency toward poor image characteristics.

In the present invention, the bias voltage may have any value so long as it is within the above range, and may be set at a constant value throughout the formation of the electrophotographic light-receiving member, or may be changed for each formation of individual layers. Alternatively, it may be gradually increased, or gradually decreased, with time in the course of film deposition.

In the present invention, the bias voltage may be applied using a direct current or alternating current, or a direct current superimposed on an alternating current. In the case of the direct current voltage, use of either a constant voltage non-variable with respect to time or a voltage variable with respect to time as exemplified by half-wave rectified voltage can be effective. In the case of the alternating current voltage, use of any of sinusoidal waves, rectangular waves, triangular waves and synthesized waves of these can be effective.

In the case when the direct current voltage or alternating current voltage variable with respect to time is employed as the bias voltage, the bias voltage within the above range is a voltage showing the effective value. The frequency thereof should preferably be not higher than about 2 MHz, which is an upper-limit frequency at which ions in plasma can follow up any variations of a sheath electric field in the sheath region formed on the substrate.

FIG. 1 is a diagrammatic cross section to illustrate a preferred example of the layer structure of the electrophotographic light-receiving member produced according to the present invention. An electrophotographic light-receiving layer 100 shown in FIG. 1 comprises a photoconductive layer 103 and a surface layer 104 which are formed in this order on a substrate 101.

Figure 2:
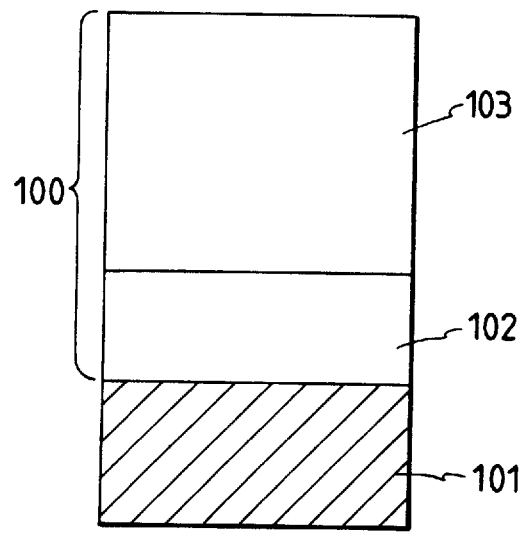

FIG. 2 is a diagrammatic cross section to illustrate another preferred example of the layer structure of the electrophotographic light-receiving member produced according to the present invention. An electrophotographic light-receiving layer 100 shown in FIG. 2 comprises a blocking layer 102 and a photoconductive layer 103 which are formed in this order on a substrate 101.

Figure 3:
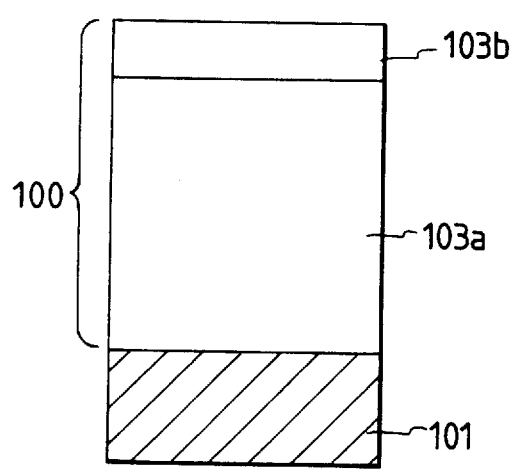

FIG. 3 is a diagrammatic cross section to illustrate still another preferred example of the layer structure of the electrophotographic light-receiving member produced according to the present invention. An electrophotographic light-receiving layer 100 shown in FIG. 3 comprises a charge transport layer 103$a$ and a charge generation layer 103$b$ which are formed in this order on a substrate 101.

Figure 4:
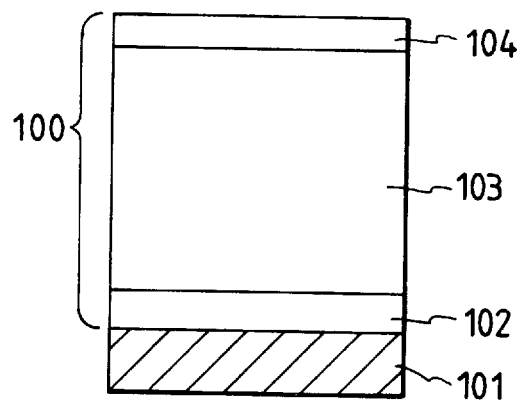

FIG. 4 is a diagrammatic cross section to illustrate a further preferred example of the layer structure of the electrophotographic light-receiving member produced according to the present invention. An electrophotographic light-receiving layer 100 comprises a blocking layer 102, a photoconductive layer 103 and a surface layer 104 formed on a substrate 101. In this drawing, the photoconductive layer 103 may alternatively comprise a charge transport layer 103$a$ and a charge generation layer 103$b$ formed superposingly.

The substrate 101 used in the present invention may include those made of, for example, a metal such as Al, Cr, Mo, Au, In, Nb, Te, V, Ti, Pt, Pb or Fe, or an alloy of any of these, as exemplified by stainless steel. It is also possible to use a substrate comprised of a film or sheet of synthetic resin such as polyester, polystyrene, polycarbonate, cellulose acetate, polypropylene, polyvinyl chloride, polyethylene or polyamide or an electrically insulating substrate made of glass or ceramic at least the surface for formation of a light-receiving layer of which is subjected to a conductivizing treatment. In this case, the surface should preferably be subjected to a conductivizing treatment also on the side opposite to the side on which the light-receiving layer is formed.

The substrate 101 may have the shape of a cylinder, sheet or sheetlike endless belt with a smooth plane or uneven surface. Its thickness may be appropriately so determined that the desired electrophotographic light-receiving member can be formed. In instances in which the electrophotographic light-receiving member is required to have a flexibility, the substrate may be made as thin as possible so long as it can well function as a substrate. In usual instances, however, the substrate may preferably have a thickness of 10 $\mu$m or more in view of its manufacture and handling, mechanical strength or the like.

In the present invention, when, for example, images are recorded using coherent light such as laser light, the surface of the substrate 101 may be made uneven so that any faulty images due to interference fringes (Moiré fringes) appearing in visible images can be cancelled. The unevenness made on the surface of the substrate 101 can be produced by known methods disclosed in Japanese Patent Applications Laid-open Nos. 60-168156, 60-178457, and 60-225854, etc. As another method for cancelling the faulty images due to interference fringes occurring when the coherent light such as laser light is used, the surface of the substrate 101 may be made uneven by making a plurality of spherical mark impressions on the surface of the substrate 101. More specifically, the surface of the substrate 101 is made more finely uneven than the resolving power required for electrophotographic light-receiving members, and also such unevenness is formed by a plurality of spherical mark impressions. The unevenness formed by a plurality of spherical mark impressions on the surface of the substrate 101 can be produced by the known method disclosed in Japanese Patent Application Laid-open No. 61-231561.

In the present invention, the light-receiving layer has the blocking layer 102, it should preferably be formed of a non-monocrystalline material having the desired characterstics, by plasma-assisted CVD using electromagnetic waves with a frequency of from 20 MHz to 450 MHz.

For example, to form a blocking layer 102 comprised of a-SiC, basically a Si-feeding gas capable of feeding silicon atoms (Si) and a C-feeding gas capable of feeding carbon atoms (C) may be introduced, in the desired gaseous state, into a reaction chamber whose inside can be evacuated, and glow discharge may be caused to take place in the reaction chamber, using the electromagnetic waves with a frequency of from 20 MHz to 450 MHz, to form a layer comprised of, e.g., a-SiC, on the substrate 101 placed at a predetermined position.

The material that can serve as the Si-feeding gas used to form the blocking layer may include gaseous or gasifiable silicon hydrides (silanes) such as $SiH_4$, $Si_2H_6$, $Si_3H_8$ and $Si_4H_{10}$, which can be effectively used. In view of readiness in handling for layer formation and Si-feeding efficiency, the material may preferably also include $SiH_4$ and $Si_2H_6$.

Starting materials that can be effectively used as starting material gases for introducing carbon atoms (C) may include those having C and H as constituent atoms, as exemplified by a saturated hydrocarbon having 1 to 5 carbon atoms, an ethylene type hydrocarbon having 2 to 4 carbon atoms and an acetylene type hydrocarbon having 2 or 3 carbon atoms. Specifically stated, the saturated hydrocarbon can be exemplified by methane ($CH_4$), ethane ($C_2H_6$), propane ($C_3H_8$), n-butane (n-$C_4H_{10}$) and pentane ($C_5H_{12}$); the ethylene type hydrocarbon, ethylene ($C_2H_4$), propylene ($C_3H_6$), butene-1 ($C_4H_8$), butene-2 ($C_4H_8$), isobutylene ($C_4H_8$) and pentene ($C_5H_{10}$); and the acetylene type hydrocarbon, acetylene ($C_2H_2$), methyl acetylene ($C_3H_4$) and butine ($C_4H_6$). Besides, carbon fluoride compounds such as $CF_4$, $CF_3$, $C_2F_6$, $C_3F_8$ and $C_4F_8$ may also be used as the C-feeding gases of the present invention.

These Si- and C-feeding starting material gases may be used optionally after their dilution with a gas such as $H_2$, He, Ar or Ne.

An alkyl silicide such as $Si(CH_3)_4$ or $Si(C_2H_5)_4$ may also be used in combination with the above starting material gases.

The above starting material gases used to form the blocking layer may be fed from independently separate feed sources (bombs). A gas comprised of gases previously mixed in given concentrations may also be used.

In the case when a blocking layer 102 comprised of a-SiO and/or a-SiN is formed, an O-feeding gas may include, for example, oxygen ($O_2$), ozone ($O_3$), and, in view of the advantage that not only oxygen atoms can be fed but also carbon atoms can be simultaneously fed, carbon monoxide (CO) and carbon dioxide ($CO_2$). A N-feeding gas may include, for example, nitrogen ($N_2$) and ammonia ($NH_3$). In view of the advantage that not only oxygen atoms can be fed but also nitrogen atoms can be simultaneously fed, the material may include nitrogen monoxide (NO), nitrogen dioxide ($NO_2$), dinitrogen monoxide ($N_2O$), dinitrogen trioxide ($N_2O_3$), dinitrogen tetraoxide ($N_2O_4$) and dinitrogen pentaoxide ($N_2O_5$).

In the present invention, it is effective for the blocking layer 102 to further contain hydrogen atoms, because they are indispensable for compensating the dangling bonds of silicon atoms, and for improving layer quality, in particular, for improving photoconductivity and charge retention characteristics.

In the present invention, the blocking layer 102 may preferably further contain atoms (M) capable of controlling its conductivity type as occasion calls. The atoms capable of controlling the conductivity type may be contained in the whole region of the blocking layer in an evenly uniformly distributed state, or may be contained so as to have a portion in which they are distributed non-uniformly in the layer thickness direction.

The above atoms (M) capable of controlling the conductivity type may include what is called dopants, used in the field of semiconductors, and it is possible to use atoms belonging to Group III in the periodic table (hereinafter "Group III atoms") capable of imparting p-type conductivity or atoms belonging to Group V in the periodic table (hereinafter "Group V atoms") capable of imparting n-type conductivity. The Group III atoms may specifically include boron (B), aluminum (Al), gallium (Ga), indium (In) and thallium (Tl). In particular, B, Al and Ga are preferable. The Group V atoms may specifically include phosphorus (P), arsenic (As), antimony (Sb) and bismuth (Bi). In particular, P and As are preferable.

The atoms (M) capable of controlling the conductivity type, contained in the blocking layer, should be contained preferably in an amount of from $1\times10^{-3}$ to $5\times10^4$ atomic ppm, more preferably from $1\times10^{-2}$ to $1\times10^4$ atomic ppm, and most preferably from $1\times10^{-1}$ to $5\times10^3$ atomic ppm.

In order to structurally introduce into the blocking layer the atoms capable of controlling the conductivity type, e.g., Group III atoms or Group V atoms, a starting material for introducing Group III atoms or a starting material for introducing Group V atoms may be fed, when the layer is formed, into the reaction chamber in a gaseous state together with other gases used to form the blocking layer.

Those which can be used as the starting material for introducing Group III atoms or starting material for introducing Group V atoms should be selected from those which are gaseous at normal temperature and normal pressure or at least those which can be readily gasified under conditions for the formation of the blocking layer. Such a starting material for introducing Group III atoms may specifically include, as a material for introducing boron atoms, boron hydrides such as $B_2H_6$, $B_4H_{10}$, $B_5H_9$, $B_5H_{11}$, $B_6H_{10}$, $B_6H_{12}$ and $B_6H_{14}$, boron halides such as $BF_3$, $BCl_3$ and $BBr_3$. Besides, the material may also include $AlCl_3$, $GaCl_3$, $Ga(CH_3)_3$, $InCl_3$ and $TlCl_3$.

The material that can be effectively used in the present invention as the starting material for introducing Group V atoms may include, as a material for introducing phosphorus atoms, phosphorus hydrides such as $PH_3$ and $P_2H_4$ and phosphorus halides such as $PH_4I$, $PF_3$, $PF_5$, $PCl_3$, $PCl_5$, $PBr_3$, $PBr_5$ and $PI_3$. Besides, the material that can be effectively used as the starting material for introducing Group V atoms may also include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$ and $BiBr_3$.

These starting materials for introducing the atoms capable of controlling the conductivity may be used optionally after their dilution with a gas such as $H_2$, He, Ar or Ne.

The blocking layer 102 of the present invention may also contain at least one kind of elements selected from Group Ia, Group IIa, Group VIb and Group VIII of the periodic table. Any of these elements may be evenly uniformly distributed in the blocking layer, or contained partly in such a way that they are evenly contained in the blocking layer but are distributed non-uniformly in the layer thickness direction. Any of these atoms should preferably be in a content of from 0.1 to 10,000 atomic ppm. The Group Ia atoms may specifically include lithium (Li), sodium (Na) and potassium (K); and the Group IIa atoms, beryllium (Be), magnesium (Mg), calcium (Ca), strontium (Sr) and barium (Ba).

The Group VIb atoms may specifically include chromium (Cr), molybdenum (Mo) and tungsten (W); and the Group VIII atoms, iron (Fe), cobalt (Co) and nickel (Ni).

In the present invention, the thickness of the blocking layer may be appropriately determined as desired, taking account of achieving the desired electrophotographic performance and in view of economical effect. It should preferably be in the range of from 0.3 μm to 10 μm, more preferably from 0.5 μm to 5 μm, and most preferably from 1 μm to 3 μm.

In order to form the a-SiC blocking layer 102 that can achieve the object of the present invention, the temperature of the conductive substrate and the gas pressure inside the reaction chamber must be appropriately set as desired.

The temperature (Ts) of the conductive substrate may be appropriately selected from an optimum temperature range in accordance with the layer configuration. In usual instances, the temperature should preferably be in the range of from 20° to 500° C., more preferably from 50° to 480° C., and most preferably from 100° to 450° C.

The gas pressure inside the reaction chamber may also be appropriately selected from an optimum pressure range in accordance with the layer region configuration. In usual instances, the pressure may preferably be in the range of from $1\times10^{-5}$ to 100 Torr, preferably from $5\times10^{-5}$ to 30 Torr, and most preferably from $1\times10^{-4}$ to 10 Torr.

In the present invention, preferable numerical values for the conductive substrate temperature and gas pressure necessary to form the blocking layer 102 may be in the ranges defined above. In usual instances, these factors for layer formation can not be independently separately determined. Optimum values for the layer region formation factors should be determined on the basis of mutual and systematic relationship so that the light-receiving member having the desired characteristics can be formed.

In the formation of the blocking layer 102, it is more preferable to apply, as previously described, a bias voltage to the cathode in addition to the use of electromagnetic waves with a frequency of from 20 MHz to 450 MHz.

In the case when the bias voltage is applied, for example, to form the blocking layer 102 comprised of a-SiC, basically a Si-feeding gas capable of feeding silicon atoms (Si) and a C-feeding gas capable of feeding carbon atoms (C) may be introduced, in the desired gaseous state, into a reaction chamber whose inside can be evacuated, and glow discharge may be caused to take place in the reaction chamber using the electromagnetic waves with a frequency of from 20 MHz to 450 MHz and at the same time applying a bias voltage to the cathode, to form a layer comprised of a-SiC, on the conductive substrate 101 placed at a predetermined position.

The photoconductive layer 103 used in the present invention is formed of a non-monocrystalline material having the desired photoconductivity type. The photoconductive layer can be formed by a process appropriately selected taking account of the conditions for manufacture, the extent of a load of equipment investment, the scale of manufacture and the characteristics of photoconductive layers to be formed. On account of a relative easiness to control conditions for depositing photoconductive layers having the desired characteristics, RF plasma-assisted CVD, VHF plasma-assisted CVD, microwave plasma-assisted CVD, sputtering and ion plating are suitable. In particular, it is preferable to form the layer by VHF plasma-assisted CVD using electromagnetic waves with a frequency of from 20 MHz to 450 MHz.

For example, in the case when the RF plasma-assisted CVD is used to form the photoconductive layer 103 comprised of a-Si, basically a Si-feeding gas capable of feeding silicon atoms (Si) may be introduced, in the desired gaseous state, into a reaction chamber whose inside can be evacuated, and glow discharge may be caused to take place in the reaction chamber to form a layer comprised of a-SiC, on the conductive substrate 101 placed at a predetermined position.

In the case when the VHF plasma-assisted CVD is used to form the photoconductive layer 103 comprised of a-Si, basically a Si-feeding gas capable of feeding silicon atoms (Si) may be introduced, in the desired gaseous state, into a reaction chamber whose inside can be evacuated, and glow discharge may be caused to take place in the reaction chamber using the electromagnetic waves with a frequency of from 20 MHz to 450 MHz, to form a layer comprised of a-SiC, on the conductive substrate 101 placed at a predetermined position.

It is also preferable to apply a bias voltage to the cathode.

As the material that can serve as the Si-feeding gas used to form the photoconductive layer in the present invention, the same materials as used to form the blocking layer previously described can be used. In this case also, in view of readiness in handling for layer formation and Si-feeding efficiency, the material may preferably include $SiH_4$ and $Si_2H_6$. These Si-feeding starting material gases may also be used optionally after their dilution with a gas such as $H_2$, He, Ar or Ne.

In the present invention, it is effective to introduce into the photoconductive layer 103 an atom capable of controlling its conductivity type, and is also effective to introduce thereinto a halogen atom such as a fluorine atom as a modifier. For the material capable of controlling conductivity type and the starting material gas, the same materials and starting material gases as those used to form the blocking layer can be used.

To form the photoconductive layer 103 comprised of a-Si that can achieve the objects of the present invention, the substrate temperature and the gas pressure in a reaction chamber need to be appropriately set as desired.

The temperature (Ts) of the substrate may be appropriately selected from an optimum temperature range in accordance with the layer configuration. In usual instances, the temperature should preferably be in the range of from 20° to 500° C., more preferably from 50° to 480° C., and most preferably from 100° to 450° C.

The gas pressure inside the reaction chamber may also be appropriately selected from an optimum pressure range in accordance with the layer region configuration. In usual instances, the pressure may preferably be in the range of from $1 \times 10^{-5}$ to 100 Torr, preferably from $5 \times 10^{-5}$ to 30 Torr, and most preferably from $1 \times 10^{-4}$ to 10 Torr. In the present invention, preferable numerical values for the conductive substrate temperature and gas pressure necessary to form the photoconductive layer 103 may be in the ranges defined above. In usual instances, these factors for layer formation are not independently separately determined. Optimum values for the layer region formation factors should be determined on the basis of mutual and systematic relationship so that the light-receiving member having the desired characteristics can be formed.

In the present invention, the thickness of the photoconductive layer 103 may be appropriately determined as desired, taking account of achieving the desired electrophotographic characteristics and in view of economical effect. It should preferably be in the range of from 5 $\mu$m to 50 $\mu$m, more preferably from 10 $\mu$m to 40 $\mu$m, and most preferably from 15 $\mu$m to 30 $\mu$m.

In the present invention, in the case when the substrate contains aluminum atoms, the photoconductive layer 103 or blocking layer 102 should preferably have, on its side of the conductive substrate, a layer region comprising at least aluminum atoms, silicon atoms, carbon atoms and hydrogen atoms in the state they are non-uniformly distributed in the layer thickness direction. This can more improve the adhesion of the layer to the substrate.

In the present invention, in the case when the charge transport layer 103a is formed, it should preferably be formed of a non-monocrystalline material having the desired characteristics, by plasma-assisted CVD making use of electromagnetic waves with a frequency of from 20 MHz to 450 MHz, and it is a layer comprising a non-monocrystalline material with a high resistance or a relatively high resistance, comprising silicon atoms as matrix and at least one kind of atoms selected from carbon atoms, oxygen atoms and nitrogen atoms, which may preferably be in a content of from 500 atomic ppm to 25 atomic %, and more preferably from 1 atomic % to 10 atomic %.

For example, to form a charge transport layer 103a comprised of a-SiC, basically a Si-feeding gas capable of feeding silicon atoms (Si) and a C-feeding gas capable of feeding carbon atoms (C) may be introduced, in the desired gaseous state, into a reaction chamber whose inside can be evacuated, and glow discharge may be caused to take place in the reaction chamber using the electromagnetic waves with a frequency of from 20 MHz to 450 MHz, to form a layer comprised of a-SiC, on the conductive substrate 101 placed at a predetermined position. It is preferable to further apply a bias voltage to the cathode.

As the material that can serve as the Si-feeding gas used to form the charge transport layer 103a, the same materials as used to form the blocking layer previously described can be used. In this case also, in view of readiness in handling for layer formation and Si-feeding efficiency, the material may preferably include $SiH_4$ and $Si_2H_6$.

As the material that can serve as the starting material gas for feeding carbon atoms (C), the same materials as used to form the blocking layer previously described can be used.

In this case also, it is effective to use the Si- and C-feeding starting material gases optionally after their dilution with a gas such as $H_2$, He, Ar or Ne.

It is also effective in the present invention to use an alkyl silicide such as $Si(CH_3)_4$ or $Si(C_2H_5)_4$ in combination with the above starting material gases.

The above starting material gases used to form the charge transport layer may be fed from independently separate feed sources (bombs). A gas comprised of gases previously mixed in given concentrations may also be used.

In the case when a charge transport layer 103a comprised of a-SiO or a-SiN, an 0-feeding gas and a N-feeding gas capable of feeding oxygen atoms (O) or nitrogen atoms (N) may include the O-feeding and N-feeding gases listed in the description of the blocking layer.

In the present invention, it is effective for the charge transport layer 103a to further contain hydrogen atoms, because the hydrogen atoms are indispensable for compensating the dangling bonds of silicon atoms, and for improving layer quality, in particular, for improving photoconductivity and charge retention characteristics.

In the present invention, the charge transport layer 103a may preferably contain atoms (M) capable of controlling its conductivity type as occasion calls. The atoms capable of controlling conductivity type may be contained in the whole region of the charge transport layer in an evenly uniformly distributed state, or may be contained so as to have a portion in which they are distributed non-uniformly in the layer thickness direction.

The above atoms capable of controlling the conductivity may include what is called dopants, used in the field of semiconductors, and any of the atoms (M) capable of controlling conductivity, listed in the description of the blocking layer 102 may be contained.

The atoms (M) capable of controlling the conductivity type, contained in the charge transport layer, should be contained preferably in an amount of from $1 \times 10^{-3}$ to $5 \times 10^4$ atomic ppm, more preferably from $1 \times 10^{-2}$ to $1 \times 10^4$ atomic ppm, and most preferably from $1 \times 10^{-1}$ to $5 \times 10^3$ atomic ppm.

In order to structurally introduce into the charge transport layer the atoms capable of controlling the conductivity type, e.g., Group III atoms or Group V atoms, a starting material for introducing Group III atoms or a starting material for introducing Group V atoms may be fed, when the layer is formed, into the reaction chamber in a gaseous state together with other gases used to form the charge transport layer.

Those which can be used as the starting material for introducing Group III atoms or starting material for introducing Group V atoms should be selected from those which are gaseous at normal temperature and normal pressure or at least those which can be readily gasified under conditions for the formation of the charge transport layer. Such a starting material for introducing Group III atoms or Group V atoms may specifically include the same starting materials for introducing Group III atoms or Group V atoms as used in the blocking layer.

In this case also, it is effective to use the starting material for introducing atoms capable of controlling conductivity, optionally after its dilution with a gas such as $H_2$, He, Ar or Ne.

Like the blocking layer 102 preferably described, the charge transport layer 103a of the present invention may also contain at least one element selected from Group Ia, Group IIa, Group VIb and Group VIII of the periodic table. Any of these elements may be evenly uniformly distributed in the charge transport layer, or contained in such a way that they are contained in the whole of the charge transport layer but are distributed so as to have a portion in which they are distributed non-uniformly in the layer thickness direction. Any of these atoms should preferably be in a content of from 0.1 to 10,000 atomic ppm.

The Group Ia, Group IIa, Group VIb and Group VIII atoms to be contained may include the same atoms as in the case of the blocking layer.

In the present invention, the thickness of the charge transport layer 103a may be appropriately determined as desired, taking account of achieving the desired electrophotographic characteristics and in view of economical effect. It should preferably be in the range of from 3 μm to 100 μm, more preferably from 5 μm to 50 μm, and most preferably from 10 μm to 30 μm.

In order to form the a-Si charge transport layer 103a. that can achieve the object of the present invention, the temperature of the conductive substrate and the gas pressure inside the reaction chamber need to be appropriately set as desired.

The temperature (Ts) of the conductive substrate may be appropriately selected from an optimum temperature range in accordance with the layer configuration. In usual instances, the temperature should preferably be in the range of from 20° to 500° C., more preferably from 50° to 480° C., and most preferably from 100° to 450° C.

The gas pressure inside the reaction chamber may also be appropriately selected from an optimum pressure range in accordance with the layer region configuration. In usual instances, the pressure may preferably be in the range of from $1 \times 10^{-5}$ to 100 Torr, preferably from $5 \times 10^{-5}$ to 30 Torr, and most preferably from $1 \times 10^{-4}$ to 10 Torr.

In the present invention, preferable numerical values for the conductive substrate temperature and gas pressure necessary to form the charge transport layer 103a may be in the ranges defined above. In usual instances, these factors for layer formation are not independently separately determined. Optimum values for the layer region formation factors should be determined on the basis of mutual and systematic relationship so that the light-receiving member having the desired characteristics can be formed.

In the present invention, in the case when the charge generation layer 103b is formed, it should preferably be formed of a non-monocrystalline material having the desired characteristics, by plasma-assisted CVD making use of electromagnetic waves with a frequency of from 20 MHz to 450 MHz, and it is a layer comprising a non-monocrystalline material which comprises silicon atoms as matrix and which may further comprises at least one kind of atoms selected from carbon atoms, oxygen atoms and nitrogen atoms, which must be in a content of not more than 1 atomic % because a high photoconductivity is required.

For example, to form a charge generation layer 103b comprised of a-SiC, basically a Si-feeding gas capable of feeding silicon atoms (Si) may be introduced, in the desired gaseous state, into a reaction chamber whose inside can be evacuated, and glow discharge may be caused to take place in the reaction chamber using the electromagnetic waves with a frequency of from 20 MHz to 450 MHz, to form a layer comprised of a-SiC, on the substrate 101 placed at a predetermined position. It is preferable to further apply a bias voltage to the cathode.

As the material that can serve as the Si-feeding gas used to form the charge generation layer 103b, the same materials as used to form the charge transport layer previously described can be used.

Of course, the Si-feeding starting material gas may also be used optionally after its dilution with a gas such as $H_2$, He, Ar or Ne.

In the present invention, it is also effective to introduce into the charge generation layer 103b the atom capable of controlling its conductivity type as described in relation to the charge transport layer, and is also effective to similarly introduce thereinto a halogen atom such as a fluorine atom as a modifier.

In the present invention, the thickness of the charge generation layer 103b may be appropriately determined as desired, taking account of achieving the desired electrophotographic performance and in view of economical effect. It should preferably be in the range of from 0.1 $\mu$m to 10 $\mu$m, more preferably from 0.3 $\mu$m to 8 $\mu$m, and most preferably from 0.5 $\mu$m to 5 $\mu$m.

In the present invention, in the case when the surface layer 104 is formed, it should preferably be formed of a non-monocrystalline material having the desired mechanical characteristics, electrical characteristics, environmental resistance, etc. and containing and silicon at least one kind of carbon, nitrogen and oxygen, by plasma-assisted CVD (VHF plasma-assisted CVD) making use of electromagnetic waves with a frequency of from 20 MHz to 450 MHz. For example, when the surface layer comprised of amorphous silicon carbide (a-SiC) is formed, basically a gas containing silicon atoms (Si) and a gas containing carbon atoms (C) may be introduced into a reaction chamber whose inside can be evacuated, and glow discharge may be caused to take place in the reaction chamber using the electromagnetic waves with a frequency of from 20 MHz to 450 MHz, to form the deposited layer on the substrate placed at a predetermined position and on which the photoconductive layer or the like has been formed. It is preferable to further apply a bias voltage to the cathode.

In the present invention, to effectively decompose the binary type starting material gas and to obtain deposited films in the state of bonding that can achieve the objects of the present invention, the electromagnetic waves for the decomposition may have a frequency of from 20 MHz to 450 MHz, within the range of which the electrophotographic performances can be improved, preferably from 30 MHz to 300 MHz, and most preferably from 51 MHz to 250 MHz.

As the starting material for the surface layer 104, a gas capable of feeding silicon atoms and a gas capable of feeding oxygen atoms are used as basic constituents. Besides, a gas comprising elements which are introduced into the surface layer in order to achieve the desired characterstics may also be used. These starting material gases may be any of those which are gaseous or those which can be readily gasified under conditions for the formation of the surface layer 104.

As the material that can serve as the Si-feeding gas used to form the surface layer, the same materials as used to form the blocking layer previously described can be used. In this case also, in view of readiness in handling for layer formation and Si-feeding efficiency, the material may preferably include $SiH_4$ and $Si_2H_6$. In addition to such silicon hydrides, gaseous or gasifiable materials of silicon compounds comprising a fluorine atom, what is called silane derivatives substituted with a fluorine atom as specifically exemplified by silicon fluorides such as $SiF_4$ and $Si_2F_6$ and fluorine-substituted silicon hydrides such as $SiH_3F$, $SiH_2F_2$ and $SiHF_3$, can also be effective as Si-feeding gases. These Si-feeding starting material gases may also be used without any problems, optionally after their dilution with a gas such as $H_2$, He, Ar or Ne.

As the starting material effectively used as a material that can serve as a feeding gas for introducing carbon atoms (C), the same materials as used for the blocking layer can be used.

It is also effective in the present invention to similarly use such C-feeding starting material gases optionally after their dilution with a gas such as $H_2$, He, Ar or Ne.

It is also effective in the present invention to use an alkyl silicide such as $Si(CH_3)_4$ or $Si(C_2H_5)_4$ in combination with the above starting material gases.

A gas that can serve as a starting material gas for introducing nitrogen atoms (N) may include, for example, nitrogen ($N_2$), ammonia ($NH_3$) and nitrogen monoxide (NO). A starting material effectively used as a gas that can serve as a starting material gas for introducing oxygen atoms (O) may include, for example, oxygen ($O_2$), nitrogen monoxide (NO), carbon monoxide (CO) and carbon dioxide ($CO_2$). Of course, it is also possible to use other starting material gases for introducing nitrogen atoms and oxygen atoms, as listed for the blocking layer previously described.

The above starting material gases used to form the surface layer may be fed from independently separate feed sources (bombs). A gas comprised of gases previously mixed in given concentrations may also be used.

In the present invention, the thickness of the surface layer 104 should be, taking account of achieving the desired electrophotographic performance and in view of economical effect, preferably in the range of from 0.01 $\mu$m to 30 $\mu$m, more preferably from 0.05 $\mu$m to 20 $\mu$m, and most preferably from 0.01 $\mu$m to 10 $\mu$m.

In the present invention, conditions for forming the surface layer 104 may be appropriately determined so that the desired electrophotographic performance can be obtained. For example, the substrate temperature may be appropriately selected from an optimum temperature range, and should preferably be in the range of from 20° to 500° C., more preferably from 50° to 480° C., and most preferably from 100° to 450° C. The gas pressure inside the reaction chamber may also be appropriately selected from an optimum pressure range, and should preferably be in the range of from $1\times10^{-5}$ to 100 Torr, more preferably from $5\times10^{-5}$ to 30 Torr, and most preferably from $1\times10^{-4}$ to 10 Torr. The power of the electromagnetic waves of a VHF band, supplied to decompose the starting material gases, should be in the range of usually from 10 to 5,000 W, and preferably from 20 to 2,000 W, per one substrate.

In the present invention, preferable numerical values for the substrate temperature and gas pressure necessary to form the surface layer 104 may be in the ranges defined above. In usual instances, these conditions can not be independently separately determined. Optimum values for the layer region formation factors should be determined on the basis of mutual and systematic relationship so that the light-receiving member having the desired characteristics can be formed.

In the electrophotographic light-receiving member, the blocking layer in the present invention is formed in order to block the injection of carriers from the substrate side. Accordingly, the material capable of controlling conductivity type, contained in the blocking layer should preferably be contained in an amount relatively larger than that of the material contained in other layers. The material capable of controlling conductivity type may be contained in the state that it is evenly uniformly distributed in the in the layer thickness direction, or may be contained in a non-uniformly distributed state (e.g., rich on the substrate side).

The charge transport layer is a layer through which carriers are moved, and is a layer that does not mainly so function as to block the injection of carriers from the substrate. Accordingly, when the material capable of controlling conductivity type is contained, it may preferably be contained in an amount large enough to move the carriers.

In the present invention, a region where characteristics such as composition are continuously changed in the direction from the blocking layer toward the photoconductive layer may be provided at the interfacial portion between the blocking layer and the photoconductive layer. The thickness of this region is a thickness that provides a substantial interface formed between the blocking layer and the photoconductive layer, and does not mean what is called the interfaceless state that assumes a connection between the blocking layer and the photoconductive layer with gradual change in composition and may make it impossible to specify the interface in respect of composition, optical characteristics and so forth.

In the layer configuration of the electrophotographic light-receiving member produced by the process of the present invention, a bonding layer, a surface protective layer and so forth may be optionally provided in addition to the above blocking layer and photoconductive layer in order to obtain the desired performances required for the electrophotographic light-receiving member. Also when these are provided, the region where composition and so forth are continuously changed may be provided between the layers. The thickness of this region is in such an extent that the interface is substantially formed.

In the present invention, a region where characteristics such as composition are continuously changed in the direction from the photoconductive layer toward the surface layer may be provided at the interfacial portion between the photoconductive layer and the surface layer. The thickness of this region is a thickness that provides a substantial interface formed between the photoconductive layer and the surface layer, and does not mean what is called the interfaceless state that assumes a connection between the photoconductive layer with gradual change in composition and the surface layer and may make it impossible to specify the interface in respect of composition, optical characteristics and so forth.

In the present invention, a region where characteristics such as composition are continuously changed in the direction from the charge generation layer toward the charge transport layer may be provided at the interfacial portion between the charge generation layer and the charge transport layer. The thickness of this region is a thickness that provides a substantial interface formed between the charge generation layer and the charge transport layer, and does not mean what is called the interfaceless state that assumes a connection between the charge generation layer with gradual change in composition and the charge transport layer and may make it impossible to specify the interface in respect of composition, optical characteristics and so forth.

In the layer configuration of the electrophotographic light-receiving member produced by the process of the present invention, a charge injection blocking layer, a surface protective layer and so forth may, each alone or in combination, be optionally provided in addition to the above photoconductive layer, or charge generation layer and charge transport layer, in order to obtain the desired performances required for the electrophotographic light-receiving member. For example, a contacting layer and a lower charge injection blocking layer may be provided in addition to the photoconductive layer and the surface layer in order to obtain the desired performances required for the electrophotographic light-receiving member. Also when these are provided, the region where composition and so forth are continuously changed may be provided between the layers. The thickness of this region is in such an extent that the interface is substantially formed.

In all the instances, for making the present invention more effective, it is important to form the interfacial portion by the use of the electromagnetic waves with a frequency of from 20 MHz to 450 MHz.

A preferred procedure for the process for producing the electrophotographic light-receiving member of the present invention will be described below. First, an example in which the light-receiving member comprises a substrate having thereon a photoconductive layer formed by RF plasma-assisted CVD and a surface layer formed by VHF plasma-assisted CVD will be described.

Figure 5:
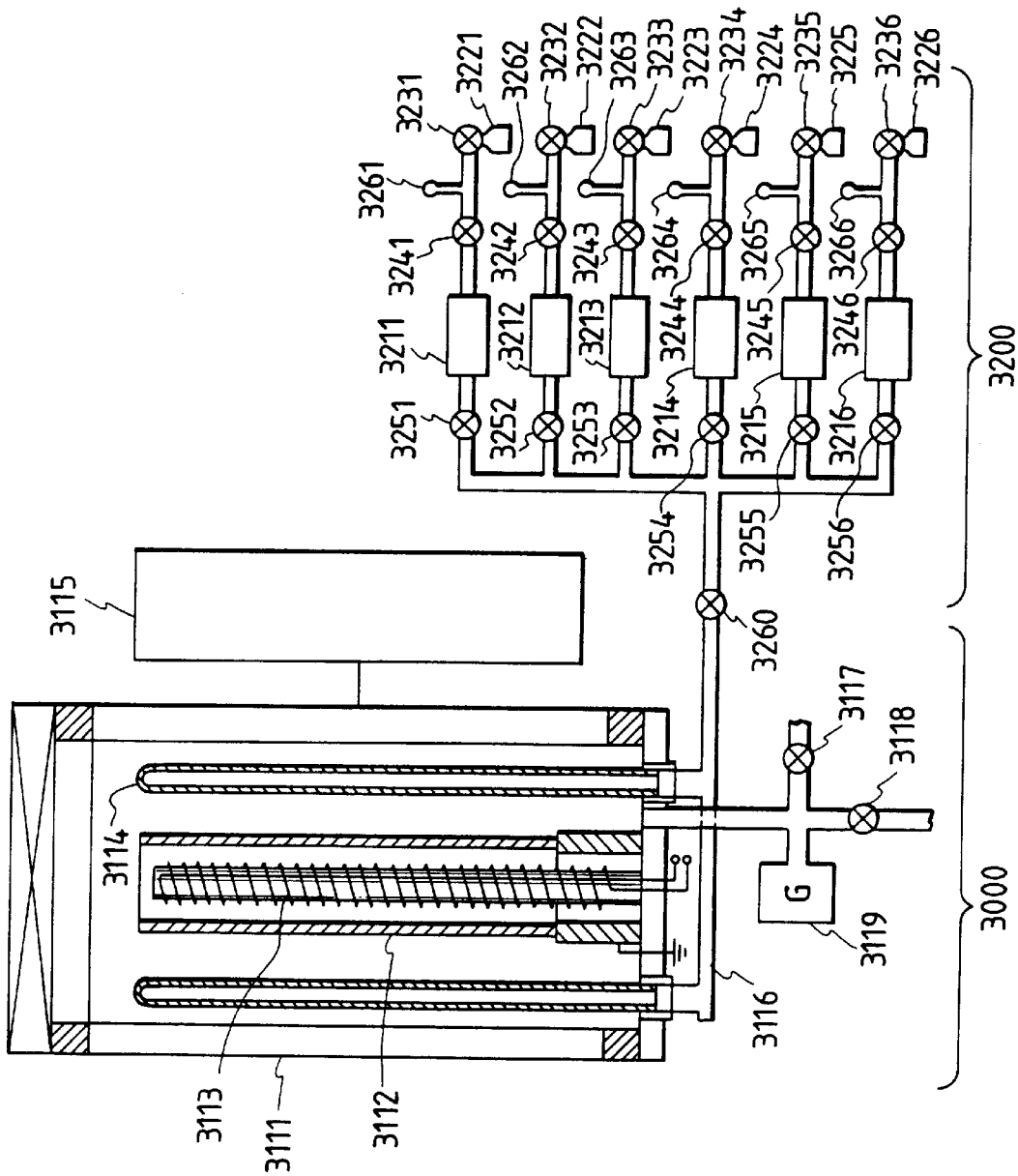
FIGS. 5, 6, 7, 8A, 8B, 9 and 10 each schematically illustrate the construction of a deposited film forming apparatus.

To form on the substrate the photoconductive layer comprised of a non-monocrystalline material, for example, a deposited film forming apparatus as shown in FIG. 5 is used when formed by RF plasma-assisted CVD. A procedure for forming the photoconductive layer by the use of this apparatus will be described below.

A cylindrical substrate 3112 is set in a reaction chamber 3111, and the inside of the reaction chamber 3111 is evacuated by means of an exhaust system (not shown) as exemplified by a vacuum pump. Subsequently, the temperature of the substrate 3112 is controlled at a given temperature of from 20° C. to 500° C. by means of a heater 3113 for heating the substrate.

Before starting material gases for forming deposited films are flowed into the reaction chamber 3111, gas bomb valves 3231 to 3236 and a leak valve 3117 of the reaction chamber are checked to make sure that they are closed, and also flow-in valves 3241 to 3246, flow-out valves 3251 to 3256 and an auxiliary valve 3260 are checked to make sure that they are opened. Then, firstly a main valve 3118 is opened to evacuate the insides of the reaction chamber 3111 and a gas pipe 3116.

Next, at the time a vacuum gauge 3119 has been read to indicate a pressure of about $5 \times 10^{-6}$ Torr, the auxiliary valve 3260 and the flow-out valves 3251 to 3256 are closed.

Thereafter, gas bomb valves 3231 to 3236 are opened so that gases are respectively introduced from gas bombs 3221 to 3226, and each gas is controlled to have a pressure of 2 kg/cm$^3$ by operating pressure controllers 3261 to 3266. Next, the flow-in valves 3241 to 3246 are slowly opened so that gases are respectively introduced into mass flow controllers 3211 to 3216.

After the film formation is thus ready to start, the photoconductive layer and the surface layer are formed on the substrate 3112.

At the time the substrate 3112 has had a given temperature, some necessary ones of flow-out valves 3251 to 3256 and the auxiliary valve 3260 are gradually opened so that given gases are fed into the reaction chamber 3111 from the gas bombs 3221 to 3226 through a gas feed pipe 3114. Next, the mass flow controllers 3211 to 3216 are operated so that each starting material gas is adjusted to flow at a given rate. In that course, the opening of the main valve 3118 is so adjusted that the pressure inside the reaction chamber 3111 comes to be a given pressure of not higher than 1 Torr, while watching the vacuum gauge 3119. At the time the inner pressure has become stable, a high-frequency power source 3120 is set at the desired electric power, and an RF power is supplied to the inside of the reaction chamber 3111 through a high-frequency matching box 3115 to cause RF glow discharge to take place. The starting material gases fed into the reaction chamber are decomposed by the discharge energy thus produced, so that a given photoconductive layer is formed on the substrate 3112. After a film with a given thickness has been formed, the supply of RF power is stopped, and the flow-out valves are closed to stop gases from flowing into the reaction chamber. The formation of the photoconductive layer is thus completed.

Figure 6:
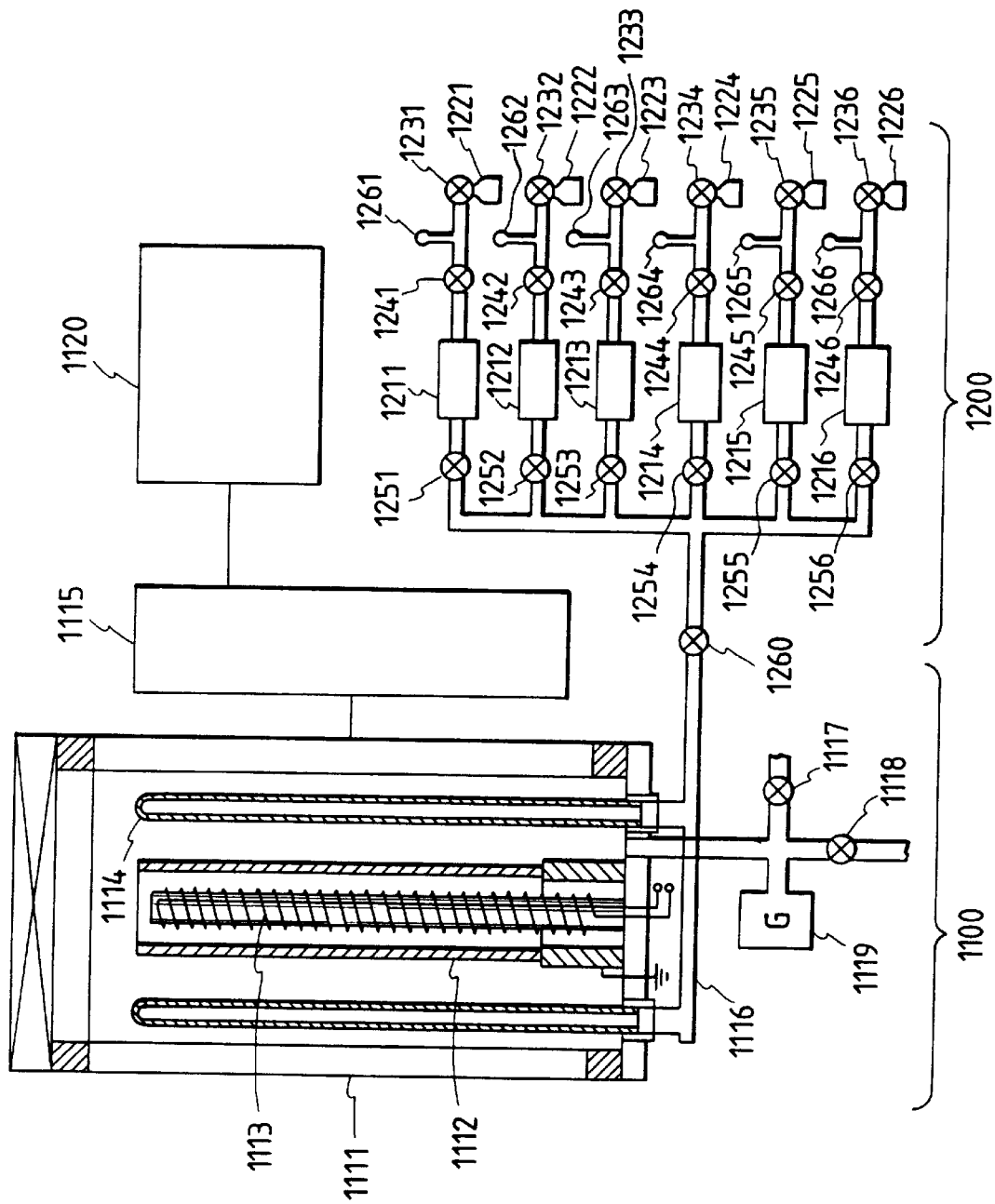

A preferred procedure for forming the surface layer by the use of a deposited film forming apparatus as shown in FIG. 6 will be described below.

FIG. 6 diagrammatically illustrates a preferred example of the deposited film forming apparatus for producing the electrophotographic light-receiving member, employing VHF plasma-assisted CVD according to the present invention.

This apparatus has a construction that can be roughly divided into a deposition apparatus 1000, a starting material gas feeding system 1200, an exhaust system (not shown) for evacuating the inside of a reaction chamber 1111, and a VHF power source 1120 for generating the electromagnetic waves with the frequency as defined in the present invention. Inside the reaction chamber 1111 in the deposition apparatus a substrate 1112, a heater 1113 for heating the substrate, and a starting material gas feed pipe 1114 are provided. The VHF power source 1120 is further connected to the reaction chamber through a high-frequency matching box 1115.

The gas feeding system 1200 is comprised of gas bombs 1221 to 1226 holding starting material gases such as $SiH_4$, $H_2$, $CH_4$, He, $C_2H_2$ and $SiF_4$, valves 1231 to 1236, 1241 to 1246 and 1251 to 1256, and mass flow controllers 1211 to 1216. The bombs for the respective gases are connected through valve 1260 to the gas feed pipe 1114 inside the reaction chamber 1111.

The apparatus shown in FIG. 6 and the apparatus shown in FIG. 5 are basically different from each other in that the matching box in the FIG. 5 apparatus is provided for the RF power source (not shown) and in contrast the high-frequency matching box in the FIG. 6 apparatus is provided for the VHF power source.

Using the deposited film forming apparatus shown in FIG. 6, the surface layer may be formed according to the above deposition procedure for the photoconductive layer.

More specifically, according to the procedure described above, starting material gases are fed at a given flow rate and the inside of the reaction chamber is adjusted to have a given pressure. At the time the inner pressure has become stable, the VHF power source 1120 of, e.g., a frequency of 100 MHz is set at the desired electric power, and a VHF power is supplied to the inside of the reaction chamber 1111 through the high-frequency matching box 1115 to cause VHF glow discharge to take place. The starting material gases fed into the reaction chamber are decomposed by the discharge energy thus produced, so that a given surface layer is formed on the substrate 1112. After a film with a given thickness has been formed, the supply of VHF power is stopped, and the flow-out valves are closed to stop gases from flowing into the reaction chamber. The formation of the surface layer is thus completed.

Needless to say, when the respective layers are formed, the flow-out valves other than those for necessary gases are all closed for each film formation. In order to prevent the corresponding gases from remaining in the reaction chamber 1111 and in the pipes extending from flow-out valves 1251 to 1256 to the reaction chamber 1111, the flow-out valves 1251 to 1256 are closed, an auxiliary valve 1260 is opened and also a main valve 1118 is full-opened so that the inside of the system is once evacuated to a high vacuum. This operation may be carried out as occasion calls.

While the film formation is carried out, the substrate 1112 may be rotated at a given speed by means of a drive system (not shown).

Needless to say, the gas species and valve operations may be changed according to the conditions under which each layer is formed.

The substrate may be heated by any method so long as a vacuum type heating element is used, which may more specifically include electric resistance heating elements such as sheath type heaters, coil type heaters, plate type heaters and ceramic heaters, heat radiation lamp heating elements such as halogen lamps and infrared lamps, and heating elements employing a heat exchanger using liquid or gas as a hot medium. As a surface material of the heating means, metals such as stainless steel, nickel, aluminum and copper, ceramics, and heat-resistant polymeric resins can be used. Other methods may also be used, e.g., a container exclusively used for heating may be provided in addition to the reaction chamber so that substrates having been heated in the container can be delivered in vacuum into the reaction chamber.

A procedure for the process for producing the electrophotographic light-receiving member of the present invention by the use of the apparatus shown in FIG. 6 will be described below. This is an example in which the light-receiving member comprises a substrate having thereon a light-receiving layer formed by VHF plasma-assisted CVD will be described.

A cylindrical substrate 1112 is set in a reaction chamber 1111, and the inside of the reaction chamber 1111 is evacuated by means of an exhaust system (not shown) as exemplified by a vacuum pump. Subsequently, the temperature of the substrate 1112 is controlled at a given temperature of from 20° C. to 500° C. by means of a heater 1113 for heating the substrate.

Before starting material gases for forming deposited films are flowed into the reaction chamber 1111, gas bomb valves 1231 to 1236 and a leak valve 1117 of the reaction chamber are checked to make sure that they are closed, and also flow-in valves 1241 to 1246, flow-out valves 1251 to 1256 and an auxiliary valve 1260 are checked to make sure that they are opened. Then, firstly a main valve 1118 is opened to evacuate the insides of the reaction chamber 1111 and a gas pipe 1116.

Next, at the time a vacuum gauge 1119 has been read to indicate a pressure of about $5\times10^{-6}$ Torr, the auxiliary valve 1260 and the flow-out valves 1251 to 1256 are closed.

Thereafter, gas bomb valves 1231 to 1236 are opened so that gases are respectively introduced from gas bombs 1221 to 1226, and each gas is controlled to have a pressure of 2 kg/cm² by operating pressure controllers 1261 to 1266. Next, the flow-in valves 1241 to 1246 are gradually opened so that gases are respectively introduced into mass flow controllers 1211 to 1216.

After the film formation is thus ready to start, the photoconductive layer is formed on the substrate 1112.

At the time the substrate 1112 has had a given temperature, some necessary ones of flow-out valves 1251 to 1256 and the auxiliary valve 1260 are gradually opened so that given gases are fed into the reaction chamber 1111 from the gas bombs 1221 to 1226 through a gas feed pipe 1114.

Next, the mass flow controllers 1211 to 1216 are operated so that each starting material gas is adjusted to flow at a given rate. In that course, the opening of the main valve 1118 is so adjusted that the pressure inside the reaction chamber 1111 comes to be a given pressure of not higher than 1 Torr, while watching the vacuum gauge 1119.

At the time the inner pressure has become stable, a power source 1120 is set at the desired electric power, and a high-frequency power of a frequency of from 20 MHz to 450 MHz is supplied to the inside of the reaction chamber 1111 through a high-frequency matching box 1115 to cause glow discharge to take place. The starting material gases fed into the reaction chamber are decomposed by the discharge energy thus produced, so that a given photoconductive layer is formed on the substrate 1112. After a film with a given thickness has been formed, the supply of electromagnetic waves is stopped, and the flow-out valves are closed to stop gases from flowing into the reaction chamber. The formation of the photoconductive layer is thus completed.

When the surface layer or other layers are formed, basically the above operations may be repeated. Also in the case when the blocking layer or the charge transport layer and the charge generation layer are formed, the same procedure may be repeated according to the order of layers.

Figure 7:
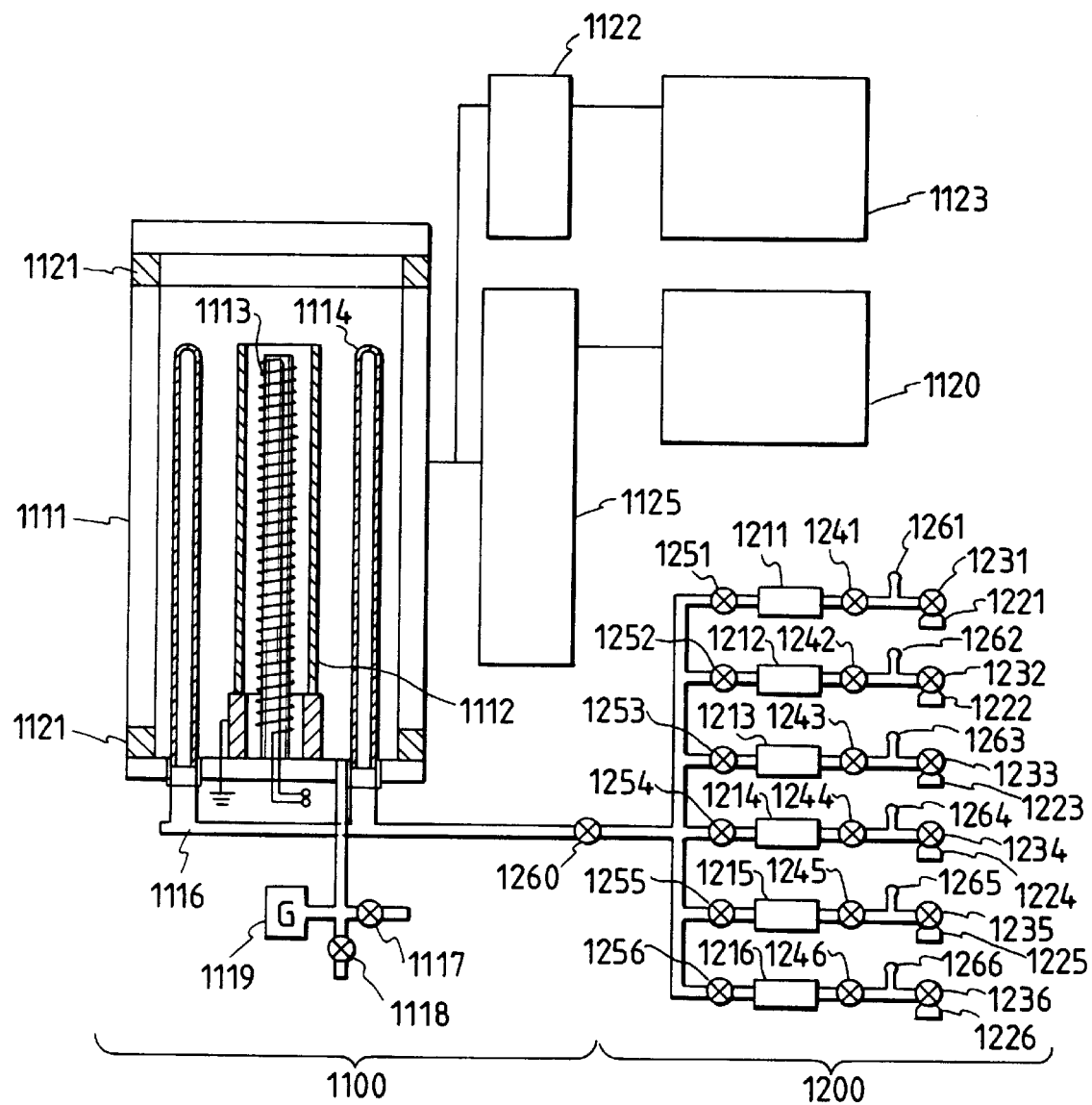

FIG. 7 diagrammatically illustrates an example of the deposited film forming apparatus for producing the electrophotographic light-receiving member by plasama CVD, having a bias power source in addition to a VHF power source.

This apparatus has a construction that can be roughly divided into a deposition apparatus 1000, a starting material gas feeding system 1200, an exhaust system (not shown) for evacuating the inside of a reaction chamber 1111, and a power source 1120 for generating the electromagnetic waves with the frequency used in the present invention. Inside the reaction chamber 1111 in the deposition apparatus 1100, a substrate 1112, a heater 1113 for heating the substrate, and a starting material gas feed pipe 1114 are provided. The power source 1120 is further connected to the reaction chamber through a high-frequency matching box 1115, and a bias power source 1123 is also connected through a low-pass filter 1122.

The gas feeding system 1200 is comprised of gas bombs 1221 to 1226 holding starting material gases such as $SiH_4$, $H_2$, $CH_4$, He, $C_2H_2$ and $SiF_4$, valves 1231 to 1236, 1241 to 1246 and 1251 to 1256, and mass flow controllers 1211 to 1216. The bombs for the respective gases are connected to the gas feed pipe 1114 inside the reaction chamber 1111.

A procedure for the process for producing the electrophotographic light-receiving member of the present invention having a blocking layer and a photoconductive layer, by the use of the apparatus shown in FIG. 7 will be described below.

A cylindrical substrate 1112 is set in a reaction chamber 1111, and the inside of the reaction chamber 1111 is evacuated by means of an exhaust system (not shown) as exemplified by a vacuum pump. Subsequently, the temperature of the substrate 1112 is controlled at a given temperature of from 20° C. to 500° C. by means of a heater 1113 for heating the substrate.

Before starting material gases for forming deposited films are flowed into the reaction chamber 1111, gas bomb valves 1231 to 1236 and a leak valve 1117 of the reaction chamber are checked to make sure that they are closed, and also flow-in valves 1241 to 1246, flow-out valves 1251 to 1256 and an auxiliary valve 1260 are checked to make sure that they are opened. Then, firstly a main valve 1118 is opened to evacuate the insides of the reaction chamber 1111 and a gas pipe 1116.

Next, at the time a vacuum gauge 1119 has been read to indicate a pressure of about $5 \times 10^{-6}$ Torr, the auxiliary valve 1260 and the flow-out valves 1251 to 1256 are closed.

Thereafter, gas bomb valves 1231 to 1236 are opened so that gases are respectively introduced from gas bombs 1221 to 1226, and each gas is controlled to have a pressure of 2 $kg/cm^2$ by operating pressure controllers 1261 to 1266. Next, the flow-in valves 1241 to 1246 are slowly opened so that gases are respectively introduced into mass flow controllers 1211 to 1216.

After the film formation is thus ready to start, the blocking layer is formed on the substrate 1112.

At the time the substrate 1112 has had a given temperature, some necessary flow-out valves 1251 to 1256 and the auxiliary valve 1260 are slowly opened so that given gases are fed into the reaction chamber 1111 from the gas bombs 1221 to 1226 through a gas feed pipe 1114. Next, the mass flow controllers 1211 to 1216 are operated so that each starting material gas is adjusted to flow at a given rate. In that course, the opening of the main valve 1118 is so adjusted that the pressure inside the reaction chamber 1111 comes to be a given pressure of not higher than 1 Torr, while watching the vacuum gauge 1119.

At the time the inner pressure has become stable, a power source 1120 is set at the desired electric power, and electromagnetic waves with a frequency of from 20 MHz to 450 MHz are supplied to the inside of the reaction chamber 1111 through a high-frequency matching box 1115 and also a bias voltage is applied to the cathode, to cause glow discharge to take place. In the apparatus shown here, the wall surface of the reaction chamber serves as the cathode. The starting material gases fed into the reaction chamber are decomposed by the discharge energy thus produced, so that a given blocking layer is formed on the substrate 1112. After a film with a given thickness has been formed, the supply of electromagnetic waves is stopped, and the flow-out valves are closed to stop gases from flowing into the reaction chamber. The formation of a deposited film is thus completed.

When the photoconductive layer, charge transport layer, charge generation layer, surface layer or other layers are formed, basically the above operations may be repeated.

While the deposited film formation is carried out, the substrate 1112 may be rotated at a given speed by means of a drive system (not shown).

In the present invention, in the case when the layer with continuous changes in composition and so forth is formed between layers comprised of the photoconductive layer and the surface layer, e.g., when an intermediate layer is formed between the photoconductive layer and the surface layer, it can be formed by a method exemplified as follows: after the photoconductive layer has been formed according to the operations described above, the supply of high-frequency power is continued and the conditions of starting material gas flow rate are so changed that the conditions thereof for the formation of the photoconductive layer are gradually and continuously changed to the conditions thereof for the formation of the surface layer. At this time, while the flow rate of starting material gases is changed, the output of power source 1120 and the main valve 1118 may be adjusted as occasion calls so that the desired conditions for the formation of the layer with compositional changes can be obtained. Needless to say, when the flow rate of starting material gases is changed, great care must be taken so as not to cause any extreme change in pressure due to violent flowing out of a gas or the like. The thickness of this region with compositional changes may be, as previously stated, in such an extent that an interface is substantially formed between the photoconductive layer and the surface layer.

In the present invention, in the case when the layer with continuous changes in composition and so forth is formed between layers comprised of the charge generation layer and the charge transport layer, e.g., when an intermediate layer is formed between the charge generation layer and the charge transport layer, it can be formed by a method exemplified as follows. After the charge transport layer has been formed according to the operations described above, the supply of high-frequency power is continued and the conditions of starting material gas flow rate are so changed that the conditions thereof for the formation of the charge transport layer are gradually and continuously changed to the conditions thereof for the formation of the charge generation layer. At this time, while the flow rate of starting material gases is changed, the output of power source 1120 and the main valve 1118 and the like may be adjusted as occasion calls so that the desired conditions for the formation of the layer with compositional changes can be obtained. Needless to say, when the flow rate of starting material gases is changed, great care must be taken so as not to cause any extreme change in pressure due to violent flowing out of a gas or the like. The thickness of this region with compositional changes may be, as previously stated, in such an extent that an interface is substantially formed between the charge generation layer and the charge transport layer.

In the present invention, in the case when the layer with continuous changes in composition and so forth is formed between layers comprised of the blocking layer and the photoconductive layer, e.g., when an intermediate layer is formed between the blocking layer and the photoconductive layer, it can be formed by a method exemplified as follows. After the blocking layer has been formed according to the operations described above, the supply of high-frequency power is continued and the conditions of starting material gas flow rate are so changed that the conditions thereof for the formation of the blocking layer are slowly and continuously changed to the conditions thereof for the formation of the photoconductive layer. At this time, while the flow rate of starting material gases is changed, the output of power source 1120 and the main valve 1118 and so on may be adjusted as occasion calls so that the desired conditions for the formation of the layer with compositional changes can be obtained. Needless to say, when the flow rate of starting material gases is changed, great care must be taken so as not to cause any extreme change in pressure due to violent flowing out of a gas or the like. The thickness of this region with compositional changes may be, as previously stated, in such an extent that an interface is substantially formed between the blocking layer and the photoconductive layer.

In the case when the layer with continuous changes in composition and so forth is formed between layers under additional application of a bias voltage, e.g., when an intermediate layer is formed between the blocking layer and the photoconductive layer under its application, the layer can be formed by a method exemplified as follows. After the blocking layer has been formed according to the operations described above, the supply of high-frequency power and the application of bias voltage are continued and the conditions of starting material gas flow rate are so changed that the conditions thereof for the formation of the blocking layer are slowly and continuously changed to the conditions thereof for the formation of the photoconductive layer. At this time, while the flow rate of starting material gases is changed, the output of power source 1120 and the main valve 1118 and so on may be adjusted as occasion calls so that the desired conditions for the formation of the layer with compositional changes can be obtained. Needless to say, when the flow rate of starting material gases is changed, great care must be taken so as not to cause any extreme change in pressure due to violent flowing out of a gas or the like. The thickness of this layer with compositional changes may be, as previously stated, in such an extent that an interface is substantially formed between the blocking layer and the photoconductive layer.

Needless to say, when the respective layers are formed, the flow-out valves other than those for necessary gases are all closed for each film formation. In order to prevent the corresponding gases from remaining in the reaction chamber 1111 and in the pipes extending from flow-out valves 1251 to 1256 to the reaction chamber 1111, the flow-out valves 1251 to 1256 are closed, an auxiliary valve 1260 is opened and also a main valve 1118 is full-opened so that the inside of the system is once evacuated to a high vacuum. This operation may be carried out as occasion calls. Needless to say, the gas species and valve operations may be changed according to the conditions under which each layer is formed.

As previously stated, in the deposited film forming apparatus, it is important, for achieving a low cost and a high performance, to remove unauthorized matter having adhered to portions of the deposition space.

The method for cleaning the deposited film forming apparatus will be described below in detail with reference to the drawings.

Figure 21:
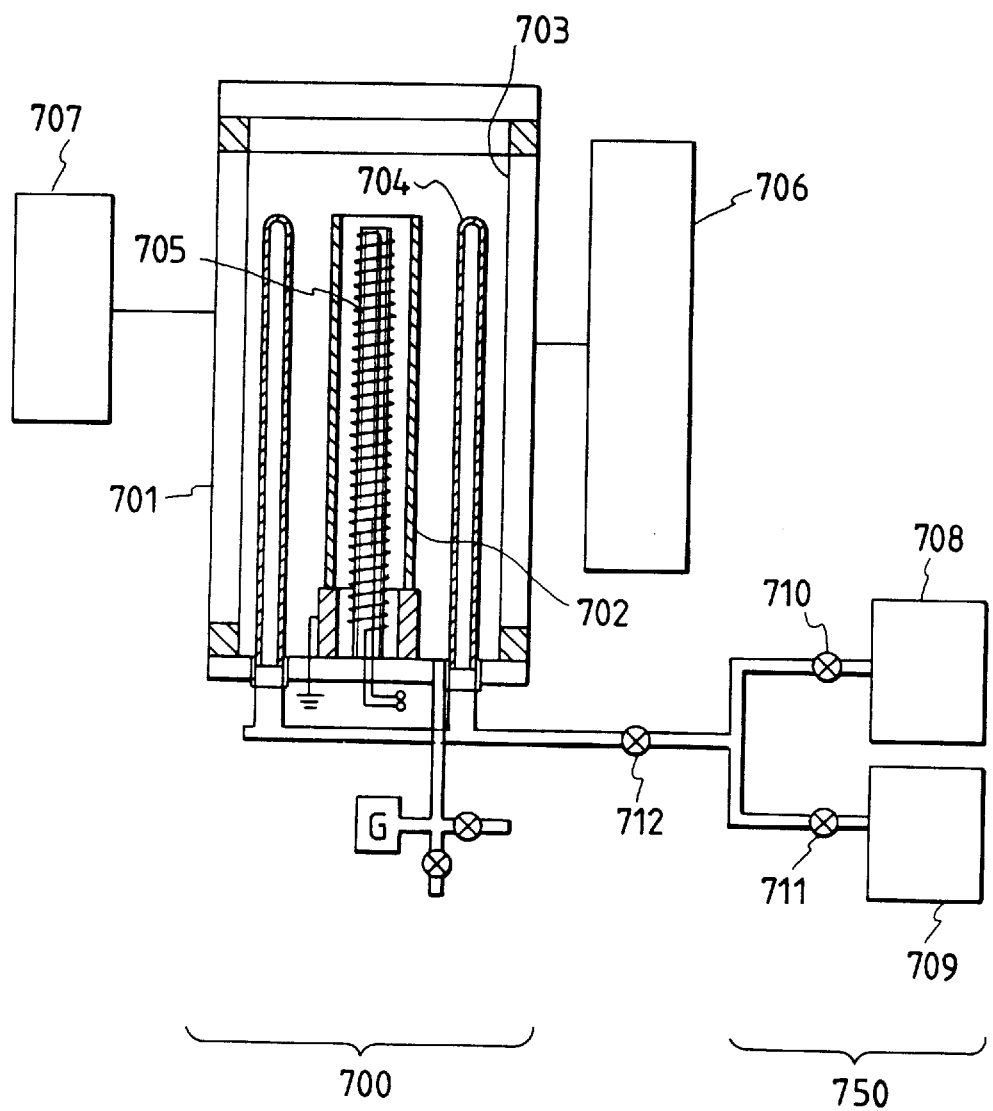

FIG. 21 is a diagrammatic illustration to describe a preferred amorphous silicon deposited film forming apparatus to which the cleaning method of the present invention can be applied.

This apparatus has a construction that can be roughly divided into a deposition apparatus 700, a starting material gas and etching gas feeding system 750, an exhaust system (not shown) for evacuating the inside of a reaction chamber 701, and an RF power source (13.56 MHz) for the formation of deposited films, and a high-frequency power source 706 for etching that generates the electromagnetic waves with the frequency of the present invention. Inside the reaction chamber 701 in the deposition apparatus 700, a substrate 702, a heater 705 for heating the substrate, and a starting material gas feed pipe 704 are provided. The power source 706 and another power source 707 are further connected to the reaction chamber through a high-frequency matching box (not shown).

The gas feeding system 750 is comprised of gas bombs holding starting material gases such as $SiH_4$, $H_2$, $CH_4$, He, $C_2H_2$ and $SiF_4$, valves, and mass flow controllers. The bombs for the respective gases are separated into a starting material gas feeding system 708 connected to the gas feed pipe 704 inside the reaction chamber 701 through valves 710 and 712 and an etching gas feeding system 709 from which a mixed gas of $ClF_3$, $CF_4$ and $O_2$ is similarly introduced into the reaction chamber 701 through valves 711 and 712.

A procedure for the method of the present invention for cleaning the deposited film forming apparatus by the use of the apparatus shown in FIG. 21 will be described below.

A cylindrical substrate 702 is taken out of the reaction chamber 701 in which the formation of deposited films has been completed, and a fresh cylindrical substrate 702 is again placed. Then, the inside of the reaction chamber 701 is evacuated by means of an exhaust system (not shown) as exemplified by a vacuum pump. Subsequently, an etching gas is introduced through gas feed pipe 704 from etching gas feeding system 709 into the reaction chamber 701 through the valves 711 and 712. After the etching gases have been kept at a given flow rate, the high-frequency power source 706 is set at a given power and its high-frequency power of a frequency of from 20 MHz to 450 MHz is introduced into the reaction chamber 701 through the high-frequency matching box (not shown). After the etching has been carried out for a given time, a fresh cylindrical substrate 702 is again placed in the reaction chamber 701. Thus, an amorphous silicone drum can be produced.

Namely, a combination of the etching gas and the high-frequency of from 20 MHz to 450 MHz makes it possible to carry out very effective cleaning. Hence, the same cleaning can be carried out also in the deposited film forming apparatus described above or another type of apparatus utilizing a frequency of from 20 MHz to 450 MHz which will be described later.

Stated additionally, when the cleaning is operated, it is not always necessary to place the cylindrical substrate 702 in the reaction chamber 701. However, in order to prevent members such as substrate holding means or a substrate heater from unnecessarily being etched, it is preferable to place a dummy substrate. It is preferable to place a dummy substrate also in order to keep cleaning discharge conditions uniform for every cleaning.

In some instances, it is permissible to change feed gases to form a deposited film on the substrate placed for the purpose of cleaning.

In deposited film forming apparatus making use of microwave plasma-assisted CVD, it is common, as typically disclosed in Japanese Patent Application Laid-open No. 60-186849 previously noted, to introduce micro waves from the sides of the both ends of a cylindrical conductive substrate. This microwave introducing part has a structure in which a "window" capable of readily transmitting microwaves, made of alumina ceramics or the like, is used so that the vacuum can be maintained and at the same time the microwaves can be introduced into the reaction chamber through it.

In the case of such a structure, once glow discharge is started, the plasma produced acts as a conductor. Hence, the power of microwaves reflects in the vicinity of the boundary between the plasma and the "window" and at the same time is consumed for the decomposition of starting material gases, so that the power of microwaves can hardly reach the vicinity of the center of the internal chamber. For this reason, the plasma produced can be uniform with difficulty, in the direction of the generatrix of the cylindrical conductive substrate. Such distribution of plasma causes, for one thing, the non-uniformity in characteristics of deposited films in the direction of the generatrix of the cylindrical conductive substrate. In order to make this distribution uniform, it can not be so much effective to merely adjust the inputted power of microwaves, and such adjustment rather tends to cause the problem that the characteristics of films become poor.

There is another problem that the non-uniformity in characteristics also occurs between deposited films simultaneously formed, on a plurality of cylindrical conductive substrates. This non-uniformity in properties of deposited films between the cylindrical conductive substrates is considered due to a delicate difference in deposited film forming apparatus or a delicate difference in conditions for the formation of deposited films. However, in the conventional construction of apparatus, it is difficult to adjust, for example, parameters such as microwave power for each cylindrical conductive substrate, and it has been difficult to achieve uniform characteristics.

Under such circumstances, the present inventors made studies on a deposited film forming apparatus that can have a superior starting material gas utilization and can achieve more uniform properties in deposited films.

As a result, they have discovered that the gas utilization can be remarkably improved when a plurality of cylindrical conductive substrates are concyclicly arranged so that an internal chamber can be formed inside the reaction chamber and also plasma is caused to take place inside this internal chamber, where the surfaces of the cylindrical conductive substrates can be substantially regarded as wall surfaces of the reaction chamber.

The present inventors have also discovered that the characteristics of deposited films can be made uniform with ease and the yield of a resulting device can be improved by supplying a high-frequency power to at least one of the cylindrical conductive substrates to thereby effect substantially uniform radiation of the high-frequency power from the surface of the cylindrical conductive substrate, so that the distribution of plasma as in the above deposited film forming apparatus employing microwave plasma-assisted CVD may occur with difficulty and the uniform properties can be achieved with ease.

A deposited film forming apparatus usable as the deposited film forming apparatus as stated above that can make deposited films uniform and in which the deposited films are formed by utilizing the high-frequency of from 20 MHz to 450 MHz will be described below in detail with reference to the drawings.

Figure 22A:
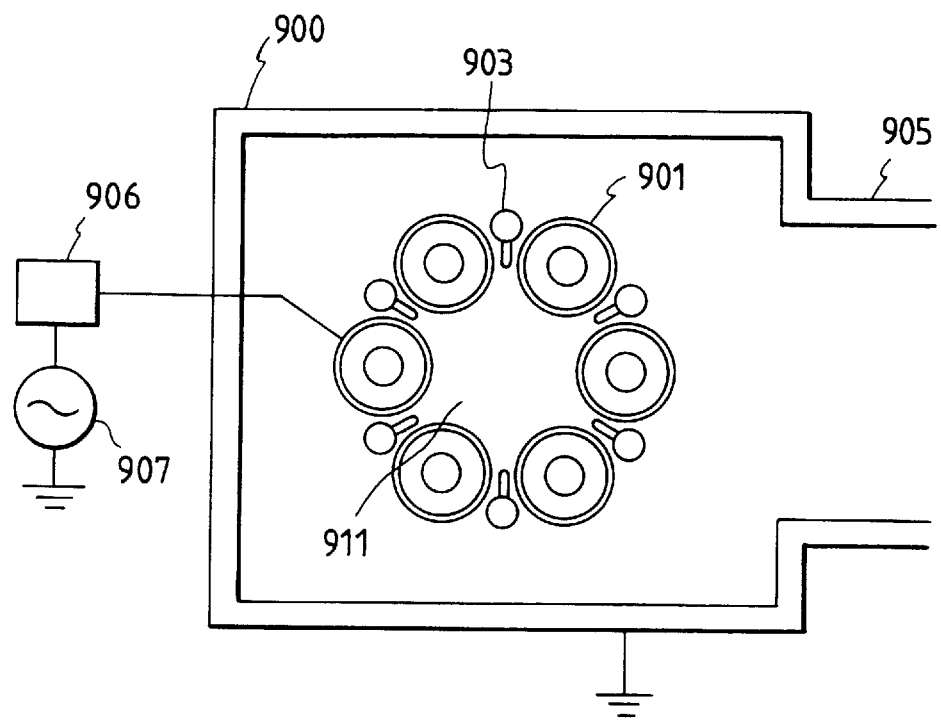
Figure 22B:
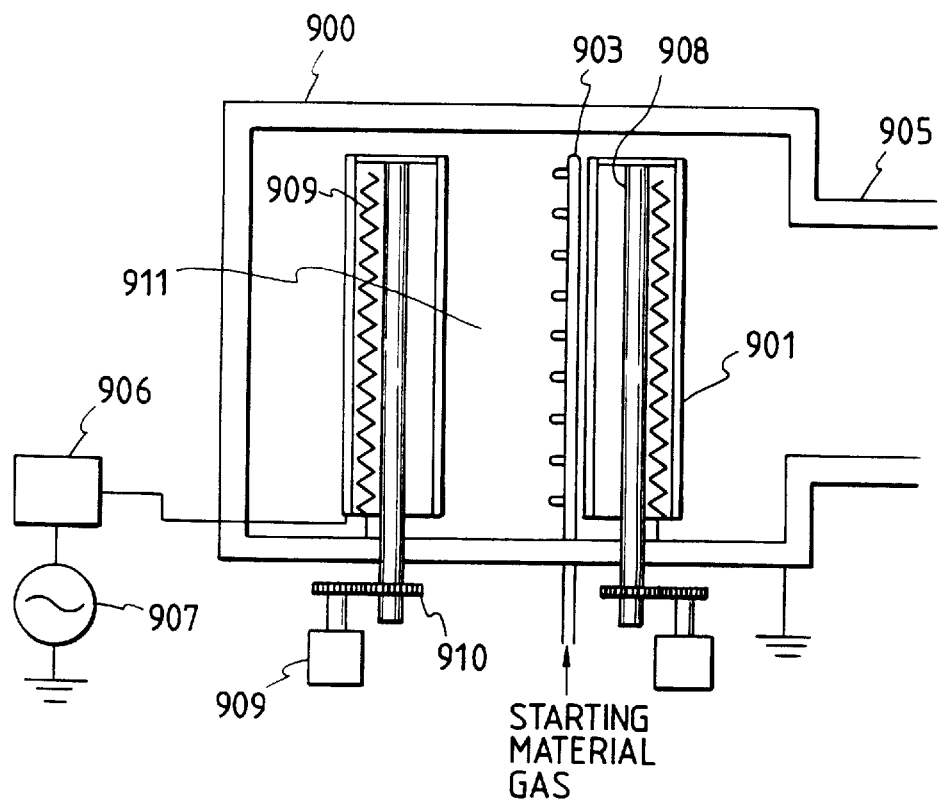

FIGS. 22A and 22B diagrammatically illustrate a transverse cross section and a longitudinal cross section, respectively, of a preferred deposited film forming apparatus according to the present invention. As shown in these FIGS. 22A and 22B, a reaction chamber 900 is connected to an exhaust system (not shown) through an exhaust tube 905. The reaction chamber 900 may have at least a vacuum airtight structure, and there are no particular limitations on its shape. For example, reaction chambers having a cylinder shape or a rectangular shape are commonly used. The reaction chamber may be made of any material. From the viewpoint of mechanical strength and prevention of leak of high-frequency power, it should preferably be made of a metal such as Al or stainless steel.

The starting material gas is fed to the inside of an internal chamber 911 formed by cylindrical conductive substrates 901, through starting material gas feed pipes 903 connected to a starting material gas feeding system (not shown) comprised of bombs, pressure controllers, mass flow controllers and valves.

At least one of the cylindrical conductive substrates 901 is electrically insulated from the reaction chamber, and is connected to a high-frequency power source 907 through a matching box 906. Then, a high-frequency power is applied across this cylindrical conductive substrate and other cylindrical conductive substrates, to thereby cause glow discharge to take place inside the internal chamber 911. The cylindrical conductive substrates 901 are each supported by a rotating shaft 908 through a holder (not shown). This rotating shaft 908 is further connected with a motor 909 through a gear 910, and each cylindrical conductive substrate 901 is rotated by means of the motor 909. Thus, uniform deposited films are formed on the cylindrical conductive substrates 901.

A procedure for the deposited film formation using the deposited film forming apparatus shown in FIGS. 22A and 22B will be described below. The deposited film formation using this apparatus can be carried out, for example, in the following way.

Cylindrical conductive substrates 901 having been degreased and cleaned are set in the reaction chamber 900, and the inside of the reaction chamber 900 is evacuated by means of an exhaust system (not shown) as exemplified by a vacuum pump. Subsequently, the temperature of each cylindrical conductive substrate 901 is controlled at a given temperature of from 20° C. to 500° C. by means of a heater 904.

At the time the cylindrical conductive substrates 901 have had a given temperature, starting material gases are fed into the internal chamber 911 from a starting material gas feeding system (not shown) through starting material gas feed pipes 903. At this time, care is taken not to cause any extreme change in pressure due to violent gas flow or the like. Next, at the time the flow rate of starting material gases reached a given flow rate, exhaust valves (not shown) are so adjusted that the inner pressure comes to be a given pressure, while watching a vacuum gauge (not shown).

Next, at the time the inner pressure has become stable, the high-frequency power source 907 is set at the desired electric power, and a high-frequency power is supplied to the cylindrical conductive substrates 901 through the matching box 906, to cause glow discharge to take place. The starting material gases fed into the reaction chamber 900 are decomposed by the discharge energy thus produced, so that given deposited films are formed on the cylindrical conductive substrates 901. After films with a given thickness have been formed, the supply of high-frequency power is stopped, and the starting material gases are stopped from flowing into the reaction chamber 900. The formation of deposited films is thus completed.

When deposited films comprised of a plurality of layers are formed on each cylindrical conductive substrate 901 to achieve intended characteristics of the deposited films, the above operations may be repeated to obtain deposited films with the desired layer configuration.

Figure 23:
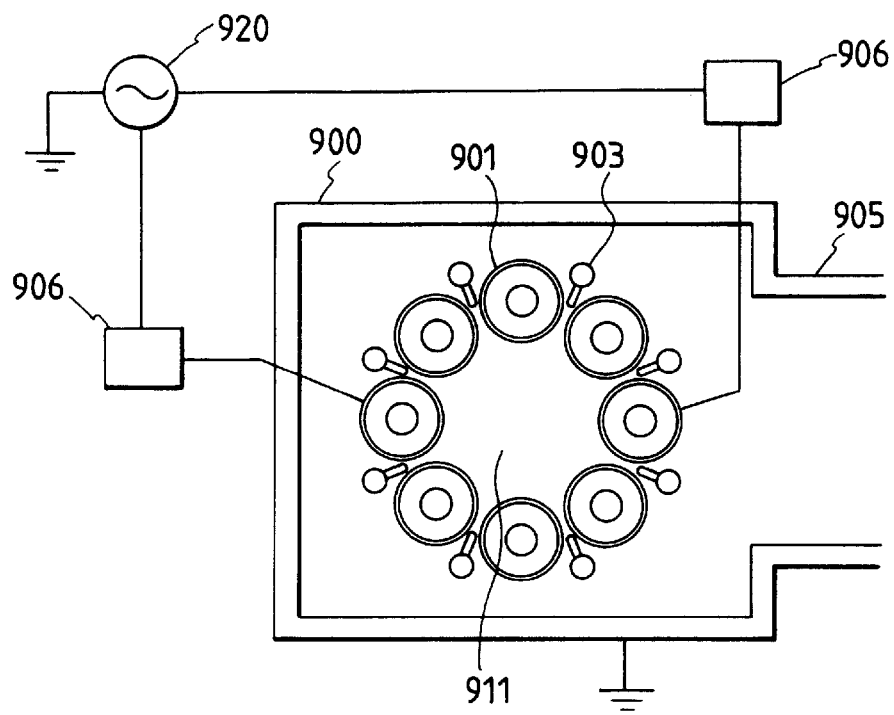
Figure 24:
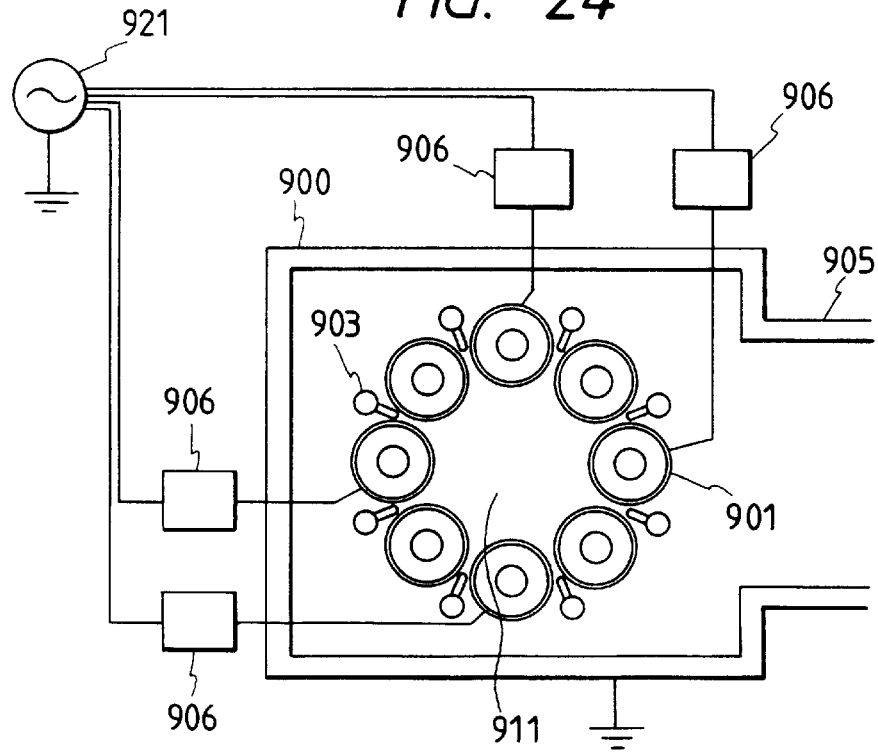

FIGS. 23 and 24 also illustrate examples of the deposited film forming apparatus of the present invention in which a high-frequency power is supplied to a plurality of cylindrical conductive substrates. More specifically, FIG. 23 illustrates an apparatus in which a high-frequency power is applied to two cylindrical conductive substrates 901, using a simultaneous excitation high-frequency power source 920 having two channels (hereinafter "ch") for supplying the high-frequency power. FIG. 24 illustrates an apparatus in which a high-frequency power is applied to four cylindrical conductive substrates 901, using a simultaneous excitation high-frequency power source 921 having four ch for supplying the high-frequency power, and also a cylindrical conductive substrate 901 to which the high-frequency power is applied and a cylindrical conductive substrate 901 to which no high-frequency power is applied are alternately so arranged that they are adjacent to each other.

Figure 25A:
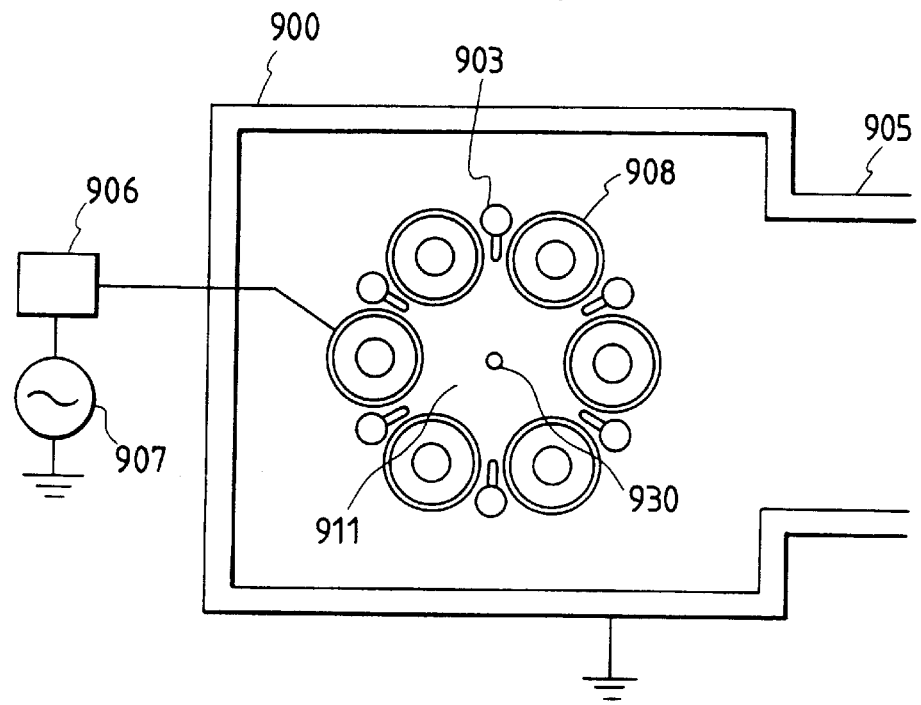
Figure 25B:
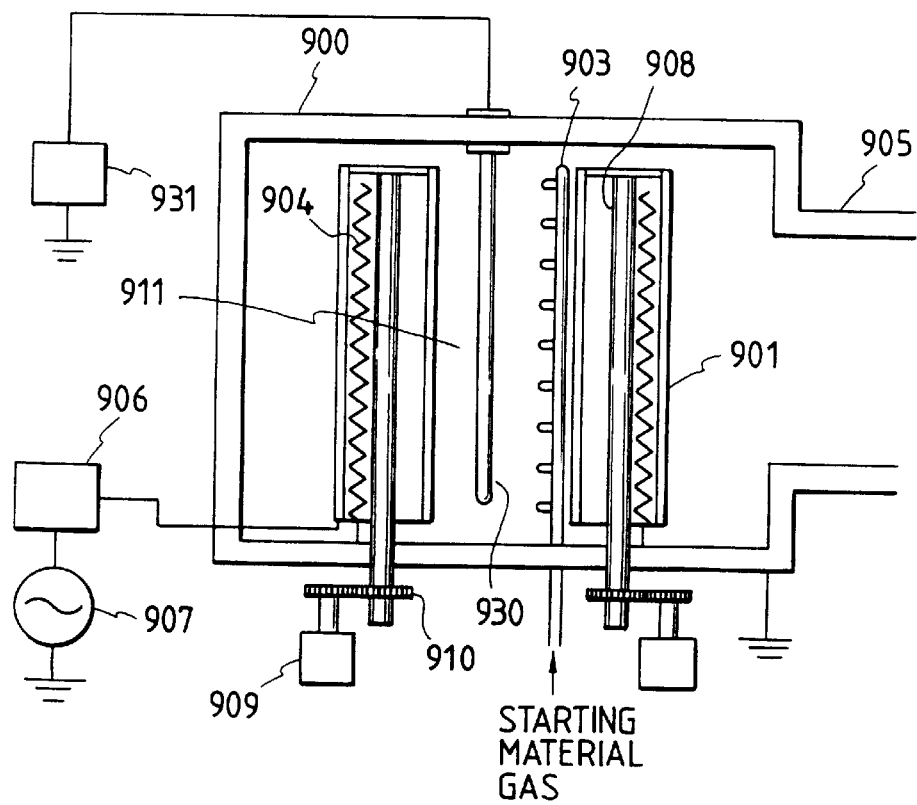

FIGS. 25A and 25B show an example of the deposited film forming apparatus of the present invention, having a means for applying an external electric bias. FIG. 25A is its transverse cross section, and FIG. 25B, its longitudinal cross section. The apparatus of FIGS. 25A and 25B is substantially the same as the apparatus shown in FIGS. 22A and 22B, except that the former additionally have a bias electrode 930 and a bias power source 931.

The starting material gases used here are appropriately selected according to deposited films to be formed. Of course, when the deposited films previously described are formed, the starting material gases previously described can be selected in variety.

The cleaning previously described can be also applied to the apparatus shown in FIGS. 22A and 22B to FIGS. 26A and 26B.

[EXAMPLES]

The present invention is described by reference to Examples to demonstrate specifically the effects of the invention. However, the present invention is not limited thereto.

Example 1

On mirror-finished, degreased and cleaned aluminum cylinders as the substrate, a photoconductive layer was formed respectively under the formation conditions shown in Table 1. Thereon, a surface layer was deposited respectively at a frequency in the VHF band range as shown in Table 2 by using the manufacturing apparatus shown in FIG. 6 to provide electrophotographic light-receiving members (hereinafter called "drums"). The drum was set in an electrophotographic apparatus (NP7550, wire-charging, non-contacting type, 50 sheets per minute) (manufactured by Canon K.K. having been modified for test purpose) and images were formed by a usual electrophotographic process to evaluate image quality on items of halftone irregularity, image smearing, black dots caused by toner fusion, and image coarseness.

The evaluation on the above respective items was made in the manner below.

Halftone irregularity

A halftone chart (prepared by Canon K.K., parts number: FY9-9042) is copied, and a 5 mm diameter region in the highest-density portion and a 5 mm diameter region in the lowest-density portion are compared and evaluated.

Black dots caused by toner fusion

A whole-area white test chart (prepared by Canon K.K.) is copied, and presence of black dots larger than the one of 0.1 mm wide×0.5 mm long formed on one sheet of the copied image is evaluated.

Image coarseness

A halftone chart (prepared by Canon K.K., parts number: FY9-9042) is copied, and image densities are measured of 100 circular areas of 0.05 mm diameter on one sheet of the copied image, and the variation of the densities is evaluated.

The following symbols are used for showing the evaluation results for the above three items.

AA: Excellent
A: Good
B: Fair in practical use
C: Poor in practical use

Image smearing

A full-letter-printed white test chart (prepared by Canon K.K., parts number: FY9-9058) is copied with double the normal exposure. Absence of breaking of fine lines in the image is evaluated on four grades below. When the image density is not uniform, the evaluation is made in the most irregular portion of the image. The results are shown by the symbols below:

AA: Excellent (no breaking)
A: Some breaking observed
B: Many breaking observed, but the printed letters being decipherable, and fair in practical use
C: Many breaking observed, and the printed letters being not decipherable, and poor in practical use Comparative Example 1

Drums were prepared in the same manner as in Example 1 except that the surface layers were formed by further connecting an RF power source of frequency of 13.56 MHz and a high frequency matching box to the manufacturing apparatus shown in FIG. 6 and using an electromagnetic wave of 13.56 MHz frequency to decompose starting gases. Other drums were also prepared in the same manner as in Example 1 except that the surface layer was formed by further connecting microwave power source of frequency of 2450 MHz and matching box to the manufacturing apparatus shown in FIG. 6 and using an electromagnetic wave of 2450

MHz frequency to decompose starting gases. The obtained drums were evaluated in the same manner as in Example 1.

Table 3 shows the results of the above evaluations. It is clear from Table 3 that the method of the present invention employing power source frequency of the VHF band gives improved image quality, particularly at frequencies from 51 to 250 MHz, in comparison with the methods employing an RF band or a μW band.

Comparative Example 2

Drums were prepared in the same manner as in Comparative Example 1 except that, in RF plasma CVD and microwave plasma CVD, the power in surface layer formation was changed to 500 W (the same condition as in VHF plasma CVD) as shown in Table 4. The obtained drums were evaluated in the same manner as in Example 1 to compare with the one obtained by plasma CVD at the frequency of 100 MHz.

Table 5 shows the results. From the table, it is understood that the difference in the image characteristics do not result from the difference in the electric power.

Example 2, and Comparative Example 3

Drums were prepared in the same manner as in Example 1 and Comparative Example 1 except that $Si_2H_6$ was used as the Si atom-containing gas, and $C_2H_2$ gas was used as the C atom-containing gas, and the gases were fed at the flow rates as shown in Table 6. The obtained drums were evaluated in the same manner as in Example 1.

Table 7 shows the results, from which it is clear that satisfactory results as in Example 1 are obtained by applying the power of a VHF band frequency independently of the kind of the starting material gas. The image characteristics were improved particularly at the frequency range of from 51 to 250 MHz.

Example 3, and Comparative Example 4

Drums were prepared in the same manner as in Example 1 and Comparative Example 1 except that He was used as the diluent gas as shown in Table 8. The obtained drums were evaluated in the same manner as in Example 1. As shown in Table 9, satisfactory results were obtained by selecting the power frequency from the VHF band as in Example 1 and Comparative Example 1.

Example 4, and Comparative Example 5

Drums were prepared in the same manner as in Example 1 and Comparative Example 1 except that $SiH_4$ and $SiF_4$ were used as the Si atom-containing gas, $CH_4$ gas was used as the C atom-containing gas, and the flow rates were selected as shown in Table 10. The obtained drums were evaluated in the same manner as in Example 1.

Table 11 shows the results, from which it is clear that satisfactory results as in Example 1 are obtained by applying the power of frequencies of the VHF band independently of the kind of the raw material gas. The image characteristics were improved particularly at the frequency range of from 51 to 250 MHZ.

Example 5, and Comparative Example 6

Drums were prepared by forming on a cylinder a charge-injection-blocking layer and a photoconductive layer in this order and then depositing a surface layer in the same manner as in Example 1 and Comparative Example 1 under the film formation conditions shown in Table 12. The obtained drums were evaluated in the same manner as in Example 1 and Comparative Example 1. As the results, excellent image characteristics were obtained by selecting the power frequency from the VHF band, particularly in the range of from 51 to 250 MHz.

Example 6, and Comparative Example 7

On the substrates, a surface layer only was formed under the film forming conditions shown in Table 2, where 100 MHz only was selected as the VHF band frequency. The bonding state of the surface layer was investigated by cutting out respectively a plurality of the portions corresponding to the upper end portion and the lower end portion of the image and determining quantitatively silicon atom, carbon atom, oxygen atom, and hydrogen atom in the layer by organic elemental analysis and if necessary Auger spectroscopy and SIMS. If necessary further, the amount and the bonding state of atoms were analyzed by ESCA. Table 13 shows the results of the analysis, from which it is understood that the Si—C bond increases and more uniform film is formed by selecting the frequency in the VHF band region.

Example 7

With a mirror-finished, degreased and cleaned aluminum cylinder as the substrate, electrophotographic light-receiving members (hereinafter called "drums") were prepared according to the procedure described above by means of the manufacturing apparatus shown in FIG. 6 at the electromagnetic wave frequency range of from 20 to 450 MHz under the conditions shown in Table 14.

The drum was set in an electrophotographic apparatus (NP7550, manufactured by Canon K.K. having been modified for the present test purpose) and images were formed by a usual electrophotographic process. The image at the initial stage was evaluated for the items of white dots, blank memory, and ghost. Further, The drums were subjected respectively to a duration test of 4,000,000 sheets of continuous image formation (hereinafter simply referred to as a "duration test"), and the images at the end of the duration test were evaluated for the above items.

Also, the electrical properties, chargeability, and sensitivity of the drum for ordinary electrophotographic process were measured.

Evaluation for each item was made in the following manner.
White dots

A whole-area black chart prepared by Canon K.K. (parts number FY9-9073) is placed on the original-setting glass deck and is copied. White dots of 0.2 mm or less in diameter on the same area of the copied image thus obtained are evaluated.
Blank memory A halftone chart prepared by Canon K.K. (parts number FY9-9042) is placed on the original-setting glass deck and is copied. On the copied images thus obtained, the difference in reflection densities between an area slightly faded in a generatrix line direction and a regular area is measured.

The following symbols are used for the evaluation results for the above items.
AA: Excellent
A: Good
B: Fair in practical use
C: Poor in practical use
Ghost A ghost test chart prepared by Canon K.K. (parts number: FY9-9040) on which a solid black circle 5 mm diameter exhibiting a reflection density of 1.1 has been stuck is placed on an image top end portion on the original-setting glass deck, and a halftone chart prepared by Canon K.K. (parts number: FY9-9042) is superposed thereon. Copies are taken in this state. In the copied images, the difference, on the halftone copy, between the reflection density of the black circle of 5 mm diameter on the ghost chart and the reflection density of the halftone area is measured.

Chargeability

The drum is set in the test apparatus, and a high voltage of +6 KV is applied to effect corona charging. The dark area surface potential of the drum is measured by means of a surface potential meter.

Sensitivity

The drum is charged at the development section to a dark-area surface potential of 400 V, and the quantity of exposure light to decrease the surface potential to 50 V is measured.

The following symbols are used for showing the evaluation results for the above two items.

AA: Excellent
A: Good
B: Fair in practical use
C: Poor in practical use

Comparative Example 8

Drum was prepared in the same manner as in Example 7 except that an RF power source of frequency of 13.56 MHz, and a high frequency matching box are connected to a deposition film forming apparatus shown in FIG. 6, and the starting gases were decomposed by application of magnetic wave of 13.56 MHz. The obtained drum was evaluated for image quality at the initial stage and after the duration test and for electrical characteristics in the same manner as in Example 7.

Table 15 shows the results of Example 7 and Comparative Example 8. From the table, it is understood that the method of the present invention improves the electrophotographic characteristics by modifying mainly the interface region, and the effect is remarkable particularly in the frequency range of from 51 MHz to 250 MHz.

Example 8

With a mirror-finished, degreased and cleaned aluminum cylinder as the substrate, electrophotographic light-receiving members were prepared according to the procedure described above by means of the manufacturing apparatus shown in FIG. 6 at an electromagnetic wave frequency in the range of from 20 to 450 MHz under the conditions shown in Table 16.

The obtained drums were evaluated for image quality at the initial stage and after the duration test and for the electrical characteristics in the same manner as in Example 7.

Comparative Example 9

Figure 8A:
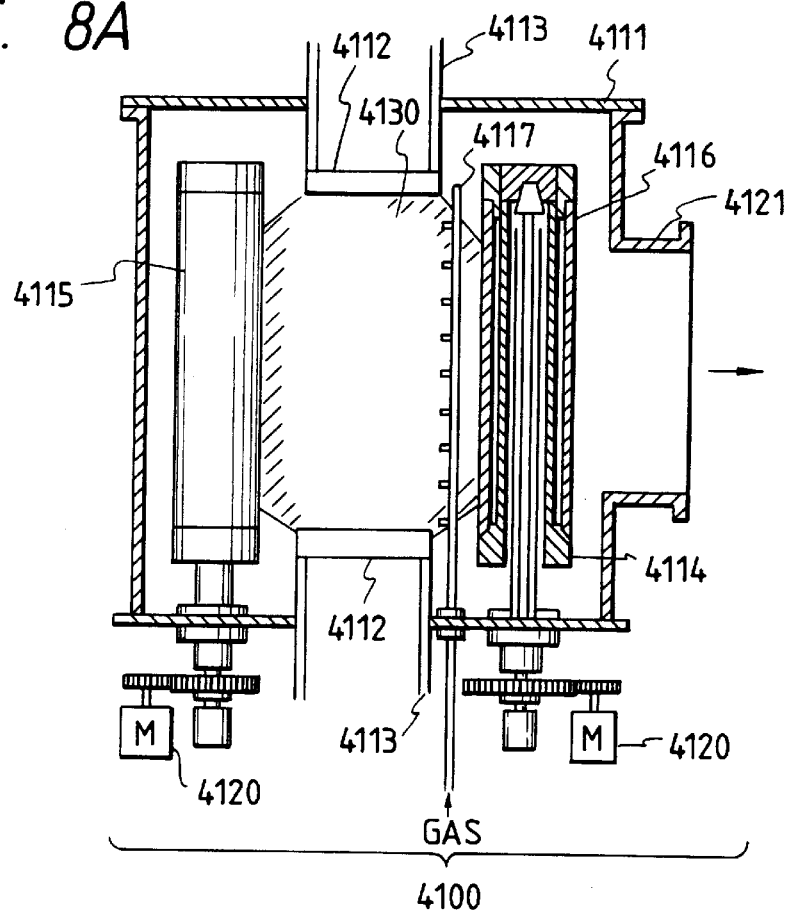
Figure 8B:
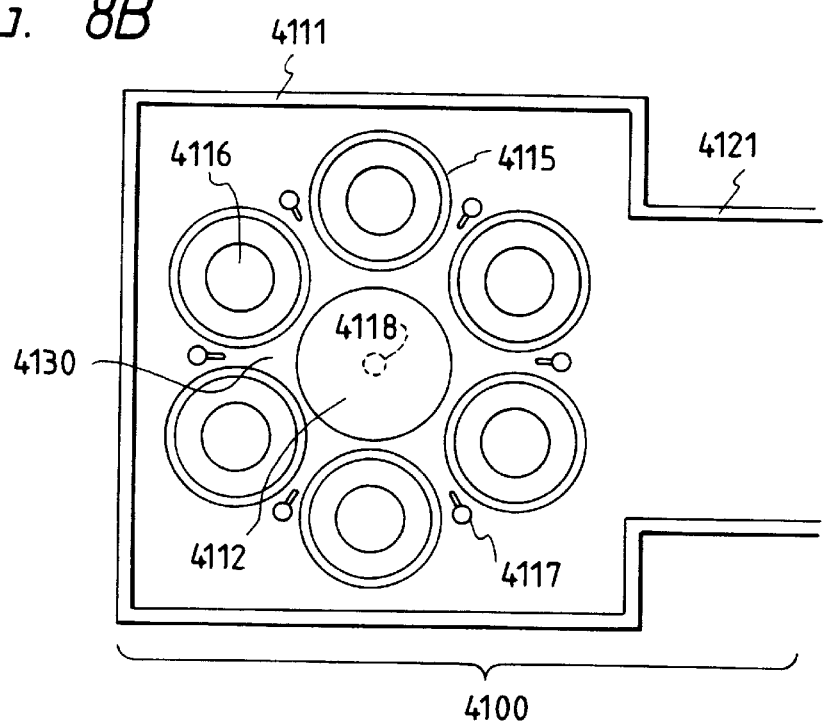
Figure 9:
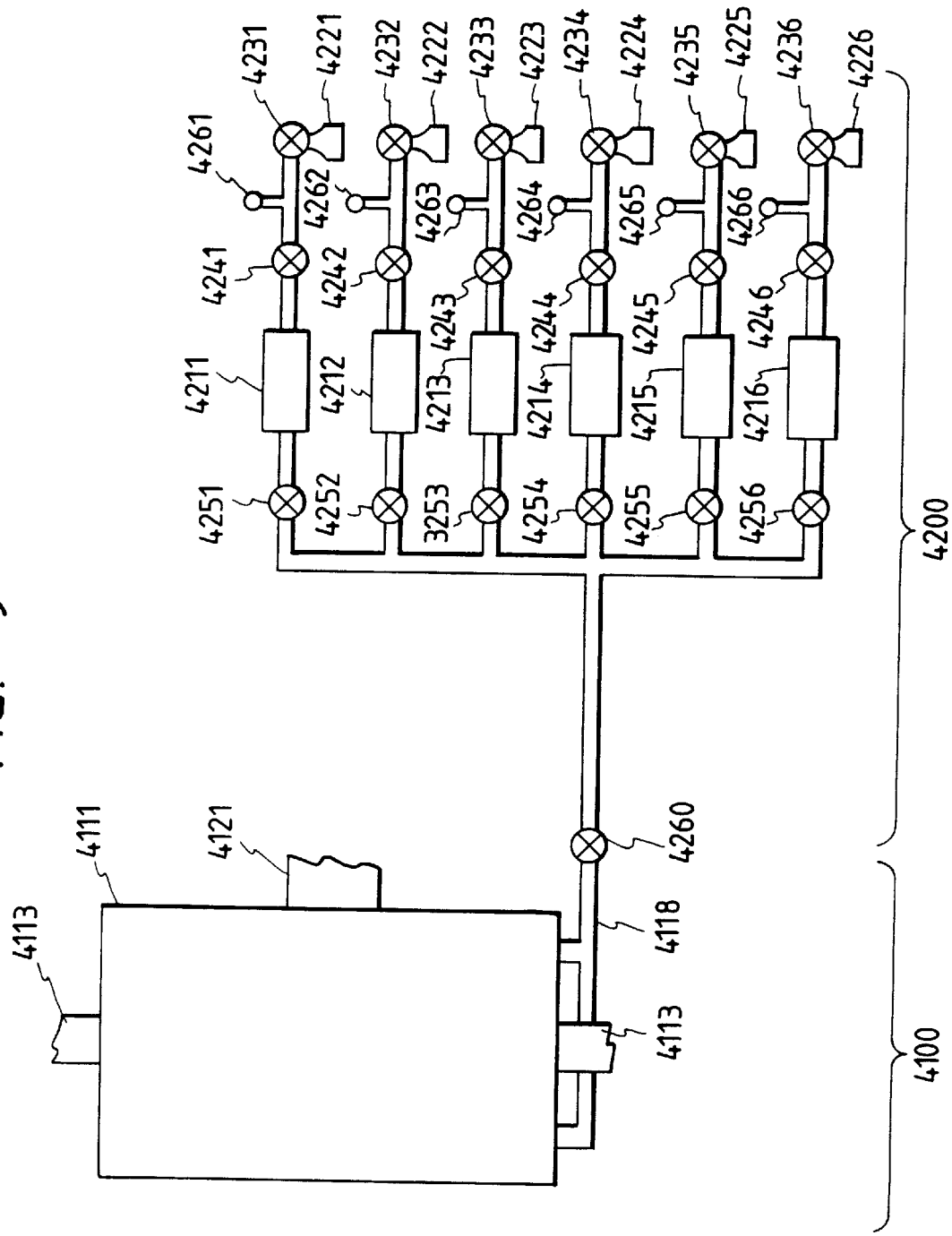

A drum was prepared by means of a deposition film forming apparatus shown in FIGS. 8A and 8B for microwave plasma CVD employing microwave of 2.45 GHz by the procedure shown below under the conditions shown in Table 16. FIG. 9 is a view illustrating schematically entire constitution of an example of a deposition film forming apparatus according to microwave plasma CVD. FIG. 8A illustrates schematically a vertical sectional view of the reaction chamber, and FIG. 8B illustrates schematically a transverse sectional view thereof.

A degreased and cleaned cylindrical substrate 4115 is placed in a reaction chamber 4111. The reaction chamber 4111 is evacuated through an evacuation tube 4121 by an evacuation device not shown in the drawing (e.g., a vacuum pump), while the substrate 4115 is being rotated by a driving device 4120, thereby the inside pressure of the reaction chamber 4111 being adjusted to a pressure of $1\times10^{-6}$ Torr or below. Then the substrate 4115 is heated up to a predetermined temperature in the range of from 20° C. to 500° C. by a substrate heater 4116.

Before the starting gases for forming the light-receiving member are introduced into the reaction chamber 4111, gas bomb valves 4231 to 4236 and a leak valve (not shown in the drawing) of the reaction chamber are confirmed to be closed, and flow-in valves 4241 to 4246, flow-out valves 4251 to 4256 and an auxiliary valve 4260 are confirmed to be opened. Then firstly a main valve (not shown in the drawing) is opened to evacuate the reaction chamber 4111 and a gas pipe 4118.

When a vacuum gauge (not shown in the drawing) has come to indicate a pressure of about $5\times10^{-6}$ Torr, the auxiliary valve 4260 and the flow-out valves 4251 to 4256 are closed.

Thereafter, gas bomb valves 4231 to 4236 are opened to introduce the gases respectively from gas bombs 4221 to 4226, and each gas is controlled to be at a pressure of 2 kg/cm$^2$ by pressure controllers 4261 to 4266. Then the flow-in valves 4241 to 4246 are gradually opened to introduce the gases into mass flow controllers 4211 to 4216.

As described above, the film formation was ready to start. The formation of a photoconductive layer and a surface layer was carried out as follows.

When the substrate 4115 has reached a given temperature, some necessary flow-out valves 4251 to 4256 and the auxiliary valve 4260 are gradually opened to feed the given gases into a discharge space 4130 of the reaction chamber 4111 from the gas bombs 4221 to 4226 through a gas feed pipe 4117. The mass flow controller 4211 to 4216 are adjusted to control each starting material gas to flow at a given rate. In that course, the opening of the main valve (not shown in the drawing) is adjusted such that the pressure in the discharge space 4130 is kept at a given pressure of not higher than 1 Torr by reference to a vacuum gauge (not shown in the drawing).

When the pressure becomes stable, microwave of 2.45 GHz is generated, and the microwave power source (not shown in the drawing) is adjusted to a desired power level, and the microwave energy is introduced through a waveguide tube 4113 and a microwave introduction window 4112 into a discharge space 4130 to generate glow discharge. The starting gases are excited and dissociated by the energy of the microwave to form a desired light receiving member on the substrate 4115. During the layer formation, the substrate is rotated at a desired rotation speed by a driving means 4120 to uniformize the formed layer.

After a film of a desired thickness has been formed, the application of the microwave power is stopped, and the flow-out valves are closed to stop the gas flows into the reaction chamber. The formation of a deposition film is thus completed.

A light-receiving layer of multi-layer structure can be formed by repeating the above operation a plurality of times.

The drum prepared by the above described procedure was evaluated for image quality at the initial stage and after the duration test and for electrical characteristics in the same manner as in Example 7.

Table 17 shows the results of Example 8 and Comparative Example 9. As shown in the table, the method of the present invention improves the electrophotographic characteristics mainly by modifying the interface region, and the effect is remarkable particularly in the frequency range of from 51 MHz to 250 MHz.

Example 9

With a mirror-finished, degreased and cleaned aluminum cylinder as the substrate, electrophotographic light-receiving members (hereinafter referred to as "drums") were prepared according to the procedure described above by means of the manufacturing apparatus shown in FIG. 6 at an electromagnetic wave frequency in the range from 20 to 450 MHz under the conditions shown in Table 18 by providing an interface region having a continuously changing composition between the blocking layer and the photoconductive layer.

The obtained drums were evaluated for image quality at the initial stage and after the duration test and for the electrical characteristics in the same manner as in Example 7.

Comparative Example 10

A drum was prepared in the same manner as in Example 9 except that an RF power source of a frequency of 13.56 MHz and a high-frequency matching box were connected to the deposition film forming apparatus shown in FIG. 6 and the starting gases were decomposed by application of electromagnetic wave of 13.56 MHz.

The obtained drum was evaluated for image quality at the initial stage and after the duration test and for the electrical characteristics in the same manner as in Example 7.

Table 19 shows the results of Example 9 and Comparative Example 10. As shown in the table, the method of the present invention improves the electrophotographic characteristics mainly by modifying the interface region, and the effect is remarkable particularly in the frequency range of from 51 MHz to 250 MHz.

Example 10

With a mirror-finished, degreased and cleaned aluminum cylinder as the substrate, electrophotographic light-receiving members (hereinafter referred to as "drums") were prepared according to the procedure described above by means of the manufacturing apparatus shown in FIG. 6 at an electromagnetic wave frequency in the range of from 20 to 450 MHz under the conditions shown in Table 20 by providing an interface region having a continuously changing composition between the blocking layer and the photoconductive layer.

The obtained drums were evaluated for image quality at the initial stage and after the duration test and for the electrical characteristics in the same manner as in Example 7.

Comparative Example 11

A drum was prepared in the same manner as in Comparative Example 9 except that a deposition film forming apparatus for microwave plasma CVD as shown in FIGS. 8A and 8B and FIG. 9 was employed under the conditions shown in Table 20.

The obtained drum was evaluated for image quality at the initial stage and after the duration test, and the electrical characteristics in the same manner as in Example 7.

Table 21 shows the results of Example 10 and Comparative Example 11. As shown in the table, the method of the present invention improves the electrophotographic characteristics by modifying mainly the interface region, and the effect is remarkable particularly in the frequency range of from 51 MHz to 250 MHz.

Example 11

With a mirror-finished, degreased and cleaned aluminum cylinder as the substrate, an electrophotographic light-receiving member (hereinafter referred to as a "drum") was prepared according to the procedure described above by means of the manufacturing apparatus shown in FIG. 6 at an electromagnetic wave frequency of 105 MHz under the conditions shown in Table 22 by providing an interface region having a continuously changing composition between the blocking layer and the photoconductive layer.

The obtained drum was evaluated for image quality at the initial stage and after the duration test and for the electrical characteristics in the same manner as in Example 7. Table 23 shows the results. The method of the present invention gave a drum having excellent electrophotographic characteristics as shown in Table 23.

Example 12

With a mirror-finished, degreased and cleaned aluminum cylinder as the substrate, an electrophotographic light-receiving member (hereinafter referred to as a "drum") was prepared according to the procedure described above by means of the manufacturing apparatus shown in FIG. 6 at the electromagnetic wave frequency of 105 MHz under the conditions shown in Table 24 by providing an interface region having continuously changing composition between the blocking layer and the photoconductive layer.

The obtained drum was evaluated for image quality at the initial stage and after the duration test, and the electrical characteristics in the same manner as in Example 7. The drum had excellent electrophotographic characteristics as the one in Example 11.

Example 13

With a mirror-finished, degreased and cleaned aluminum cylinder as the substrate, electrophotographic light-receiving members (hereinafter referred to as "drums") were prepared according to the procedure described above by means of the manufacturing apparatus shown in FIG. 6 at an electromagnetic wave frequency in the range from 20 to 450 MHz under the conditions shown in Table 25.

The obtained drums were evaluated for image quality at the initial stage and after the duration test, and the electrical characteristics in the same manner in Example 7. The drums with a blocking layer containing SiN had excellent electrophotographic characteristics as the ones in Example 7.

Example 14

With a mirror-finished, degreased and cleaned aluminum cylinder as the substrate, electrophotographic light-receiving members (hereinafter referred to as "drums") were prepared according to the procedure described above by means of the manufacturing apparatus shown in FIG. 6 at an electromagnetic wave frequency in the range of from 20 to 450 MHz under the conditions shown in Table 26.

The obtained drums were evaluated for image quality at the initial stage and after the duration test and for the electrophotographic characteristics in the same manner as in Example 7. The drums with a blocking layer containing SiO (oxygen-containing non-monocrystalline silicon) had excellent electrophotographic characteristics as the ones in Example 7.

Example 15

With a mirror-finished, degreased and cleaned aluminum cylinder as the substrate, electrophotographic light-receiving members (hereinafter referred to as "drums") was prepared according to the procedure described above by means of the manufacturing apparatus shown in FIG. 6 at the electromagnetic wave frequency in the range of from 20 to 450 MHz under the conditions shown in Table 27.

The obtained drum was evaluated for image quality at the initial stage and after the duration test, and the electrical characteristics in the same manner as in Example 7. The drum with a blocking layer containing Si(C+N) (non-monocrystalline silicon containing carbon and nitrogen) had excellent electrophotographic characteristics as the ones in Example 7.

Example 16

With a mirror-finished, degreased and cleaned aluminum cylinder as the substrate, electrophotographic light-receiving members (hereinafter referred to as "drums") were prepared according to the procedure described above by means of the manufacturing apparatus shown in FIG. 6 at an electromagnetic wave frequency in the range of from 20 to 450 MHz under the conditions shown in Table 28.

The obtained drums were evaluated for image quality at the initial stage and at the end of the duration test, and the electrical characteristics in the same manner as in Example 7. The drum with a blocking layer containing Si(C+0) (non-monocrystalline silicon containing carbon and oxygen) had excellent electrophotographic characteristics as the ones in Example 7.

Example 17

With a mirror-finished, degreased and cleaned aluminum cylinder as the substrate, electrophotographic light-receiving members (hereinafter referred to as "drums") were prepared according to the procedure described above by means of the manufacturing apparatus shown in FIG. 6 at an electromagnetic wave frequency in the range of from 20 to 450 MHz under the conditions shown in Table 29.

The obtained drums were evaluated for image quality at the initial stage and after the duration test, and the electrical characteristics in the same manner as in Example 7. The drum with a blocking layer containing Si(C+N) (non-monocrystalline silicon containing carbon and nitrogen) had excellent electrophotographic characteristics as the ones in Example 7.

Example 18

With a mirror-finished, degreased and cleaned aluminum cylinder as the substrate, electrophotographic light-receiving members (hereinafter referred to as "drums") were prepared according to the procedure described above by means of the manufacturing apparatus shown in FIG. 6. at an electromagnetic wave frequency in the range of from 20 to 450 MHz under the conditions shown in Table 30.

The obtained drum was evaluated for image quality at the initial stage and after the duration test and for the electrical characteristics in the same manner as in Example 7. The drum with a blocking layer containing Si(C+O+N) (non-monocrystalline silicon containing carbon, oxygen, and nitrogen) had excellent electrophotographic characteristics as the ones in Example 7.

Example 19

With a mirror-finished, degreased and cleaned aluminum cylinder as the substrate, electrophotographic light-receiving members (hereinafter referred to as "light-receiving members") were prepared according to the procedure described above by means of the manufacturing apparatus shown in FIG. 6 at an electromagnetic wave frequency in the range of from 20 to 450 MHz under the conditions shown in Table 31.

The light-receiving member was set in an electrophotographic apparatus (NP7550, manufactured by Canon K.K., having been modified for the present test purpose), and images were formed by a usual electrophotographic process. The image at the initial stage was evaluated for the items of white dots, blank memory, and ghost. Further, the drums were subjected respectively to a duration test of 4,000,000 sheets of continuous image formation (hereinafter simply referred to as a "duration test"), and the images at the end of the duration test were evaluated for the above items.

The electrical properties, and potential shift of the light-receiving members for ordinary electrophotographic process were also evaluated.

The methods for evaluation of white dots, blank memory, and ghost are described before.

Potential shift

The electrophotographic photosensitive member is set in the experiment apparatus, and a high voltage of +6 KV is applied to the charger to cause corona charging. The dark-area surface potential of the electrophotographic photosensitive member is measured. The dark-area surface potential immediately after the application of voltage to the charger is represented by $V_{d0}$ and that after two minutes is represented by $V_d$. The difference between $V_{d0}$ and $V_d$ is defined as the potential shift. The results of the evaluation are shown with the symbols below:

AA: Excellent
A: Good
B: Fair in practical use
C: Poor in practical use

The evaluation results on the above items are shown in Table 32.

Comparative Example 12

A light-receiving member was prepared in the same manner as in Example 19 except that an RF power source of 13.56 MHz and a high-frequency matching box are connected to the deposition film forming apparatus shown in FIG. 6 and the starting gases were decomposed by application of the electromagnetic wave of 13.56 MHz. The obtained light-receiving member was evaluated for image quality and electrical properties at the initial stage and after the duration test.

The results are shown in Table 32 together with the results of Example 19. As shown in Table 32, electrophotographic characteristics are improved by the method of the present invention, particularly in the frequency range of from 51 MHz to 250 MHz.

Example 20

With a mirror-finished, degreased and cleaned aluminum cylinders as the substrate, light-receiving members were prepared according to the procedure described above by means of the manufacturing apparatus shown in FIG. 6 at an electromagnetic wave frequency in the range of from 20 to 450 MHz under the conditions shown in Table 33. The light-receiving member was evaluated for image quality at the initial stage and after the duration test, and electrical properties in the same manner as in Example 19. The results are shown in Table 34.

Comparative Example 13

A drum was prepared by means of a deposition film forming apparatus shown in FIGS. 8A and 8B and FIG. 9 for microwave plasma CVD employing microwave of 2.45 GHz by the same procedure as in Comparative Example 9 under the conditions shown in Table 33. A charge-transporting layer and a charge-generating layer were formed on a cylindrical substrate 4115 in the same manner as in Comparative Example 9.

The light-receiving member prepared by microwave plasma CVD was evaluated for image quality at the initial stage and after the duration test and for electrical properties. Table 34 shows the results of Example 20 and Comparative Example 13. As shown in the table, the method of the present invention improves the electrophotographic characteristics by modifying mainly the interface region, and the effect is remarkable particularly in the frequency range of from 51 MHz to 250 MHz.

Example 21

With a mirror-finished, degreased and cleaned aluminum cylinder as the substrate, light-receiving members were prepared according to the procedure described above by means of the manufacturing apparatus shown in FIG. 6 at an electromagnetic wave frequency in the range of from 20 to 450 MHz under the conditions shown in Table 35 by providing an interface region having a continuously changing composition between the charge-generating layer and the charge-transporting layer. The light-receiving member was evaluated for image quality at the initial stage and after the duration test and for electrical properties in the same manner as the ones obtained in Example 19. The results are shown in Table 36.

Comparative Example 14

A light-receiving member was prepared in the same manner as in Example 21 except that an RF power source of 13.56 MHz and a high-frequency matching box are connected to the deposition film forming apparatus shown in FIG. 6 and the starting gases were decomposed by application of the electromagnetic wave of 13.56 MHz. The obtained light-receiving member was evaluated for image quality and electrical properties at the initial stage and after the duration test.

The results are shown in Table 36 together with the results of Example 21. As shown in the table, the method of the present invention improves the electrophotographic characteristics by modifying mainly the interface region, and the effect is remarkable particularly in the frequency range of from 51 MHz to 250 MHz.

Example 22

With a mirror-finished, degreased and cleaned aluminum cylinder as the substrate, light-receiving members were prepared according to the procedure described above by means of the manufacturing apparatus shown in FIG. 6 at an electromagnetic wave frequency in the range of from 20 to 450 MHz under the conditions shown in Table 37 by providing an interface region having a continuously changing composition between the charge-generating layer and the charge-transporting layer. The obtained light-receiving members were evaluated for image quality at the initial stage and after the duration test and for electrical properties in the same manner as in Example 19. The results are shown in Table 38.

Comparative Example 15

A light-receiving member was prepared by means of a conventional deposition film forming apparatus for microwave plasma CVD under the conditions shown in Table 37 in the same manner as in Comparative example 13. The obtained light-receiving member was evaluated for image quality at the initial stage and after the duration test and for electrical properties in the same manner as in Example 19. The results are shown in Table 38 together with the results of Example 22. As shown in the table, the method of the present invention improves the electrophotographic characteristics mainly by modifying the interface region, and the effect is remarkable particularly in the frequency range of from 51 MHz to 250 MHz.

Example 23

With a mirror-finished, degreased and cleaned aluminum cylinder as the substrate, a light-receiving member was prepared according to the procedure described above by means of the manufacturing apparatus shown in FIG. 6 at an electromagnetic wave frequency of 105 MHz under the conditions shown in Table 39 by providing an interface region having a continuously changing composition between the charge-generating layer and the charge-transporting layer. The obtained light-receiving member was evaluated for image quality at the initial stage and after the duration test and for electrical properties in the same manner as in Example 19. The results are shown in Table 40. The obtained light-receiving member according to the present invention had excellent electrophotographic characteristics as shown in Table 40.

Example 24

With a mirror-finished, degreased and cleaned aluminum cylinder as the substrate, a light-receiving member was prepared according to the procedure described above by means of the manufacturing apparatus shown in FIG. 6 at an electromagnetic wave frequency of 105 MHz under the conditions shown in Table 41 by providing an interface region having a continuously changing composition between the charge-generating layer and the charge-transporting layer. The obtained light-receiving member was evaluated for image quality at the initial stage and after the duration test and for electrical properties in the same manner as in Example 19. The obtained light-receiving member had excellent electrophotographic characteristics as the one obtained in Example 23.

Example 25

With a mirror-finished, degreased and cleaned aluminum cylinder as the substrate, light-receiving members were prepared according to the procedure described above by means of the manufacturing apparatus shown in FIG. 6 at an electromagnetic wave frequency in the range of from 20 to 450 MHz under the conditions shown in Table 42.

The obtained light-receiving members were evaluated for image quality at the initial stage and after the duration test and for electrical properties in the same manner as in Example 19. The obtained light-receiving members containing SiN in the charge-transporting layer had excellent electrophotographic characteristics as the ones obtained in Example 19.

Example 26

With a mirror-finished, degreased and cleaned aluminum cylinder as the substrate, light-receiving members were prepared according to the procedure described above by means of the manufacturing apparatus shown in FIG. 6 at an electromagnetic wave frequency in the range of from 20 to 450 MHz under the conditions shown in Table 43.

The obtained light-receiving members were evaluated for image quality at the initial stage and after the duration test and for electrical properties in the same manner as in Example 19. The obtained light-receiving members containing SiO in the charge-transporting layer had also excellent electrophotographic characteristics as the ones obtained in Example 19.

Example 27

With a mirror-finished, degreased and cleaned aluminum cylinder as the substrate, light-receiving members were prepared according to the procedure described above by means of the manufacturing apparatus shown in FIG. 6 at an electromagnetic wave frequency in the range of from 20 to 450 MHz under the conditions shown in Table 44.

The obtained light-receiving members were evaluated for image quality at the initial stage and after the duration test and for electrical properties in the same manner as in Example 19. The obtained light-receiving members containing SiN(O) in the charge-transporting layer had also excellent electrophotographic characteristics as the ones obtained in Example 19.

Example 28

With a mirror-finished, degreased and cleaned aluminum cylinder as the substrate, light-receiving members were prepared according to the procedure described above by means of the manufacturing apparatus shown in FIG. 6 at an electromagnetic wave frequency in the range of from 20 to 450 MHz under the conditions shown in Table 45.

The obtained light-receiving member were evaluated for image quality at the initial stage and after the duration test and for electrical properties in the same manner as in Example 19. The obtained light-receiving members containing SiO(C) in the charge-transporting layer had also excellent electrophotographic characteristics as the ones obtained in Example 19.

Example 29

With a mirror-finished, degreased and cleaned aluminum cylinder as the substrate, light-receiving members were prepared according to the procedure described above by means of the manufacturing apparatus shown in FIG. 6 at an electromagnetic wave frequency in the range of from 20 to 450 MHz under the conditions shown in Table 46.

The obtained light-receiving member were evaluated for image quality at the initial stage and after the duration test and for electrical properties in the same manner as in Example 19. The obtained light-receiving members containing SiO(C+O+N) in the charge-transporting layer had also excellent electrophotographic characteristics as the ones obtained in Example 19.

Example 30

With a mirror-finished, degreased and cleaned aluminum cylinder as the substrate, electrophotographic light-receiving members (hereinafter called "drums") were prepared according to the procedure described before by means of the manufacturing apparatus shown in FIG. 6 at an electromagnetic wave frequency in the range of from 20 to 450 MHz under the conditions shown in Table 47.

The drum was set in an electrophotographic apparatus (NP7550, manufactured by Canon K.K., having been modified for the present test purpose) and images were formed by a usual electrophotographic process. The images at the initial stage were evaluated for the items of white dots, image smearing, ghost, and black lines. Further, a duration test of 4,000,000 sheets of continuous image formation was conducted (hereinafter simply referred to as a "duration test"), and the images at the end of the duration test were evaluated for the above items.

White dots, image smearing, and ghost were evaluated as described before. Black lines were evaluated as below:
Black lines The halftone chart provided by Canon K.K. (parts number: FY9-9042) is placed on the glass board for an original, and is copied. The copied image is examined visually for streaks having a density higher than the rest of the image portion and a length of 3 mm or more with special care to the portion having been brought into contact with the separating blade. The results of evaluation of the black lines are represented by the symbols below:
AA: Not found
A: Few streaks found
B: Found but not inconvenient practically
C: Found readily, and inconvenient practically Comparative Example 16

A drum was prepared in the same manner as in Example 30 except that, to a deposition film forming apparatus shown in FIG. 6, an RF power source of frequency of 13.56 MHz and a high frequency matching box were connected, and the starting gases were decomposed by application of electromagnetic wave of 13.56 MHz. The obtained drum was evaluated for image quality at the initial-stage and after the duration test and for electrical characteristics in the same manner as in Example 30.

Table 48 shows the results of Example 30 and Comparative Example 16. From Table 48, it is understood that the method of the present invention improves the electrophotographic characteristics by modifying mainly the interface region, and the effect is remarkable particularly in the frequency range of from 51 MHz to 250 MHz.

Example 31

With a mirror-finished, degreased and cleaned aluminum cylinder as the substrate, drums were prepared according to the procedure described above by means of the manufacturing apparatus shown in FIG. 6 at an electromagnetic wave frequency in the range of from 20 to 450 MHz under the conditions shown in Table 49.

The obtained drums were evaluated for image quality of the initial stage and after the duration test in the same manner as in Example 30.

Comparative Example 17

A drum was prepared by means of a deposition film forming apparatus shown in FIGS. 8A and 8B and FIG. 9 for microwave plasma CVD employing microwave of 2.45 GHz by the procedure shown above under the conditions shown in Table 49. A photoconductive layer and a surface layer were formed on a cylindrical substrate 3115 respectively in the same manner as in Comparative Example 9. The drum prepared by microwave plasma CVD was evaluated for image quality at the initial stage and after the duration test in the same manner as in Example 30. Table 50 shows the results of Example 31 and Comparative Example 17. As understood from Table 50, the method of the present invention improves the electrophotographic characteristics by modifying mainly the interface region, and the effect is remarkable particularly in the frequency range of from 51 MHz to 250 MHz.

Example 32

With a mirror-finished, degreased and cleaned aluminum cylinder as the substrate, drums were prepared according to the procedure described above by means of the manufacturing apparatus shown in FIG. 6 at an electromagnetic wave frequency in the range of from 20 to 450 MHz by providing an interface region having a continuously changing composition between the photoconductive layer and the surface layer under the conditions shown in Table 51.

The obtained drums were evaluated for image quality of the initial stage and after the duration test in the same manner as in Example 30.

Comparative Example 18

A drum is prepared in the same manner as in Example 32 except that, to a deposition film forming apparatus shown in FIG. 6, an RF power source of frequency of 13.56 MHz and a high frequency matching box are connected, and the starting gases were decomposed by application of electromagnetic wave of 13.56 MHz. The obtained drum was evaluated for image quality at the initial stage and after the duration test and for electrical characteristics in the same manner as in Example 30.

Table 52 shows the results of Example 32 and Comparative Example 18. From Table 52, it is understood that the method of the present invention improves the electrophotographic characteristics by modifying mainly the interface region, and the effect is remarkable particularly in the frequency range of from 51 MHz to 250 MHz.

Example 33

With a mirror-finished, degreased and cleaned aluminum cylinder as the substrate, drums were prepared according to the procedure described above by means of the manufacturing apparatus shown in FIG. 6 at an electromagnetic wave frequency in the range of from 20 to 450 MHz by providing an interface region having a continuously changing composition between the photoconductive layer and the surface layer under the conditions shown in Table 53.

The obtained drums were evaluated for image quality at the initial stage and after the duration test in the same manner as in Example 30.

Comparative Example 19

A drum was prepared in the same manner as in Comparative Example 17 except that a conventional deposition film forming apparatus for microwave plasma CVD as shown in FIGS. 8A and 8B and FIG. 9 was employed under the conditions shown in Table 53. The obtained drum was evaluated for image quality at the initial stage and after the duration test in the same manner as in Example 30.

Table 54 shows the results of Example 33 and Comparative Example 19. As shown in the table, the method of the present invention improves the electrophotographic characteristics by modifying mainly the interface region, and the effect is remarkable particularly in the frequency range of from 51 MHz to 250 MHz.

Example 34

With a mirror-finished, degreased and cleaned aluminum cylinder as the substrate, a drum was prepared according to the procedure described above by means of the manufacturing apparatus shown in FIG. 6 at an electromagnetic wave frequency of 105 MHz by providing an interface region having a continuously changing composition between the photoconductive layer and the surface layer under the conditions shown in Table 55.

The obtained drum was evaluated for image quality at the initial stage and after the duration test in the same manner as in Example 30. Table 56 shows the results. As understood from the table, the drum prepared according to the present invention had excellent electrophotographic characteristics.

Example 35

With a mirror-finished, degreased and cleaned aluminum cylinder as the substrate, a drum was prepared according to the procedure described above by means of the manufacturing apparatus shown in FIG. 6 at an electromagnetic wave frequency of 105 MHz by providing an interface region having a continuously changing composition between the photoconductive layer and the surface layer under the conditions shown in Table 57.

The obtained drum was evaluated for image quality at the initial stage and after the duration test in the same manner as in Example 30. The obtained drum had excellent electrophotographic characteristics as the one obtained in Example 34.

Test examples of the present invention are shown below. The content of a mentioned atom is indicated by the ratio of the mentioned atom to the total of the atom and silicon atom.

Test Example 1

Figure 10:
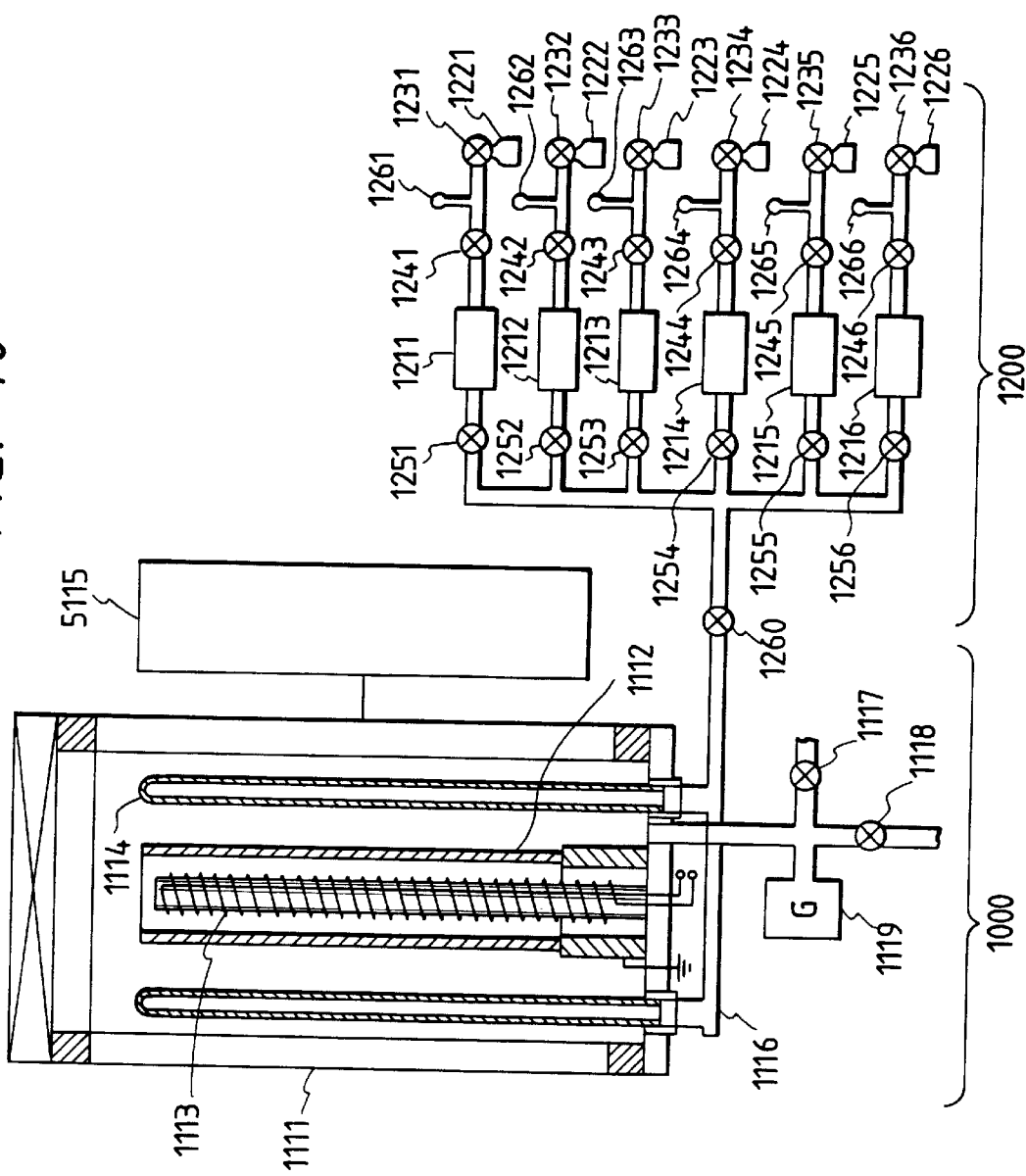
Figure 11:
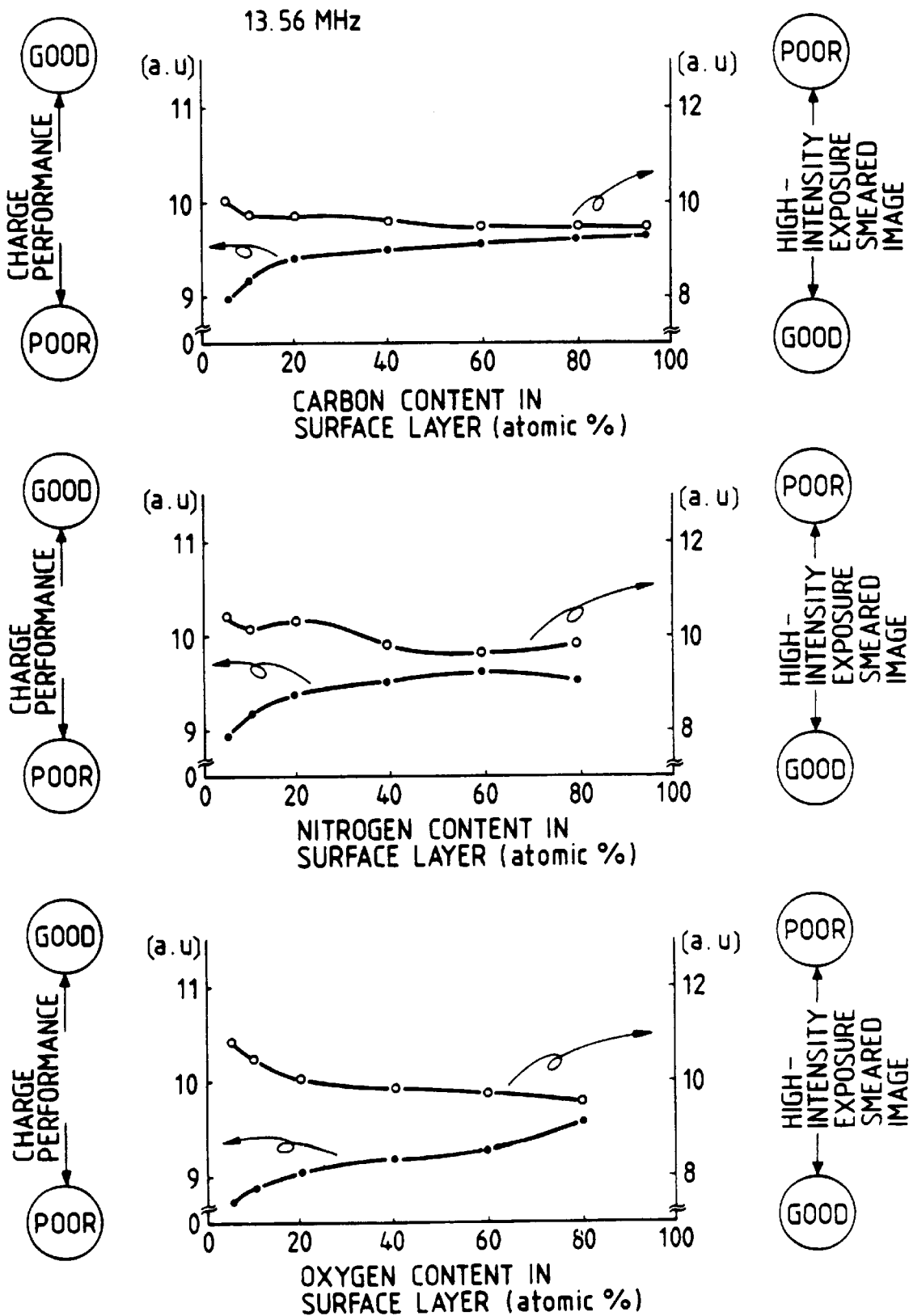
Figure 12A:
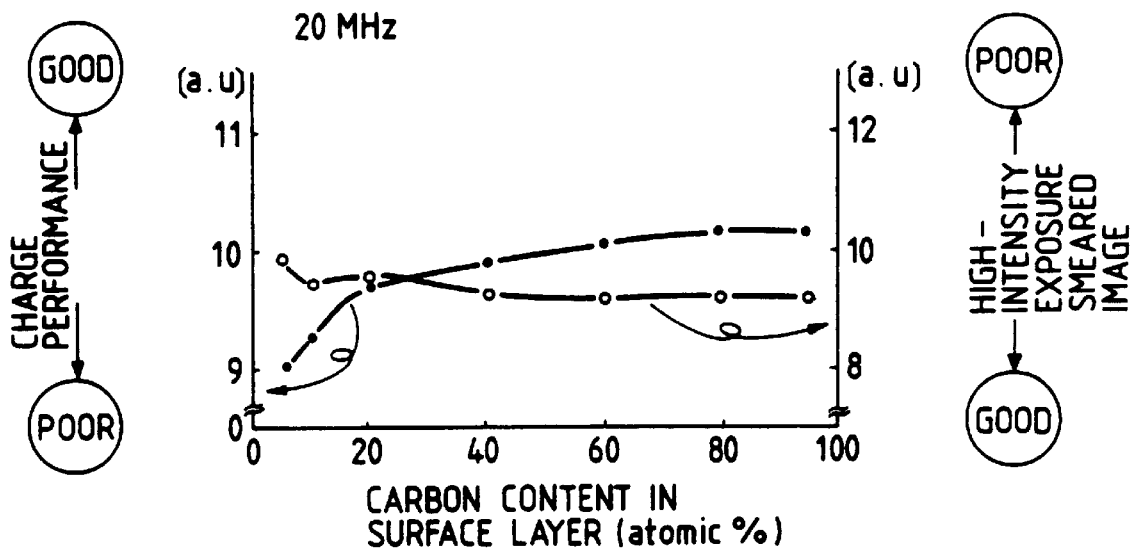
Figure 12B:
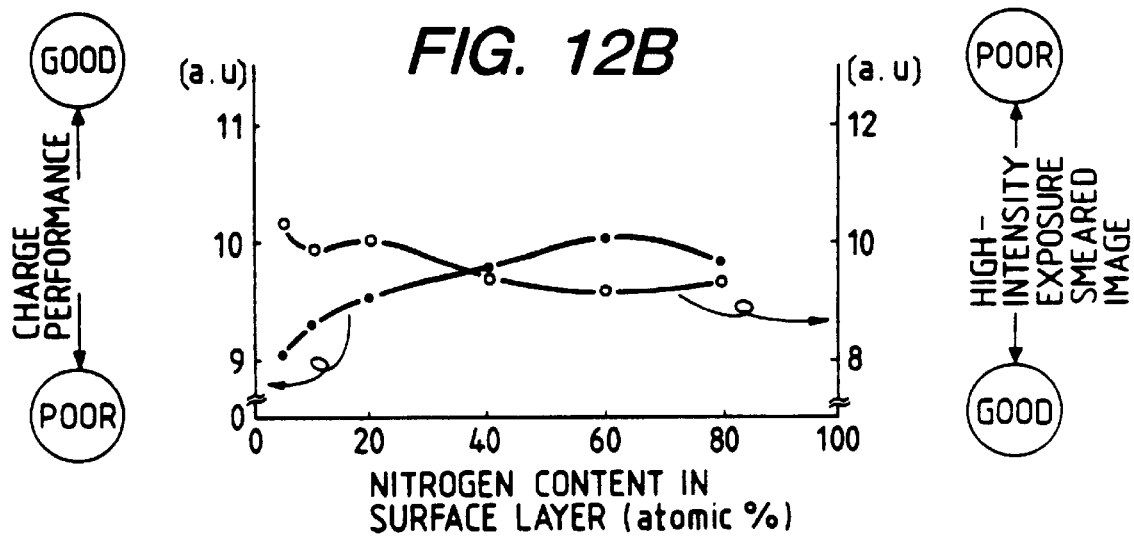
Figure 12C:
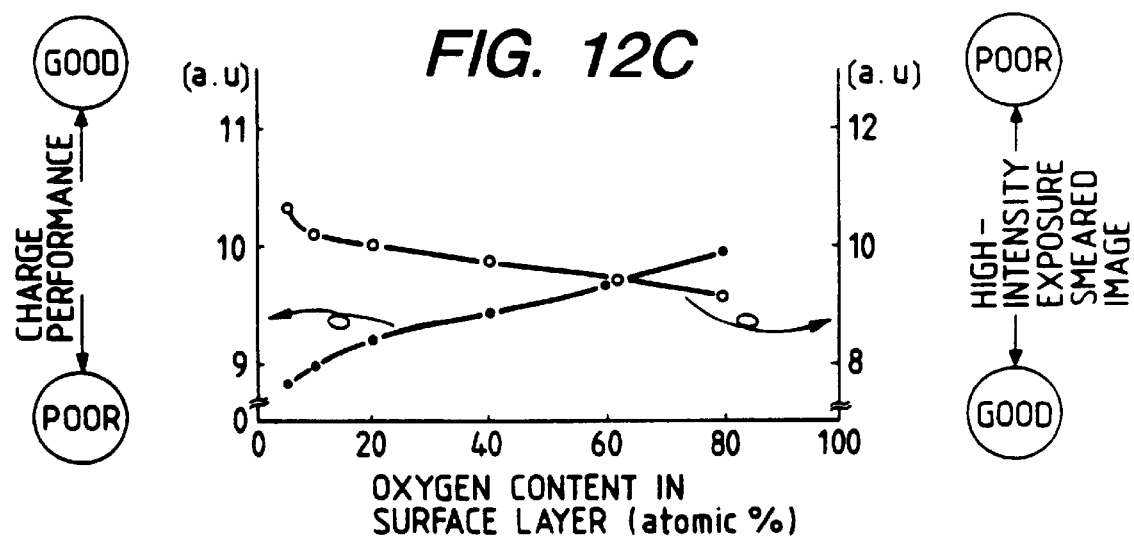
Figure 13A:
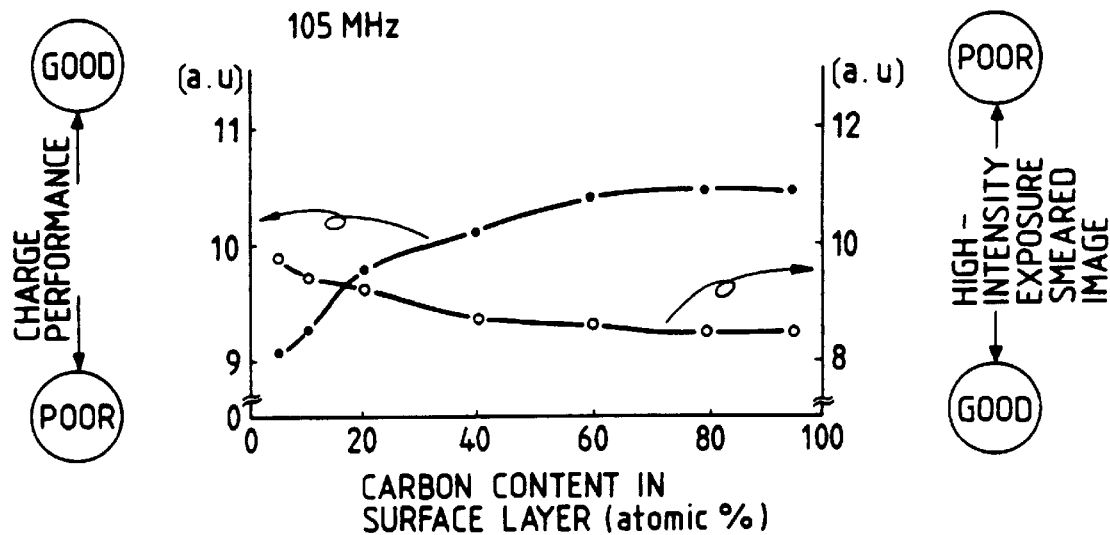
Figure 13B:
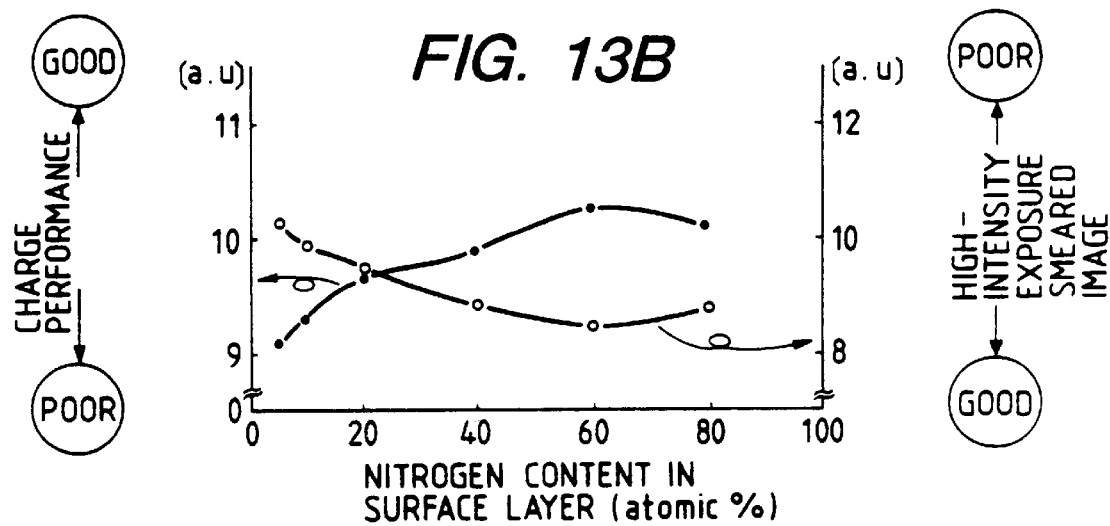
Figure 13C:
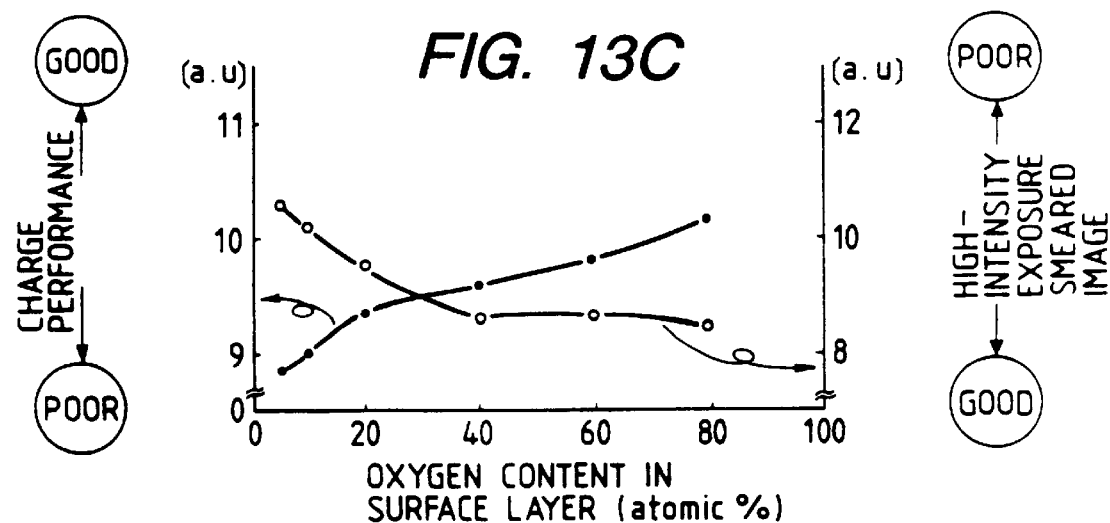
Figure 15A:
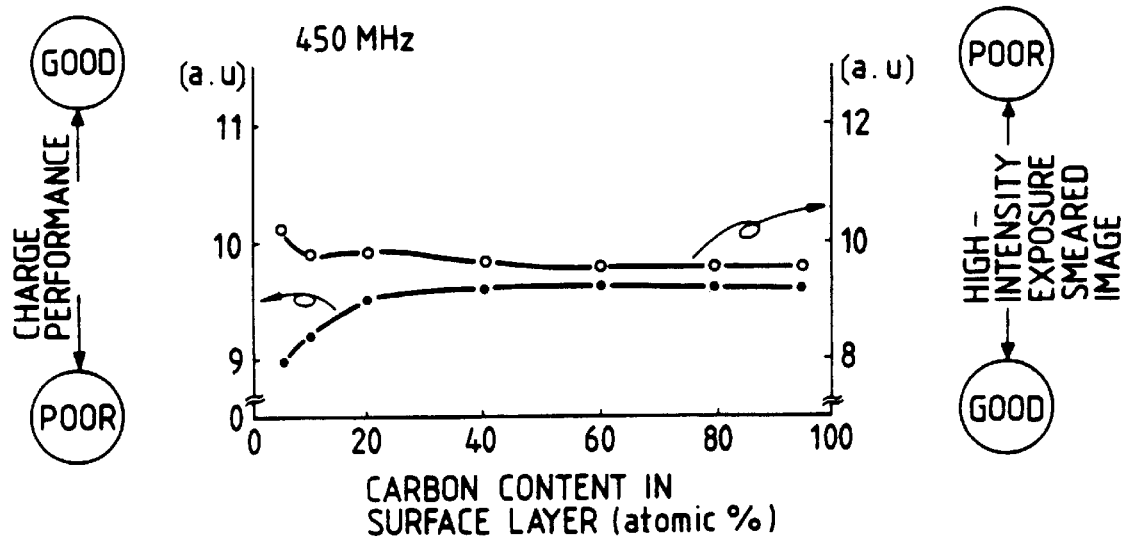
Figure 15B:
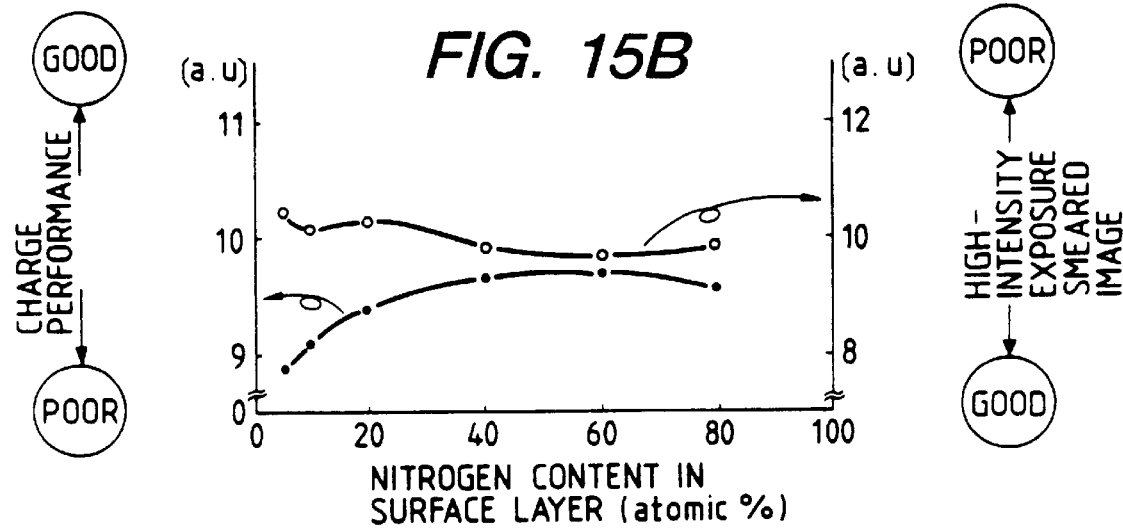
Figure 15C:
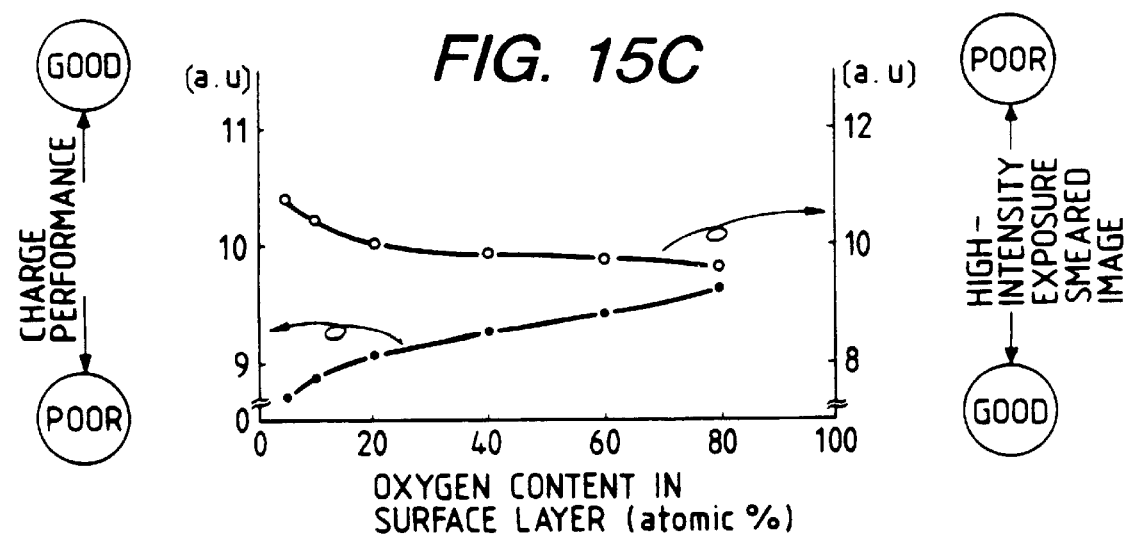
Figure 17A:
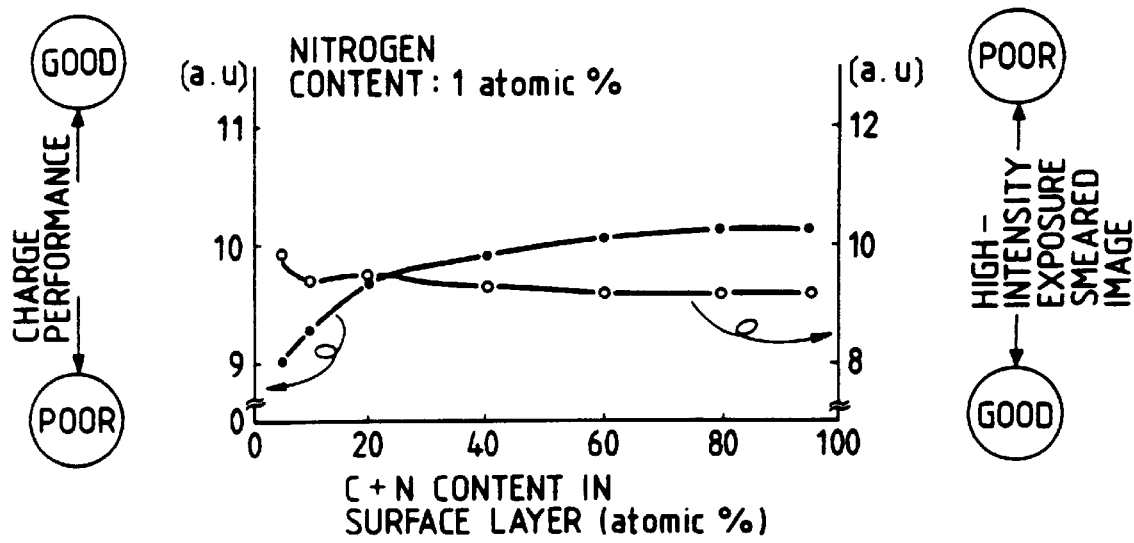
Figure 17B:
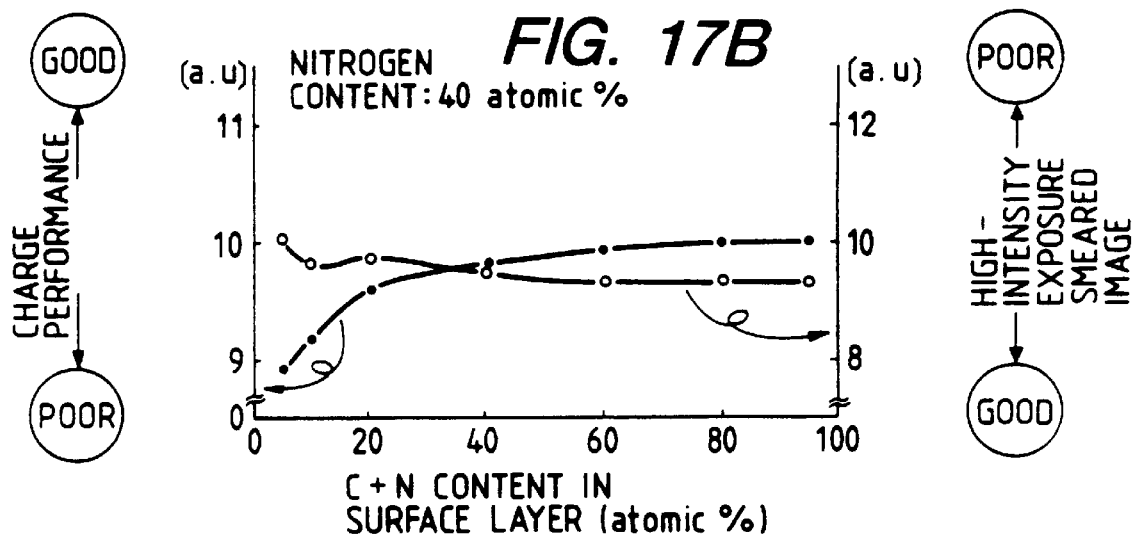
Figure 17C:
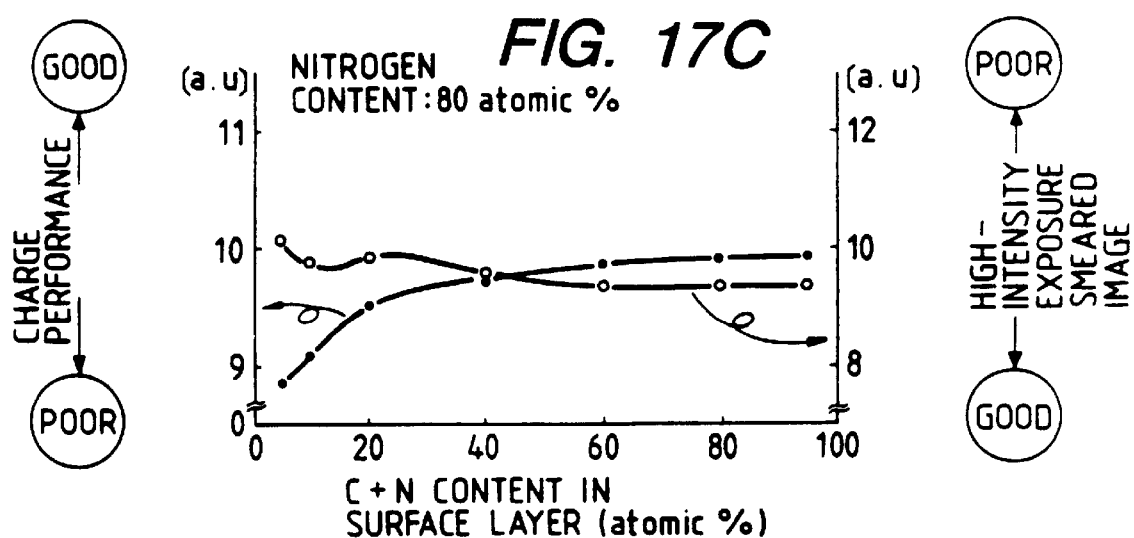

With a mirror-polished degreased and cleaned aluminum cylinder as the substrate, light-receiving members for electrophotography were prepared by means of a production apparatus as shown in FIGS. 8A and 8B and FIG. 10 under the conditions shown in Table 58 by incorporating carbon, nitrogen, or oxygen at predetermined contents thereof into the surface layer. Methane ($CH_4$), nitrogen ($N_2$), and oxygen ($O_2$) are used as the gases for introducing atoms of carbon, nitrogen, and oxygen respectively. The rates of introduction of the gases were respectively adjusted to obtain desired contents of carbon, nitrogen, and oxygen in the surface layer. The frequency of the applied electromagnetic wave was taken at five levels of 13.56 MHz, 20 MHz, 105 MHz, 450 MHz, and 2.45 GHz. The apparatus shown in FIG. 10 was used for application of electromagnetic wave of from 13.56 to 450 MHz, and the apparatus shown in FIGS. 8A and 8B was used for application of electromagnetic wave of 2.45 GHz. In the drawing, the numeral 5115 denotes a matching box.

The obtained light-receiving member was set in an electrophotographic apparatus (NP-6060 made by Canon K.K., modified for the present test), and chargeability and image smearing at intense light exposure were evaluated. The chargeability is indicated by the surface potential of the light-receiving member at the position of the developing device when the surface of the light-receiving member is charged in a dark state by corona discharge at a predetermined current intensity. Higher chargeability gives more excellent characteristics of the light-receiving member.

The image smearing at intense high exposure was evaluated as follows. Firstly, the charging current intensity is adjusted so as to give a surface potential of 400 V to the light-receiving member. Then, an original having many fine lines printed thereon is copied with halogen light irradiation at an intensity of about 2 lux·sec. The length of the unfocused state of the image at the border between an exposed area and an unexposed area of the image is measured, and relative length of broadening of the images is evaluated. The lower value indicates less image smearing at high intensity of exposure light, and is desirable.

FIGS. 11A to 15C show the changes of the chargeability and image smearing at high exposure at the respective frequencies (5 levels of 13.56 MHz, 20 MHz, 105 MHz, 450 MHz, and 2.45 GHz) as a function of the content of one kind of atoms of carbon, nitrogen, or oxygen in the surface layer. FIGS. 11A to 15C show that the chargeability and the image smearing at high exposure are both improved at the frequency of from 20 to 450 MHz of the electromagnetic wave in preparation of the light-receiving member containing carbon, nitrogen, and oxygen in the surface layer, and that the effects are sufficiently high at the contents (atomic %) of atoms of carbon, nitrogen, and oxygen of 20 to 95%, 20 to 80%, and 20 to 80%, respectively.

Test Example 2

The effects of the contents of atoms of carbon, nitrogen, and oxygen in the surface layer and the effects of frequencies of the electromagnetic wave were investigated in the same manner as in Test Example 1 except that two or more kind of atoms of carbon, nitrogen, and oxygen were incorporated into the surface layer. FIGS. 16A to 20C show the results when carbon and nitrogen were incorporated. From the results, the chargeability and image smearing at high exposure are both improved at the electromagnetic wave frequency of from 20 to 450 MHz in the cases also where carbon and nitrogen are simultaneously incorporated, and the effects are particularly remarkable at the contents (atomic %) of carbon and nitrogen of not higher than 95% and not higher than 80% respectively the sum of the contents of the both in the range of from 20 to 95%.

Similarly, in the case where carbon and oxygen are simultaneously incorporated, the effects are remarkable at the contents (atomic %) of carbon and oxygen of not higher than 95%, and not higher than 80% respectively the sum of the contents of from 20 to 95%.

In the case where oxygen and nitrogen are simultaneously incorporated, the chargeability and the image smearing at high exposure are improved at the electromagnetic frequency of from 20 to 450 MHz also, and the effect is remarkable at the contents (atomic %) of oxygen and nitrogen of not higher than 80% respectively with the sum of the contents of both elements of from 20 to 95%.

Further, in the case where carbon, nitrogen, and oxygen are simultaneously incorporated, the chargeability and the image smearing at high exposure are improved at the electromagnetic frequency of from 20 to 450 MHz, and in particular the effect is remarkable at the contents (atomic %) of carbon, nitrogen, and oxygen not higher than 95%, not higher than 80%, and not higher than 80%, respectively and the sum of the contents of from 20 to 95%.

From the results of Test Examples 1 and 2, a light-receiving member having a surface layer comprising at least one kind of elements of carbon, nitrogen, and oxygen is improved in chargeability and image smearing at high exposure, when the light receiving member is prepared by decomposition of the starting gases by electromagnetic wave of frequency of 20 to 450 MHz, and in particular at the content (atomic %) of carbon, nitrogen, and oxygen of not more than 95%, not more than 80%, and not more than 80% respectively with the sum of the contents in the range of from 20% to 90%.

Example 36

With a mirror-finished, degreased and cleaned aluminum cylinder as the substrate, electrophotographic light-receiving members were prepared according to the procedure described before by means of the manufacturing apparatus shown in FIG. 6 at an electromagnetic wave frequency in the range of from 20 to 450 MHz under the conditions shown in Table 59. The feed rate of methane was controlled to give carbon content of 60 atomic % in the surface layer. This light-receiving member was set in an electrophotographic apparatus (NP6060, manufactured by Canon K.K. having been modified for the present test purpose) and images were formed by a usual electrophotographic process. The images at the initial stage were evaluated for the items of white dots, image smearing, ghost, black lines, chargeability, and image smearing at high exposure. Further, a duration test of 4,000,000 sheets of continuous image formation (hereinafter simply referred to as a "duration test") was conducted, and the images at the end of the duration test were evaluated for the above items.

White dots, image smearing, ghost, and black lines were evaluated in the manner as described before.
Chargeability The chargeability was evaluated in the same manner as in Test Example 1, and the results are indicated by the symbols below:
 AA: Excellent
 A: Good
 B: Fair in practical use
 C: Poor in practical use
Image smearing at high exposure
 Evaluation was conducted in the same manner as in Test Example 1, and the results are indicated by the symbols below:
 AA: Excellent
 A: Good
 B: Fair in practical use
 C: Poor in practical use Comparative Example 20

A light-receiving member was prepared in the same manner as in Example 36 except that, to a deposition film forming apparatus shown in FIG. 6, a high frequency power source of frequency of 13.56 MHz and a high frequency matching box were connected, and the starting gases were decomposed by application of electromagnetic wave of 13.56 MHz. The obtained light-receiving member was evaluated for image quality at the initial-stage and after the duration test the same manner as in Example 36.

Table 60 shows the results of Example 36 and Comparative Example 20. From the table, it is understood that the method of the present invention improves the electrophotographic characteristics mainly by modifying the interface region.

Example 37

With a mirror-finished, degreased and cleaned aluminum cylinder as the substrate, graphic light-receiving members were prepared according to the procedure described before by means of the manufacturing apparatus shown in FIG. 6 at an electromagnetic wave frequency in the range of from 20 to 450 MHz under the conditions shown in Table 61. The feed rate of ammonia was controlled to give a nitrogen content of 50 atomic % in the surface layer. The obtained light-receiving members were evaluated for image quality at the initial stage and after the duration test in the same manner as in Example 36.

Comparative Example 21

A light-receiving member was prepared by means of a deposition film forming apparatus shown in FIGS. 8A and 8B and FIG. 9 for microwave plasma CVD employing microwave of 2.45 GHz by the procedure as in Comparative Example 9 under the conditions shown in Table 61. After the arrangement for the film formation is ready, a photoconductive layer and a surface layer were formed on a cylindrical substrate 3115 respectively in the same manner as in Comparative Example 9.

The drum prepared by microwave plasma CVD was evaluated for image quality at the initial stage and after the duration test in the same manner as in Example 36. Table 62 shows the results of Example 37 and Comparative Example 21. As understood from Table 62, the method of the present invention improves the electrophotographic characteristics by modifying mainly the interface region.

Example 38

With a mirror-finished, degreased and cleaned aluminum cylinder as the substrate, electrophotographic light-receiving members were prepared according to the procedure described before by means of the manufacturing apparatus shown in FIG. 6 at an electromagnetic wave frequency in the range of from 20 to 450 MHz by providing an interface region having a continuously changing composition between the photoconductive layer and the surface layer under the conditions shown in Table 63. The feed rate of oxygen was controlled to give an oxygen content of 40 atomic % in the surface layer. The obtained light-receiving members were evaluated for image quality at the initial stage and after the duration test in the same manner as in Example 36.

Comparative Example 22

A light-receiving member was prepared in the same manner as in Example 38 except that, to a deposition film forming apparatus shown in FIG. 10, a high frequency power source of frequency of 13.56 MHz and a high frequency matching box were connected, and the starting gases were decomposed by application of electromagnetic wave of 13.56 MHz. The obtained light-receiving member was evaluated for image quality at the initial-stage and after the duration test the same manner as in Example 36.

Table 64 shows the results of Example 38 and Comparative Example 22. As understood from the table, the method of the present invention improves the electrophotographic characteristics mainly by modifying the interface region.

Example 39

With a mirror-finished, degreased and cleaned aluminum cylinder as the substrate, electrophotographic light-receiving members were prepared according to the procedure described before by means of the manufacturing apparatus shown in FIG. 6 at an electromagnetic wave frequency in the range of from 20 to 450 MHz by providing an interface region having a continuously changing composition between the photoconductive layer and the surface layer under the conditions shown in Table 65. The feed rates of methane, ammonia, and carbon monoxide were controlled to give the contents of atoms of carbon, nitrogen, and oxygen of 40 atomic %, 20 atomic %, and 10 atomic % respectively in the surface layer. The resulting light-receiving members were evaluated for image quality at the initial stage and after the duration test in the same manner as in Example 36.

Comparative Example 23

A light-receiving member was prepared in the same manner as in Comparative Example 21 by using a deposition film forming apparatus for microwave plasma CVD as shown in FIGS. 8A and 8B and FIG. 9 under the conditions shown in Table 65. The obtained light-receiving member was evaluated for image quality at the initial stage and after the duration test in the same manner as in Example 36.

Table 66 shows the results of Example 39 and Comparative Example 23. As shown in the table, the method of the present invention improves the electrophotographic characteristics mainly by modifying the interface region.

Example 40

With a mirror-finished, degreased and cleaned aluminum cylinder as the substrate, an electrophotographic light-receiving member was prepared according to the procedure described before by means of the manufacturing apparatus shown in FIG. 6 at an electromagnetic wave frequency of 105 MHz by providing an interface region having a continuously changing composition between the photoconductive layer and the surface layer under the conditions shown in Table 67. The feed rate of methane was controlled to give a carbon content of 70 atomic % in the surface layer. This light-receiving member was evaluated for image quality at the initial stage and after the duration test in the same manner as in Example 36.

Comparative Example 24

A light-receiving member was prepared in the same manner as in Example 40 except that the carbon content in the surface layer was controlled to be at 10 atomic %. The obtained light-receiving member was evaluated in the same manner as in Example 36.

Table 68 shows the results of Example 40 and Comparative Example 24. From Table 68, it was confirmed that the method of the present invention improves the electrophotographic characteristics of the light receiving member mainly by improving the interface region, and in particular the effects of improvement of chargeability, photosensitivity, image smearing at high exposure, etc. are remarkable in the light-receiving member having a surface layer comprising at least one kind of elements of carbon, nitrogen, and oxygen at contents (atomic %) of not higher than 95%, not higher than 80%, and not higher than 80% respectively with the sum of the contents of atoms of carbon, nitrogen, and oxygen being in the range of from 20 to 95%.

Example 41

With a mirror-finished, degreased and cleaned aluminum cylinder as the substrate, an electrophotographic light-receiving member was prepared according to the procedure described before by means of the manufacturing apparatus shown in FIG. 6 at an electromagnetic wave frequency of 105 MHz by providing an interface region having a continuously changing composition between the photoconductive layer and the surface layer under the conditions shown in Table 69. The feed rates of methane, ammonia, and carbon monoxide were controlled to give contents (atomic %) of atoms of carbon, nitrogen, and oxygen of 30 atomic %, 20 atomic %, and 20 atomic % in the surface layer. The obtained light-receiving member was evaluated for image quality at the initial stage and after the duration test in the same manner as in Example 36.

Comparative Example 25

A light-receiving member was prepared in the same manner as in Example 41 except that the contents (atomic %) of atoms of carbon, nitrogen, and oxygen in the surface layer were controlled to be at 10 atomic %, 2 atomic %, and 2 atomic %, respectively. The obtained light-receiving member was evaluated in the same manner as in Example 36.

Table 70 shows the results of Example 41 and Comparative Example 25. From Table 70, it was confirmed that the method of the present invention improves the electrophotographic characteristics of the light-receiving member mainly by modifying the interface region, and in particular the effects of improvement of chargeability, photosensitivity, image smearing at high exposure, etc. are remarkable in the light-receiving member having a surface layer comprising at least one kind of elements of carbon, nitrogen, and oxygen at contents (atomic %) of not higher than 95%, not higher than 80%, and not higher than 80% respectively with the sum of the contents of atoms of carbon, nitrogen, and oxygen being in the range of from 20 to 95%.

The effects of application of a bias voltage in the present invention is described in more detail by reference to Examples without limiting the invention.

Example 42

With a mirror-finished, degreased and cleaned aluminum cylinder as the substrate, electrophotographic light-receiving members (hereinafter referred to as "drums") were prepared according to the procedure described before by means of a manufacturing apparatus shown in FIG. 7 at an electromagnetic wave frequency in the range of from 20 to 450 MHz under the conditions shown in Table 71 under application of a bias voltage ($V_0$) in the range of from 50 V to 200 V. Here, the bias voltage ($V_0$) means the difference between the bias voltage ($V_1$) applied to the cathode and the self-bias voltage ($V_2$) at the cathode without application of bias voltage (the difference of the voltage being hereinafter referred to simply as "bias voltage ($V_0$)").

In this example, drums had a blocking layer and a photoconductive layer. In formation of the blocking layer and the photoconductive layer, the electric discharge was once interrupted when the blocking layer was completed, and then the discharge was again started to form the photoconductive layer, thereby forming an interface between the two layers. DC voltage, which is substantially constant during application time, was employed as the bias voltage.

The prepared drum was set in an electrophotographic apparatus (NP6060, manufactured by Canon K.K., roller charging type: contact type, copying speed: 60 sheets per minute, having been modified for the present test purpose), and images were formed by a usual electrophotographic process. The images at the initial stage were evaluated for the items of white dots, image smearing, ghost, blank memory, and chargeability. Further, a duration test of 4,000,000 sheets of continuous image formation (hereinafter simply referred to as a "duration test") was conducted, and the images at the end of the duration test were evaluated for the above items. The duration test was conducted under severer conditions than the duration tests described in the foregoing Examples and Comparative Examples.

White dots, image smearing, ghost, and blank memory were evaluated as described before. The chargeability was evaluated as follows.

Chargeability

The obtained drum is set in an experiment apparatus, and is charged by corona discharge by application of high voltage of +6 KV, and the surface potential of the dark area of the drum is measured by a surface potential meter. The evaluation results are shown by the symbols below:

AA: Excellent
A: Good
B: Fair in practical use
C: Poor in practical use

Example 43

Drums were prepared in the same manner as in Example 42 except that the bias voltage ($V_0$) was changed to 0 V (no bias voltage application) or 250 V for the purpose of comparison of the effects of the bias voltage. The obtained drums were evaluated for image quality at the initial stage and after the duration test in the same manner as in Example 42.

The results of Examples 42 and 43 are shown in Tables 72 to 77. As understood from the tables, more satisfactory results were obtained in the cases where the applied bias voltage ($V_0$) was within the range of $0 < V_0 \leq 200$ V.

Example 44

With the same mirror-finished, degreased and cleaned aluminum cylindrical substrate as the one in Example 42, drums were prepared according to the procedure described before by means of the manufacturing apparatus shown in FIG. 7 at an electromagnetic wave frequency in the range of from 20 to 450 MHz under the conditions shown in Table 78 under application of a bias voltage ($V_0$) in the range of from 50 V to 200 V. In this example, an interface region having a continuously changing composition was formed between the blocking layer and the photoconductive layer. DC voltage, which is substantially constant during application time, was employed as the bias voltage.

The prepared drums were evaluated for image quality at the initial stage and after the duration test in the same manner as in Example 42.

Comparative Example 26

Drums were prepared in the same manner as in Example 44 except that an RF power source of 13.56 MHz and a high frequency matching box were connected to the deposition film forming apparatus shown in FIG. 7, and the starting gases were decomposed by application of electromagnetic wave of 13.56 MHz. The obtained drum was evaluated for image quality at the initial stage and after the duration test in the same manner as in Example 42.

The results of Example 44 and Comparative Example 26 are shown in Tables 79 to 84. As understood from these tables, larger improvement in electrophotographic properties was achieved in the cases where a frequency employed was in the range of from 20 to 450 MHz and a bias voltage ($V_0$) applied was in the range of $0<V_0\leq 200$ V, mainly by modification of the interface region. In particular, the effects were more remarkable in the frequency range of from 51 to 250 MHz.

Example 45

With the same mirror-finished, degreased and cleaned aluminum cylindrical substrate as the one in Example 42, drums were prepared according to the procedure described before by means of the manufacturing apparatus shown in FIG. 7 at an electromagnetic wave frequency in the range of from 20 to 450 MHz under application of a bias voltage ($V_0$) in the range of from 50 to 200 V under the conditions shown in Table 85. In this example, an interface between the blocking layer and the photoconductive layer was formed by interrupting once the electric discharge on completion of the blocking layer and then restarting the discharge to form photoconductive layer. DC voltage, which is substantially constant during application time, was employed as the bias voltage.

The prepared drums were evaluated for image quality at the initial stage and after the duration test in the same manner as in Example 42.

Comparative Example 27

For comparing the effects of frequency, drums were prepared by means of a deposition film forming apparatus shown in FIGS. 8A and 8B and FIG. 9 for microwave plasma CVD employing microwave of 2.45 GHz by a procedure similar to that as described above under the conditions shown in Table 85.

The prepared drums by the microwave plasma CVD process were evaluated for image quality at the initial stage and after the duration test.

The results of Example 45 and Comparative Example 27 are shown in Tables 86 to 91. As understood from these tables, the method of the present invention improves the electrophotographic properties mainly by modification of the interface region. In particular, the effects were more remarkable in the frequency range of from 51 to 250 MHz.

Example 46

With the same mirror-finished, degreased and cleaned aluminum cylindrical substrate as the one in Example 42, a drum was prepared according to the procedure described before by means of the manufacturing apparatus shown in FIG. 7 under the conditions shown in Table 92. In this example, an interface region having a continuously changing composition was provided between the blocking layer and the photoconductive layer. DC voltage, which is substantially constant during application time, was employed as the bias voltage.

The prepared drum was evaluated for image quality at the initial stage and after the duration test in the same manner as in Example 42.

Example 47

A drum was prepared in the same manner as in Example 46 except that the interface between the blocking layer and the photoconductive layer was formed by interrupting the electrical discharge on completion of the blocking layer formation and restarting the discharge to form the photoconductive layer.

The prepared drum was evaluated for image quality at the initial stage and after the duration test in the same manner as in Example 42.

Example 48

A drum was prepared in the same manner as in Example 46 except for using the conditions shown in Table 93.

The prepared drum was evaluated for image quality at the initial stage and after the duration test in the same manner as in Example 42.

Example 49

A drum was prepared in the same manner as in Example 48 except that the interface between the blocking layer and the photoconductive layer was formed by interrupting the electrical discharge on completion of the blocking layer formation and restarting the discharge to form the photoconductive layer.

The prepared drum was evaluated for image quality at the initial stage and after the duration test in the same manner as in Example 42.

The results of Examples 46 to 49 are shown in Table 94. As understood from the table, the method of the present invention provides excellent electrophotographic properties mainly by improvement in the interfacial characteristics. In the present invention, the interface between the blocking layer and the photoconductive layer was formed effectively to improve the interfacial characteristics either by interrupting the discharge once on completion of the blocking layer formation and restarting the discharge or by forming a region having a continuously changing composition.

Example 50

With the same mirror-finished, degreased and cleaned aluminum cylindrical substrate as the one in Example 42, a drum was prepared according to the procedure described before by means of the manufacturing apparatus shown in FIG. 7 under the conditions shown in Table 95. In this example, an interface region having a continuously changing composition was provided between the blocking layer and the photoconductive layer. As the bias voltage, an AC voltage of 60 Hz and $V_{p-p}$100 V and a DC voltage of 50 V were applied in superposition. The prepared drum was evaluated for image quality at the initial stage and after the duration test in the same manner as in Example 42.

Example 51

With the same mirror-finished, degreased and cleaned aluminum cylindrical substrate as the one in Example 42, a drum was prepared according to the procedure described before by means of the manufacturing apparatus shown in FIG. 7 under the conditions shown in Table 96. In this example, an interface region having a continuously changing composition was provided between the blocking layer and the photoconductive layer. As the bias voltage, an AC voltage of 100 Hz and $V_{p-p}$100 V and a DC voltage of 50 V were applied in superposition. The prepared drum was evaluated for image quality at the initial stage and after the duration test in the same manner as in Example 42.

Table 97 shows the results of Examples 50 and 51. As understood from the table, the present invention improves the interfacial characteristics, thereby giving excellent electrophotographic characteristics.

Example 52

With the same mirror-finished, degreased and cleaned aluminum cylindrical substrate as the one in Example 42, drums were prepared according to the procedure described before by means of the manufacturing apparatus shown in FIG. 7 at an electromagnetic wave frequency in the range of from 20 to 450 MHz under application of a bias voltage ($V_0$) in the range of from 50 V to 200 V under the conditions shown in Table 98. In this example, the drum had a photoconductive layer and a surface layer. An interface between the photoconductive layer and the surface layer was formed by interrupting once the electric discharge on completion of the photoconductive layer and then restarting the discharge to form the surface layer. DC voltage, which is substantially constant during application time, was employed as the bias voltage.

The prepared drums were evaluated for white dots, image smearing, and ghost of the image in the same manner as in Example 42, and also for black lines and sensitivity, at the initial stage and after the duration test. The method of evaluation of the black lines was already described. The sensitivity was evaluated as below.

Sensitivity

The drum is electrically charged to have a predetermined dark-area surface potential, and immediately a light image is projected thereon by use of light of a xenon lamp as a light source through a filter to intercept the light of wavelength of shorter than 550 nm. The light-area surface potential is brought to a predetermined value by light projection while the light-area potential is being measured with a surface potential meter. The sensitivity is represented by the quantity of light to bring the light-area surface potential to the predetermined value. The evaluation results of the sensitivity are shown by the symbols below:

AA: Excellent
A: Good
B: Fair in practical use
C: Poor in practical use

Example 53

Drums were prepared in the same manner as in Example 52 except that the bias voltage ($V_0$) was changed to 0 V (no bias voltage application) or 250 V for the purpose of comparison of the effects of the bias voltage. The obtained drums were evaluated for image quality at the initial stage and after the duration test in the same manner as in Example 52.

The results of Examples 52 and 53 are shown in Tables 99 to 104. As understood from the tables, satisfactory results were obtained in the cases where the bias voltage ($V_0$) was within the range of $0<V_0 \leq 200$ V. On the surface of the drum prepared by application of bias voltage ($V_0$) of 250 V, spherical projections were found much more in number than those on the surface of the drums prepared at the bias voltage ($V_0$) not higher than 200 V by observation with a microscope, and some of the projections were observed to cause white dots on the image.

Example 54

With the same mirror-finished, degreased and cleaned aluminum cylindrical substrate as the one in Example 42, drums were prepared according to the procedure described before by means of the manufacturing apparatus shown in FIG. 7 at an electromagnetic wave frequency in the range of from 20 to 450 MHz under application of a bias voltage ($V_0$) in the range of from 50 V to 200 V under the conditions shown in Table 105. In this Example, an interface region having a continuously changing composition was provided between the photoconductive layer and the surface layer. DC voltage, which is substantially constant during application time, was employed as the bias voltage.

The prepared drum was evaluated at the initial stage and after the duration test in the same manner as in Example 52.

Comparative Example 28

For the purpose of studying the effects of frequency, a drum was prepared in the same manner as in Example 54 except that an RF power source of 13.56 MHz and a high frequency matching box were connected to the deposition film forming apparatus shown in FIG. 7, and the starting gases were decomposed by application of electromagnetic wave of 13.56 MHz. The obtained drum was evaluated for image quality at the initial stage and after the duration test in the same manner as in Example 52.

The results of Example 54 and Comparative Example 28 are shown in Tables 106 to 111. As understood from these tables, the electrophotographic properties were improved, in the cases where a frequency employed was in the range of from 20 to 450 MHz and a bias voltage ($V_0$) applied was in the range of $0<V_0 \leq 200$ V, mainly by modification of the interface region. In particular, the effects were more remarkable in the frequency range of from 51 to 250 MHz.

Example 55

With the same mirror-finished, degreased and cleaned aluminum cylindrical substrate as the one in Example 42, drums were prepared according to the procedure described before by means of the manufacturing apparatus shown in FIG. 7 at an electromagnetic wave frequency in the range of from 20 to 450 MHz under application of a bias voltage ($V_0$) in the range of from 50 V to 200 V under the conditions shown in Table 112. In this example, an interface between the photoconductive layer and the surface layer was formed by interrupting once the electric discharge on completion of the photoconductive layer and then restarting the discharge to form the surface layer. DC voltage, which is substantially constant during application time, was employed as the bias voltage.

The prepared drums were evaluated at the initial stage and after the duration test in the same manner as in Example 52.

Comparative Example 29

For the purpose of studying the effects of the frequency, a drum was prepared by means of a deposition film forming apparatus shown in FIGS. 8A and 8B and FIG. 9 for microwave plasma CVD employing microwave of 2.45 GHz by a procedure similar to that in Comparative Example 27 under the conditions shown in Table 112.

The results of Example 55 and Comparative Example 29 are shown in Tables 113 to 118. As understood from these tables, the method of the present invention improves the electrophotographic properties mainly by modification of the interface region. In particular, the effects were more remarkable in the frequency range of from 51 to 250 MHz.

Example 56

With the same mirror-finished, degreased and cleaned aluminum cylindrical substrate as the one in Example 42, a drum was prepared according to the procedure described before by means of the manufacturing apparatus shown in FIG. 7 under the conditions shown in Table 119. In this Example, an interface region having the continuously changing composition was provided between the photoconductive layer and the surface layer. DC voltage, which is substantially constant during application time, was employed as the bias voltage.

The prepared drum was evaluated for image quality at the initial stage and after the duration test in the same manner as in Example 52.

Example 57

A drum was prepared in the same manner as in Example 56 except that the interface between the photoconductive layer and the surface layer was formed by interrupting once the electrical discharge on completion of the photoconductive layer formation and restarting the discharge to form the surface layer.

The prepared drum was evaluated at the initial stage and after the duration test in the same manner as in Example 52.

Example 58

A drum was prepared in the same manner as in Example 56 except for using the conditions shown in Table 120.

The prepared drum was evaluated at the initial stage and after the duration test in the same manner as in Example 52.

Example 59

A drum was prepared in the same manner as in Example 58 except that the interface between the photoconductive layer and the surface layer was formed by interrupting once the electrical discharge on completion of the photoconductive layer formation and restarting the discharge to form the surface layer.

The prepared drum was evaluated at the initial stage and after the duration test in the same manner as in Example 52.

The results of Examples 56 to 59 are shown in Tables 121. As understood from the table, the method of the present invention provides excellent electrophotographic properties mainly by improvement in the interfacial characteristics. Further, in the present invention, the interface between the photoconductive layer and the surface layer was formed effectively to improve the Interfacial characteristics either by interrupting the discharge once at the completion of the blocking layer formation and restarting the discharge or by forming a region having a continuously changing composition.

Example 60

With the same mirror-finished, degreased and cleaned aluminum cylindrical substrate as the one in Example 42, a drum was prepared according to the procedure described before by means of the manufacturing apparatus shown in FIG. 7 under the conditions shown in Table 122. In this Example, an interface region having a continuously changing composition was provided between the photoconductive layer and the surface layer. As the bias voltage, an AC voltage of 60 Hz and $V_{p-p}$100 V and a DC voltage of 50 V were applied in superposition. The prepared drum was evaluated for image quality at the initial stage and after the duration test in the same manner as in Example 52.

Example 61

With the same mirror-finished, degreased and cleaned aluminum cylindrical substrate as the one in Example 42, a drum was prepared according to the procedure described before by means of the manufacturing apparatus shown in FIG. 7 under the conditions shown in Table 123. In this Example, an interface region having a continuously changing composition was provided between the photoconductive layer and the surface layer. As the bias voltage, an AC voltage of 100 Hz and $V_{p-p}$100 V and a DC voltage of 50 V were applied in superposition. The prepared drum was evaluated for image quality at the initial stage and after the duration test in the same manner as in Example 52.

Table 124 shows the results of Examples 60 and 61. As understood from the table, the present invention mainly improves the interfacial characteristics to give excellent electrophotographic characteristics.

Example 62

With the same mirror-finished, degreased and cleaned aluminum cylindrical substrate as the one in Example 42, ten lots of drums were prepared by the apparatus shown in FIG. 7 according to the procedure described before under the conditions shown in Table 125. In this Example, an interface region having a continuously changing composition was provided between the photoconductive layer and the surface layer. DC voltage, which is substantially constant during application time, was employed as the bias voltage.

The prepared 10 lots of drums were respectively referred to as Samples 1 to 10, and were evaluated respectively for image quality at the initial stage and after the duration test in the same manner as in Example 52.

Example 63

Ten lots of drums were prepared, to study the effect of the bias voltage on the reproducibility of the electrophotographic characteristics, in the same manner as in Example 62 except that the bias voltage ($V_0$) was zero V. The obtained drums were referred to as Samples 11 to 20 respectively, and the samples were respectively evaluated for image quality at the initial stage and after the duration test in the same manner as in Example 52.

Tables 126 and 127 show the results of Examples 62 and 63. As understood from these tables, the method of the present invention improves more the electrophotographic characteristics mainly by modification of the interface region, and the reproducibility of the characteristics is also improved.

Example 64

With the same mirror-finished, degreased and cleaned aluminum cylindrical substrate as the one in Example 42, drums were prepared according to the procedure described before by means of the manufacturing apparatus shown in FIG. 7 at an electromagnetic wave frequency in the range of from 20 to 450 MHz under application of a bias voltage ($V_0$) in the range of from 50 V to 200 V under the conditions shown in Table 128.

In this example, the drums had a charge-transporting layer and a charge-generating layer. An interface between the charge-transporting layer and the charge-generating layer was formed by interrupting once the electric discharge on completion of the charge-transporting layer and then restarting the discharge to form the charge-generating layer. As the bias voltage, DC voltage was applied which was substantially constant during application time.

The prepared drums were evaluated at the initial stage and after the duration test for white dots, image smearing, ghost, and blank memory in the same manner as in Example 42, and for black lines and sensitivity in the same manner as in Example 52, and for potential shift, which is an electrical characteristic of a light-receiving member in an ordinary electrophotography process, in a manner as described before.

Example 65

Drums were prepared in the same manner as in Example 64 except that the bias voltage ($V_0$) was changed to 0 V (no bias voltage application) or 250 V for the purpose of studying of the effects of the bias voltage. The obtained drums were evaluated for image quality at the initial stage and after the duration test in the same manner as in Example 64.

The results of Examples 64 and 65 are shown in Tables 129 to 136. As understood from the tables, more satisfactory results were obtained in the cases where the bias voltage ($V_0$) was within the range of $0<V_0 \leq 200$ V. On the surface of the drum prepared by application of bias voltage ($V_0$) of 250 V, spherical projections were found much more in number than those on the surface of the drums prepared at the bias voltage ($V_0$) not higher than 200 V by observation with a microscope, and some of the projections were observed to cause white dots on the image.

Example 66

With the same mirror-finished, degreased and cleaned aluminum cylindrical substrate as the one in Example 42, drums were prepared according to the procedure described before by means of the manufacturing apparatus shown in FIG. 7 at an electromagnetic wave frequency in the range of from 20 to 450 MHz under application of a bias voltage ($V_0$) in the range of from 50 V to 200 V under the conditions shown in Table 137. In this Example, an interface region having a continuously changing composition was provided between the charge-transporting layer and the charge-generating layer. As the bias voltage, a DC voltage was applied which was substantially constant during application time.

The prepared drum was evaluated at the initial stage and after the duration test in the same manner as in Example 64.

Comparative Example 30

For the purpose of studying the effects of the frequency, a drum was prepared in the same manner as in Example 66 except that an RF power source of 13.56 MHz and a high frequency matching box were connected to the deposition film forming apparatus shown in FIG. 7, and the starting gases were decomposed by application of electromagnetic wave of 13.56 MHz. The obtained drum was evaluated the same manner as in Example 64.

The results of Example 66 and Comparative Example 30 are shown in Tables 138 to 145. As understood from these tables, the electrophotographic properties were improved in the cases where a frequency employed was in the range of from 20 to 450 MHz and a bias voltage ($V_0$) applied was in the range of $0<V_0$ 200 V, mainly by modification of the interface region. In particular, the effects were remarkable in the frequency range of from 51 to 250 MHz.

Example 67

With the same mirror-finished, degreased and cleaned aluminum cylindrical substrate as the one in Example 42, drums were prepared according to the procedure described before by means of the manufacturing apparatus shown in FIG. 7 at an electromagnetic wave frequency in the range of from 20 to 450 MHz under application of a bias voltage ($V_0$) in the range of from 50 V to 200 V under the conditions shown in Table 146. In this example, an interface between the charge-transporting layer and the charge-generating layer was formed by interrupting once the electric discharge on completion of the charge-transporintg layer and then restarting the discharge to form the charge-generating layer. DC voltage, which is substantially constant during application time, was employed as the bias voltage.

The prepared drums were evaluated at the initial stage and after the duration test in the same manner as in Example 64.

Comparative Example 31

For comparing the effects of frequency, a drum was prepared by means of a deposition film forming apparatus shown in FIGS. 8A and 8B and FIG. 9 for microwave plasma CVD employing microwave of 2.45 GHz by a procedure similar to that in Comparative Example 27 under the conditions shown in Table 146.

The results of Example 67 and Comparative Example 31 are shown in Tables 147 to 154. As understood from these tables, the method of the present invention improves the electrophotographic characteristics mainly by modification of the interface region. In particular, the effects were more remarkable in the frequency range of from 51 to 250 MHz.

Example 68

With the same mirror-finished, degreased and cleaned aluminum cylindrical substrate as the one in Example 42, a drum was prepared according to the procedure described before by means of the manufacturing apparatus shown in FIG. 7 under the conditions shown in Table 155. In this Example, an interface region having the continuously changing composition was provided between the charge-transporting layer and the charge-generating layer. DC voltage, which is substantially constant during application time, was employed as the bias voltage.

The prepared drum was evaluated for image quality at the initial stage and after the duration test in the same manner as in Example 64.

Example 69

A drum was prepared in the same manner as in Example 68 except that the interface was formed by interrupting once the electric discharge on completion of formation of the charge-transporting layer and restarting the discharge to form the charge-generating layer.

The resulting drum was evaluated for image quality at the initial stage and after the duration test in the same manner as in Example 64.

Example 70

A drum was prepared in the same manner as in Example 68 except that the conditions were as shown in Table 156.

The resulting drum was evaluated for image quality at the initial stage and after the duration test in the same manner as in Example 64.

Example 71

A drum was prepared in the same manner as in Example 70 except that the interface was formed by interrupting once the electric discharge on completion of formation of the charge-transporting layer and restarting the discharge to form the charge-generating layer.

The resulting drum was evaluated for image quality at the initial stage and after the duration test in the same manner as in Example 64.

The results of Examples 68 to 71 are shown in Table 157. As understood from the table, the method of the present invention provides excellent electrophotographic characteristics mainly by improvement of the interfacial characteristics. Further, in the present invention, the interface between the photoconductive layer and the surface layer was formed effectively to improve the interfacial characteristics either by interrupting the discharge once at the completion of the charge-transporting layer formation and restarting the discharge or by forming a region having a continuously changing composition.

Example 72

With the same mirror-finished, degreased and cleaned aluminum cylindrical substrate as the one in Example 42, a drum was prepared according to the procedure described before by means of the manufacturing apparatus shown in FIG. 7 under the conditions shown in Table 158. In this Example, an interface region having a continuously changing composition was provided between the charge-transporting layer and the charge-generating layer. As the bias voltage, an AC voltage of 60 Hz and $V_{p-p}$ 100 V and a DC voltage of 50 V were applied in superposition. The prepared drum was evaluated for image quality at the initial stage and after the duration test in the same manner as in Example 64.

Example 73

With the same mirror-finished, degreased and cleaned aluminum cylindrical substrate as the one in Example 42, a drum was prepared according to the procedure described before by means of the manufacturing apparatus shown in FIG. 7 under the conditions shown in Table 159. In this Example, an interface region having a continuously changing composition was provided between the charge-transporting layer and the charge-generating layer. As the bias voltage, an AC voltage of 100 Hz and $V_{p-p}$ 100 V and a DC voltage of 50 V were applied in superposition. The prepared drum was evaluated for image quality at the initial stage and after the duration test in the same manner as in Example 64.

Table 160 shows the results of Examples 72 and 73. As understood from the table, the method of the present invention gives excellent electrophotographic characteristics mainly because of the improvement of the interfacial characteristics.

The deposition film forming apparatus is described by reference to Examples and Test Examples.

Test Example 3

Figure 26A:
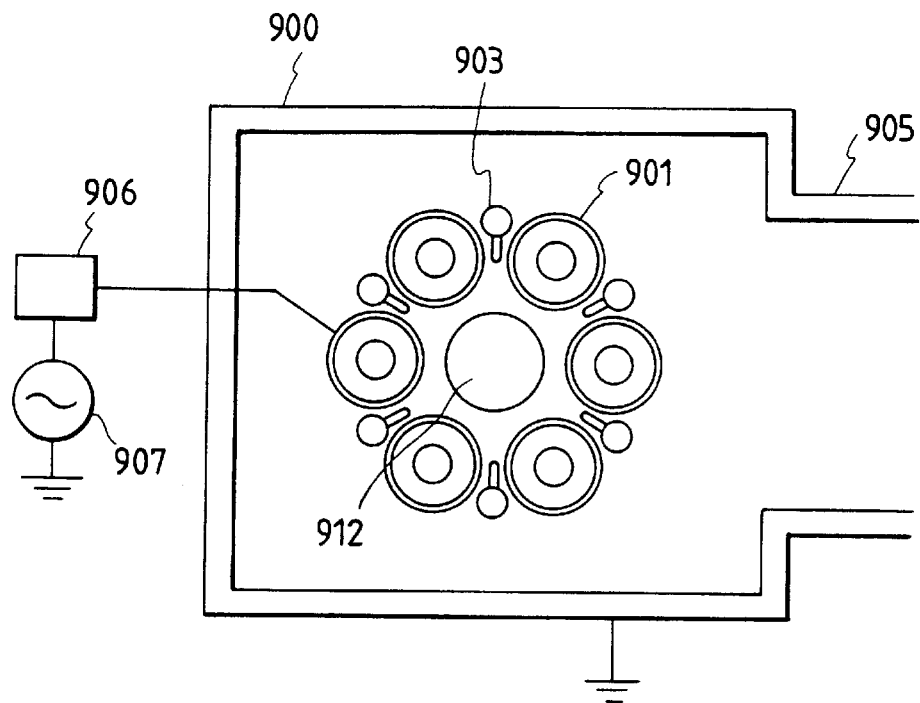
Figure 26B:
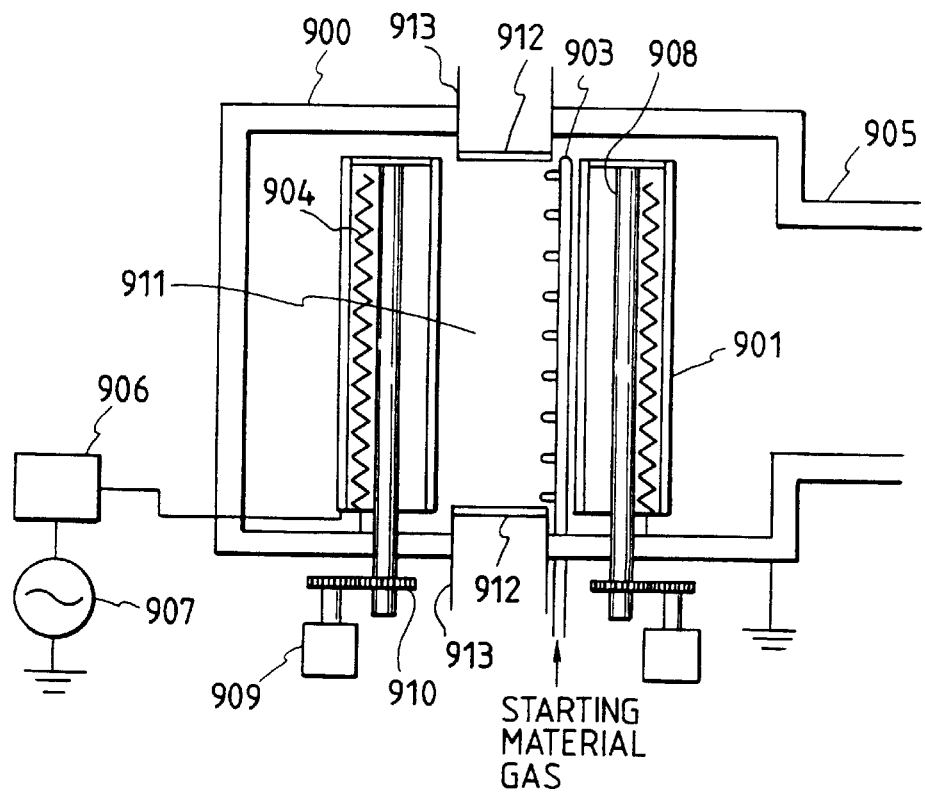

A deposition film forming apparatus shown in FIGS. 26A and 26B was used. With this apparatus, distribution of the saturation electron current in the inner chamber 911 was measured. The apparatus shown in FIGS. 26A and 26B is made by modifying the deposition film forming apparatus of the present invention shown in FIGS. 22A and 22B for experiment by providing the upper and lower windows 912 and the waveguide tubes 913 and connecting a microwave power source (not shown in the drawing), an isolator (not shown in the drawing), and the like to enable microwave discharge. In this apparatus, the upper window 912 and the lower window 912 are apart at a distance of about 400 mm. In this Test Example, without application of microwave, high frequency power of 105 MHz was applied to one of the cylindrical electroconductive substrates 901 to cause glow discharge, and the distribution of the saturation electron current was measured according to a single probe method by inserting a probe into the inner chamber 911 as a function of the distance from the upper window 912 under the conditions of Table 161.

Comparative Test Example 1

With the deposition film forming apparatus shown in FIGS. 26A and 26B, distribution of the saturation electron current was measured under the conditions of Table 162 in the same manner as in Test Example 3 except that the high frequency power was not applied at all but microwave was applied to cause electric discharge.

Figure 27:
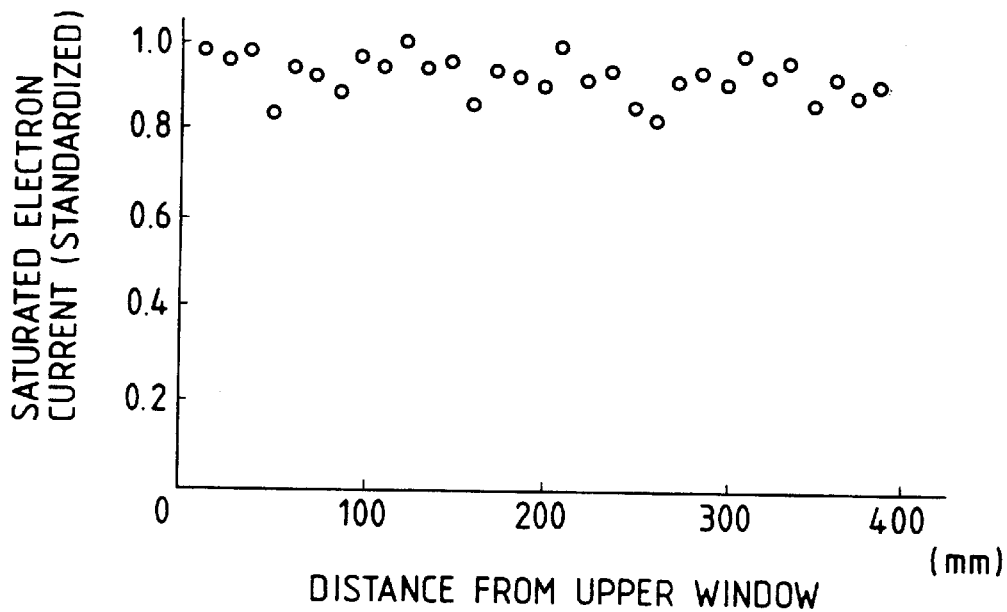
FIGS. 27 and 28 are each a graph to show distribution of saturated electron currents.
Figure 28:
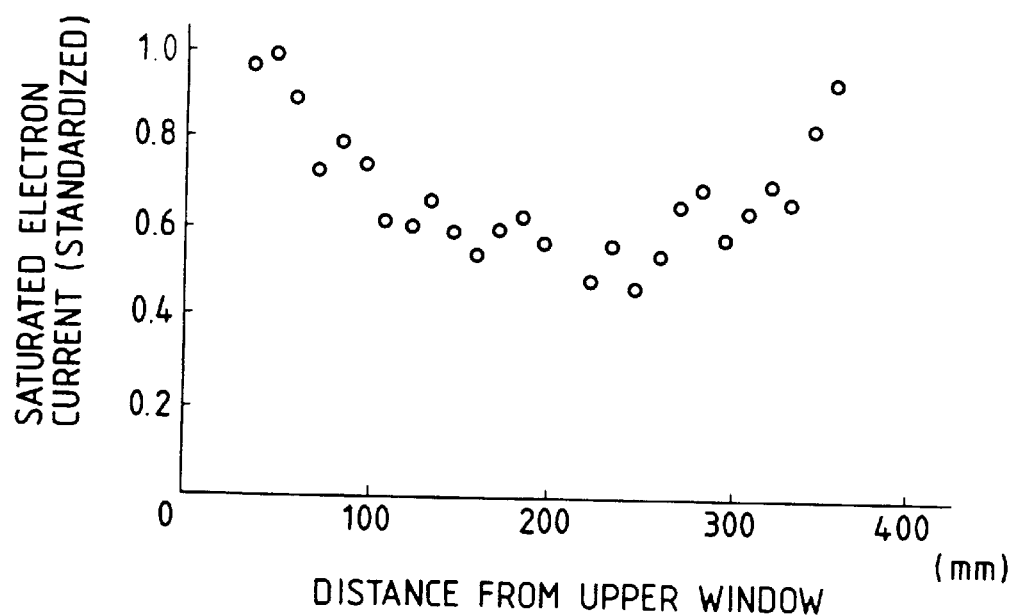

The results of Test Example 3 and Comparative Test Example 1 are shown in FIGS. 27 and 28. From the comparison of FIGS. 27 and 28, in microwave plasma CVD, the plasma distribution is improved to be uniformized by causing glow discharge by applying high frequency power to at least one cylindrical electroconductive substrate 901.

Test Example 4

With the deposition film forming apparatus shown in FIGS. 26A and 26B, glow discharge was caused by application of high frequency power of 105 MHz to one of the cylindrical electroconductive substrate 901. In this Test Example, an aluminum cylinder of 108 mm in diameter was used as the cylindrical electroconductive substrate 901, and from it an electrophotographic light-receiving member (hereinafter referred to as a "drum") was prepared.

Six drums thus prepared was respectively set in an electrophotographic apparatus, NP-6550 made by Canon K.K. modified for experiment. Thereby, chargeability, sensitivity, and residual potential thereof were measured as the typical electrophotographic potential characteristics. The drum to which high frequency power was applied is referred to as "Drum No. 1", and other drums are referred to respectively as "Drum No. 2" to "Drum No. 6" counter-clockwise in top view. Thus, variation among the six drums was evaluated, and simultaneously the copied images of a test chart were evaluated also. The variation of the characteristics in a generatrix line direction of the drum was measured at five separate points: middle point, 70 mm up and down from the middle point, and 140 mm up and down from the middle point.

The chargeability and the sensitivity were measured by methods already described. The residual potential and the copied image were evaluated as follows.

Residual potential

A drum is electrically charged to a predetermined dark-area surface potential. Immediately relatively intense light is projected thereto in a certain quantity. The imagewise light projection is conducted with light of a xenon lamp as a light source through a filter to intercept the light of wavelength of shorter than 550 nm. Then the light-area potential of the drum is measured by a surface potential meter.

Copied image

Copied image is formed of a test chart made by Canon K.K. (parts number: FY9-9060-000) and a halftone chart (parts number: FY9-9042), and irregularity of the image density is observed.

Comparative Test Example 2

With the deposition film forming apparatus shown in FIGS. 26A and 26B, drums were prepared under the conditions of Table 164 without applying high frequency power to the cylindrical electroconductive substrate 901 with introduction of microwave to cause glow discharge. The drums thus prepared were evaluated in the same manner as in Test Example 4.

Table 165 shows the results of Test Example 4 and Comparative Test Example 2. In the table, the variation of characteristics in the generatrix line direction is shown by the symbols as below:

AA: Excellent

A: Good, slight variation in characteristics observed, but no density irregularity observed in copied image B: Variation in characteristics observed, no problem in density irregularity of image in practical use C: Variation in characteristics being significant, copied image being defective The variation among the six drums is shown by the symbols as below:

AA: Substantially no variation

A: Slight variation

B: Considerable variation, but practically allowable

C: Some drums being practically defective

Table 165 shows that, as compared with the microwave plasma CVD, glow discharge caused by application of high frequency power to the cylindrical electroconductive substrate improves the variation of characteristics in the generatrix line direction of the drum and variation of characteristics among the six cylindrical electroconductive substrates.

Comparative Example 32

With the deposition film forming apparatus shown in FIGS. 22A and 22B, drums were prepared by use of an aluminum cylinder of 108 mm in diameter as the cylindrical electroconductive substrate 901 and by applying high frequency power of 13.56 MHz to one of the cylindrical electroconductive substrates under the conditions of Table 166.

The one drum to which high frequency power was applied is referred to as "Drum No. 1", and other drums are referred to respectively as "Drum No. 2" to "Drum No. 6" counterclockwise in top view. The variation of potential characteristics and copied image quality were evaluated in the generatrix line direction and among the six drums in the same manner as in Test Example 4.

Example 74

With the deposition film forming apparatus shown in FIGS. 22A and 22B, drums were prepared by use of an aluminum cylinder of 108 mm in diameter as the cylindrical electroconductive substrate 901 and by applying high frequency power of 20 MHz to one of the cylindrical electroconductive substrates under the conditions of Table 167.

The one drum to which high frequency power had been applied is referred to as "Drum No. 1", and other drums are referred to respectively as "Drum No. 2" to "Drum No. 6" counterclockwise in top view. The variation of potential characteristics and copied image quality were evaluated in the generatrix line direction and among the six drums in the same manner as in Test Example 4.

Example 75

With the deposition film forming apparatus shown in FIGS. 22A and 22B, drums were prepared by use of an aluminum cylinder of 108 mm in diameter as the cylindrical electroconductive substrate 901 and by applying high frequency power of 105 MHz to one of the cylindrical electroconductive substrates under the conditions of Table 168.

The one drum to which high frequency power had been applied is referred to as "Drum No. 1", and other drums are referred to respectively as "Drum No. 2" to "Drum No. 6" counterclockwise in top view. The variation of potential characteristics and copied image quality were evaluated in the generatrix line direction and among the six drums in the same manner as in Test Example 4.

Example 76

With the deposition film forming apparatus shown in FIGS. 22A and 22B, drums were prepared by use of an aluminum cylinder of 108 mm in diameter as the cylindrical electroconductive substrate 901 and by applying high frequency power of 200 MHz to one of the cylindrical electroconductive substrates under the conditions of Table 169.

The one drum to which high frequency power had been applied is referred to as "Drum No. 1", and other drums are referred to respectively as "Drum No. 2" to "Drum No. 6" counterclockwise in top view. The variation of potential characteristics and copied image quality were evaluated in the generatrix line direction and among the six drums in the same manner as in Test Example 4.

Example 77

With the deposition film forming apparatus shown in FIGS. 22A and 22B, drums were prepared by use of an aluminum cylinder of 108 mm in diameter as the cylindrical electroconductive substrate 901 and by applying high frequency power of 450 MHz to one of the cylindrical electroconductive substrates under the conditions of Table 170.

The one drum to which high frequency power had been applied is referred to as "Drum No. 1", and other drums are referred to respectively as "Drum No. 2" to "Drum No. 6" counterclockwise in top view. The variation of potential characteristics and copied image quality were evaluated in the generatrix line direction and among the six drums in the same manner as in Test Example 4.

Table 171 shows collectively the results of Examples 74 to 77 and Comparative Example 32. The drums prepared under application of electromagnetic wave of a frequency of from 20 MHz to 450 MHz exhibited no or less variation in characteristics satisfactorily. On the other hand, the drums prepared under application of high frequency power of 13.56 MHz are satisfactory in variation of characteristics in the generatrix line direction, but is inferior to the drums of Examples 74 to 77 in the individual drum characteristics. As shown above, the deposition film forming apparatus of the present invention gave drums satisfactory in less variation of characteristics in the generatrix line direction of the drum and among the drum.

Example 78

With the deposition film forming apparatus shown in FIG. 23, drums were prepared by use of an aluminum cylinder of 108 mm in diameter as the cylindrical electroconductive substrate 901 and by applying high frequency power of 200 MHz to the cylindrical electroconductive substrates under the conditions of Table 172. In this Example, the high frequency power was applied to two of the eight cylindrical electroconductive substrates by means of a high frequency power source 920 of two-channel simultaneous excitation type respectively through one of the two matching boxes 906 as shown in FIG. 23.

Of the two drum to which high frequency power was applied, the one distant from the exhaust tube 905 is referred to as "Drum No. 1", and other drums are referred to respectively as "Drum No. 2" to "Drum No. 8" counterclockwise in top view. The variation of potential characteristics and copied image quality were evaluated in the generatrix line direction and among the eight drums in the same manner as in Test Example 4.

Example 79

With the deposition film forming apparatus shown in FIG. 24, drums were prepared by use of an aluminum cylinder of 108 mm in diameter as the cylindrical electroconductive substrate 901 and by applying high frequency power of 105 MHz to the cylindrical electroconductive substrates under the conditions of Table 173. In this Example, the high frequency power was applied to four of the eight cylindrical electroconductive substrates by means of a high frequency power source 921 of four-channel simultaneous excitation type respectively through one of the four matching boxes 906 as shown in FIG. 24.

Of the four drum to which high frequency power was applied, the one most distant from the exhaust tube 905 is referred to as "Drum No. 1", and other drums are referred to respectively as "Drum No. 2" to "Drum No. 8" counterclockwise in top view. The variation of potential characteristics and copied image quality were evaluated in the generatrix line direction and among the eight drums in the same manner as in Test Example 4.

Table 174 shows the results of Examples 78 and 79. As understood from the table, the deposition film forming apparatus of the present invention gives drums having satisfactorily less variation in characteristics in the generatrix line direction of the drum and among the eight drums.

Example 80

With the deposition film forming apparatus shown in FIGS. 25A and 25B, drums were prepared by use of an aluminum cylinder of 108 mm in diameter as the cylindrical electroconductive substrate 901 and by applying high frequency power of 105 MHz to one of the cylindrical electroconductive substrates 901 under the conditions shown in Table 175. In this Example, a bias electrode 930 was placed at the approximate center of the inner chamber 911 and a bias power source was connected thereto to apply external electric bias. The drum prepared under application of high frequency power is referred to as "Drum No. 1", and other drums are referred to respectively as "Drum No. 2" to "Drum No. 6" counterclockwise. The variation of potential characteristics and copied image quality were evaluated in the generatrix line direction and among the six drums in the same manner as in Test Example 4.

Table 176 shows the results. As understood from the table, the deposition film forming apparatus of the present invention gave drums having satisfactorily less variation in characteristics in the generatrix line direction of the drum and among the six drums.

The effect of the cleaning in the present invention is described below specifically by reference to Test Examples.

Test Example 5

A deposition film forming apparatus for RF plasma CVD shown in FIG. 21 was employed in this Test Example. On the inside wall of the reaction chamber, aluminum base plates of a size of 5cm×5 cm were press-bonded. An amorphous silicon film was deposited in a thickness of 10 μm on a cylindrical substrate under the formation conditions shown in Table 177. Then the cylindrical substrate having the amorphous silicon film deposited thereon in the reaction chamber was replaced with another fresh cylindrical substrate.

Subsequently, the degenerated product deposited on the aluminum base plates was removed by etching under the various etching conditions shown in Table 178. During the removal operation, the substrate was kept at a temperature of 25° C. by means of a cooling apparatus not shown in the drawing. The etching time was fixed to 20 minutes.

The etching state was evaluated on the area of the etched-off portion, by visually examining the presence of the degenerated product. The evaluation results are by the symbols below:

AA: Degenerated product completely etched off from aluminum base plate

A: Half or more of product etched off

B: Less than half of product etched off

C: No or little product etched off

Table 178 shows the etching conditions and the results of the etching. The results show that the degenerated product mainly composed of silicon and having accumulated on the inside wall of the reaction chamber was suitably etched off by using $ClF_3$ gas with supply of high frequency plasma energy generated by electromagnetic wave of from 20 MHz to 450 MHz. Thus the use of an electromagnetic wave of from 20 MHz to 450 MHz enables uniform cleaning in a short time.

The effects of the present invention shown below specifically by reference to Examples without limiting the invention.

Example 81

An amorphous silicon drum was prepared by means of the RF plasma CVD apparatus according to the procedure described before under the formation condition shown in Table 179. Then, the prepared amorphous silicon drum was taken out, and etching treatment of the inside of the apparatus was conducted under the conditions shown in Table 180. After the etching treatment, a fresh cylindrical substrate 702 was placed in the reaction chamber 701, and another amorphous silicon drum was prepared again under the conditions shown in Table 179. This amorphous silicon drum was set in an electrophotographic apparatus (NP7550, made by Canon K.K. modified for the present test), and image formation was conducted in a usual electrophotographic process. The formed images were evaluated for image defects (white dots) according to the evaluation method described before.

Comparative Examples 33 and 34

Amorphous silicon drums were prepared under the same conditions as in Example 81, and the inside of the reaction chamber was subjected to etching treatment under the conditions for the comparative examples in Table 180. Thereafter amorphous silicon drums were prepared again in the same manner as in Example 81, and were evaluated in the same manner.

Table 181 shows collectively the results of Example 81 and Comparative Examples 33 and 34. As shown in the table, the amorphous silicon drum prepared according to the present invention was satisfactory regarding the image defects.

Example 82

Amorphous silicon drums were prepared in the same manner as in Example 81 except that the frequency of the electromagnetic wave for use in etching was changed within the scope of the present invention as shown in Table 182. The drums were evaluated in the same manner as in Example 81. The results are shown in Table 182. As shown in Table 182, the cleaning was satisfactory at the frequencies in the scope of the present invention.

Example 83

Amorphous silicon drums were prepared in a similar manner as in Example 81 under the conditions shown in Table 183. The inside of the reaction chamber was treated by etching in the same manner as in Example 82, and other amorphous silicon drums were prepared again under the conditions shown in Table 183. The prepared drums were evaluated in the same manner. Satisfactory results were obtained in any of the cleaning conditions of the present invention similarly as in Example 82.

The process for forming a light-receiving member of the present invention offsets the disadvantages encountered on the surface layer formed by a conventional process, and capable of easily uniformizing the bonding state of the atoms contained in the surface layer when a binary gas system of a silicon atom-supplying gas and a carbon atom-supplying gas or a ternary starting gas system are used. Thereby, the process of the present invention solves effectively the problems in electrophotographic characteristics such as halftone irregularity, coarse image, black dots caused by toner fusion, and so forth.

The process for forming a light receiving member of the present invention enables modification of an interface region of a multilayer structure of a light receiving member prepared by a conventional process, thereby improving image quality such as white dots, blank memory, and ghost, and electrophotographic characteristics of the light-receiving member such as chargeability, and potential shift and gives advantageously a light-receiving member of high durability and high quality.

The process for forming a light receiving member of the present invention enables modification mainly of an interface region of a multilayer structure of a light receiving member prepared by a conventional process, thereby improving electrophotographic characteristics such as white dots, image smearing, ghost, black lines, chargeability, image smearing at high exposure. Especially the process of the present invention gives a light-receiving member excellent in durability, environmental resistance, and high speed operability.

The process of the present invention exhibits effects of improvements in chargeability, and sensitivity, and of decreasing image smearing at high exposure by incorporating in the surface layer at least one kind of elements of carbon, nitrogen, and oxygen at the contents (atomic %) of not more than 95%, not more than 80%, not more than 80% with the sum of the contents thereof in the range of from 20% to 95%.

The process for forming an electrophotographic light-receiving member of the present invention enables modification mainly of an interface region between two layers of a multilayer structure of the electrophotographic light receiving member prepared by a conventional process, thereby improving electrophotographic characteristics such as white dots, image smearing, ghost, black lines, and sensitivity, and further increasing the reproducibility thereof. Thereby, the process of the present invention provides an electrophotographic light-receiving member excellent in durability, environmental resistance, and high speed operability with high reproducibility.

The deposition film forming apparatus of the present invention improves remarkably the efficiency of gas utilization by arranging a plurality of cylindrical electroconductive substrates on one and the same circumference of a circle, and uniformizes the characteristics of the deposited film by applying high frequency power to at least one of the plurality of the cylindrical electroconductive substrates arranged on the circle circumference to uniformize the plasma. Thereby, the present invention enables improvement of productivity by high utilization efficiency of the starting gas, and improvement of the yield by uniformizing the characteristics of the deposition film, thus stably supplying deposition films of high quality at low cost.

In removal, by use of gaseous $ClF_3$, of a reaction product adhering to inside wall of a flow path of a deposition film forming gas in deposition film formation, the present invention enables effective removal of the reaction product and effective cleaning of the reaction vessel by conducting the operation with supply of high frequency energy of a specified magnetic wave frequency, thereby providing an amorphous silicon drum of high quality in a short time at a high yield.

The present invention is not limited to the constitution described above. The present invention naturally includes modified constitution within the gist of the present invention.

TABLE 1

| Photoconductive layer forming conditions | |
| --- | --- |
| Gas flow rate (sccm): | |
| $SiH_4$ | 350 |
| He | 350 |
| Pressure (mTorr): | 500 |
| RF power: | 400 |
| Layer thickness ($\mu$m): | 25 |

TABLE 2

Surface layer forming conditions

| | RF | VHF | | | | | | μW |
|---|---|---|---|---|---|---|---|---|
| Power source frequency (MHz): | | | | | | | | |
| | 13.56 | 20 | 30 | 51 | 100 | 250 | 300 | 450 | 2450 |

| Gas flow rate: | | | | | | | | | |
|---|---|---|---|---|---|---|---|---|---|
| (sccm) | | | | | | | | | |
| SiH$_4$ | 20 | 30 | 30 | 40 | 40 | 40 | 50 | 50 | 70 |
| CH$_4$ | 100 | 150 | 150 | 200 | 200 | 200 | 250 | 250 | 300 |
| H$_2$ | 450 | 500 | 500 | 550 | 550 | 600 | 600 | 650 | 700 |
| Pressure (mTorr): | 400 | 300 | 200 | 100 | 50 | 50 | 30 | 30 | 11 |
| Power (W): | 300 | 500 | 500 | 500 | 500 | 500 | 500 | 500 | 1000 |
| Layer thickness (μm): | 0.5 | 0.5 | 0.5 | 0.5 | 0.5 | 0.5 | 0.5 | 0.5 | 0.5 |
| | Cp. 1 | | | | Example 1 | | | | Cp. 1 |

Cp.: Comparative Example

TABLE 3

Comparison of performances

| | RF | VHF | | | | | | μW |
|---|---|---|---|---|---|---|---|---|
| Power source frequency (MHz): | | | | | | | | |
| | 13.56 | 20 | 30 | 51 | 100 | 250 | 300 | 450 | 2450 |

| | | | | | | | | | |
|---|---|---|---|---|---|---|---|---|---|
| Halftone unevenness: | A | A | A | AA | AA | AA | A | A | B |
| Black spots due to toner melt-adhesion: | B | A | AA | AA | AA | A | A | B | B |
| Coarse image: | A | A | A | A | AA | AA | A | A | A |
| Smeared image: | B | B | A | AA | AA | AA | AA | A | A |
| Overall evaluation: | B | A | A | AA | AA | AA | A | A | B |
| | Cp. 1 | | | | Example 1 | | | | Cp. 1 |

Cp.: Comparative Example

TABLE 4

Film forming conditions
(Comparative Example 2)

| Power source frequency (MHz): | RF 13.56 | VHF 100 | μW 2450 |
|---|---|---|---|
| Gas flow rate: | | | |
| (sccm) | | | |
| SiH$_4$ | 20 | 40 | 70 |
| CH$_4$ | 100 | 200 | 300 |
| H$_2$ | 450 | 550 | 700 |
| Pressure (mTorr): | 400 | 50 | 11 |
| Power (W): | 500 | 500 | 500 |
| Layer thickness (μm): | 0.5 | 0.5 | 0.5 |

TABLE 5

Comparison of performances
(Comparative Example 2)

| Power source frequency (MHz): | RF 13.56 | VHF 100 | μW 2450 |
|---|---|---|---|
| Halftone unevenness: | B | AA | B |
| Black spots due to toner melt adhesion: | B | AA | B |
| Coarse image: | A | AA | B |
| Smeared image: | B | AA | A |
| Overall evaluation: | B | AA | B |

TABLE 6

| | Surface layer forming conditions | | | | | | | | |
|---|---|---|---|---|---|---|---|---|---|
| | RF | | VHF | | | | | | μW |
| | Power source frequency (MHz): | | | | | | | | |
| | 13.56 | 20 | 30 | 51 | 100 | 250 | 300 | 450 | 2450 |
| Gas flow rate: | | | | | | | | | |
| (sccm) | | | | | | | | | |
| $Si_2H_6$ | 10 | 15 | 15 | 20 | 20 | 20 | 30 | 30 | 60 |
| $C_2H_2$ | 50 | 100 | 100 | 150 | 150 | 150 | 200 | 200 | 300 |
| $H_2$ | 400 | 500 | 500 | 550 | 550 | 600 | 600 | 650 | 700 |
| Pressure (mTorr): | 400 | 300 | 200 | 100 | 50 | 50 | 30 | 30 | 10 |
| Power (W): | 300 | 500 | 500 | 500 | 500 | 500 | 500 | 500 | 1000 |
| Layer thickness (μm): | 0.5 | 0.5 | 0.5 | 0.5 | 0.5 | 0.5 | 0.5 | 0.5 | 0.5 |
| | Cp. 3 | | | | Example 2 | | | | Cp. 3 |

Cp.: Comparative Example

TABLE 7

| | Comparison of performances | | | | | | | | |
|---|---|---|---|---|---|---|---|---|---|
| | RF | | | VHF | | | | | μW |
| | Power source frequency (MHz): | | | | | | | | |
| | 13.56 | 20 | 30 | 51 | 100 | 250 | 300 | 450 | 2450 |
| Halftone unevenness: | A | A | A | AA | AA | A | A | A | B |
| Black spots due to toner melt-adhesion: | B | B | A | AA | AA | AA | A | A | B |
| Coarse image: | B | A | A | A | AA | AA | AA | A | A |
| Smeared image: | B | A | AA | AA | AA | AA | A | B | B |
| Overall evaluation: | B | A | A | AA | AA | AA | A | A | B |
| | Cp. 3 | | | | Example 2 | | | | Cp. 3 |

Cp.: Comparative Example

TABLE 8

| | Surface layer forming conditions | | | | | | | | |
|---|---|---|---|---|---|---|---|---|---|
| | RF | | VHF | | | | | | μW |
| | Power source frequency (MHz): | | | | | | | | |
| | 13.56 | 20 | 30 | 51 | 100 | 250 | 300 | 450 | 2450 |
| Gas flow rate: | | | | | | | | | |
| (sccm) | | | | | | | | | |
| $SiH_4$ | 20 | 30 | 30 | 40 | 40 | 40 | 50 | 50 | 70 |
| $CH_4$ | 100 | 150 | 150 | 200 | 200 | 200 | 250 | 250 | 300 |
| He | 450 | 500 | 500 | 550 | 550 | 600 | 600 | 650 | 700 |
| Pressure (mTorr): | 400 | 300 | 200 | 100 | 50 | 50 | 30 | 30 | 11 |
| Power (W): | 300 | 500 | 500 | 500 | 500 | 500 | 500 | 500 | 1000 |
| Layer thickness (μm): | 0.5 | 0.5 | 0.5 | 0.5 | 0.5 | 0.5 | 0.5 | 0.5 | 0.5 |
| | Cp. 4 | | | | Example 3 | | | | Cp. 4 |

Cp.: Comparative Example

TABLE 9

Comparison of performances

| | RF | | | VHF | | | | | μW |
|---|---|---|---|---|---|---|---|---|---|
| | Power source frequency (MHz): | | | | | | | | |
| | 13.56 | 20 | 30 | 51 | 100 | 250 | 300 | 450 | 2450 |
| Halftone unevenness: | B | A | A | AA | AA | A | A | B | B |
| Black spots due to toner melt-adhesion: | B | A | A | A | AA | AA | AA | A | A |
| Coarse image: | B | B | A | AA | AA | AA | A | A | A |
| Smeared image: | A | A | A | AA | AA | AA | A | A | B |
| Overall evaluation: | B | A | A | AA | AA | AA | A | A | B |
| | Cp. 4 | | | | Example 3 | | | | Cp. 4 |

Cp.: Comparative Example

TABLE 10

Surface layer forming conditions

| | RF | | | VHF | | | | | μW |
|---|---|---|---|---|---|---|---|---|---|
| | Power source frequency (MHz): | | | | | | | | |
| | 13.56 | 20 | 30 | 51 | 100 | 250 | 300 | 450 | 2450 |
| Gas flow rate: | | | | | | | | | |
| (sccm) | | | | | | | | | |
| $SiH_4$ | 16 | 24 | 24 | 32 | 32 | 32 | 40 | 40 | 56 |
| $SiF_4$ | 4 | 6 | 6 | 8 | 8 | 8 | 10 | 10 | 14 |
| $CH_4$ | 100 | 150 | 150 | 200 | 200 | 200 | 250 | 250 | 300 |
| $H_2$ | 450 | 500 | 500 | 550 | 550 | 600 | 600 | 650 | 700 |
| Pressure (mTorr): | 400 | 300 | 200 | 100 | 50 | 50 | 30 | 30 | 11 |
| Power (W): | 300 | 500 | 500 | 500 | 500 | 500 | 500 | 500 | 1000 |
| Layer thickness (μm): | 0.5 | 0.5 | 0.5 | 0.5 | 0.5 | 0.5 | 0.5 | 0.5 | 0.5 |
| | Cp. 5 | | | | Example 4 | | | | Cp. 5 |

Cp.: Comparative Example

TABLE 11

Comparison of performances

| | RF | | | VHF | | | | | μW |
|---|---|---|---|---|---|---|---|---|---|
| | Power source frequency (MHz): | | | | | | | | |
| | 13.56 | 20 | 30 | 51 | 100 | 250 | 300 | 450 | 2450 |
| Halftone unevenness: | B | A | AA | AA | AA | AA | A | A | A |
| Black spots due to toner melt-adhesion: | B | A | A | AA | AA | AA | A | A | B |
| Coarse image:. | A | A | A | AA | AA | AA | A | B | B |
| Smeared image: | B | B | A | A | AA | AA | A | A | A |
| Overall evaluation: | B | A | A | AA | AA | AA | A | A | B |
| | Cp. 5 | | | | Example 4 | | | | Cp. 5 |

Cp.: Comparative Example

TABLE 12

|  | Charge injection blocking layer | Photoconductive layer |
|---|---|---|
| Gas flow rate (sccm): |  |  |
| $SiH_4$ | 150 | 356 |
| $H_2$ | 600 | 600 |
| NO | 5 | 0 |
| $B_2H_6$* | 1,500 | 0.3 |
| Pressure (mTorr): | 450 | 570 |
| RF power: | 100 | 500 |
| Layer thickness ($\mu$m): | 3 | 25 |

*(based on $SiH_4$)

TABLE 13

| | Results of analysis | | |
|---|---|---|---|
| | Compositional ratio (atomic %) | | |
| Power source frequency (MHz): | RF 13.56 | VHF 100 | $\mu$W 2450 |
| Elements: | | | |
| Si (total) | 30.4 | 27.3 | 29.5 |
| Si (Si—C) | 19.2 | 21.3 | 15.6 |
| C (total) | 18.4 | 24.1 | 21.4 |
| C (C—Si) | 15.6 | 20.6 | 13.6 |
| H | 51.2 | 48.6 | 49.1 |
| | Cp. 7 | Example 6 | Cp. 7 |

Cp.: Comparative Example
Si (Si—C): Compositional ratio of Si atom having Si—C bonding
C (C—Si): Compositional ratio of C atom having C—Si bonding

TABLE 14

|  | Blocking layer | Photoconductive layer |
|---|---|---|
| Gas flow rate (sccm): |  |  |
| $SiH_4$ | 350 | 350 |
| $CH_4$ | 100 |  |
| $B_2H_6$ (ppm)* | 500 | 1.0 |
| Pressure (mTorr): | 100 | 100 |
| High-frequency power (W): (RF power) | 500 | 500 |
| Substrate temperature (°C.): | 300 | 300 |
| Layer thickness (um): | 3.0 | 25 |

*(based on $SiH_4$)

TABLE 15

|  | Cp. 8 | Example 7 | | | | | | |
|---|---|---|---|---|---|---|---|---|
|  | Power source frequency (MHz) | | | | | | | |
|  | 13.56 | 20 | 30 | 51 | 105 | 200 | 250 | 450 |
| White dots: | AA/B | A/A | A/A | AA/AA | AA/AA | AA/AA | AA/AA | A/A |
| Blank memory: | AA/A | AA/A | AA/AA | AA/AA | AA/AA | AA/AA | AA/AA | AA/AA |
| Ghost: | AA/A | A/A | A/A | AA/AA | AA/AA | AA/AA | AA/AA | AA/A |
| Charge performance: | AA/B | A/A | A/A | AA/AA | AA/AA | AA/AA | AA/AA | AA/AA |
| Sensitivity: | A/B | A/A | A/A | A/A | A/A | A/A | A/A | A/A |
| Overall evaluation: | B | A | A | AA | AA | AA | AA | A |

(Initial image/After running test)

TABLE 16

|  | Blocking layer | Photoconductive layer |
|---|---|---|
| Gas flow rate (sccm): |  |  |
| $SiH_4$ | 500 | 500 |
| $CH_4$ | 100 |  |
| $B_2H_6$ (ppm)* | 500 |  |
| Pressure (mTorr): | 20 | 20 |
| High-frequency power (W): (Microwave power) | 1,000 | 1,000 |
| Substrate temperature (°C.): | 300 | 300 |
| Layer thickness (μm): | 3.0 | 25 |

*(based on $SiH_4$)

TABLE 17

|  | Example 8 | | | | | | | Cp. 9 |
|---|---|---|---|---|---|---|---|---|
|  | Power source frequency (MHz): | | | | | | | |
|  | 20 | 30 | 51 | 105 | 200 | 250 | 450 | 2,450 |
| White dots: | A/A | AA/A | AA/AA | AA/AA | AA/AA | AA/AA | A/A | AA/B |
| Blank memory: | AA/A | AA/AA | AA/AA | AA/AA | AA/AA | AA/AA | AA/AA | AA/A |
| Ghost: | A/A | AA/A | AA/AA | AA/AA | AA/AA | AA/AA | AA/AA | A/A |
| Charge performance: | A/A | A/A | AA/AA | AA/AA | AA/AA | AA/AA | AA/AA | A/B |
| Sensitivity: | A/A | A/A | A/A | A/A | A/A | A/A | A/A | A/B |
| Overall evaluation: | A | A | AA | AA | AA | AA | A | B |

(Initial image/After running test)

TABLE 18

|  | Blocking layer | Photoconductive layer |
|---|---|---|
| Gas flow rate (sccm): |  |  |
| $SiH_4$ | 500 | 500 |
| $CH_4$ | 100 |  |
| $B_2H_6$ (ppm)* | 500 | 1.0 |
| Pressure (mTorr): | 150 | 150 |
| High-frequency power (W): (RF power) | 400 | 400 |
| Substrate temperature (°C.): | 320 | 320 |
| Layer thickness (μm): | 3.0 | 30 |

*(based on $SiH_4$)

TABLE 19

|  | Cp. 10 | Example 9 | | | | | | |
|---|---|---|---|---|---|---|---|---|
|  | Power source frequency (MHz): | | | | | | | |
|  | 13.56 | 20 | 30 | 51 | 105 | 200 | 250 | 450 |
| White dots: | AA/A | AA/AA | A/A | A/A | AA/AA | AA/AA | AA/AA | A/A |
| Blank memory: | A/B | A/A | AA/AA | AA/AA | AA/AA | AA/AA | AA/AA | AA/AA |
| Ghost: | A/B | AA/A | AA/A | AA/AA | AA/AA | AA/AA | AA/AA | AA/A |
| Charge performance: | AA/A | AA/A | A/A | AA/AA | AA/AA | AA/AA | AA/AA | AA/AA |
| Sensitivity: | A/A | A/A | A/A | A/A | A/A | A/A | A/A | A/A |
| Overall evaluation: | B | A | A | AA | AA | AA | AA | A |

(Initial image/After running test)

TABLE 20

|  | Blocking layer | Photoconductive layer |
|---|---|---|
| Gas flow rate (sccm): | | |
| $SiH_4$ | 400 | 400 |
| $CH_4$ | 100 | |
| $B_2H_6$ (ppm)* | 500 | 1.0 |
| Pressure (mTorr): | 10 | 10 |
| High-frequency power (W): (Microwave power) | 1,000 | 1,000 |
| Substrate temperature (°C.): | 270 | 270 |
| Layer thickness (μm): | 3.0 | 27 |

*(based on $SiH_4$)

TABLE 21

|  | Example 10 | | | | | | | Cp. 11 |
|---|---|---|---|---|---|---|---|---|
|  | Power source frequency (MHz): | | | | | | | |
|  | 20 | 30 | 51 | 105 | 200 | 250 | 450 | 2,450 |
| White dots: | AA/AA | AA/A | AA/AA | AA/AA | AA/AA | AA/AA | AA/AA | AA/A |
| Blank memory: | A/A | AA/AA | AA/AA | AA/AA | AA/AA | AA/AA | A/A | A/B |
| Ghost: | A/A | AA/A | AA/AA | AA/AA | AA/AA | AA/AA | A/A | A/A |
| Charge performance: | AA/A | AA/AA | AA/AA | AA/AA | AA/AA | AA/AA | AA/AA | A/A |
| Sensitivity: | A/A | A/A | A/A | A/A | A/A | A/A | A/A | A/A |
| Overall evaluation: | A | A | AA | AA | AA | AA | A | B |

(Initial image/After running test)

TABLE 22

|  | Blocking layer | Photoconductive layer |
|---|---|---|
| Gas flow rate (sccm): | | |
| $SiH_4$ | 400 | 400 |
| $CH_4$ | 100 | 50 |
| $H_2$ | 1,500 | 1,500 |
| He | 2,500 | 2,500 |
| $B_2H_6$ (ppm)* | 500 | 7 |
| Pressure (mTorr): | 10 | 10 |
| High-frequency power (W): | 700 | 700 |
| Substrate temperature (°C.): | 270 | 270 |
| Layer thickness (μm): | 3.0 | 25 |

*(based on $SiH_4$)

TABLE 23

| Power source frequency (MHz): | Example 11 105 |
|---|---|
| White dots: | AA/AA |
| Blank memory: | AA/AA |
| Ghost: | AA/AA |
| Charge performance: | AA/AA |
| Sensitivity: | A/A |
| Overall evaluation: | AA |

(Initial image/After running test)

TABLE 24

| | Blocking layer | Photoconductive layer |
|---|---|---|
| Gas flow rate (sccm): | | |
| $SiH_4$ | 300 | 300 |
| $CH_4$ | 100 | |
| $H_2$ | 500 | 500 |
| $B_2H_6$ (ppm)* | 500 | 10 |
| Pressure (mTorr): | 100 | 100 |
| High-frequency power (W): | 600 | 600 |
| Substrate temperature (°C.): | 300 | 300 |
| Layer thickness (μm): | 3.0 | 23 |

*(based on $SiH_4$)

TABLE 25

| | Blocking layer | Photoconductive layer |
|---|---|---|
| Gas flow rate (sccm): | | |
| $SiH_4$ | 300 | 300 |
| $N_2$ | 50 | |
| $H_2$ | | 500 |
| $B_2H_6$ (ppm)* | 10 | 10 |
| Pressure (mTorr): | 100 | 100 |
| High-frequency power (W): | 600 | 600 |
| Substrate temperature (°C.): | 300 | 300 |
| Layer thickness (μm): | 3.0 | 23 |

*(based on $SiH_4$)

TABLE 26

| | Blocking layer | Photoconductive layer |
|---|---|---|
| Gas flow rate (sccm): | | |
| $SiH_4$ | 300 | 300 |
| $O_2$ | 10 | |
| $H_2$ | | 500 |
| $B_2H_6$ (ppm)* | 500 | 10 |
| Pressure (mTorr): | 100 | 100 |
| High-frequency power (W): | 600 | 600 |
| Substrate temperature (°C.): | 300 | 300 |
| Layer thickness (μm): | 3.0 | 23 |

*(based on $SiH_4$)

TABLE 27

| | Blocking layer | Photoconductive layer |
|---|---|---|
| Gas flow rate (sccm): | | |
| $SiH_4$ | 300 | 300 |
| $CH_4$ | 50 | |
| $N_2$ | 10 | |
| $H_2$ | | 500 |
| $B_2H_6$ (ppm)* | 500 | 10 |
| Pressure (mTorr): | 100 | 100 |
| High-frequency power (W): | 600 | 600 |
| Substrate temperature (°C.): | 300 | 300 |
| Layer thickness (μm): | 3.0 | 23 |

*(based on $SiH_4$)

TABLE 28

| | Blocking layer | Photoconductive layer |
|---|---|---|
| Gas flow rate (sccm): | | |
| $SiH_4$ | 300 | 300 |
| $CH_4$ | 50 | |
| $N_2$ | 10 | |
| $H_2$ | | 500 |
| $B_2H_6$ (ppm)* | 500 | 10 |
| Pressure (mTorr): | 100 | 100 |
| High-frequency power (W): | 600 | 600 |
| Substrate temperature (°C.): | 300 | 300 |
| Layer thickness (μm): | 3.0 | 23 |

*(based on $SiH_4$)

TABLE 29

| | Blocking layer | Photoconductive layer |
|---|---|---|
| Gas flow rate (sccm): | | |
| $SiH_4$ | 300 | 300 |
| NO | 10 | |
| $H_2$ | | 500 |
| $B_2H_6$ (ppm)* | 500 | 10 |
| Pressure (mTorr): | 100 | 100 |
| High-frequency power (W): | 600 | 600 |
| Substrate temperature (°C.): | 300 | 300 |
| Layer thickness (μm): | 3.0 | 23 |

*(based on $SiH_4$)

TABLE 30

| | Blocking layer | Photoconductive layer |
|---|---|---|
| Gas flow rate (sccm): | | |
| $SiH_4$ | 300 | 300 |
| $CO_2$ | 20 | |
| $N_2$ | 10 | |
| $H_2$ | 500 | 500 |
| $B_2H_6$ (ppm)* | | 10 |
| Pressure (mTorr): | 100 | 100 |
| High-frequency power (W): | 600 | 600 |
| Substrate temperature (°C.): | 300 | 300 |
| Layer thickness (μm): | 3.0 | 23 |

*(based on $SiH_4$)

TABLE 31

|  | Charge transport layer | Charge generation layer |
|---|---|---|
| Gas flow rate (sccm): | | |
| $SiH_4$ | 350 | 350 |
| $CH_4$ | 50 | |
| $B_2H_6$ (ppm)* | 10 | 0.5 |
| Pressure (mTorr): | 100 | 100 |
| High-frequency power (W): (RF power) | 500 | 500 |
| Substrate temperature (°C.): | 300 | 300 |
| Layer thickness (μm): | 27 | 3 |

*(based on $SiH_4$)

TABLE 32

| Power source | Cp. 12 | Example 19 | | | | | | |
|---|---|---|---|---|---|---|---|---|
| frequency (MHz): | 13.56 | 20 | 30 | 51 | 105 | 200 | 250 | 450 |
| White dots: | AA/B | A/A | A/A | AA/A | AA/AA | AA/AA | AA/AA | A/A |
| Blank memory: | AA/B | A/A | AA/AA | AA/AA | AA/AA | AA/AA | AA/AA | AA/AA |
| Ghost: | AA/A | AA/A | AA/A | AA/AA | AA/AA | AA/AA | AA/AA | AA/A |
| Potential shift: | AA/B | A/B | A/A | AA/AA | AA/AA | AA/AA | AA/A | AA/AA |
| Overall evaluation: | B | A | A | AA | AA | AA | AA | A |

(Initial image/After running test)

TABLE 33

|  | Charge transport layer | Charge generation layer |
|---|---|---|
| Gas flow rate (sccm): | | |
| $SiH_4$ | 500 | 500 |
| $CH_4$ | 120 | |
| $B_2H_6$ (ppm)* | 100 | |
| Pressure (mTorr): | 20 | 20 |
| High-frequency power (W): (Microwave power) | 1,000 | 1,000 |
| Substrate temperature (°C.): | 300 | 300 |
| Layer thickness (um): | 26 | 4 |

*(based on $SiH_4$)

TABLE 34

|  | Example 20 | | | | | | | Cp. 13 |
|---|---|---|---|---|---|---|---|---|
|  | Power source frequency (MHz): | | | | | | | |
|  | 20 | 30 | 51 | 105 | 200 | 250 | 450 | 2,450 |
| White dots: | A/A | A/A | AA/AA | AA/AA | AA/AA | AA/A | A/A | AA/B |
| Blank memory: | AA/A | AA/AA | AA/AA | AA/AA | AA/AA | AA/AA | AA/AA | AA/A |
| Ghost: | A/A | AA/A | AA/AA | AA/AA | AA/AA | AA/AA | AA/A | A/A |
| Potential shift: | A/A | A/A | A/AA | AA/AA | AA/AA | AA/AA | AA/AA | AA/B |
| Overall evaluation: | A | A | AA | AA | AA | AA | A | B |

(Initial image/After running test)

TABLE 35

|  | Charge transport layer | Charge generation layer |
|---|---|---|
| Gas flow rate (sccm): | | |
| $SiH_4$ | 500 | 500 |
| $CH_4$ | 120 | |
| $B_2H_6$ (ppm)* | 100 | 1.0 |
| Pressure (mTorr): | 150 | 150 |
| High-frequency power (W): (RF power) | 400 | 400 |
| Substrate temperature (°C.): | 320 | 320 |
| Layer thickness (µm): | 26 | 4 |

*(based on $SiH_4$)

TABLE 36

| | Cp. 14 | | Example 21 | | | | | |
|---|---|---|---|---|---|---|---|---|
| | | | Power source frequency (MHz): | | | | | |
| | 13.56 | 20 | 30 | 51 | 105 | 200 | 250 | 450 |
| White dots: | AA/B | AA/AA | A/A | A/A | AA/AA | AA/AA | AA/AA | A/A |
| Blank memory: | A/B | A/A | AA/AA | AA/AA | AA/AA | AA/AA | AA/AA | AA/AA |
| Ghost: | A/A | A/A | AA/AA | AA/AA | AA/AA | AA/AA | AA/AA | AA/A |
| Potential shift: | AA/A | AA/A | A/AA | AA/AA | AA/AA | AA/AA | AA/AA | AA/A |
| Overall evaluation: | B | A | A | AA | AA | AA | AA | A |

(Initial image/After running test)

TABLE 37

|  | Charge transport layer | Charge generation layer |
|---|---|---|
| Gas flow rate (sccm): | | |
| $SiH_4$ | 400 | 400 |
| $CH_4$ | 100 | |
| $B_2H_6$ (ppm)* | 100 | 1.0 |
| Pressure (mTorr): | 10 | 10 |
| High-frequency power (W): (Microwave power) | 1,000 | 1,000 |
| Substrate temperature (°C.): | 270 | 270 |
| Layer thickness (µm): | 25 | 5 |

*(based on $SiH_4$)

TABLE 38

| | Example 22 | | | | | | | Cp. 15 |
|---|---|---|---|---|---|---|---|---|
| | Power source frequency (MHz): | | | | | | | |
| | 20 | 30 | 51 | 105 | 200 | 250 | 450 | 2,450 |
| White dots: | AA/AA | AA/A | AA/AA | AA/AA | AA/AA | AA/AA | AA/AA | AA/A |
| Blank memory: | A/AA | A/AA | A/AA | AA/AA | AA/AA | AA/AA | A/A | A/B |
| Ghost: | A/A | AA/A | AA/AA | AA/AA | AA/AA | AA/A | A/A | A/A |
| Potential shift: | AA/A | AA/AA | AA/AA | AA/AA | AA/AA | AA/AA | AA/AA | AA/A |
| Overall evaluation: | A | A | AA | AA | AA | AA | A | B |

(Initial image/After running test)

TABLE 39

| | Charge transport layer | Charge generation layer |
|---|---|---|
| Gas flow rate (sccm): | | |
| $SiH_4$ | 400 | 500 |
| $CH_4$ | 120 | 50 |
| $H_2$ | 1,500 | 1,500 |
| He | 2,500 | 2,500 |
| $B_2H_6$ (ppm)* | 100 | 10 |
| Pressure (mTorr): | 10 | 10 |
| High-frequency power (W): | 700 | 700 |
| Substrate temperature (°C.): | 270 | 270 |
| Layer thickness (μm): | 27 | 3 |

*(based on $SiH_4$)

TABLE 40

| | |
|---|---|
| Power source frequency (MHz): | Example 23 105 |
| White dots: | AA/AA |
| Blank memory: | AA/AA |
| Ghost: | AA/AA |
| Potential shift: | AA/AA |
| Overall evaluation: | AA |

(Initial image/After running test)

TABLE 41

| | Charge transport layer | Charge generation layer |
|---|---|---|
| Gas flow rate (sccm): | | |
| $SiH_4$ | 400 | 400 |
| $CH_4$ | 100 | |
| $H_2$ | 500 | 500 |
| $B_2H_6$ (ppm)* | 100 | 10 |
| Pressure (mTorr): | 100 | 100 |
| High-frequency power (W): | 600 | 600 |
| Substrate temperature (°C.): | 300 | 300 |
| Layer thickness (μm): | 26 | 4 |

*(based on $SiH_4$)

TABLE 42

| | Charge transport layer | Charge generation layer |
|---|---|---|
| Gas flow rate (sccm): | | |
| $SiH_4$ | 400 | 400 |
| $N_2$ | 10 | |
| $H_2$ | | 500 |
| $B_2H_6$ (ppm)* | 10 | 10 |
| Pressure (mTorr): | 100 | 100 |
| High-frequency power (W): | 600 | 600 |
| Substrate temperature (°C.) | 300 | 300 |
| Layer thickness (μm): | 26 | 4 |

*(based on $SiH_4$)

TABLE 43

| | Charge transport layer | Charge generation layer |
|---|---|---|
| Gas flow rate (sccm): | | |
| $SiH_4$ | 400 | 400 |
| $O_2$ | 20 | |
| $H_2$ | | 500 |
| $B_2H_6$ (ppm)* | 100 | 10 |
| Pressure (mTorr): | 100 | 100 |
| High-freguency power (W): | 600 | 600 |
| Substrate temperature (°C.): | 300 | 300 |
| Layer thickness (μm): | 26 | 4 |

*(based on $SiH_4$)

TABLE 44

| | Charge transport layer | Charge generation layer |
|---|---|---|
| Gas flow rate (sccm): | | |
| $SiH_4$ | 400 | 400 |
| $O_2$ | 20 | |
| $N_2$ | 20 | |
| $H_2$ | | 500 |
| $B_2H_6$ (ppm)* | 100 | 10 |
| Pressure (mTorr): | 100 | 100 |
| High-frequency power (W): | 600 | 600 |
| Substrate temperature (°C.): | 300 | 300 |
| Layer thickness (μm): | 26 | 4 |

*(based on $SiH_4$)

TABLE 45

| | Charge transport layer | Charge generation layer |
|---|---|---|
| Gas flow rate (sccm): | | |
| $SiH_4$ | 400 | 400 |
| $CH_4$ | 70 | |
| $O_2$ | 20 | |
| $H_2$ | | 500 |
| $B_2H_6$ (pm)* | 100 | 10 |
| Pressure (mTorr): | 100 | 100 |
| High-frequency power (W): | 600 | 600 |
| Substrate temperature (°C.): | 300 | 300 |
| Layer thickness (μm): | 26 | 4 |

*(based on $SiH_4$)

TABLE 46

| | Charge transport layer | Charge generation layer |
|---|---|---|
| Gas flow rate (sccm): | | |
| $SiH_4$ | 400 | 400 |
| $CO_2$ | 20 | |
| $N_2$ | 10 | |
| $H_2$ | | 500 |
| $B_2H_6$ (ppm)* | 100 | 10 |
| Pressure (mTorr): | 100 | 100 |
| High-frequency power (W): | 600 | 600 |
| Substrate temperature (°C.): | 300 | 300 |
| Layer thickness (μm): | 26 | 4 |

*(based on $SiH_4$)

TABLE 47

|  | Photoconductive layer | Surface layer |
|---|---|---|
| Gas flow rate (sccm): |  |  |
| $SiH_4$ | 350 | 30 |
| $CH_4$ |  | 500 |
| $H_2$ |  | 100 |
| Pressure (mTorr): | 100 | 50 |
| High-frequency power (W): (RF power) | 500 | 300 |
| Substrate temperature (°C.): | 300 | 280 |
| Layer thickness (μm): | 25 | 0.5 |

TABLE 48

| | Cp. 16 | Example 30 | | | | | | |
|---|---|---|---|---|---|---|---|---|
| | | Power source frequency (MHz): | | | | | | |
| | 13.56 | 20 | 30 | 51 | 105 | 200 | 250 | 450 |
| White dots: | AA/B | A/A | A/A | AA/AA | AA/AA | A/A | AA/AA | A/A |
| Smeared image: | AA/A | AA/A | AA/AA | AA/AA | AA/AA | AA/AA | AA/AA | AA/AA |
| Ghost: | AA/A | A/A | AA/A | AA/AA | AA/AA | AA/AA | AA/AA | AA/A |
| Black lines: | AA/B | A/A | A/A | AA/AA | AA/AA | AA/AA | AA/AA | AA/AA |
| Overall evaluation: | B | A | A | AA | AA | AA | AA | A |

(Initial image/After running test)

TABLE 49

|  | Photoconductive layer | Surface layer |
|---|---|---|
| Gas flow rate (sccm): |  |  |
| $SiH_4$ | 500 | 50 |
| $CH_4$ |  | 500 |
| Pressure (mTorr): | 20 | 25 |
| High-frequency power (W): (Microwave power) | 1,000 | 900 |
| Substrate temperature (°C.): | 300 | 300 |
| Layer thickness (μm): | 25 | 0.5 |

TABLE 50

| | Example 31 | | | | | | | Cp. 17 |
|---|---|---|---|---|---|---|---|---|
| | Power source frequency (MHz): | | | | | | | |
| | 20 | 30 | 51 | 105 | 200 | 250 | 450 | 2,450 |
| White dots: | A/A | AA/A | AA/AA | AA/AA | A/A | AA/AA | A/A | AA/B |
| Smeared image: | AA/A | AA/AA | AA/AA | AA/AA | AA/AA | AA/AA | AA/AA | AA/A |
| Ghost: | A/A | AA/A | AA/AA | AA/AA | AA/AA | AA/AA | AA/A | A/A |
| Black lines: | A/A | A/A | AA/AA | AA/AA | AA/AA | AA/AA | AA/AA | A/B |
| Overall evaluation: | A | A | AA | AA | AA | AA | A | B |

(Initial image/After running test)

TABLE 51

|  | Photoconductive layer | Surface layer |
|---|---|---|
| Gas flow rate (sccm): | | |
| $SiH_4$ | 500 | 45 |
| $CH_4$ | | 500 |
| $H_2$ | | 200 |
| Pressure (mTorr): | 150 | 100 |
| High-frequency power (W): (RF power) | 400 | 400 |
| Substrate temperature (°C.): | 320 | 300 |
| Layer thickness (μm): | 30 | 0.5 |

TABLE 52

| | Cp. 18 | Example 32 | | | | | | |
|---|---|---|---|---|---|---|---|---|
| | | Power source frequency (MHz): | | | | | | |
| | 13.56 | 20 | 30 | 51 | 105 | 200 | 250 | 450 |
| White dots: | AA/A | AA/AA | A/A | A/A | AA/AA | AA/AA | A/A | A/A |
| Smeared image: | A/B | A/A | AA/AA | AA/AA | AA/AA | AA/AA | AA/AA | AA/AA |
| Ghost: | A/B | AA/A | AA/A | AA/AA | AA/AA | AA/AA | AA/AA | AA/A |
| Black lines: | AA/A | AA/A | A/A | AA/AA | AA/AA | AA/AA | AA/AA | AA/AA |
| Overall evaluation: | B | A | A | AA | AA | AA | AA | A |

(Initial image/After running test)

TABLE 53

|  | Photoconductive layer | Surface layer |
|---|---|---|
| Gas flow rate (sccm): | | |
| $SiH_4$ | 400 | 50 |
| $CH_4$ | | 700 |
| Pressure (mTorr): | 10 | 10 |
| High-frequency power (W): (Microwave power) | 1,000 | 1,000 |
| Substrate temperature (°C.): | 270 | 270 |
| Layer thickness (μm): | 27 | 0.6 |

TABLE 54

| | Example 33 | | | | | | | Cp. 19 |
|---|---|---|---|---|---|---|---|---|
| | Power source frequency (MHz): | | | | | | | |
| | 20 | 30 | 51 | 105 | 200 | 250 | 450 | 2,450 |
| White dots: | AA/AA | AA/A | AA/AA | AA/AA | AA/AA | AA/AA | AA/AA | AA/A |
| Smeared image: | A/A | AA/AA | AA/AA | AA/AA | AA/AA | AA/AA | A/A | A/B |
| Ghost: | A/A | AA/A | AA/AA | AA/AA | AA/AA | AA/AA | A/A | A/A |
| Black lines: | AA/A | AA/AA | AA/AA | AA/AA | AA/AA | AA/AA | AA/AA | A/A |
| Overall evaluation: | A | A | AA | AA | AA | AA | A | B |

(Initial image/After running test)

TABLE 55

|  | Photoconductive layer | Surface layer |
|---|---|---|
| Gas flow rate (sccm): | | |
| $SiH_4$ | 400 | 50 |
| $CH_4$ | 50 | 500 |
| $H_2$ | 1,500 | |
| He | 2,500 | 3,000 |
| $B_2H_6$* | 7 | |
| Pressure (mTorr): | 10 | 10 |
| High-frequency power (W): | 700 | 700 |
| Substrate temperature (°C.): | 270 | 270 |
| Layer thickness (μm): | 25 | 0.5 |

*(based on $SiH_4$)

TABLE 56

| Power source frequency (MHz): | Example 34 105 |
|---|---|
| White dots: | AA/AA |
| Smeared image: | AA/AA |
| Ghost: | AA/AA |
| Black lines: | AA/AA |
| Overall evaluation: | AA |

(Initial image/After running test)

TABLE 57

|  | Photoconductive layer | Surface layer |
|---|---|---|
| Gas flow rate (sccm): | | |
| $SiH_4$ | 300 | 35 |
| $CH_4$ | | 500 |
| $H_2$ | 500 | |
| $B_2H_6$* | 10 | |
| Pressure (mTorr): | 100 | 100 |
| High-frequency power (W): | 600 | 600 |

TABLE 57-continued

|  | Photoconductive layer | Surface layer |
|---|---|---|
| Substrate temperature (°C.): | 300 | 300 |
| Layer thickness (μm): | 23 | 0.5 |

*(based on $SiH_4$)

TABLE 58

|  | Photoconductive layer | Surface layer |
|---|---|---|
| Gas flow rate (sccm): | | |
| $SiH_4$ | 350 | 30 |
| $H_2$ | | 100 |
| $CH_4$ or $N_2$ or $O_2$ | | *** |
| Pressure (mTorr): | 100 | 80 |
| High-frequency power (W): (RF power) | 500 | 200 |
| Substrate temperature (°C.): | 300 | 280 |
| Layer thickness (μm): | 25 | 0.5 |

TABLE 59

|  | Photoconductive layer | Surface layer |
|---|---|---|
| Gas flow rate (sccm): | | |
| $SiH_4$ | 350 | 30 |
| $CH_4$ | | *** |
| $H_2$ | | 100 |
| Pressure (mTorr): | 100 | 50 |
| High-frequency power (W): (RF power) | 500 | 300 |
| Substrate temperature (°C.): | 300 | 280 |
| Layer thickness (μm): | 25 | 0.5 |

TABLE 60

|  | Example 36 | | | | | | | Cp. 20 |
|---|---|---|---|---|---|---|---|---|
|  | Power source frequency (MHz): | | | | | | | |
|  | 20 | 30 | 51 | 105 | 260 | 250 | 450 | 13.56 |
| White dots: | A/A | A/A | AA/AA | AA/AA | A/A | AA/AA | A/A | AA/B |
| Smeared image: | AA/A | AA/AA | AA/AA | AA/AA | AA/AA | AA/AA | AA/AA | AA/A |
| Ghost: | A/A | AA/A | AA/AA | AA/AA | AA/AA | AA/AA | A/A | AA/A |
| Black lines: | A/A | A/A | AA/AA | AA/AA | AA/AA | AA/AA | AA/AA | AA/B |
| Charge performance: | A/A | A/A | AA/AA | AA/AA | AA/AA | A/A | A/A | B/B |
| High-intensity exposure smeared image: | A/A | A/A | AA/AA | AA/AA | AA/AA | A/A | A/A | B/B |
| Overall evaluation: | A | A | AA | AA | AA | AA | A | B |

(Initial image/After running test)

TABLE 61

|  | Photoconductive layer | Surface layer |
|---|---|---|
| Gas flow rate (sccm): | | |
| $SiH_4$ | 500 | 20 |
| $CH_4$ | | *** |
| Pressure (mTorr): | 20 | 25 |
| High-frequency power (W): (Microwave power) | 1,000 | 900 |
| Substrate temperature (°C.): | 300 | 300 |
| Layer thickness (μm): | 25 | 0.5 |

TABLE 62

| | Example 37 | | | | | | | Cp. 21 |
|---|---|---|---|---|---|---|---|---|
| | Power source frequency (MHz): | | | | | | | |
| | 20 | 30 | 51 | 105 | 200 | 250 | 450 | 2,450 |
| White dots: | A/A | AA/A | AA/AA | AA/AA | A/A | AA/AA | A/A | AA/B |
| Smeared image: | AA/A | AA/AA | AA/AA | AA/AA | AA/AA | AA/AA | AA/AA | AA/A |
| Ghost: | A/A | AA/A | AA/AA | AA/AA | AA/AA | AA/AA | AA/A | A/A |
| Black lines: | A/A | A/A | AA/AA | AA/AA | AA/AA | AA/AA | AA/AA | A/B |
| Charge performance: | A/A | A/A | AA/AA | AA/AA | AA/AA | AA/AA | A/A | B/B |
| High-intensity exposure smeared image: | A/A | A/A | AA/AA | AA/AA | AA/AA | AA/AA | A/A | B/B |
| Overall evaluation: | A | A | AA | AA | AA | AA | A | B |

(Initial image/After running test)

TABLE 63

|  | Photoconductive layer | Surface layer |
|---|---|---|
| Gas flow rate (sccm): | | |
| $SiH_4$ | 500 | 10 |
| $O_2$ | | *** |
| Pressure (mTorr): | 150 | 100 |
| High-frequency power (W): (RF power) | 400 | 400 |
| Substrate temperature (°C.): | 320 | 300 |
| Layer thickness (μm): | 30 | 0.5 |

TABLE 64

| | Example 38 | | | | | | | Cp. 22 |
|---|---|---|---|---|---|---|---|---|
| | Power source frequency (MHz): | | | | | | | |
| | 20 | 30 | 51 | 105 | 200 | 250 | 450 | 13.56 |
| White dots: | AA/AA | A/A | A/A | AA/AA | AA/AA | A/A | A/A | AA/A |
| Smeared image: | A/A | AA/AA | AA/AA | AA/AA | AA/AA | AA/AA | AA/AA | A/B |
| Ghost: | AA/A | AA/A | AA/AA | AA/AA | AA/AA | AA/AA | AA/A | A/B |
| Black lines: | AA/A | A/A | AA/AA | AA/AA | AA/AA | AA/AA | AA/AA | AA/A |

TABLE 64-continued

|  | Example 38 | | | | | | | Cp. 22 |
|---|---|---|---|---|---|---|---|---|
|  | Power source frequency (MHz): | | | | | | | |
|  | 20 | 30 | 51 | 105 | 200 | 250 | 450 | 13.56 |
| Charge performance: | A/A | A/A | AA/AA | AA/AA | AA/AA | AA/AA | A/A | B/B |
| High-intensity exposure smeared image: | A/A | A/A | AA/AA | AA/AA | AA/AA | AA/AA | A/A | B/B |
| Overall evaluation: | A | A | AA | AA | AA | AA | A | B |

(Initial image/After running test)

TABLE 65

|  | Photoconductive layer | Surface layer |
|---|---|---|
| Gas flow rate (sccm): | | |
| SiH$_4$ | 400 | 50 |
| CH$_4$ |  | *** |
| O$_2$ |  | *** |
| N$_2$ |  | *** |
| Pressure (mTorr): | 10 | 10 |
| High-freguency power (W): (Microwave power) | 1,000 | 1,000 |
| Substrate temperature (°C.): | 270 | 270 |
| Layer thickness (μm): | 27 | 0.6 |

TABLE 66

|  | Example 39 | | | | | | | Cp. 23 |
|---|---|---|---|---|---|---|---|---|
|  | Power source frequency (MHz): | | | | | | | |
|  | 20 | 30 | 51 | 105 | 200 | 250 | 450 | 2,450 |
| White dots: | AA/AA | AA/A | AA/AA | AA/AA | AA/AA | AA/AA | AA/AA | AA/A |
| Smeared image: | A/A | AA/AA | AA/AA | AA/AA | AA/AA | AA/AA | A/A | A/B |
| Ghost: | A/A | AA/A | AA/AA | AA/AA | AA/AA | AA/AA | A/A | A/A |
| Black lines: | AA/A | AA/AA | AA/AA | AA/AA | AA/AA | AA/AA | AA/AA | A/A |
| Charge performance: | A/A | A/A | AA/AA | AA/AA | AA/AA | AA/AA | A/A | B/B |
| High-intensity exposure smeared image: | A/A | A/A | AA/AA | AA/AA | AA/AA | AA/AA | A/A | B/B |
| Overall evaluation: | A | A | AA | AA | AA | AA | A | B |

(Initial image/After running test)

TABLE 67

|  | Photoconductive layer | Surface layer |
|---|---|---|
| Gas flow rate (sccm): | | |
| SiH$_4$ | 400 | 50 |
| CH$_4$ | 50 | *** |
| H$_2$ | 1,500 | |
| He | 2,500 | 3,000 |
| B$_2$H$_6$ (ppm)* | 7 | |
| Pressure (mTorr): | 10 | 10 |
| High-frequency power (W): | 700 | 700 |
| Substrate temperature (°C.): | 270 | 270 |
| Layer thickness (μm): | 25 | 0.5 |

*(based on SiH$_4$)

TABLE 68

| | Example 40 | Comparative Example 24 |
|---|---|---|
| Power source frequency (MHz): | 105 | 105 |
| White dots: | AA/AA | AA/AA |
| Smeared image: | AA/AA | A/A |
| Ghost: | AA/AA | AA/AA |
| Black lines: | AA/AA | AA/AA |
| Charge performance: | AA/AA | A/A |
| High-intensity exposure smeared image: | AA/AA | A/A |
| Photosensitivity: | AA/AA | A/A |
| Overall evaluation: | AA | A |

(Initial image/After running test)

TABLE 69

| | Photoconductive layer | Surface layer |
|---|---|---|
| Gas flow rate (sccm): | | |
| $SiH_4$ | 300 | 35 |
| $CH_4$ | | *** |
| $NH_3$ | | *** |
| CO | | *** |
| $H_2$ | 500 | |
| $B_2H_6$ (ppm)* | 10 | |
| Pressure (mTorr): | 100 | 100 |
| High-frequency power (W): | 600 | 600 |
| Substrate temperature (°C.): | 300 | 300 |
| Layer thickness (μm): | 23 | 0.5 |

*(based on $SiH_4$)

TABLE 70

| | Example 41 | Comparative Example 25 |
|---|---|---|
| Power source frequency (MHz): | 105 | 105 |
| White dots: | AA/AA | AA/AA |
| Smeared image: | AA/AA | A/A |
| Ghost: | AA/AA | AA/AA |
| Black lines: | AA/AA | AA/AA |
| Charge performance: | AA/AA | A/A |
| High-intensity exposure smeared image: | AA/AA | A/A |
| Photosensitivity: | AA/AA | A/A |
| Overall evaluation: | AA | A |

(Initial image/After running test)

TABLE 71

| | Blocking layer | Photoconductive layer |
|---|---|---|
| Gas flow rate (sccm): | | |
| $SiH_4$ | 450 | 450 |
| $B_2H_6$ (ppm) | 1,000 | |
| $CO_2$ | 10 | |
| Pressure (mTorr): | 70 | 80 |
| High-frequency power (W): | 500 | 500 |
| Substrate temperature (°C.): | 300 | 280 |
| Layer thickness (μm): | 3.0 | 25.0 |

TABLE 72

Evaluation on white dots

| | Frequency (MHz) | | | | | |
|---|---|---|---|---|---|---|
| Bias voltage | 20 | 51 | 105 | 144 | 250 | 450 |
| (Example 43) | | | | | | |
| 0: (Example 42) | A/B | AA/A | AA/A | AA/A | AA/B | A/B |
| 50: | A/A | AA/AA | AA/AA | AA/AA | AA/AA | A/A |
| 100: | A/A | AA/AA | AA/AA | AA/AA | AA/AA | A/A |
| 150: | A/A | AA/AA | AA/AA | AA/AA | AA/AA | A/A |
| 200: | A/A | AA/AA | AA/AA | AA/AA | A/A | A/A |
| (Example 43) | | | | | | |
| 250: | A/B | A/B | A/B | A/B | A/B | A/B |

(Initial image/After running test)

TABLE 73

Evaluation on smeared image

| | Frequency (MHz) | | | | | |
|---|---|---|---|---|---|---|
| Bias voltage | 20 | 51 | 105 | 144 | 250 | 450 |
| (Example 43) | | | | | | |
| 0: (Example 42) | AA/A | A/B | AA/A | AA/A | AA/A | A/B |
| 50: | AA/A | AA/AA | AA/AA | AA/AA | AA/AA | AA/AA |
| 100: | A/A | AA/AA | AA/AA | AA/AA | AA/AA | AA/AA |
| 150: | AA/AA | AA/AA | AA/AA | AA/AA | AA/AA | AA/AA |
| 200: | AA/AA | AA/AA | AA/AA | AA/AA | AA/AA | AA/AA |
| (Example 43) | | | | | | |
| 250: | AA/AA | AA/AA | AA/AA | AA/AA | AA/AA | AA/AA |

(Initial image/After running test)

TABLE 74

Evaluation on ghost

| | Frequency (MHz) | | | | | |
|---|---|---|---|---|---|---|
| Bias voltage | 20 | 51 | 105 | 144 | 250 | 450 |
| (Example 43) | | | | | | |
| 0: (Example 42) | A/A | AA/B | AA/A | AA/B | AA/A | AA/A |
| 50: | A/A | AA/AA | AA/AA | AA/AA | AA/AA | AA/AA |
| 100: | A/A | AA/AA | AA/AA | AA/AA | AA/AA | A/A |
| 150: | A/A | AA/AA | AA/AA | AA/AA | AA/AA | AA/A |
| 200: | A/A | AA/AA | AA/AA | AA/AA | AA/AA | AA/AA |
| (Example 43) | | | | | | |
| 250: | A/A | AA/AA | AA/AA | AA/AA | AA/AA | AA/AA |

(Initial image/After running test)

TABLE 75

Evaluation on blank memory

| Bias voltage | Frequency (MHz) | | | | | |
|---|---|---|---|---|---|---|
| | 20 | 51 | 105 | 144 | 250 | 450 |
| (Example 43) | | | | | | |
| 0: | AA/A | AA/B | AA/A | AA/B | AA/A | AA/B |
| (Example 42) | | | | | | |
| 50: | A/A | AA/AA | AA/AA | AA/AA | AA/AA | AA/AA |
| 100: | A/A | AA/AA | AA/AA | AA/AA | AA/AA | AA/AA |
| 150: | A/A | AA/AA | AA/AA | AA/AA | AA/AA | AA/AA |
| 200: | A/A | AA/AA | AA/AA | AA/AA | AA/AA | AA/AA |
| (Example 43) | | | | | | |
| 250: | A/A | AA/AA | AA/AA | AA/AA | AA/AA | AA/AA |

(Initial image/After running test)

TABLE 76

Evaluation on charge performance

| Bias voltage | Frequency (MHz) | | | | | |
|---|---|---|---|---|---|---|
| | 20 | 51 | 105 | 144 | 250 | 450 |
| (Example 43) | | | | | | |
| 0: | A/A | AA/B | AA/A | AA/B | AA/B | AA/B |
| (Example 42) | | | | | | |
| 50: | A/A | AA/AA | AA/AA | AA/AA | AA/AA | A/A |
| 100: | A/A | AA/AA | AA/AA | AA/AA | AA/AA | AA/AA |
| 150: | A/A | AA/AA | AA/AA | AA/AA | AA/AA | AA/AA |
| 200: | A/A | AA/AA | AA/AA | AA/AA | AA/AA | AA/AA |
| (Example 43) | | | | | | |
| 250: | A/A | AA/AA | AA/AA | AA/AA | AA/AA | AA/AA |

(Initial image/After running test)

TABLE 77

Overall evaluation

| Bias voltage | Frequency (MHz) | | | | | |
|---|---|---|---|---|---|---|
| | 20 | 51 | 105 | 144 | 250 | 450 |
| (Example 43) | | | | | | |
| 0: | B | A | A | A | A | B |
| (Example 42) | | | | | | |
| 50: | A | AA | AA | AA | AA | A |
| 100: | A | AA | AA | AA | AA | A |
| 150: | A | AA | AA | AA | AA | A |
| 200: | A | AA | AA | AA | A | A |
| (Example 43) | | | | | | |
| 250: | B | B | A | A | A | B |

TABLE 78

| | Blocking layer | Photoconductive layer |
|---|---|---|
| Gas flow rate (sccm): | | |
| SiH$_4$ | 500 | 500 |
| B$_2$H$_6$ (ppm) | 1,000 | |
| H$_2$ | | 500 |
| CO$_2$ | 10 | |
| Pressure (mTorr): | 200 | 200 |

TABLE 78-continued

| | Blocking layer | Photoconductive layer |
|---|---|---|
| High-frequency power (W): | 500 | 350 |
| Substrate temperature (°C.): | 270 | 270 |
| Layer thickness (μm): | 3 | 30 |

TABLE 79

Evaluation on white dots

| Bias voltage | Frequency (MHz) | | | | | | |
|---|---|---|---|---|---|---|---|
| | 13.56 | 20 | 51 | 105 | 144 | 250 | 450 |
| 50: | AA/A | A/A | AA/AA | AA/AA | AA/AA | AA/AA | A/A |
| 100: | A/B | A/A | AA/AA | AA/AA | AA/AA | AA/AA | A/A |
| 150: | A/B | A/A | AA/AA | AA/AA | AA/AA | AA/AA | A/A |
| 200: | A/B | A/A | AA/AA | AA/AA | AA/AA | A/A | A/A |
| | Cp. 26 | | | Example 44 | | | |

(Initial image/After running test)

TABLE 80

Evaluation on smeared image

| Bias voltage | Frequency (MHz) | | | | | | |
|---|---|---|---|---|---|---|---|
| | 13.56 | 20 | 51 | 105 | 144 | 250 | 450 |
| 50: | AA/B | AA/A | AA/AA | AA/AA | AA/AA | AA/AA | AA/AA |
| 100: | AA/B | A/A | AA/AA | AA/AA | AA/AA | AA/AA | AA/AA |
| 150: | AA/B | AA/AA | AA/AA | AA/AA | AA/AA | AA/AA | AA/AA |
| 200: | A/B | AA/AA | AA/AA | AA/AA | AA/AA | AA/AA | AA/AA |
| | Cp. 26 | | | Example 44 | | | |

(Initial image/After running test)

TABLE 81

Evaluation on ghost

| Bias voltage | Frequency (MHz) | | | | | | |
|---|---|---|---|---|---|---|---|
| | 13.56 | 20 | 51 | 105 | 144 | 250 | 450 |
| 50: | AA/B | A/A | A/A | AA/AA | AA/AA | AA/AA | AA/AA |
| 100: | AA/A | A/A | AA/AA | AA/AA | AA/AA | AA/AA | A/A |
| 150: | A/B | A/A | AA/AA | AA/AA | AA/AA | AA/AA | AA/A |
| 200: | AA/A | A/A | AA/AA | AA/AA | AA/AA | AA/AA | AA/AA |
| | Cp. 26 | | | Example 44 | | | |

(Initial image/After running test)

TABLE 82

Evaluation on blank memory

| Bias voltage | Frequency (MHz) | | | | | | |
|---|---|---|---|---|---|---|---|
| | 13.56 | 20 | 51 | 105 | 144 | 250 | 450 |
| 50: | AA/B | A/A | AA/AA | AA/AA | AA/AA | AA/AA | AA/AA |
| 100: | A/B | A/A | AA/AA | AA/AA | AA/AA | AA/AA | AA/AA |
| 150: | AA/A | A/A | AA/AA | AA/AA | AA/AA | AA/AA | AA/AA |
| 200: | A/B | A/A | AA/AA | AA/AA | AA/AA | AA/AA | AA/AA |
| | Cp. 26 | | | Example 44 | | | |

(Initial image/After running test)

TABLE 83

Evaluation on charge performance

| Bias voltage | Frequency (MHz) | | | | | | |
|---|---|---|---|---|---|---|---|
| | 13.56 | 20 | 51 | 105 | 144 | 250 | 450 |
| 50: | B/B | A/A | AA/AA | AA/AA | AA/AA | AA/AA | A/A |
| 100: | A/B | A/A | AA/AA | AA/AA | AA/AA | AA/AA | AA/AA |
| 150: | A/B | A/A | AA/AA | AA/AA | AA/AA | AA/AA | AA/AA |
| 200: | B/B | A/A | AA/AA | AA/AA | AA/AA | AA/AA | AA/AA |
| | Cp. 26 | | | Example 44 | | | |

(Initial image/After running test)

TABLE 84

Overall evaluation

| Bias voltage | Frequency (MHz) | | | | | | |
|---|---|---|---|---|---|---|---|
| | 13.56 | 20 | 51 | 105 | 144 | 250 | 450 |
| 50: | B | A | A | AA | AA | AA | A |
| 100: | B | A | AA | AA | AA | AA | A |
| 150: | B | A | AA | AA | AA | AA | A |
| 200: | B | A | AA | AA | AA | A | A |
| | Cp. 26 | | | Example 44 | | | |

TABLE 85

| | Blocking layer | Photoconductive layer |
|---|---|---|
| Gas flow rate (sccm): | | |
| $SiH_4$ | 500 | 600 |
| $B_2H_6$ (ppm) | 1,000 | |
| $CO_2$ | 10 | |
| Pressure (mTorr): | 60 | 50 |
| High-frequency power (W): | 500 | 700 |
| Substrate temperature (°C.): | 300 | 300 |
| Layer thickness (μm): | 3 | 25 |

TABLE 86

Evaluation on white dots

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | A/A | A/B |
| 100: | A/A | AA/AA | AA/AA | AA/AA | AA/AA | A/A | AA/B |
| 150: | A/A | AA/AA | AA/AA | AA/AA | AA/AA | A/A | AA/A |
| 200: | A/A | AA/AA | AA/AA | AA/AA | A/A | A/A | A/B |
| | | | | Example 45 | | | Cp. 27 |

(Initial image/After running test)

TABLE 87

Evaluation on smeared image

| Bias voltage | Frequency (MHz) | | | | | | |
|---|---|---|---|---|---|---|---|
| | 20 | 51 | 105 | 144 | 250 | 450 | 2450 |
| 50: | AA/A | AA/AA | AA/AA | AA/AA | AA/AA | AA/AA | AA/A |
| 100: | A/A | AA/AA | AA/AA | AA/AA | AA/AA | AA/AA | AA/B |
| 150: | AA/AA | AA/AA | AA/AA | AA/AA | AA/AA | AA/AA | A/B |
| 200: | AA/AA | AA/AA | AA/AA | AA/AA | AA/AA | AA/AA | AA/A |
| | | | | Example 45 | | | Cp. 27 |

(Initial image/After running test)

TABLE 88

Evaluation on ghost

| Bias voltage | Frequency (MHz) | | | | | | |
|---|---|---|---|---|---|---|---|
| | 20 | 51 | 105 | 144 | 250 | 450 | 2450 |
| 50: | A/A | A/A | AA/AA | AA/AA | AA/AA | AA/AA | AA/A |
| 100: | A/A | AA/AA | AA/AA | AA/AA | AA/AA | A/A | AA/B |
| 150: | A/A | AA/AA | AA/AA | AA/AA | AA/AA | AA/A | A/A |
| 200: | A/A | AA/AA | AA/AA | AA/AA | AA/AA | AA/AA | AA/A |
| | | | | Example 45 | | | Cp. 27 |

(Initial image/After running test)

TABLE 89

Evaluation on blank memory

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | AA/AA | AA/B |
| 100: | A/A | AA/AA | AA/AA | AA/AA | AA/AA | AA/AA | A/B |
| 150: | A/A | AA/AA | AA/AA | AA/AA | AA/AA | AA/AA | AA/B |
| 200: | A/A | AA/AA | AA/AA | AA/AA | AA/AA | AA/AA | AA/A |
| | | | | Example 45 | | | Cp. 27 |

(Initial image/After running test)

TABLE 90

Evaluation on charge performance

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | A/A | B/B |
| 100: | A/A | AA/AA | AA/AA | AA/AA | AA/AA | AA/AA | A/B |
| 150: | A/A | AA/AA | AA/AA | AA/AA | AA/AA | AA/AA | A/A |
| 200: | A/A | AA/AA | AA/AA | AA/AA | AA/AA | AA/AA | A/B |
| | | | | Example 45 | | | Cp. 27 |

(Initial image/After running test)

TABLE 91

Overall evaluation

| Bias voltage | Frequency (MHz) | | | | | | |
|---|---|---|---|---|---|---|---|
| | 20 | 51 | 105 | 144 | 250 | 450 | 2450 |
| 50: | A | A | AA | AA | AA | A | B |
| 100: | A | AA | AA | AA | AA | A | B |
| 150: | A | AA | AA | AA | AA | A | B |
| 200: | A | AA | AA | AA | AA | A | B |
| | | | | Example 45 | | | Cp. 27 |

TABLE 92

|  | Blocking layer | Photoconductive layer |
|---|---|---|
| Gas flow rate (sccm): |  |  |
| $SiH_4$ | 400 | 400 |
| $H_2$ | 150 | 150 |
| $B_2H_6$ (ppm)* | 1,000 | 5 |
| $CO_2$ | 10 |  |
| Pressure (mTorr): | 20 | 20 |
| High frequency (MHz): | 144 | 144 |
| Bias voltage ($V_0$) | 60 | 80 |
| High-frequency power (W): | 500 | 400 |
| Substrate temperature (°C.): | 330 | 330 |
| Layer thickness (μm): | 3.0 | 28 |

*(based on $SiH_4$)

TABLE 93

|  | Blocking layer | Photoconductive layer |
|---|---|---|
| Gas flow rate (sccm): |  |  |
| $SiH_4$ | 500 | 500 |
| $H_2$ | 150 | 150 |
| $B_2H_6$ (ppm)* | 1,000 | 5 |
| $CO_2$ | 10 |  |
| Pressure (mTorr): | 20 | 20 |
| High frequency (MHz): | 105 | 105 |
| Bias voltage ($V_0$) | 120 | 120 |
| High-frequency power (W): | 350 | 300 |
| Substrate temperature (°C.): | 250 | 250 |
| Layer thickness (μm): | 3.0 | 30 |

*(based on $SiH_4$)

TABLE 94

|  | Example | | | |
|---|---|---|---|---|
|  | 46 | 47 | 48 | 49 |
| White dots: | AA/AA | AA/AA | AA/AA | AA/AA |
| Smeared image: | AA/AA | AA/AA | AA/AA | AA/AA |
| Ghost: | AA/AA | AA/AA | AA/AA | AA/AA |
| Blank memory: | AA/AA | AA/AA | AA/AA | AA/AA |
| Charge performance: | AA/AA | AA/AA | AA/AA | AA/AA |
| Overall evaluation: | AA | AA | AA | AA |

(Initial image/After running test)

TABLE 95

|  | Blocking layer | Photoconductive layer |
|---|---|---|
| Gas flow rate (sccm): |  |  |
| $SiH_4$ | 450 | 500 |
| $B_2H_6$ (ppm) | 1,000 |  |
| $H_2$ |  | 100 |
| $CO_2$ | 10 |  |
| Pressure (mTorr): | 30 | 30 |
| High frequency (MHz): | 105 | 105 |
| Bias voltage ($V_0$) | DC/AC superimposed | DC/AC superimposed |
| High-frequency power (W): | 300 | 350 |
| Substrate temperature (°C.): | 250 | 250 |
| Layer thickness (μm): | 3 | 29 |

TABLE 96

|  | Blocking layer | Photoconductive layer |
|---|---|---|
| Gas flow rate (sccm): |  |  |
| $SiH_4$ | 400 | 350 |
| $B_2H_6$ (ppm) | 1,000 | 3 |
| $H_2$ |  | 150 |
| $CO_2$ | 10 |  |
| Pressure (mTorr): | 20 | 20 |
| High frequency (MHz): | 105 | 105 |
| Bias voltage ($V_0$) | DC/AC superimposed | DC/AC superimposed |
| High-frequency power (W): | 300 | 350 |
| Substrate temperature (°C.): | 280 | 280 |
| Layer thickness (μm): | 3 | 30 |

TABLE 97

|  | Example | |
|---|---|---|
|  | 50 | 51 |
| White dots: | AA/AA | AA/AA |
| Smeared image: | AA/AA | AA/AA |
| Ghost: | AA/AA | AA/AA |
| Blank memory: | AA/AA | AA/AA |
| Charge performance: | AA/AA | AA/AA |
| Overall evaluation: | AA | AA |

(Initial image/After running test)

TABLE 98

|  | Photoconductive layer | Surface layer |
|---|---|---|
| Gas flow rate (sccm): |  |  |
| $SiH_4$ | 450 | 30 |
| $CH_4$ |  | 500 |
| $H_2$ |  | 100 |
| NO |  | 10 |
| Pressure (mTorr): | 70 | 80 |
| High-frequency power (W): | 500 | 300 |
| Substrate temperature (°C.): | 300 | 280 |
| Layer thickness (μm): | 30 | 0.5 |

TABLE 99

Evaluation on white dots

| Bias voltage | Frequency (MHz) | | | | | |
|---|---|---|---|---|---|---|
|  | 20 | 51 | 105 | 144 | 250 | 450 |
| (Example 53) 0: | A/B | AA/A | AA/A | A/A | AA/B | A/B |
| (Example 52) |  |  |  |  |  |  |
| 50: | A/A | AA/AA | AA/AA | AA/AA | AA/AA | A/A |
| 100: | A/A | AA/AA | AA/AA | AA/AA | AA/AA | A/A |
| 150: | A/A | AA/AA | AA/AA | AA/AA | AA/AA | A/A |
| 200: | A/A | AA/AA | AA/AA | AA/AA | A/A | A/A |
| (Example 53) 250: | A/B | A/B | A/B | A/B | A/B | A/B |

(Initial image/After running test)

TABLE 100

Evaluation on smeared image

| Bias voltage | Frequency (MHz) | | | | | |
|---|---|---|---|---|---|---|
| | 20 | 51 | 105 | 144 | 250 | 450 |
| (Example 53) | | | | | | |
| 0: (Example 52) | AA/A | AA/B | AA/A | AA/A | AA/A | A/B |
| 50: | AA/A | AA/AA | AA/AA | AA/AA | AA/AA | AA/AA |
| 100: | A/A | AA/AA | AA/AA | AA/AA | AA/AA | AA/AA |
| 150: | AA/AA | AA/AA | AA/AA | AA/AA | AA/AA | AA/AA |
| 200: (Example 53) | AA/AA | AA/AA | AA/AA | AA/AA | AA/AA | AA/AA |
| 250: | AA/AA | AA/AA | AA/AA | AA/AA | AA/AA | AA/AA |

(Initial image/After running test)

TABLE 101

Evaluation on ghost

| Bias voltage | Frequency (MHz) | | | | | |
|---|---|---|---|---|---|---|
| | 20 | 51 | 105 | 144 | 250 | 450 |
| (Example 53) | | | | | | |
| 0: (Example 52) | A/A | AA/B | AA/A | AA/B | AA/A | AA/A |
| 50: | A/A | AA/AA | AA/AA | AA/AA | AA/AA | AA/AA |
| 100: | A/A | AA/AA | AA/AA | AA/AA | AA/AA | A/A |
| 150: | A/A | AA/AA | AA/AA | AA/AA | AA/AA | AA/A |
| 200: (Example 53) | A/A | AA/AA | AA/AA | AA/AA | AA/AA | AA/AA |
| 250: | A/A | AA/AA | AA/AA | AA/AA | AA/AA | AA/AA |

(Initial image/After running test)

TABLE 102

Evaluation on black lines

| Bias voltage | Frequency (MHz) | | | | | |
|---|---|---|---|---|---|---|
| | 20 | 51 | 105 | 144 | 250 | 450 |
| (Example 53) | | | | | | |
| 0: (Example 52) | A/A | AA/B | AA/A | AA/B | AA/A | A/B |
| 50: | A/A | AA/AA | AA/AA | AA/AA | AA/AA | AA/AA |
| 100: | A/A | AA/AA | AA/AA | AA/AA | AA/AA | AA/AA |
| 150: | A/A | AA/AA | AA/AA | AA/AA | AA/AA | AA/AA |
| 200: (Example 53) | A/A | AA/AA | AA/AA | AA/AA | AA/AA | AA/AA |
| 250: | A/A | AA/AA | AA/AA | AA/AA | AA/AA | AA/AA |

(Initial image/After running test)

TABLE 103

Evaluation on sensitivity

| Bias voltage | Frequency (MHz) | | | | | |
|---|---|---|---|---|---|---|
| | 20 | 51 | 105 | 144 | 250 | 450 |
| (Example 53) | | | | | | |
| 0: (Example 52) | A/A | A/B | A/A | A/B | A/B | A/B |
| 50: | A/A | AA/AA | AA/AA | AA/AA | AA/AA | A/A |
| 100: | A/A | AA/AA | AA/AA | AA/AA | AA/AA | AA/AA |
| 150: | A/A | AA/AA | AA/AA | AA/AA | AA/AA | AA/AA |
| 200: (Example 53) | A/A | AA/AA | AA/AA | AA/AA | AA/AA | AA/AA |
| 250: | A/A | AA/AA | AA/AA | AA/AA | AA/AA | AA/AA |

(Initial image/After running test)

TABLE 104

Overall evaluation

| Bias voltage | Frequency (MHz) | | | | | |
|---|---|---|---|---|---|---|
| | 20 | 51 | 105 | 144 | 250 | 450 |
| (Example 53) | | | | | | |
| 0: (Example 52) | B | A | A | A | A | B |
| 50: | A | AA | AA | AA | AA | A |
| 100: | A | AA | AA | AA | AA | A |
| 150: | A | AA | AA | AA | AA | A |
| 200: (Example 53) | A | AA | AA | AA | A | A |
| 250: | B | B | B | B | B | B |

TABLE 105

| | Photoconductive layer | Surface layer |
|---|---|---|
| Gas flow rate (sccm): | | |
| $SiH_4$ | 500 | 50 |
| $CH_4$ | | 700 |
| $H_2$ | | 200 |
| NO | | 10 |
| Pressure (mTorr): | 200 | 200 |
| High-frequency power (W): | 500 | 350 |
| Substrate temperature (°C.): | 270 | 270 |
| Layer thickness (µm): | 30 | 0.5 |

TABLE 106

Evaluation on white dots

| Bias voltage | 13.56 | Frequency (MHz) | | | | | |
|---|---|---|---|---|---|---|---|
| | | 20 | 51 | 105 | 144 | 250 | 450 |
| 50: | AA/B | A/A | AA/AA | AA/AA | AA/AA | AA/AA | A/A |
| 100: | A/B | A/A | AA/AA | AA/AA | AA/AA | AA/AA | A/A |
| 150: | A/B | A/A | AA/AA | AA/AA | AA/AA | AA/AA | A/A |
| 200: | A/B | A/A | AA/AA | AA/AA | AA/AA | A/A | A/A |
| | Cp. 28 | | | Example 54 | | | |

(Initial image/After running test)

TABLE 107

Evaluation on smeared image

| Bias voltage | Frequency (MHz) | | | | | | |
|---|---|---|---|---|---|---|---|
| | 13.56 | 20 | 51 | 105 | 144 | 250 | 450 |
| 50: | AA/B | AA/A | AA/AA | AA/AA | AA/AA | AA/AA | AA/AA |
| 100: | AA/B | A/A | AA/AA | AA/AA | AA/AA | AA/AA | AA/AA |
| 150: | AA/B | AA/AA | AA/AA | AA/AA | AA/AA | AA/AA | AA/AA |
| 200: | A/B | AA/AA | AA/AA | AA/AA | AA/AA | AA/AA | AA/AA |
| | Cp. 28 | | | Example 54 | | | |

(Initial image/After running test)

TABLE 108

Evaluation on ghost

| Bias voltage | Frequency (MHz) | | | | | | |
|---|---|---|---|---|---|---|---|
| | 13.56 | 20 | 51 | 105 | 144 | 250 | 450 |
| 50: | AA/B | A/A | A/A | AA/AA | AA/AA | AA/AA | AA/AA |
| 100: | AA/A | A/A | AA/AA | AA/AA | AA/AA | AA/AA | A/A |
| 150: | A/B | A/A | AA/AA | AA/AA | AA/AA | AA/AA | AA/A |
| 200: | AA/A | A/A | AA/AA | AA/AA | AA/AA | AA/AA | AA/AA |
| | Cp. 28 | | | Example 54 | | | |

(Initial image/After running test)

TABLE 109

Evaluation on black lines

| Bias voltage | Frequency (MHz) | | | | | | |
|---|---|---|---|---|---|---|---|
| | 13.56 | 20 | 51 | 105 | 144 | 250 | 450 |
| 50: | AA/B | A/A | AA/AA | AA/AA | AA/AA | AA/AA | AA/AA |
| 100: | A/B | A/A | AA/AA | AA/AA | AA/AA | AA/AA | AA/AA |
| 150: | AA/A | A/A | AA/AA | AA/AA | AA/AA | AA/AA | AA/AA |
| 200: | A/B | A/A | AA/AA | AA/AA | AA/AA | AA/AA | AA/AA |
| | Cp. 28 | | | Example 54 | | | |

(Initial image/After running test)

TABLE 110

Evaluation on sensitivity

| Bias voltage | Frequency (MHz) | | | | | | |
|---|---|---|---|---|---|---|---|
| | 13.56 | 20 | 51 | 105 | 144 | 250 | 450 |
| 50: | B/B | A/A | AA/AA | AA/AA | AA/AA | AA/AA | A/A |
| 100: | A/B | A/A | AA/AA | AA/AA | AA/AA | AA/AA | AA/AA |
| 150: | A/B | A/A | AA/AA | AA/AA | AA/AA | AA/AA | AA/AA |
| 200: | B/B | A/A | AA/AA | AA/AA | AA/AA | AA/AA | AA/AA |
| | Cp. 28 | | | Example 54 | | | |

(Initial image/After running test)

TABLE 111

Overall evaluation

| Bias voltage | Frequency (MHz) | | | | | | |
|---|---|---|---|---|---|---|---|
| | 13.56 | 20 | 51 | 105 | 144 | 250 | 450 |
| 50: | B | A | A | AA | AA | AA | A |
| 100: | B | A | AA | AA | AA | AA | A |
| 150: | B | A | AA | AA | AA | AA | A |
| 200: | B | A | AA | AA | AA | A | A |
| | Cp. 28 | | | Example 54 | | | |

TABLE 112

| | Photoconductive layer | Surface layer |
|---|---|---|
| Gas flow rate (sccm): | | |
| SiH$_4$ | 600 | 50 |
| CH$_4$ | | 500 |
| NO | | 10 |
| Pressure (mTorr): | 50 | 45 |
| High-frequency power (W): | 700 | 600 |
| Substrate temperature (°C.): | 300 | 300 |
| Layer thickness (μm): | 25 | 0.5 |

TABLE 113

Evaluation on white dots

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | A/A | A/B |
| 100: | A/A | AA/AA | AA/AA | AA/AA | AA/AA | A/A | AA/B |
| 150: | A/A | AA/AA | AA/AA | AA/AA | AA/AA | A/A | AA/A |
| 200: | A/A | AA/AA | AA/AA | AA/AA | A/A | A/A | A/B |
| | | | | Example 55 | | | Cp. 29 |

(Initial image/After running test)

TABLE 114

Evaluation on smeared image

| Bias voltage | Frequency (MHz) | | | | | | |
|---|---|---|---|---|---|---|---|
| | 20 | 51 | 105 | 144 | 250 | 450 | 2450 |
| 50: | AA/A | AA/AA | AA/AA | AA/AA | AA/AA | AA/AA | AA/A |
| 100: | A/A | AA/AA | AA/AA | AA/AA | AA/AA | AA/AA | AA/B |
| 150: | AA/AA | AA/AA | AA/AA | AA/AA | AA/AA | AA/AA | A/B |
| 200: | AA/AA | AA/AA | AA/AA | AA/AA | AA/AA | AA/AA | AA/A |
| | | | | Example 55 | | | Cp. 29 |

(Initial image/After running test)

TABLE 115

Evaluation on ghost

| Bias voltage | Frequency (MHz) | | | | | | |
|---|---|---|---|---|---|---|---|
| | 20 | 51 | 105 | 144 | 250 | 450 | 2450 |
| 50: | A/A | A/A | AA/AA | AA/AA | AA/AA | AA/AA | AA/A |
| 100: | A/A | AA/AA | AA/AA | AA/AA | AA/AA | A/A | AA/B |
| 150: | A/A | AA/AA | AA/AA | AA/AA | AA/AA | AA/A | A/A |
| 200: | A/A | AA/AA | AA/AA | AA/AA | AA/AA | AA/AA | AA/A |
| | | | | Example 55 | | | Cp. 29 |

(Initial image/After running test)

TABLE 116

Evaluation on black lines

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | AA/AA | AA/B |
| 100: | A/A | AA/AA | AA/AA | AA/AA | AA/AA | AA/AA | A/B |
| 150: | A/A | AA/AA | AA/AA | AA/AA | AA/AA | AA/AA | AA/B |
| 200: | A/A | AA/AA | AA/AA | AA/AA | AA/AA | AA/AA | AA/A |
| | | | Example 55 | | | | Cp. 29 |

(Initial image/After running test)

TABLE 117

Evaluation on sensitivity

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | A/A | B/B |
| 100: | A/A | AA/AA | AA/AA | AA/AA | AA/AA | AA/AA | A/B |
| 150: | A/A | AA/AA | AA/AA | AA/AA | AA/AA | AA/AA | A/A |
| 200: | A/A | AA/AA | AA/AA | AA/AA | AA/AA | AA/AA | A/B |
| | | | Example 55 | | | | Cp. 29 |

(Initial image/After running test)

TABLE 118

Overall evaluation

| Bias voltage | Frequency (MHz) | | | | | | |
|---|---|---|---|---|---|---|---|
| | 20 | 51 | 105 | 144 | 250 | 450 | 2450 |
| 50: | A | A | AA | AA | AA | A | B |
| 100: | A | AA | AA | AA | AA | A | B |
| 150: | A | AA | AA | AA | AA | A | B |
| 200: | A | AA | AA | AA | A | A | B |
| | | | Example 55 | | | | Cp. 29 |

TABLE 119

| | Photoconductive layer | Surface layer |
|---|---|---|
| Gas flow rate (sccm): | | |
| $SiH_4$ | 400 | 120 |
| $CH_4$ | | 800 |
| $H_2$ | 150 | 80 |
| $B_2H_6$ (ppm)* | 5 | |
| NO | | 10 |
| Pressure (mTorr): | 20 | 20 |
| High frequency (MHz): | 144 | 144 |
| Bias voltage ($V_O$) | 60 | 80 |
| High-frequency power (W): | 500 | 400 |
| Substrate temperature (°C.): | 330 | 330 |
| Layer thickness (µm): | 28 | 0.5 |

*(based on $SiH_4$)

TABLE 120

| | Photoconductive layer | Surface layer |
|---|---|---|
| Gas flow rate (sccm): | | |
| $SiH_4$ | 500 | 35 |
| $CH_4$ | | 300 |
| $H_2$ | 150 | 100 |
| $B_2H_6$ (ppm)* | 5 | |
| NO | | 10 |
| Pressure (mTorr): | 20 | 20 |
| High frequency (MHz): | 105 | 105 |
| Bias voltage ($V_O$) | 120 | 120 |
| High-frequency power (W): | 350 | 300 |
| Substrate temperature (°C.): | 250 | 250 |
| Layer thickness (µm): | 30 | 0.6 |

*(based on $SiH_4$)

TABLE 121

| | Example | | | |
|---|---|---|---|---|
| | 56 | 57 | 58 | 59 |
| White dots: | AA/AA | AA/AA | AA/AA | AA/AA |
| Smeared image: | AA/AA | AA/AA | AA/AA | AA/AA |
| Ghost: | AA/AA | AA/AA | AA/AA | AA/AA |
| Black lines: | AA/AA | AA/AA | AA/AA | AA/AA |
| Sensitivity: | AA/AA | AA/AA | AA/AA | AA/AA |
| Overall evaluation: | AA | AA | AA | AA |

(Initial image/After running test)

TABLE 122

| | Photoconductive layer | Surface layer |
|---|---|---|
| Gas flow rate (sccm): | | |
| $SiH_4$ | 500 | 150 |
| $CH_4$ | | 450 |
| $H_2$ | 100 | 150 |
| $B_2H_6$ (ppm)* | 7 | |
| NO | | 10 |
| Pressure (mTorr): | 30 | 30 |
| High frequency (MHz): | 105 | 105 |
| Bias voltage ($V_O$) | DC/AC superimposed | DC/AC superimposed |
| High-frequency power (W): | 350 | 300 |
| Substrate temperature (°C.): | 250 | 250 |
| Layer thickness (µm): | 29 | 0.5 |

*(based on $SiH_4$)

TABLE 123

| | Photoconductive layer | Surface layer |
|---|---|---|
| Gas flow rate (sccm): | | |
| $SiH_4$ | 350 | 150 |
| $CH_4$ | | 450 |
| $H_2$ | 150 | 150 |
| $B_2H_6$ (ppm)* | 3 | |
| NO | | 10 |
| Pressure (mTorr): | 20 | 20 |
| High frequency (MHz): | 105 | 105 |
| Bias voltage ($V_O$) | DC/AC superimposed | DC/AC superimposed |
| High-frequency power (W): | 350 | 300 |
| Substrate temperature (°C.): | 280 | 280 |
| Layer thickness (µm): | 30 | 0.5 |

*(based on $SiH_4$)

TABLE 124

|  | Example | |
|---|---|---|
|  | 60 | 61 |
| White dots: | AA/AA | AA/AA |
| Smeared image: | AA/AA | AA/AA |
| Ghost: | AA/AA | AA/AA |
| Black lines: | AA/AA | AA/AA |
| Sensitivity: | AA/AA | AA/AA |
| Overall evaluation: | AA | AA |

(Initial image/After running test)

TABLE 125

|  | Photoconductive layer | Surface layer |
|---|---|---|
| Gas flow rate (sccm): | | |
| $SiH_4$ | 500 | 120 |
| $CH_4$ | | 800 |
| NO | | 10 |
| Pressure (mTorr): | 35 | 20 |
| High frequency (MHz): | 105 | 105 |
| Bias voltage ($V_0$): | 60 | 60 |
| High-frequency power (W): | 500 | 400 |
| Substrate temperature (°C.): | 330 | 330 |
| Layer thickness (μm): | 28 | 0.5 |

TABLE 126

|  | Sample | | | | |
|---|---|---|---|---|---|
|  | 1 | 2 | 3 | 4 | 5 |
| White dots: | AA/AA | A/A | AA/AA | AA/AA | AA/AA |
| Smeared image: | AA/AA | AA/AA | AA/AA | AA/AA | AA/AA |
| Ghost: | AA/AA | A/A | AA/AA | AA/AA | AA/AA |
| Black lines: | AA/AA | AA/AA | AA/AA | AA/AA | AA/AA |
| Sensitivity: | AA/AA | AA/AA | AA/AA | AA/AA | AA/AA |
| Overall evaluation: | AA | A | AA | AA | AA |

|  | Sample | | | | |
|---|---|---|---|---|---|
|  | 6 | 7 | 8 | 9 | 10 |
| White dots: | AA/AA | A/A | AA/AA | AA/AA | AA/AA |
| Smeared image: | AA/AA | AA/AA | AA/AA | AA/AA | AA/AA |
| Ghost: | AA/AA | AA/AA | AA/AA | AA/AA | AA/AA |
| Black lines: | AA/AA | AA/AA | AA/AA | AA/AA | AA/AA |
| Sensitivity: | AA/AA | AA/AA | AA/AA | AA/AA | AA/AA |
| Overall evaluation: | AA | A | AA | AA | AA |

(Initial image/After running test)

TABLE 127

|  | Sample | | | | |
|---|---|---|---|---|---|
|  | 11 | 12 | 13 | 14 | 15 |
| White dots: | AA/B | AA/A | A/B | AA/A | A/A |
| Smeared image: | AA/A | AA/AA | AA/B | AA/B | A/B |
| Ghost: | AA/A | AA/A | AA/A | AA/AA | AA/B |
| Black lines: | AA/B | AA/A | A/B | AA/B | A/B |
| Sensitivity: | A/A | A/A | A/A | A/B | A/A |
| Overall evaluation: | B | AA | A | A | B |

TABLE 127-continued

|  | Sample | | | | |
|---|---|---|---|---|---|
|  | 16 | 17 | 18 | 19 | 20 |
| White dots: | A/A | AA/B | A/A | A/B | A/B |
| Smeared image: | AA/AA | AA/A | AA/A | AA/B | A/B |
| Ghost: | AA/A | A/B | AA/A | AA/A | AA/A |
| Black lines: | AA/AA | AA/A | AA/AA | A/A | AA/B |
| Sensitivity: | A/A | A/B | A/A | A/B | A/A |
| Overall evaluation: | A | A | A | A | B |

(Initial image/After running test)

TABLE 128

|  | Charge transport layer | Charge generation layer |
|---|---|---|
| Gas flow rate (sccm): | | |
| $SiH_4$ | 350 | 350 |
| $CH_4$ | 50 | |
| $B_2H_6$ (ppm)* | 10 | 0.5 |
| NO | 10 | |
| Pressure (mTorr): | 100 | 100 |
| High-frequency power (W): | 500 | 500 |
| Substrate temperature (°C.): | 300 | 300 |
| Layer thickness (μm): | 27 | 3 |

*(based on $SiH_4$)

TABLE 129

Evaluation on white dots

|  | Frequency (MHz) | | | | | |
|---|---|---|---|---|---|---|
| Bias voltage | 20 | 51 | 105 | 144 | 250 | 450 |
| (Example 65) | | | | | | |
| 0: | A/B | AA/A | AA/A | AA/A | AA/B | A/B |
| (Example 64) | | | | | | |
| 50: | A/A | AA/AA | AA/AA | AA/AA | AA/AA | A/A |
| 100: | A/A | AA/AA | AA/AA | AA/AA | AA/AA | A/A |
| 150: | A/A | AA/AA | AA/AA | AA/AA | AA/AA | A/A |
| 200: | A/A | AA/AA | AA/AA | AA/AA | A/A | A/A |
| (Example 65) | | | | | | |
| 250: | B/B | B/B | B/B | B/B | B/B | B/B |

(Initial image/After running test)

TABLE 130

Evaluation on smeared image

|  | Frequency (MHz) | | | | | |
|---|---|---|---|---|---|---|
| Bias voltage | 20 | 51 | 105 | 144 | 250 | 450 |
| (Example 65) | | | | | | |
| 0: | AA/A | AA/B | AA/A | AA/A | AA/A | A/B |
| (Example 64) | | | | | | |
| 50: | AA/A | AA/AA | AA/AA | AA/AA | AA/AA | AA/AA |
| 100: | A/A | AA/AA | AA/AA | AA/AA | AA/AA | AA/AA |
| 150: | AA/AA | AA/AA | AA/AA | AA/AA | AA/AA | AA/AA |
| 200: | AA/AA | AA/AA | AA/AA | AA/AA | AA/AA | AA/AA |
| (Example 65) | | | | | | |
| 250: | AA/AA | AA/AA | AA/AA | AA/AA | AA/AA | AA/AA |

(Initial image/After running test)

TABLE 131

Evaluation on ghost

Frequency (MHz)

| Bias voltage | 20 | 51 | 105 | 144 | 250 | 450 |
|---|---|---|---|---|---|---|
| (Example 65) | | | | | | |
| 0: | AA/A | AA/B | AA/A | AA/B | AA/A | AA/A |
| (Example 64) | | | | | | |
| 50: | A/A | A/A | AA/AA | AA/AA | AA/AA | AA/AA |
| 100: | A/A | AA/AA | AA/AA | AA/AA | AA/AA | A/A |
| 150: | A/A | AA/AA | AA/AA | AA/AA | AA/AA | AA/A |
| 200: | A/A | AA/AA | AA/AA | AA/AA | AA/AA | AA/AA |
| (Example 65) | | | | | | |
| 250: | A/A | AA/AA | AA/AA | AA/AA | AA/AA | AA/AA |

(Initial image/After running test)

TABLE 132

Evaluation on black lines

Frequency (MHz)

| Bias voltage | 20 | 51 | 105 | 144 | 250 | 450 |
|---|---|---|---|---|---|---|
| (Example 65) | | | | | | |
| 0: | A/A | AA/B | AA/A | AA/B | AA/A | A/B |
| (Example 64) | | | | | | |
| 50: | A/A | AA/AA | AA/AA | AA/AA | AA/AA | AA/AA |
| 100: | A/A | AA/AA | AA/AA | AA/AA | AA/AA | AA/AA |
| 150: | A/A | AA/AA | AA/AA | AA/AA | AA/AA | AA/AA |
| 200: | A/A | AA/AA | AA/AA | AA/AA | AA/AA | AA/AA |
| (Example 65) | | | | | | |
| 250: | A/A | AA/AA | AA/AA | AA/AA | AA/AA | AA/AA |

(Initial image/After running test)

TABLE 133

Evaluation on sensitivity

Frequency (MHz)

| Bias voltage | 20 | 51 | 105 | 144 | 250 | 450 |
|---|---|---|---|---|---|---|
| (Example 65) | | | | | | |
| 0: | A/A | A/B | A/A | A/B | A/B | A/B |
| (Example 64) | | | | | | |
| 50: | A/A | AA/AA | AA/AA | AA/AA | AA/AA | A/A |
| 100: | A/A | AA/AA | AA/AA | AA/AA | AA/AA | AA/AA |
| 150: | A/A | AA/AA | AA/AA | AA/AA | AA/AA | AA/AA |
| 200: | A/A | AA/AA | AA/AA | AA/AA | AA/AA | AA/AA |
| (Example 65) | | | | | | |
| 250: | A/A | AA/AA | AA/AA | AA/AA | AA/AA | AA/AA |

(Initial image/After running test)

TABLE 134

Evaluation on blank memory

Frequency (MHz)

| Bias voltage | 20 | 51 | 105 | 144 | 250 | 450 |
|---|---|---|---|---|---|---|
| (Example 65) | | | | | | |
| 0: | A/A | AA/A | AA/A | AA/A | AA/A | AA/A |
| (Example 64) | | | | | | |
| 50: | A/A | AA/AA | AA/AA | AA/AA | AA/AA | A/A |
| 100: | A/A | AA/AA | AA/AA | AA/AA | AA/AA | AA/AA |
| 150: | A/A | AA/AA | AA/AA | AA/AA | AA/AA | AA/AA |
| 200: | A/A | AA/AA | AA/AA | AA/AA | AA/AA | AA/AA |
| (Example 65) | | | | | | |
| 250: | A/A | AA/AA | AA/AA | AA/AA | AA/AA | AA/AA |

(Initial image/After running test)

TABLE 135

Evaluation on potential shift

Frequency (MHz)

| Bias voltage | 20 | 51 | 105 | 144 | 250 | 450 |
|---|---|---|---|---|---|---|
| (Example 65) | | | | | | |
| 0: | A/A | AA/A | AA/A | AA/A | AA/A | AA/A |
| (Example 64) | | | | | | |
| 50: | A/A | AA/AA | AA/AA | AA/AA | AA/AA | A/A |
| 100: | A/A | AA/AA | AA/AA | AA/AA | AA/AA | AA/AA |
| 150: | A/A | AA/AA | AA/AA | AA/AA | AA/AA | AA/AA |
| 200: | A/A | AA/AA | AA/AA | AA/AA | AA/AA | AA/AA |
| (Example 65) | | | | | | |
| 250: | A/A | AA/AA | AA/AA | AA/AA | AA/AA | AA/AA |

(Initial image/After running test)

TABLE 136

Overall evaluation

Frequency (MHz)

| Bias voltage | 20 | 51 | 105 | 144 | 250 | 450 |
|---|---|---|---|---|---|---|
| (Example 65) | | | | | | |
| 0: | A | A | A | A | A | A |
| (Example 64) | | | | | | |
| 50: | A | AA | AA | AA | AA | A |
| 100: | A | AA | AA | AA | AA | A |
| 150: | A | AA | AA | AA | AA | A |
| 200: | A | AA | AA | AA | A | A |
| (Example 65) | | | | | | |
| 250: | B | B | B | B | B | B |

TABLE 137

|  | Charge transport layer | Charge generation layer |
|---|---|---|
| Gas flow rate (sccm): |  |  |
| $SiH_4$ | 500 | 500 |
| $CH_4$ | 120 |  |
| $B_2H_6$ (ppm)* | 100 | 1.0 |
| NO |  | 10 |
| Pressure (mTorr): | 150 | 150 |
| High-frequency power (W): | 400 | 400 |
| Substrate temperature (°C.): | 320 | 320 |
| Layer thickness (μm): | 26 | 4 |

*(based on $SiH_4$)

TABLE 138

Evaluation on white dots

| Bias voltage | Frequency (MHz) | | | | | | |
|---|---|---|---|---|---|---|---|
|  | 13.56 | 20 | 51 | 105 | 144 | 250 | 450 |
| 50: | AA/B | A/A | AA/AA | AA/AA | AA/AA | AA/AA | A/A |
| 100: | A/B | A/A | AA/AA | AA/AA | AA/AA | AA/AA | A/A |
| 150: | A/B | A/A | AA/AA | AA/AA | AA/AA | AA/AA | A/A |
| 200: | A/B | A/A | AA/AA | AA/AA | AA/AA | A/A | A/A |
|  | Cp. 30 | | | Example 66 | | | |

(Initial image/After running test)

TABLE 139

Evaluation on smeared image

| Bias voltage | Frequency (MHz) | | | | | | |
|---|---|---|---|---|---|---|---|
|  | 13.56 | 20 | 51 | 105 | 144 | 250 | 450 |
| 50: | AA/B | AA/A | AA/AA | AA/AA | AA/AA | AA/AA | AA/AA |
| 100: | AA/B | A/A | AA/AA | AA/AA | AA/AA | AA/AA | AA/AA |
| 150: | AA/B | AA/AA | AA/AA | AA/AA | AA/AA | AA/AA | AA/AA |
| 200: | A/B | AA/AA | AA/AA | AA/AA | AA/AA | AA/AA | AA/AA |
|  | Cp. 30 | | | Example 66 | | | |

(Initial image/After running test)

TABLE 140

Evaluation on ghost

| Bias voltage | Frequency (MHz) | | | | | | |
|---|---|---|---|---|---|---|---|
|  | 13.56 | 20 | 51 | 105 | 144 | 250 | 450 |
| 50: | AA/B | A/A | A/A | AA/AA | AA/AA | AA/AA | AA/AA |
| 100: | AA/A | A/A | AA/AA | AA/AA | AA/AA | AA/AA | A/A |
| 150: | A/B | A/A | AA/AA | AA/AA | AA/AA | AA/AA | AA/A |
| 200: | AA/A | A/A | AA/AA | AA/AA | AA/AA | AA/AA | AA/AA |
|  | Cp. 30 | | | Example 66 | | | |

(Initial image/After running test)

TABLE 141

Evaluation on black lines

| Bias voltage | Frequency (MHz) | | | | | | |
|---|---|---|---|---|---|---|---|
|  | 13.56 | 20 | 51 | 105 | 144 | 250 | 450 |
| 50: | AA/B | A/A | AA/AA | AA/AA | AA/AA | AA/AA | AA/AA |
| 100: | A/B | A/A | AA/AA | AA/AA | AA/AA | AA/AA | AA/AA |
| 150: | AA/A | A/A | AA/AA | AA/AA | AA/AA | AA/AA | AA/AA |
| 200: | A/B | A/A | AA/AA | AA/AA | AA/AA | AA/AA | AA/AA |
|  | Cp. 30 | | | Example 66 | | | |

(Initial image/After running test)

TABLE 142

Evaluation on sensitivity

| Bias voltage | Frequency (MHz) | | | | | | |
|---|---|---|---|---|---|---|---|
|  | 13.56 | 20 | 51 | 105 | 144 | 250 | 450 |
| 50: | B/B | A/A | AA/AA | AA/AA | AA/AA | AA/AA | A/A |
| 100: | A/B | A/A | AA/AA | AA/AA | AA/AA | AA/AA | AA/AA |
| 150: | A/B | A/A | AA/AA | AA/AA | AA/AA | AA/AA | AA/AA |
| 200: | B/B | A/A | AA/AA | AA/AA | AA/AA | AA/AA | AA/AA |
|  | Cp. 30 | | | Example 66 | | | |

(Initial image/After running test)

TABLE 143

Evaluation on blank memory

| Bias voltage | Frequency (MHz) | | | | | | |
|---|---|---|---|---|---|---|---|
|  | 13.56 | 20 | 51 | 105 | 144 | 250 | 450 |
| 50: | B/B | A/A | AA/AA | AA/AA | AA/AA | AA/AA | A/A |
| 100: | A/B | A/A | AA/AA | AA/AA | AA/AA | AA/AA | AA/AA |
| 150: | A/B | A/A | AA/AA | AA/AA | AA/AA | AA/AA | AA/AA |
| 200: | B/B | A/A | AA/AA | AA/AA | AA/AA | AA/AA | AA/AA |
|  | Cp. 30 | | | Example 66 | | | |

(Initial image/After running test)

TABLE 144

Evaluation on potential shift

| Bias voltage | Frequency (MHz) | | | | | | |
|---|---|---|---|---|---|---|---|
|  | 13.56 | 20 | 51 | 105 | 144 | 250 | 450 |
| 50: | B/B | A/A | AA/AA | AA/AA | AA/AA | AA/AA | A/A |
| 100: | A/B | A/A | AA/AA | AA/AA | AA/AA | AA/AA | AA/AA |
| 150: | A/B | A/A | AA/AA | AA/AA | AA/AA | AA/AA | AA/AA |
| 200: | B/B | A/A | AA/AA | AA/AA | AA/AA | AA/AA | AA/AA |
|  | Cp. 30 | | | Example 66 | | | |

(Initial image/After running test)

TABLE 145

Overall evaluation

| Bias voltage | Frequency (MHz) | | | | | | |
|---|---|---|---|---|---|---|---|
| | 13.56 | 20 | 51 | 105 | 144 | 250 | 450 |
| 50: | B | A | A | AA | AA | AA | A |
| 100: | B | A | AA | AA | AA | AA | A |
| 150: | B | A | AA | AA | AA | AA | A |
| 200: | B | A | AA | AA | AA | A | A |
| | Cp. 30 | | | Example 66 | | | |

TABLE 146

| | Charge transport layer | Charge generation layer |
|---|---|---|
| Gas flow rate (sccm): | | |
| SiH₄ | 500 | 500 |
| CH₄ | 120 | |
| B₂H₆ (ppm)* | 100 | |
| NO | 10 | |
| Pressure (mTorr): | 20 | 20 |
| High-frequency power (W): | 700 | 700 |
| Substrate temperature (°C.): | 300 | 300 |
| Layer thickness (μm): | 26 | 4 |

*(based on SiH₄)

TABLE 147

Evaluation on white dots

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | A/A | A/B |
| 100: | A/A | AA/AA | AA/AA | AA/AA | AA/AA | A/A | AA/B |
| 150: | A/A | AA/AA | AA/AA | AA/AA | AA/AA | A/A | AA/A |
| 200: | A/A | AA/AA | AA/AA | AA/AA | A/A | A/A | A/B |
| | | | | Example 67 | | | Cp. 31 |

(Initial image/After running test)

TABLE 148

Evaluation on smeared image

| Bias voltage | Frequency (MHz) | | | | | | |
|---|---|---|---|---|---|---|---|
| | 20 | 51 | 105 | 144 | 250 | 450 | 2450 |
| 50: | AA/A | AA/AA | AA/AA | AA/AA | AA/AA | AA/AA | AA/A |
| 100: | A/A | AA/AA | AA/AA | AA/AA | AA/AA | AA/AA | AA/B |
| 150: | AA/AA | A/AA | AA/AA | AA/AA | AA/AA | AA/AA | A/B |
| 200: | AA/AA | AA/AA | AA/AA | AA/AA | AA/AA | AA/AA | AA/A |
| | | | | Example 67 | | | Cp. 31 |

(Initial image/After running test)

TABLE 149

Evaluation on ghost

| Bias voltage | Frequency (MHz) | | | | | | |
|---|---|---|---|---|---|---|---|
| | 20 | 51 | 105 | 144 | 250 | 450 | 2450 |
| 50: | A/A | A/A | AA/AA | AA/AA | AA/AA | AA/AA | AA/A |
| 100: | A/A | AA/AA | AA/AA | AA/AA | AA/AA | A/A | AA/B |
| 150: | A/A | AA/AA | AA/AA | AA/AA | AA/AA | AA/A | A/A |
| 200: | A/A | AA/AA | AA/AA | AA/AA | AA/AA | AA/AA | AA/A |
| | Example 67 | | | | | | Cp. 31 |

(Initial image/After running test)

TABLE 150

Evaluation on black lines

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | AA/AA | AA/B |
| 100: | A/A | AA/AA | AA/AA | AA/AA | AA/AA | AA/AA | A/B |
| 150: | A/A | AA/AA | AA/AA | AA/AA | AA/AA | AA/AA | AA/B |
| 200: | A/A | AA/AA | AA/AA | AA/AA | AA/AA | AA/AA | AA/B |
| | Example 67 | | | | | | Cp. 31 |

(Initial image/After running test)

TABLE 151

Evaluation on sensitivity

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | A/A | B/B |
| 100: | A/A | AA/AA | AA/AA | AA/AA | AA/AA | AA/AA | A/B |
| 150: | A/A | AA/AA | AA/AA | AA/AA | AA/AA | AA/AA | A/A |
| 200: | A/A | AA/AA | AA/AA | AA/AA | AA/AA | AA/AA | A/B |
| | Example 67 | | | | | | Cp. 31 |

(Initial image/After running test)

TABLE 152

Evaluation on blank memory

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | A/A | B/B |
| 100: | A/A | AA/AA | AA/AA | AA/AA | AA/AA | AA/AA | A/B |
| 150: | A/A | AA/AA | AA/AA | AA/AA | AA/AA | AA/AA | A/A |
| 200: | A/A | AA/AA | AA/AA | AA/AA | AA/AA | AA/AA | A/B |
| | Example 67 | | | | | | Cp. 31 |

(Initial image/After running test)

TABLE 153

Evaluation on potential shift

| Bias voltage | Frequency (MHz) | | | | | | |
|---|---|---|---|---|---|---|---|
| | 20 | 51 | 105 | 144 | 250 | 450 | 2450 |
| 50: | A/A | AA/AA | AA/AA | AA/AA | AA/AA | A/A | B/B |
| 100: | A/A | AA/AA | AA/AA | AA/AA | AA/AA | AA/AA | A/B |
| 150: | A/A | AA/AA | AA/AA | AA/AA | AA/AA | AA/AA | A/A |
| 200: | A/A | AA/AA | AA/AA | AA/AA | AA/AA | AA/AA | A/B |
| | Example 67 | | | | | | Cp. 31 |

(Initial image/After running test).

TABLE 154

Overall evaluation

| Bias voltage | Frequency (MHz) | | | | | | |
|---|---|---|---|---|---|---|---|
| | 20 | 51 | 105 | 144 | 250 | 450 | 2450 |
| 50: | A | A | AA | AA | AA | A | B |
| 100: | A | AA | AA | AA | AA | A | B |
| 150: | A | AA | AA | AA | AA | A | B |
| 200: | A | AA | AA | AA | A | A | B |
| | Example 67 | | | | | | Cp. 31 |

TABLE 155

| | Charge transport layer | Charge generation layer |
|---|---|---|
| Gas flow rate (sccm) | | |
| SiH$_4$ | 400 | 400 |
| CH$_4$ | 100 | |
| H$_2$ | 150 | |
| B$_2$H$_6$ (ppm)* | 100 | 1.0 |
| NO | 10 | |
| Pressure (mTorr): | 20 | 20 |
| High frequency (MHz): | 144 | 144 |
| Bias voltage (V$_0$) | 60 | 80 |
| High-frequency power (W): | 500 | 400 |
| Substrate temperature (°C.): | 330 | 330 |
| Layer thickness (μm): | 25 | 5 |

*(based on SiH$_4$)

TABLE 156

|  | Charge transport layer | Charge generation layer |
|---|---|---|
| Gas flow rate (sccm): | | |
| $SiH_4$ | 400 | 400 |
| $CH_4$ | 100 | |
| $H_2$ | 150 | |
| $B_2H_6$ (ppm)* | 100 | 1.0 |
| NO | 10 | |
| Pressure (mTorr): | 20 | 20 |
| High frequency (MHz): | 105 | 105 |
| Bias voltage ($V_O$): | 120 | 120 |
| High-frequency power (W): | 350 | 300 |
| Substrate temperature (°C.): | 250 | 250 |
| Layer thickness (µm): | 25 | 5 |

*(based on $SiH_4$)

TABLE 157

|  | Example | | | |
|---|---|---|---|---|
|  | 68 | 69 | 70 | 71 |
| White dots: | AA/AA | AA/AA | AA/AA | AA/AA |
| Smeared image: | AA/AA | AA/AA | AA/AA | AA/AA |
| Ghost: | AA/AA | AA/AA | AA/AA | AA/AA |
| Black lines: | AA/AA | AA/AA | AA/AA | AA/AA |
| Sensitivity: | AA/AA | AA/AA | AA/AA | AA/AA |
| Blank memory: | AA/AA | AA/AA | AA/AA | AA/AA |
| Potential shift: | AA/AA | AA/AA | AA/AA | AA/AA |
| Overall evaluation: | AA | AA | AA | AA |

(Initial image/After running test)

TABLE 158

|  | Charge transport layer | Charge generation layer |
|---|---|---|
| Gas flow rate (sccm): | | |
| $SiH_4$ | 500 | 150 |
| $CH_4$ | | 450 |
| $H_2$ | 100 | 150 |
| $B_2H_6$ (ppm)* | 7 | |
| NO | 10 | |
| Pressure (mTorr): | 30 | 30 |
| High frequency (MHz): | 105 | 105 |
| Bias voltage ($V_O$): | DC/AC superimposed | DC/AC superimposed |
| High-frequency power (W): | 350 | 350 |
| Substrate temperature (°C.): | 250 | 256 |
| Layer thickness (µm): | 29 | 0.5 |

*(based on $SiH_4$)

TABLE 159

|  | Charge transport layer | Charge generation layer |
|---|---|---|
| Gas flow rate (sccm): | | |
| $SiH_4$ | 350 | 150 |
| $CH_4$ | | 450 |
| $H_2$ | 150 | 150 |
| $B_2H_6$ (ppm)* | 3 | |
| NO | 10 | |
| Pressure (mTorr): | 20 | 20 |
| High frequency (MHz): | 105 | 105 |

TABLE 159-continued

|  | Charge transport layer | Charge generation layer |
|---|---|---|
| Bias voltage ($V_O$) | DC/AC superimposed | DC/AC superimposed |
| High-frequency power (W): | 350 | 300 |
| Substrate temperature (°C.): | 280 | 280 |
| Layer thickness (µm): | 30 | 0.5 |

*(based on $SiH_4$)

TABLE 160

|  | Example | |
|---|---|---|
|  | 72 | 73 |
| White dots: | AA/AA | AA/AA |
| Smeared image: | AA/AA | AA/AA |
| Ghost: | AA/AA | AA/AA |
| Black lines: | AA/AA | AA/AA |
| Sensitivity: | AA/AA | AA/AA |
| Blank memory: | AA/AA | AA/AA |
| Potential shift: | AA/AA | AA/AA |
| Overall evaluation: | AA | AA |

(Initial image/After running test)

TABLE 161

| Gas flow rate (sccm): | 350 |
|---|---|
| $SiH_4$ | |
| Pressure (mTorr): | 10 |
| High-frequency power (W): | 500 |
| Microwave power (W): | 0 |
| Substrate temperature (°C.): | 300 |

TABLE 162

| Gas flow rate (sccm) | 350 |
|---|---|
| $SiH_4$ | |
| Pressure (mTorr): | 10 |
| High-frequency power (W): | 0 |
| Microwave power (W): | 500 |
| Substrate temperature (°C.): | 300 |

TABLE 163

|  | Photoconductive layer | Surface layer |
|---|---|---|
| Gas flow rate (sccm): | | |
| $SiH_4$ | 350 | 50 |
| $CH_4$ | | 500 |
| Pressure (mTorr): | 20 | 20 |
| High-frequency power (W): | 700 | 600 |
| Microwave power (W): | 0 | 0 |
| Substrate temperature (°C.): | 300 | 280 |
| Layer thickness (µm): | 25 | 0.5 |

TABLE 164

| | Photoconductive layer | Surface layer |
|---|---|---|
| Gas flow rate (sccm): | | |
| $SiH_4$ | 350 | 50 |
| $CH_4$ | | 500 |
| Pressure (mTorr): | 20 | 20 |
| High-frequency power (W): | 0 | 0 |
| Microwave power (W): | 700 | 600 |
| Substrate temperature (°C.): | 300 | 280 |
| Layer thickness (μm): | 25 | 0.5 |

TABLE 165

| | No. 1 | No. 2 | No. 3 | No. 4 | No. 5 | No. 6 | Non-uniformity between 6 drums |
|---|---|---|---|---|---|---|---|
| Test Example 4: | A | AA | AA | AA | AA | AA | A |
| Comparative Test Example 2: | A | A | B | B | A | B | B |

TABLE 166

| | Photoconductive layer | Surface layer |
|---|---|---|
| Gas flow rate (sccm): | | |
| $SiH_4$ | 350 | 50 |
| $CH_4$ | | 500 |
| $H_2$ | | 100 |
| $B_2H_6$ (ppm)* | 2 | |
| Pressure (mTorr): | 120 | 120 |
| High-frequency power (W): | 800 | 600 |
| Substrate temperature (°C.): | 300 | 280 |
| Layer thickness (μm): | 25 | 0.5 |

*(based on $SiH_4$)

TABLE 167

| | Photoconductive layer | Surface layer |
|---|---|---|
| Gas flow rate (sccm): | | |
| $SiH_4$ | 380 | 30 |
| $CH_4$ | | 500 |
| $H_2$ | | 300 |
| $B_2H_6$ (ppm)* | 2 | |
| Pressure (mTorr): | 20 | 20 |
| High-frequency power (W): | 900 | 700 |
| Substrate temperature (°C.): | 300 | 280 |
| Layer thickness (μm): | 25 | 0.5 |

*(based on $SiH_4$)

TABLE 168

| | Photoconductive layer | Surface layer |
|---|---|---|
| Gas flow rate (sccm): | | |
| $SiH_4$ | 300 | 30 |
| $CH_4$ | | 600 |
| $H_2$ | 100 | 300 |

TABLE 168-continued

| | Photoconductive layer | Surface layer |
|---|---|---|
| $B_2H_6$ (ppm)* | 1.5 | |
| Pressure (mTorr): | 15 | 15 |
| High-frequency power (W): | 900 | 700 |
| Substrate temperature (°C.): | 300 | 280 |
| Layer thickness (μm): | 25 | 0.5 |

*(based on $SiH_4$)

TABLE 169

| | Photoconductive layer | Surface layer |
|---|---|---|
| Gas flow rate (sccm): | | |
| $SiH_4$ | 300 | 30 |
| $CH_4$ | | 500 |
| $H_2$ | | 100 |
| $B_2H_6$ (ppm)* | 3 | |
| Pressure (mTorr): | 10 | 10 |
| High-frequency power (W): | 950 | 700 |
| Substrate temperature (°C.): | 300 | 280 |
| Layer thickness (μm): | 25 | 0.5 |

*(based on $SiH_4$)

TABLE 170

| | Photoconductive layer | Surface layer |
|---|---|---|
| Gas flow rate (sccm): | | |
| $SiH_4$ | 300 | 30 |
| $CH_4$ | | 500 |
| $H_2$ | | 100 |
| $B_2H_6$ (ppm)* | 3 | |
| Pressure (mTorr): | 10 | 10 |
| High-frequency power (W): | 950 | 700 |
| Substrate temperature (°C.): | 300 | 280 |
| Layer thickness (μm): | 25 | 0.5 |

*(based on $SiH_4$)

TABLE 171

| | Frequency (MHz) | Non-uniform performance in the generatrix direction No. | | | | | | Non-uniformity between 6 drums |
|---|---|---|---|---|---|---|---|---|
| | | 1 | 2 | 3 | 4 | 5 | 6 | |
| Comparative Example 32: | 13.56 | A | AA | A | A | AA | AA | B |
| Example 74: | 20 | AA | AA | AA | AA | AA | AA | A |
| Example 75: | 105 | AA | AA | A | A | AA | AA | A |
| Example 76: | 200 | AA | AA | AA | AA | AA | Ak | AA |
| Example 77: | 450 | AA | AA | AA | A | AA | AA | A |

TABLE 172

|  | Photoconductive layer | Surface layer |
|---|---|---|
| Gas flow rate (sccm): |  |  |
| $SiH_4$ | 300 | 30 |
| $CH_4$ |  | 500 |
| $H_2$ | 50 | 100 |
| $B_2H_6$ (ppm)* | 3 |  |
| Pressure (mTorr): | 10 | 10 |
| High-frequency power (W): |  |  |
| ch. 1 (applied to No. 1) | 450 | 300 |
| ch. 2 (applied to No. 2) | 500 | 300 |
| Substrate temperature (°C.): | 300 | 280 |
| Layer thickness (μm): | 25 | 0.5 |

*(based on $SiH_4$)

TABLE 173

|  | Photoconductive layer | Surface layer |
|---|---|---|
| Gas flow rate (sccm): |  |  |
| $SiH_4$ | 300 | 30 |
| $CH_4$ |  | 500 |
| $H_2$ | 50 | 100 |
| $B_2H_6$ (ppm)* | 3 |  |
| Pressure (mTorr): | 10 | 10 |
| High-frequency power (W): |  |  |
| ch. 1 (applied to No. 1) | 220 | 180 |
| ch. 2 (applied to No. 3) | 230 | 180 |
| ch. 3 (applied to No. 5) | 250 | 200 |
| ch. 4 (applied to No. 6) | 230 | 180 |
| Substrate temperature (°C.): | 300 | 280 |
| Layer thickness (μm): | 25 | 0.5 |

*(based on $SiH_4$)

TABLE 174

|  | No. 1 | No. 2 | No. 3 | No. 4 | No. 5 | No. 6 | Non-uniformity between 8 drums |
|---|---|---|---|---|---|---|---|
| Example 78: | AA | AA | AA | AA | AA | AA | AA |
| Example 79: | AA | AA | AA | AA | AA | AA | AA |

TABLE 175

|  | Photoconductive layer | Surface layer |
|---|---|---|
| Gas flow rate (sccm): |  |  |
| $SiH_4$ | 500 | 80 |
| $CH_4$ |  | 800 |
| $H_2$ |  | 100 |
| $B_2H_6$ (ppm)* | 3 |  |
| Pressure (mTorr): | 10 | 10 |
| High-frequency power (W): | 950 | 700 |
| External electric bias voltage (V): | 60 | 80 |
| Substrate temperature (°C.): | 300 | 280 |
| Layer thickness (μm): | 25 | 0.5 |

*(based on $SiH_4$)

TABLE 176

|  | No. 1 | No. 2 | No. 3 | No. 4 | No. 5 | No. 6 | Non-uniformity between 6 drums |
|---|---|---|---|---|---|---|---|
| Example 80: | AA | AA | AA | AA | AA | AA | AA |

TABLE 177

| Conditions | | |
|---|---|---|
| Gas fed: | $SiH_4$ | 700 sccm |
|  | $H_2$ | 500 sccm |
| Reactor inner pressure: | 300 mTorr |  |
| RF Power: | 350 W |  |

TABLE 178

| Etching conditions | | | | | |
|---|---|---|---|---|---|
| Etching gas | Flow rate (sccm) | Inner pressure (mTorr) | Power (W) | Frequency (MHz) | Results of etching |
| $ClF_3$ | 20 | 200 | 350 | 20 | AA |
| $ClF_3$ | 20 | 200 | 350 | 51 | AA |
| $ClF_3$ | 20 | 200 | 350 | 100 | AA |
| $ClF_3$ | 20 | 200 | 350 | 200 | AA |
| $ClF_3$ | 20 | 200 | 350 | 300 | AA |
| $ClF_3$ | 20 | 200 | 350 | 400 | AA |
| $ClF_3$ | 20 | 200 | 350 | 450 | AA |
| $ClF_3$ | 20 | 200 | 350 | 500 | A |
| $ClF_3$ | 20 | 200 | 350 | 13.56 | A |
| $ClF_3$ | 20 | 200 | 350 | 10 | A |
| $ClF_3$ | 20 | 200 | 350 | 5 | A |
| $ClF_3$ | 20 | 200 | — | — | A |
| $CF_4/O_2$ | 50/10 | 200 | 350 | 13.56 | B |
| $CF_4/O_2$ | 50/10 | 200 | — | — | C |

TABLE 179

|  | Gas fed & flow rate (sccm) | Substrate temp. (°C.) | Inner pressure (mTorr) | RF Power (W) | Layer thickness (μm) |
|---|---|---|---|---|---|
| First layer: |  |  |  |  |  |
| $SiH_4$ | 300 |  |  |  |  |
| $H_2$ | 300 | 250 | 300 | 400 | 3 |
| $B_2H_6$ | 1,000 (ppm)* |  |  |  |  |
| Second layer: |  |  |  |  |  |
| $SiH_4$ | 300 |  |  |  |  |
| $H_2$ | 300 | 250 | 300 | 400 | 20 |
| $B_2H_6$ | 0.5 (ppm)* |  |  |  |  |
| Third layer: |  |  |  |  |  |
| $SiH_4$ | 30 | 250 | 400 | 200 | 0.5 |
| $CH_4$ | 300 |  |  |  |  |

*(based on $SiH_4$)

TABLE 180

| Etching gas | Flow rate (sccm) | Inner pressure (mTorr) | High frequency power (W) | Frequency (MHz) | Cleaning time (min) |
|---|---|---|---|---|---|
| Example 81: $ClF_3$ | 400 | 400 | 500 | 100 | 30 |
| Comparative Example 33: $ClF_3$ | 400 | 400 | 500 | 13.56 | 30 |
| Comparative Example 34: $CF_4$ $O_2$ | 800 100 | 400 | 800 | 13.56 | 90 |

TABLE 181

| | Faulty image (white dots) |
|---|---|
| Example 81: | AA |
| Comparative Example 33: | A |
| Comparative Example 34: | B |

TABLE 182

| | Frequency (MHz) | | | | | |
|---|---|---|---|---|---|---|
| | 20 | 100 | 200 | 300 | 400 | 450 |
| Faulty image (white dots): | AA | AA | AA | AA | AA | AA |

TABLE 183

| | Gas fed & flow rate (sccm) | Substrate temp. (°C.) | Inner pressure (mTorr) | RF Power (W) | Layer thickness (μm) |
|---|---|---|---|---|---|
| First layer: | | | | | |
| $SiH_4$ | 300 | | | | |
| $CH_4$ | 50 | | | | |
| $H_2$ | 500 | 250 | 300 | 500 | 25 |
| $B_2H_6$ | 3 (ppm)* | | | | |
| Second layer: | | | | | |
| $SiH_4$ | 300 | | | | |
| $H_2$ | 300 | 250 | 300 | 400 | 5 |
| $B_2H_6$ | 0.5 (ppm)* | | | | |
| Third layer: | | | | | |
| $SiH_4$ | 30 | 250 | 400 | 200 | 0.5 |
| $CH_4$ | 300 | | | | |

*(based on $SiH_4$)

What is claimed is:

1. A method for cleaning an apparatus for forming a film by vapor phase deposition comprising:

(a) introducing an etching gas selected from the group consisting of $ClF_3$ gas and $CF_4$ gas from gaps between dummy substrates disposed in a circle in the apparatus to a discharge space circumscribed by the dummy substrates; and thereafter (b) applying to at least one of the dummy substrates an electromagnetic wave with a frequency from 20 MHZ to 450 MHZ to generate a plasma between the at least one of the dummy substrates to which the electromagnetic wave is applied and the remaining dummy substrates to which the electromagnetic wave is not applied to thereby remove a reaction product of the vapor phase deposition adhered to the inside of the apparatus.

2. The method according to claim 1, wherein the frequency is within the range of 51 MHz to 250 MHz.

3. The method according to claim 1, wherein the reaction product comprises silicon.

4. The method according to claim 1, wherein the reaction product comprises an inorganic material comprising silicon as a main component.

5. The method according to claim 1, wherein the film is employed in an electrophotographic photoconductive member.

6. The method according to claim 1 wherein the apparatus comprises heaters and the dummy substrates are disposed so as to surround the heaters.

7. The method according to claim 1 wherein the dummy substrates are cylindrical.

8. The method according to claim 6 wherein the dummy substrates are cylindrical.

9. The method according to claim 1, wherein the dummy substrates have the same shape of a substrate for forming the film.

10. The method according to claim 3, wherein the frequency is within the range of 51 MHz to 250 MHz.

11. The method according to claim 6, wherein the frequency is within the range of 51 MHz to 250 MHz.

12. The method according to claim 1, wherein the etching gas further comprises $O_2$ gas.

13. The method according to claim 1, wherein the remaining dummy substrates and the at least one of the dummy substrates to which the electromagnetic wave is applied are disposed alternatively.

14. The method according to claim 1, including providing a plurality of the dummy substrates to which the electromagnetic wave is applied and disposing the plurality of the dummy substrates to which the electromagnetic wave is applied at equal spacing with respect to all the dummy substrates.

* * * * *

UNITED STATES PATENT AND TRADEMARK OFFICE
CERTIFICATE OF CORRECTION

PATENT NO. : 5,817,181
DATED : October 6, 1998
INVENTOR(S) : Ryuji Okamura et al.

It is certified that error appears in the above-identified patent and that said Letters Patent is hereby corrected as shown below:

Title page
Item [56] REFERENCES CITED,
Attorney, Agent or Firm,
"Fitzpatrick, Cella Harper & Scinto" should read -- Fitzpatrick, Cella, Harper & Scinto --.

Title,
"LIGHT-RECEIVED" should read -- LIGHT-RECEIVING --.

Column 1,
Line 3, "LIGHT-RECEIVED" should read -- LIGHT-RECEIVING --.
Line 63, "hereinafter" should read -- (hereinafter --.

Column 2,
Line 13, "timer stability," should read -- time-stability, --;
Line 55, "regimes less times" should read -- requires less time. --;
Line 67, "what" should read -- which --.

Column 3,
Line 9, "more" should read -- more and more --; and
"future, and it is sought to make" should read -- future. --;
Line 10, "improvements." should be deleted;
Line 20, "uneveness" should read -- unevenness --;
Line 23, "uneveness" should read -- unevenness --.

Column 5,
Line 65, "with" should read -- with the --.

Column 6,
Line 16, "even" should read -- ever --.

Column 7,
Line 4, "producing," should read -- producing --.

UNITED STATES PATENT AND TRADEMARK OFFICE
CERTIFICATE OF CORRECTION

PATENT NO. : 5,817,181
DATED : October 6, 1998
INVENTOR(S) : Ryuji Okamura et al.

It is certified that error appears in the above-identified patent and that said Letters Patent is hereby corrected as shown below:

Column 8,
Line 53, "23E" should read -- 20C --.

Column 12,
Line 9, "along" should read -- along with --;
Line 28, "oxygen, " should read -- oxygen --;
Line 29, "tp" should read -- to --;
Line 41, "cause" should read -- caused --.

Column 15,
Line 39, "in, " should read -- in --.

Column 16,
Line 7, "are" should read -- is --;
Line 52, "are" should read -- is --.

Column 17,
Line 19, "contribute" should read -- contribute to --.

Column 18,
Line 64, "bompardment," should read -- bombardment, --.

Column 20,
Line 27, "uneve-" should read -- uneven --;
Line 29, "uneveness" should read -- unevenness --.

Column 25,
Line 16, "0-feeding" should read -- O-feeding --.

Column 26,
Line 20, "103a." should read -- 103a --;
Line 52, "comprises" should read -- comprise --.

UNITED STATES PATENT AND TRADEMARK OFFICE
CERTIFICATE OF CORRECTION

PATENT NO. : 5,817,181
DATED : October 6, 1998
INVENTOR(S) : Ryuji Okamura et al.

It is certified that error appears in the above-identified patent and that said Letters Patent is hereby corrected as shown below:

Column 27,
Line 23, "and silicon" should read -- silicon and --.

Column 28,
Line 65, "in the" (second occurrence) should be deleted.

Column 31,
Line 23, "apparatus" should read -- apparatus 1000, --.

Column 33,
Line 22, "plasama" should read -- plasma --.

Column 39,
Line 11, "reached" should read -- have reached --.

Column 47,
Line 9, "was" should read -- were --;
Line 34, "Si(C+0)" should read -- Si(C+O) --.

Column 48,
Line 67, "cylinders" should read -- cylinder --.

Column 51,
Line 47, "member" should read -- members --;
Line 63, "member" should read -- members --.

Column 65,
Line 38, "Interfacial" should read --interfacial--.

Column 67,
Line 52, "$0<V_o 200$" should read -- $O \leq V_o 200$ --.

Column 73,
Line 4, "drum" should read -- drums --;
Line 27, "drum" should read -- drums --.

UNITED STATES PATENT AND TRADEMARK OFFICE
CERTIFICATE OF CORRECTION

PATENT NO.    : 5,817,181
DATED         : October 6, 1998
INVENTOR(S)   : Ryuji Okamura et al.

It is certified that error appears in the above-identified patent and that said Letters Patent is hereby corrected as shown below:

Column 75,
Line 63, "chargeability," should read -- chargeability, and --.

Column 77,
Table 3, "uneveness:" should read -- unevenness: --.

Column 78,
Line 50, "frequency (MHz:" should read -- frequency (MHz): --.

Column 81,
Table 9, "uneveness:" should read -- unevenness: --;
Table 11, "unevenness:" should read -- unevenness: --.

Column 83,
Line 7, "356" should read -- 350 --;
Table 15 should read

Table 15

| | Cp.8 | | | Example 7 | | | | |
|---|---|---|---|---|---|---|---|---|
| Power source frequency (MHz): | 13.56 | 20 | 30 | 51 | 105 | 200 | 250 | 450 |
| White dots: | AA/B | A/A | A/A | AA/AA | AA/AA | AA/AA | AA/AA | A/A |
| Blank memory: | AA/A | AA/A | AA/AA | AA/AA | AA/AA | AA/AA | AA/AA | AA/AA |
| Ghost: | AA/A | A/A | AA/A | AA/AA | AA/AA | AA/AA | AA/AA | AA/A |
| Charge performance: | AA/B | A/A | A/A | AA/AA | AA/AA | AA/AA | AA/AA | AA/AA |
| Sensitivity: | A/B | A/A | A/A | A/A | A/A | A/A | A/A | A/A |
| Overall evaluation: | B | A | A | AA | AA | AA | AA | A |

(Initial image/After running test)

UNITED STATES PATENT AND TRADEMARK OFFICE
CERTIFICATE OF CORRECTION

PATENT NO. : 5,817,181
DATED : October 6, 1998
INVENTOR(S) : Ryuji Okamura et al.

It is certified that error appears in the above-identified patent and that said Letters Patent is hereby corrected as shown below:

Column 85,
Table 16, "Substrate.temperature (°C.):" should read -- Substrate temperature (°C.): --.

Column 89,
Line 49, "Layer thickness (um):" should read -- Layer thickness ($\mu$m): --.

Column 91,
Line 49, "Layer thickness (um):" should read -- Layer thickness ($\mu$m): -- .

Column 96,
Line 12 , "High - freguency" should read -- High - frequency --.

Column 102,
Table 60, "260" should read -- 200 --.

Column 129,
Line 28, "AAIAA" should read -- AA/AA --.

Column 130
Line 54, "Gas flow rate (sccm)" should read -- Gas flow rate (sccm): --.

Column 131,
Line 49, "256" should read -- 250 --.

Column 132,
Line 38, "Gas flow rate (sccm):      350" should read
-- Gas flow rate (sccm): --;
Line 39, "SiH4" should read -- SiH4      350 --;
Line 47, "Gas flow rate (sccm):      350" should read
-- Gas flow rate (sccm): --;
Line 48, "SiH$_4$" should read --SiH4      350--.

UNITED STATES PATENT AND TRADEMARK OFFICE
CERTIFICATE OF CORRECTION

PATENT NO. : 5,817,181
DATED : October 6, 1998
INVENTOR(S) : Ryuji Okamura et al.

It is certified that error appears in the above-identified patent and that said Letters Patent is hereby corrected as shown below:

Column 134,
Line 63, "Ak" should read -- AA --.

Signed and Sealed this

Eleventh Day of December, 2001

Attest:

NICHOLAS P. GODICI
Attesting Officer    Acting Director of the United States Patent and Trademark Office